(12) United States Patent
Yamazaki et al.

(10) Patent No.: US 11,031,403 B2
(45) Date of Patent: Jun. 8, 2021

(54) SEMICONDUCTOR DEVICE AND MANUFACTURING METHOD OF SEMICONDUCTOR DEVICE

(71) Applicant: SEMICONDUCTOR ENERGY LABORATORY CO., LTD., Atsugi (JP)

(72) Inventors: Shunpei Yamazaki, Tokyo (JP); Daisuke Matsubayashi, Kanagawa (JP); Kiyoshi Kato, Kanagawa (JP); Katsuaki Tochibayashi, Kanagawa (JP); Shuhei Nagatsuka, Kanagawa (JP)

(73) Assignee: Semiconductor Energy Laboratory Co., Ltd., Atsugi (JP)

( * ) Notice: Subject to any disclaimer, the term of this patent is extended or adjusted under 35 U.S.C. 154(b) by 0 days.

(21) Appl. No.: 16/605,548

(22) PCT Filed: Apr. 19, 2018

(86) PCT No.: PCT/IB2018/052701
§ 371 (c)(1),
(2) Date: Oct. 16, 2019

(87) PCT Pub. No.: WO2018/197994
PCT Pub. Date: Nov. 1, 2018

(65) Prior Publication Data
US 2020/0126992 A1 Apr. 23, 2020

(30) Foreign Application Priority Data

Apr. 28, 2017 (JP) .............................. JP2017-090374
Apr. 28, 2017 (JP) .............................. JP2017-090842

(51) Int. Cl.
*H01L 27/108* (2006.01)
*H01L 27/1156* (2017.01)
(Continued)

(52) U.S. Cl.
CPC .. *H01L 27/10805* (2013.01); *H01L 21/31116* (2013.01); *H01L 27/0629* (2013.01);
(Continued)

(58) Field of Classification Search
CPC ............. H01L 29/7869; H01L 27/1225; H01L 29/786; H01L 27/10805
See application file for complete search history.

(56) References Cited

U.S. PATENT DOCUMENTS 7,674,650 B2    3/2010  Akimoto et al.
8,547,771 B2   10/2013  Koyama
(Continued)

FOREIGN PATENT DOCUMENTS

JP      63-268184 A     11/1988
JP     2002-050748 A     2/2002
(Continued)

OTHER PUBLICATIONS

International Search Report (Application No. PCT/IB2018/052701) dated Jul. 17, 2018.
(Continued)

*Primary Examiner* — John A Bodnar
(74) *Attorney, Agent, or Firm* — Fish & Richardson P.C.

(57) ABSTRACT

A semiconductor device that can be highly integrated is provided. The semiconductor device includes a first transistor, a second transistor, a first capacitor, and a second capacitor. The first transistor includes an oxide over a first insulator, a second insulator over the oxide, a first conductor over the second insulator, a third insulator over the first conductor, a fourth insulator in contact with the second insulator, the first conductor, and the third insulator, and a fifth insulator in contact with the fourth insulator. The second transistor includes an oxide over the first insulator, a sixth insulator over the oxide, a second conductor over the
(Continued)

sixth insulator, a seventh insulator over the second conductor, an eighth insulator in contact with the sixth insulator, the second conductor, and the seventh insulator, and a ninth insulator in contact with the eighth insulator. The first capacitor includes an oxide, a tenth insulator over the oxide, and a third conductor over the tenth insulator. The second capacitor includes an oxide, an eleventh insulator over the oxide, and a fourth conductor over the eleventh insulator.

8 Claims, 67 Drawing Sheets

(51) Int. Cl.
  *H01L 27/06* (2006.01)
  *H01L 29/786* (2006.01)
  *H01L 21/311* (2006.01)
  *H01L 27/32* (2006.01)
  *H01L 27/12* (2006.01)

(52) U.S. Cl.
  CPC ...... *H01L 27/1156* (2013.01); *H01L 27/1225* (2013.01); *H01L 27/1255* (2013.01); *H01L 27/3276* (2013.01); *H01L 29/7869* (2013.01); *H01L 29/78621* (2013.01); *H01L 29/78648* (2013.01)

(56) References Cited

U.S. PATENT DOCUMENTS

| | | | |
|---|---|---|---|
| 8,629,437 B2 | 1/2014 | Ishida et al. |
| 8,835,918 B2 | 9/2014 | Yamazaki et al. |
| 8,860,108 B2 | 10/2014 | Yamazaki et al. |
| 9,006,733 B2 | 4/2015 | Yamazaki |
| 9,048,142 B2 | 6/2015 | Yamazaki |
| 9,048,321 B2 | 6/2015 | Kurata et al. |
| 9,082,663 B2 | 7/2015 | Isobe et al. |
| 9,123,632 B2 | 9/2015 | Yamazaki et al. |
| 9,171,959 B2 | 10/2015 | Kurata et al. |
| 9,287,405 B2 | 3/2016 | Sasagawa et al. |
| 9,431,435 B2 | 8/2016 | Ando et al. |
| 9,431,545 B2 | 8/2016 | Saito et al. |
| 9,455,349 B2 | 9/2016 | Suzawa et al. |
| 9,466,615 B2 | 10/2016 | Miyairi et al. |
| 9,472,682 B2 | 10/2016 | Yamazaki et al. |
| 9,614,062 B2 | 4/2017 | Yamazaki |
| 9,728,648 B2 | 8/2017 | Sasagawa et al. |
| 9,780,201 B2 | 10/2017 | Ando et al. |
| 9,865,588 B2 | 1/2018 | Isobe |
| 9,887,295 B2 | 2/2018 | Suzawa et al. |
| 9,923,097 B2 | 3/2018 | Koezuka et al. |
| 9,947,802 B2 | 4/2018 | Kimura et al. |
| 9,954,004 B2 | 4/2018 | Yamazaki |
| 9,997,545 B2 | 6/2018 | Yamazaki |
| 10,103,271 B2 | 10/2018 | Suzawa et al. |
| 10,153,375 B2 | 12/2018 | Sasagawa et al. |
| 10,186,604 B2 | 1/2019 | Ando et al. |
| 10,204,898 B2 | 2/2019 | Momo et al. |
| 2002/0014648 A1 | 2/2002 | Mizutani et al. |
| 2002/0028544 A1 | 3/2002 | Fujimoto et al. |
| 2009/0283763 A1 | 11/2009 | Park et al. |
| 2012/0068179 A1 | 3/2012 | Ishida et al. |
| 2012/0161220 A1 | 6/2012 | Yamazaki |
| 2012/0193697 A1 | 8/2012 | Takemura |
| 2012/0292615 A1 | 11/2012 | Saito |
| 2013/0075722 A1 | 3/2013 | Yamazaki et al. |
| 2013/0193493 A1 | 8/2013 | Yamazaki |
| 2014/0001468 A1 | 1/2014 | Yamazaki et al. |
| 2015/0108472 A1 | 4/2015 | Suzawa et al. |
| 2015/0108475 A1 | 4/2015 | Ando et al. |
| 2015/0187814 A1 | 7/2015 | Miyairi et al. |
| 2015/0279860 A1 | 10/2015 | Yamazaki |
| 2015/0348961 A1 | 12/2015 | Isobe |
| 2016/0035865 A1 | 2/2016 | Nagamatsu et al. |
| 2016/0043070 A1 | 2/2016 | Momo et al. |
| 2017/0033205 A1 | 2/2017 | Yamazaki et al. |
| 2018/0219028 A1 | 8/2018 | Yamazaki |
| 2019/0157262 A1 | 5/2019 | Momo et al. |

FOREIGN PATENT DOCUMENTS

| | | |
|---|---|---|
| JP | 2007-096055 A | 4/2007 |
| JP | 2007-123861 A | 5/2007 |
| JP | 2011-119674 A | 6/2011 |
| JP | 2012-178555 A | 9/2012 |
| JP | 2012-256877 A | 12/2012 |
| KR | 2012-0089588 A | 8/2012 |
| TW | 201234535 | 8/2012 |

OTHER PUBLICATIONS

Written Opinion (Application No. PCT/IB2018/052701) dated Jul. 17, 2018.

FIG. 12A
FIG. 12C
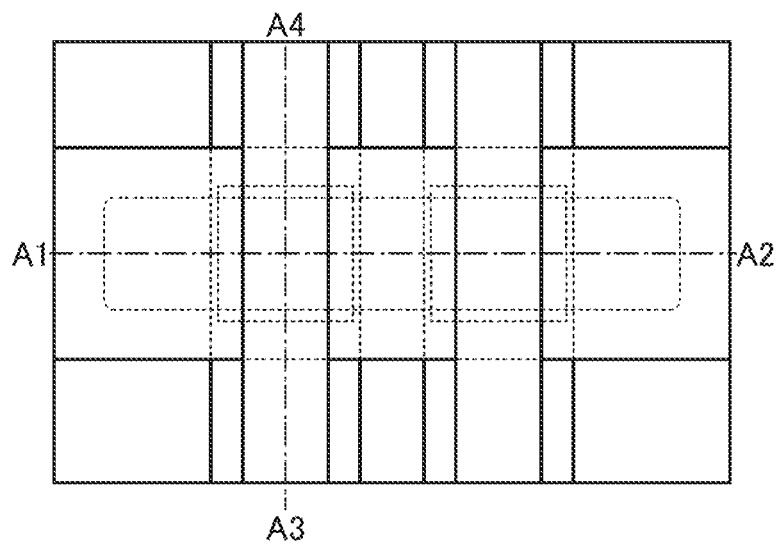
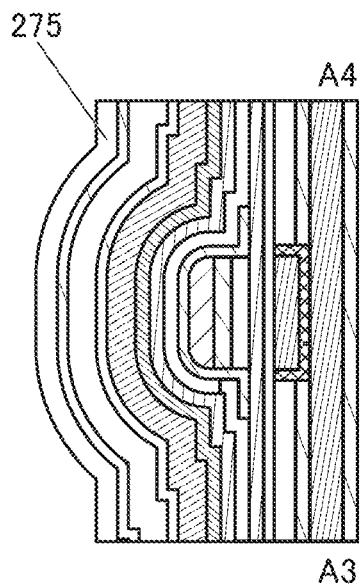
FIG. 12B
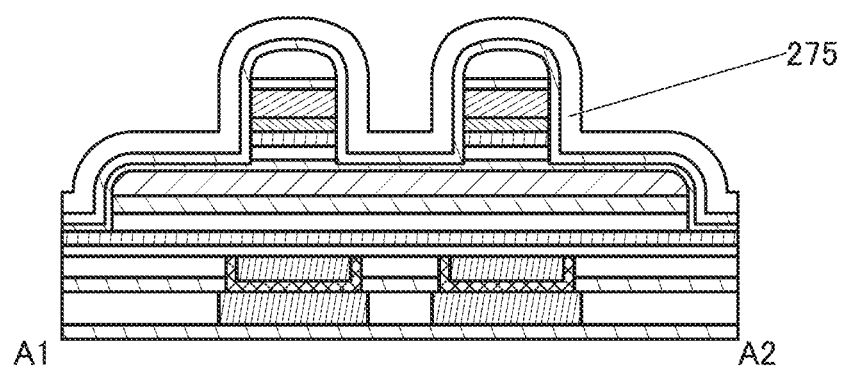

FIG. 17A
FIG. 17C
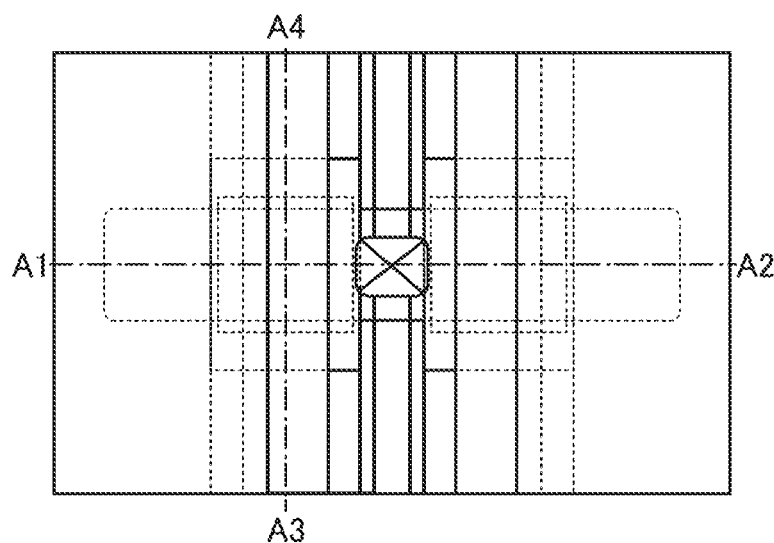
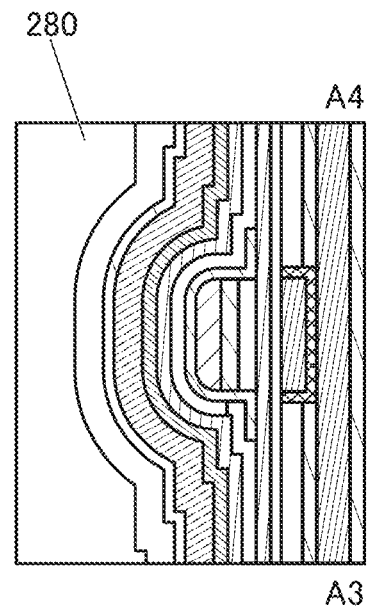
FIG. 17B
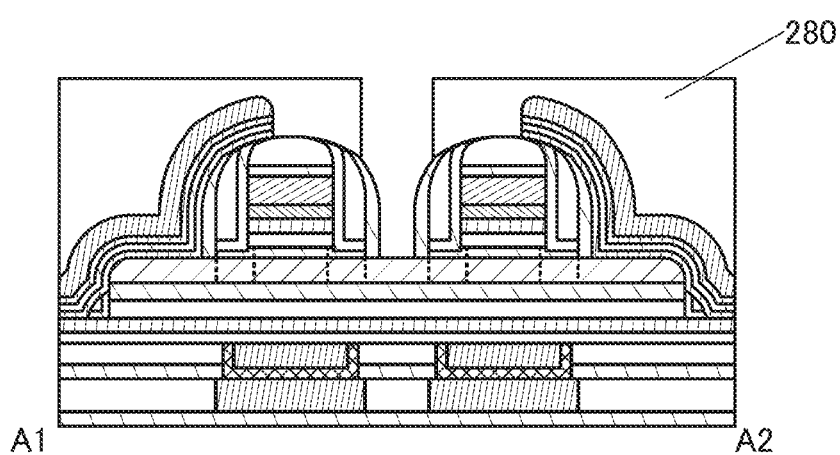

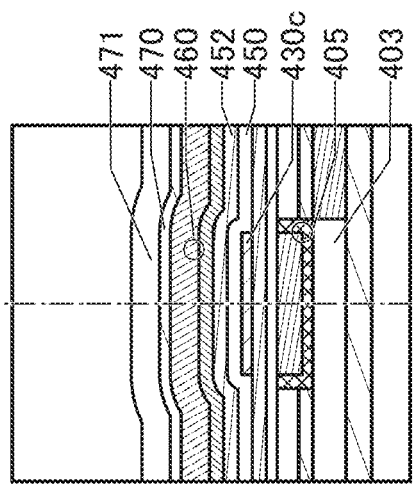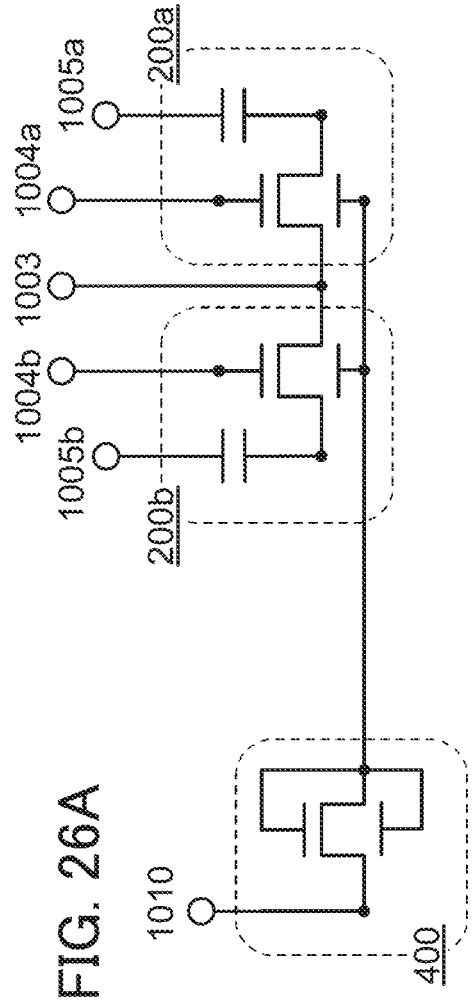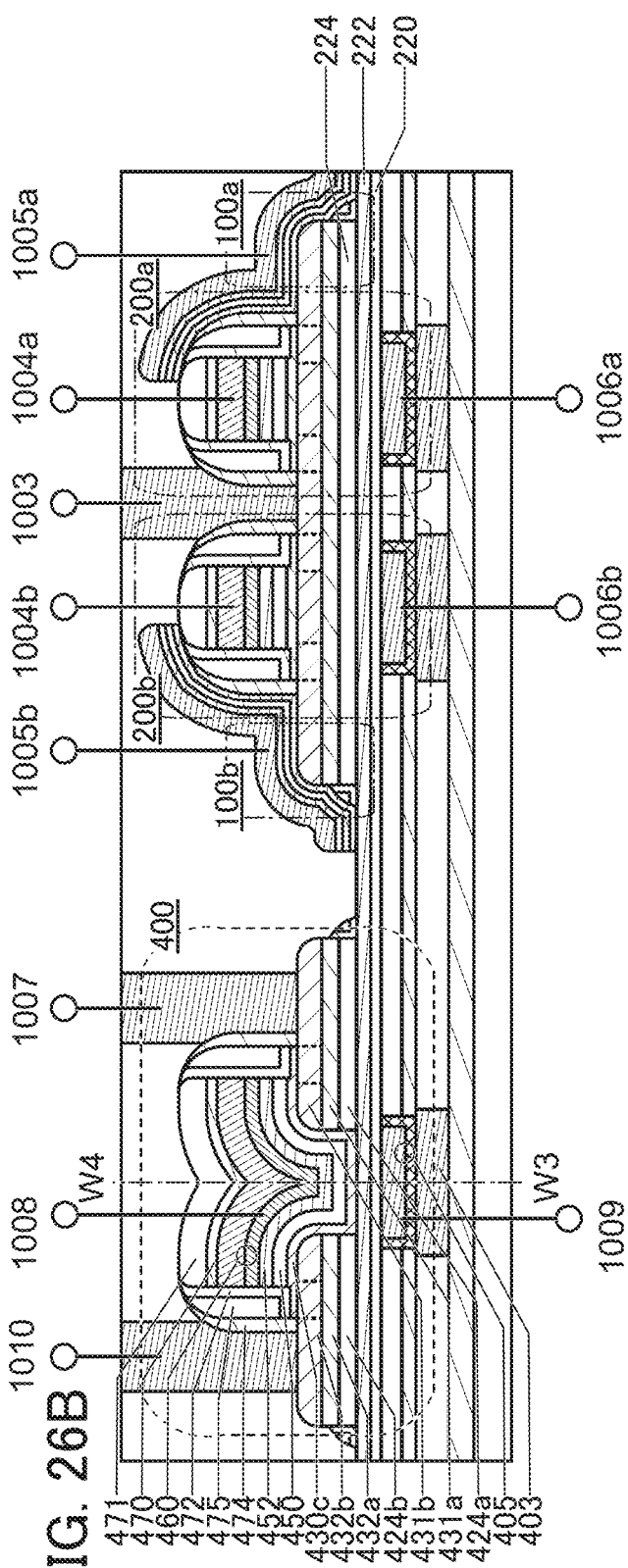

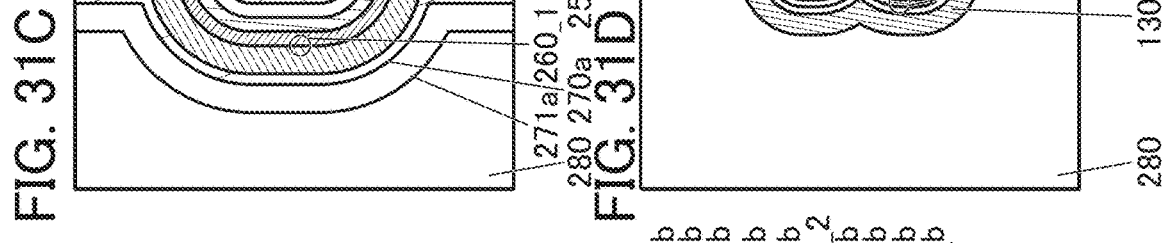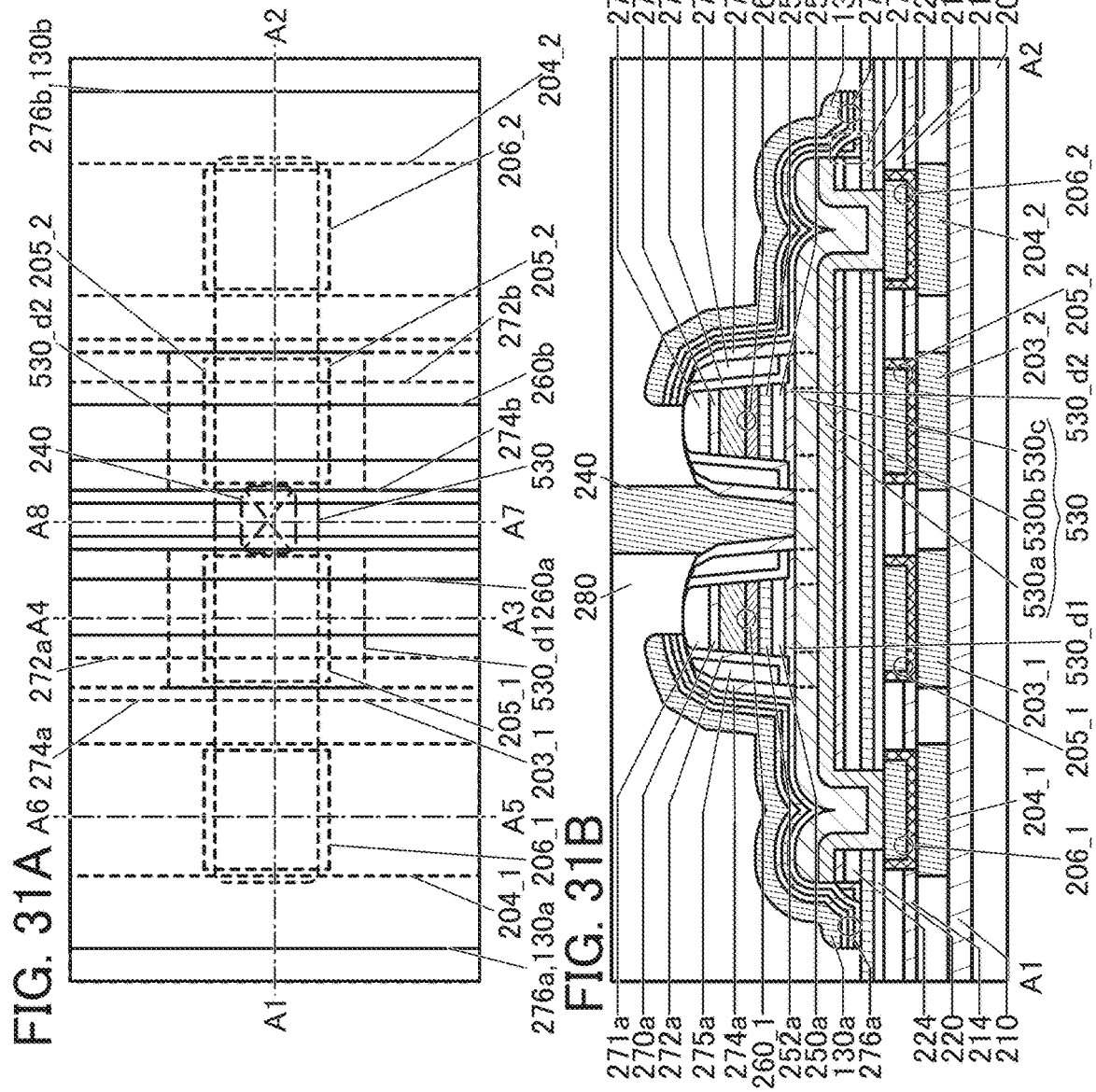

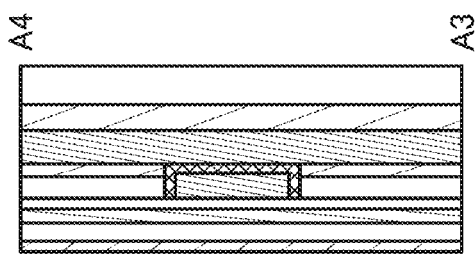
FIG. 35C
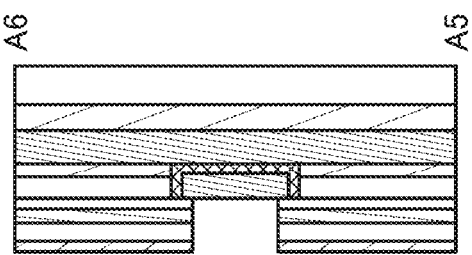
FIG. 35D
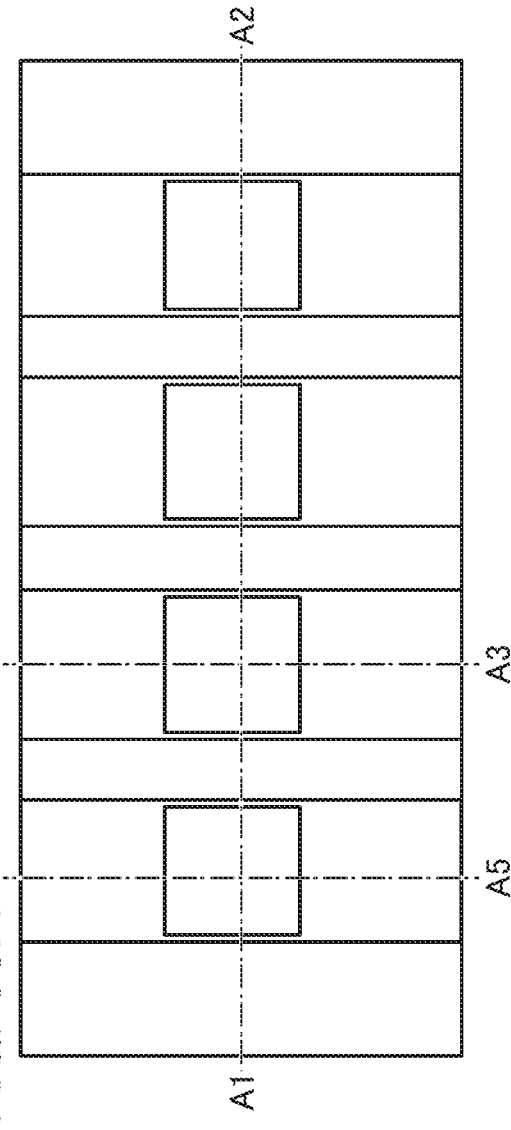
FIG. 35A
FIG. 35B
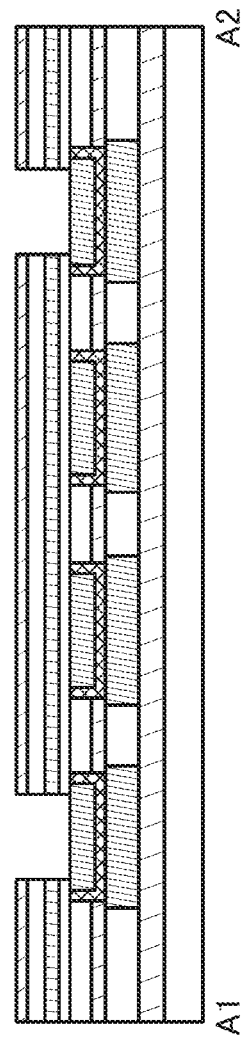

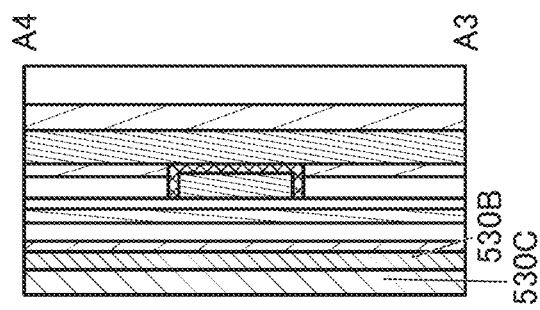
FIG. 36C
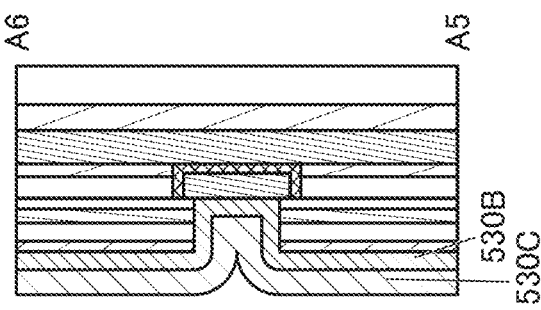
FIG. 36D
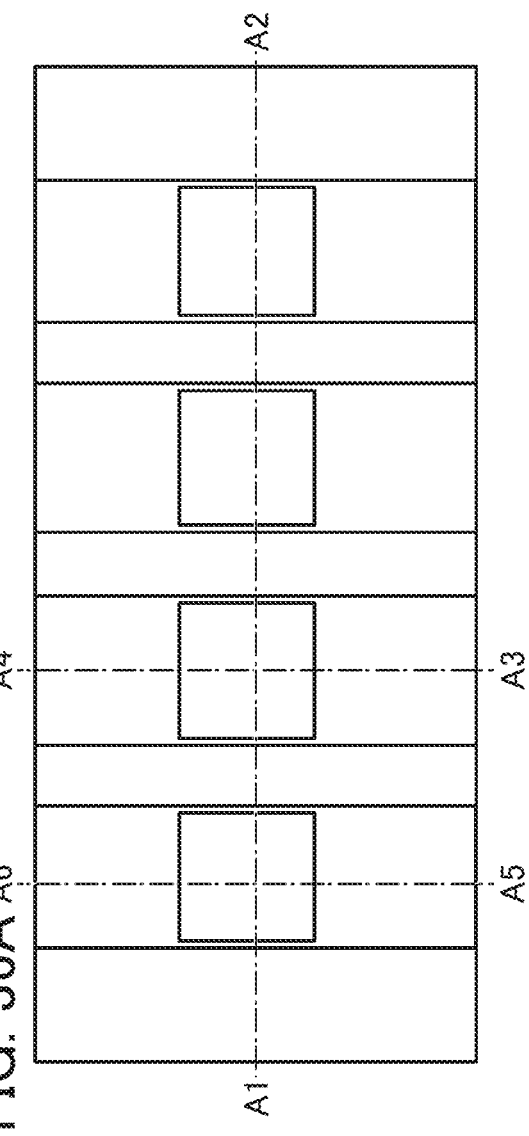
FIG. 36A
FIG. 36B

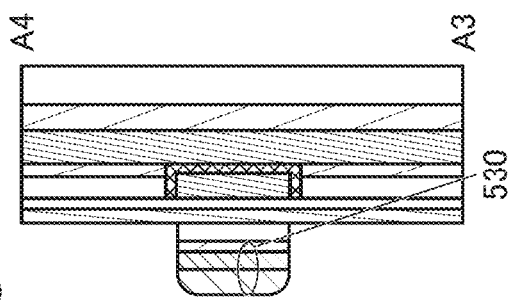
FIG. 37C
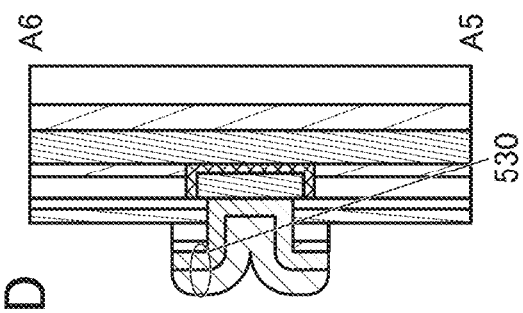
FIG. 37D
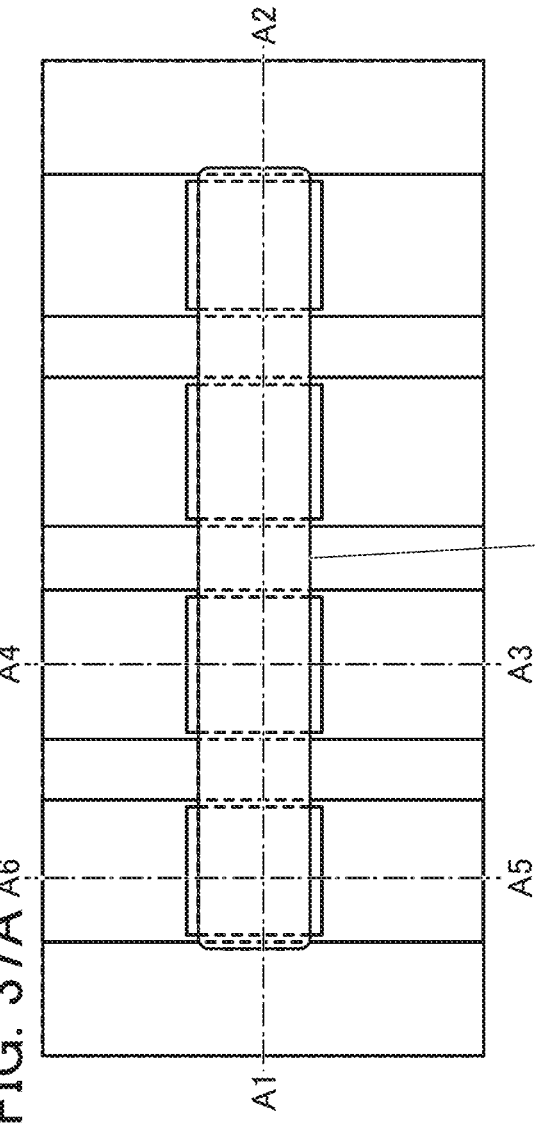
FIG. 37A
FIG. 37B

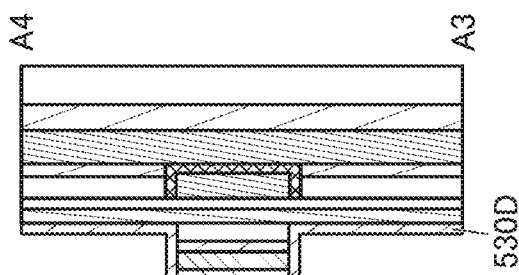
FIG. 38C
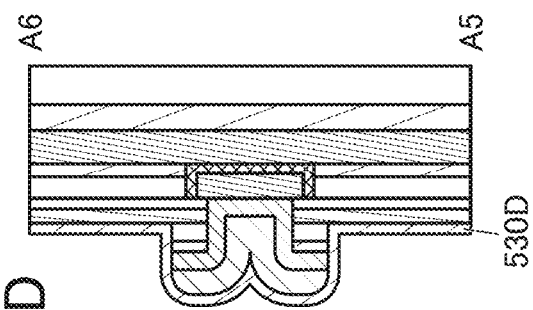
FIG. 38D
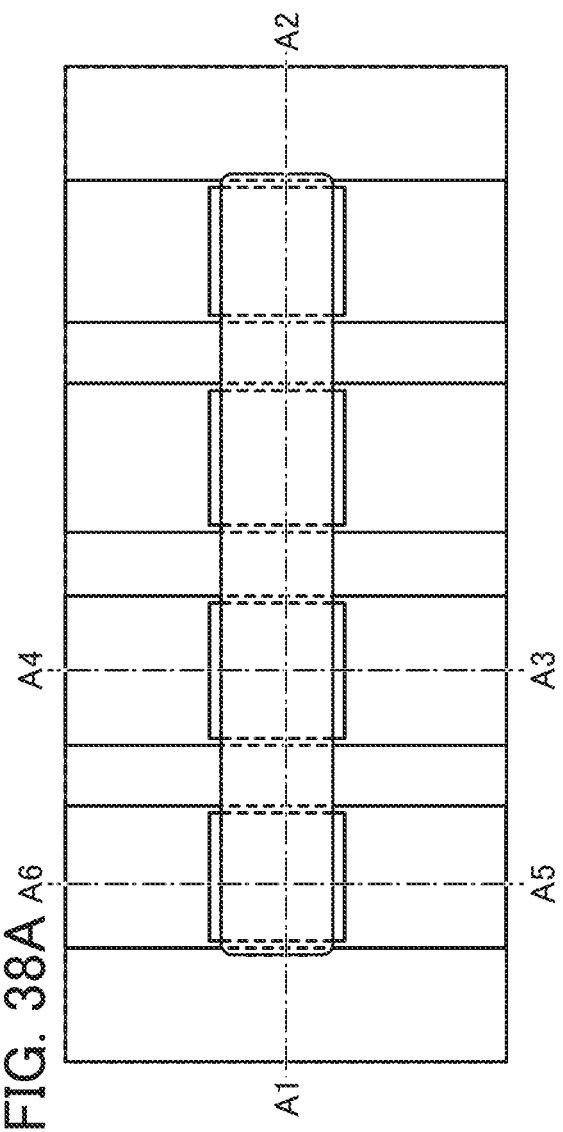
FIG. 38A
FIG. 38B
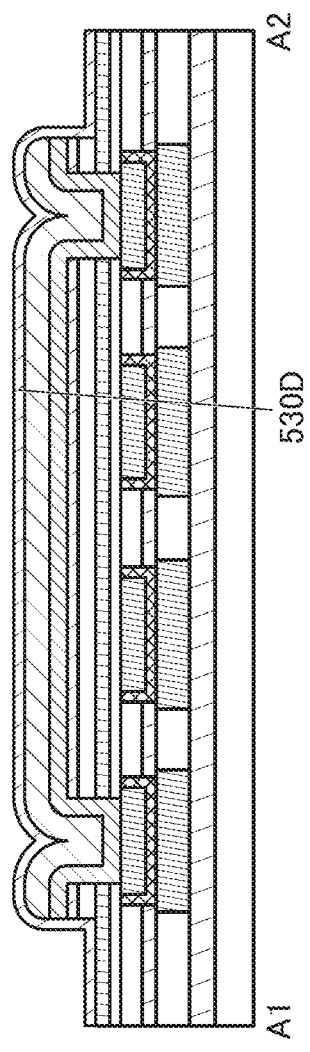

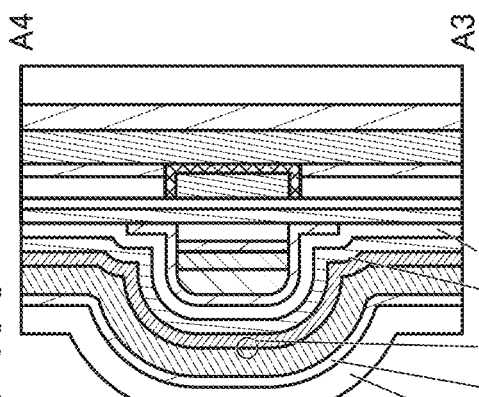
FIG. 40A
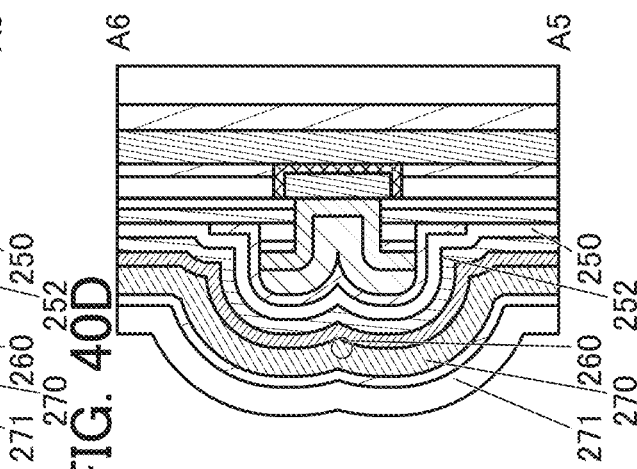
FIG. 40C
FIG. 40D
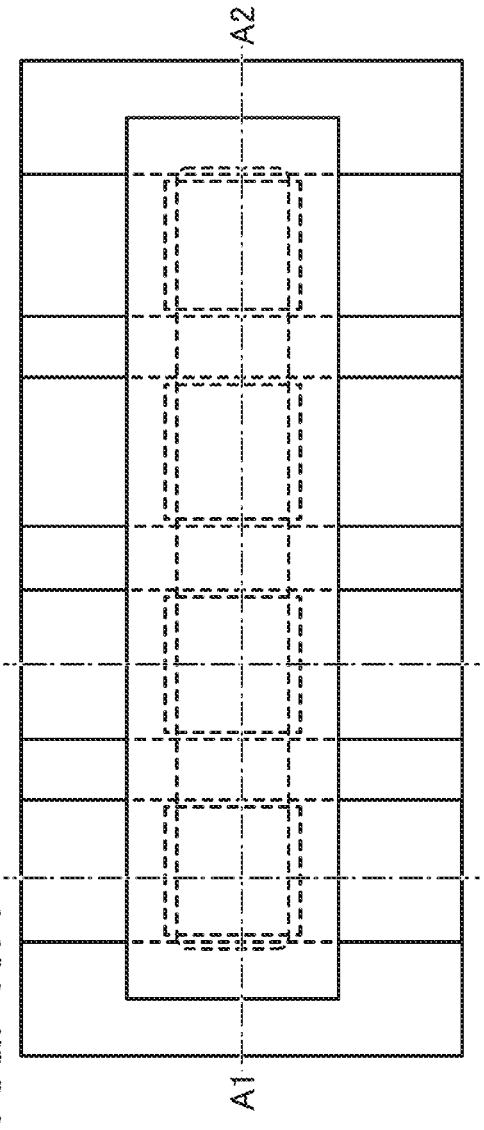
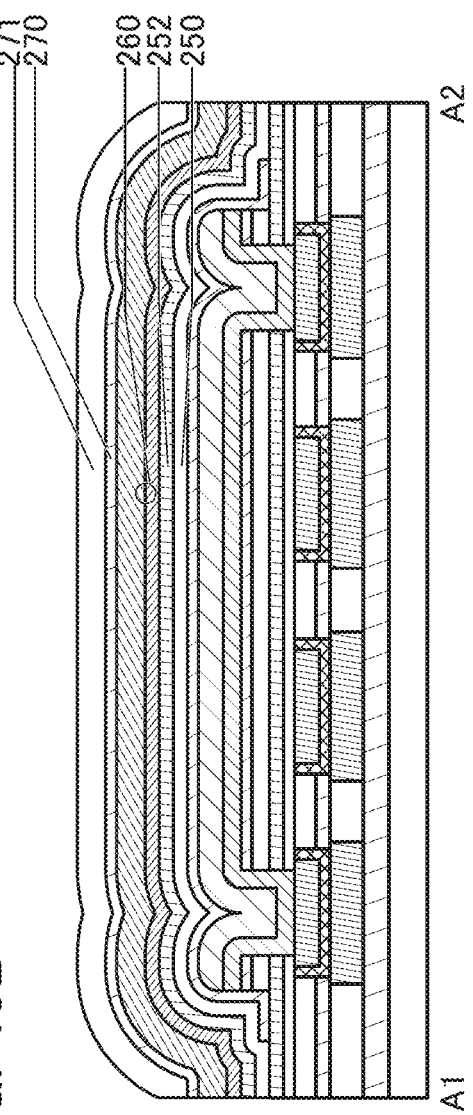
FIG. 40B

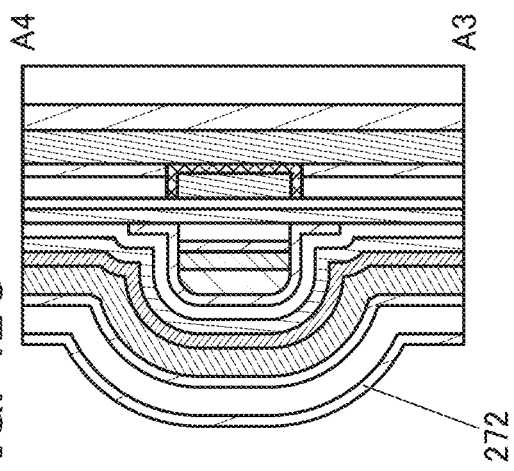
FIG. 42C
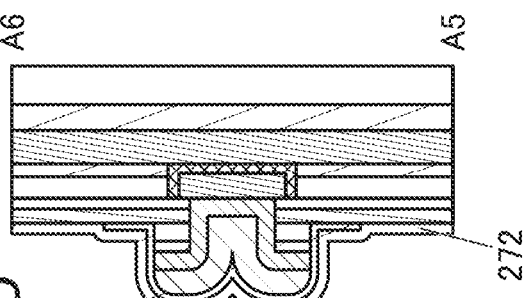
FIG. 42D
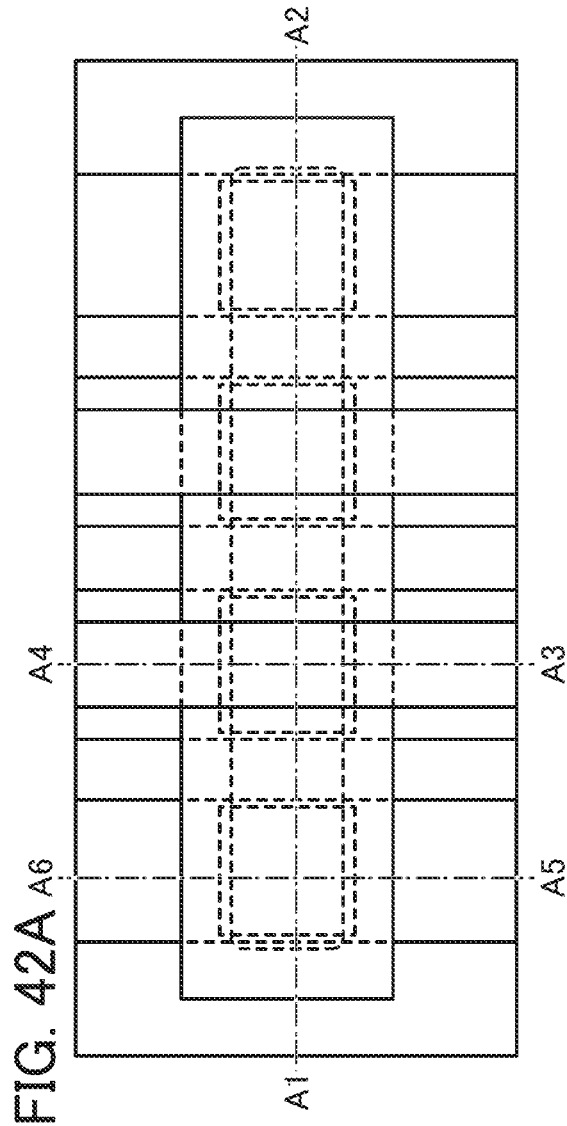
FIG. 42A
FIG. 42B
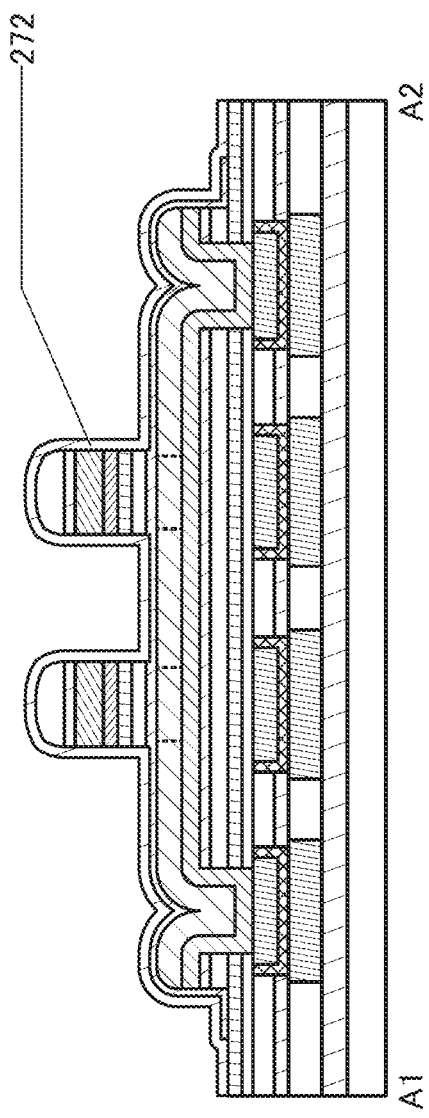

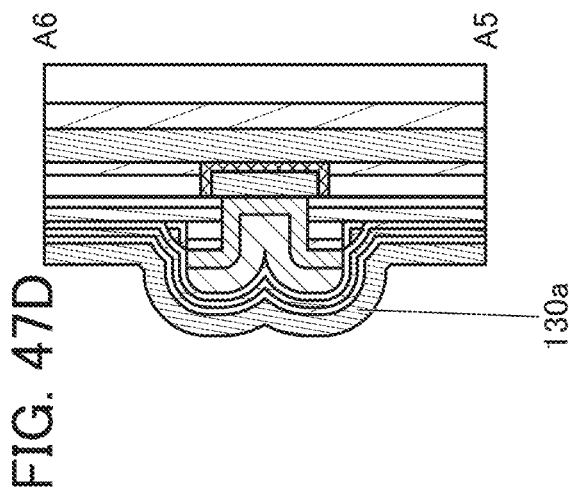
FIG. 47C
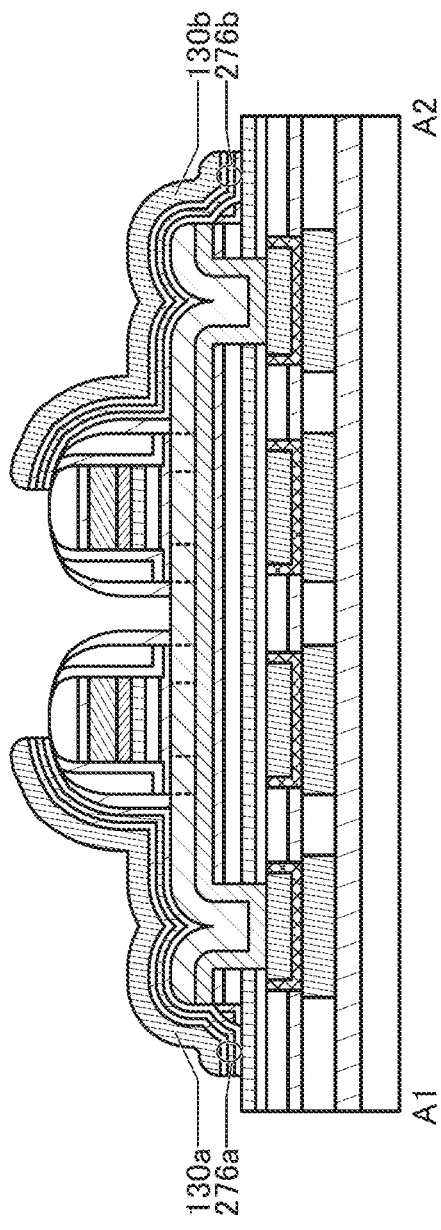
FIG. 47D
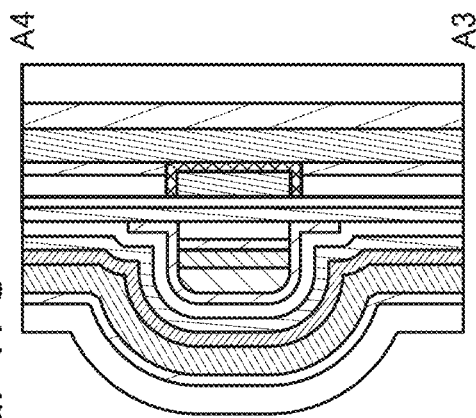
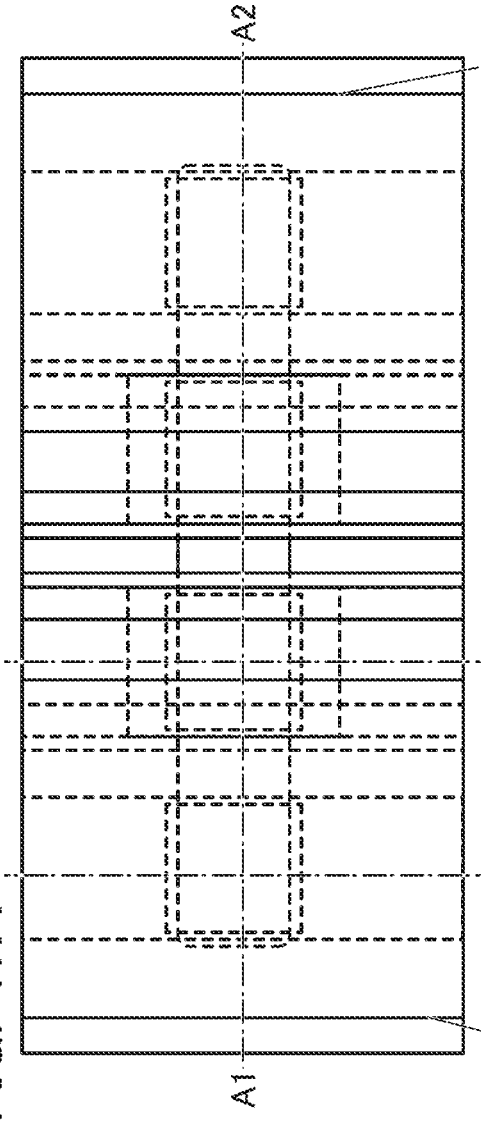
FIG. 47A
FIG. 47B

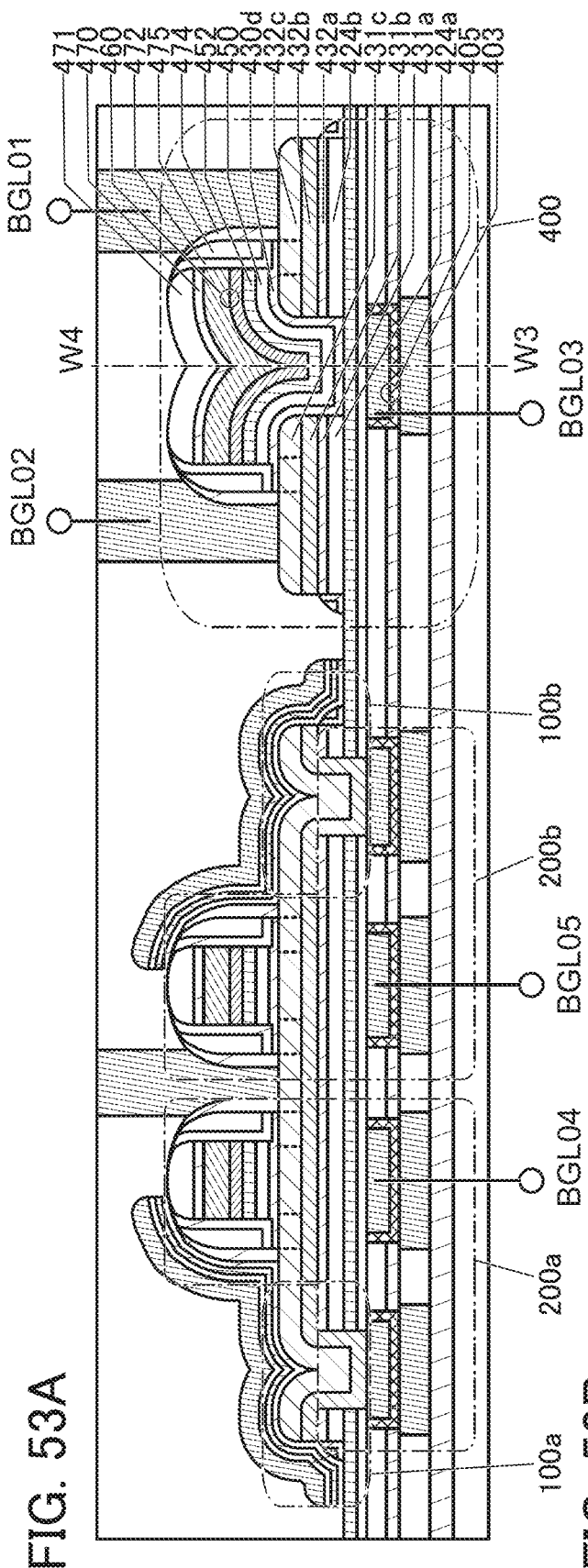
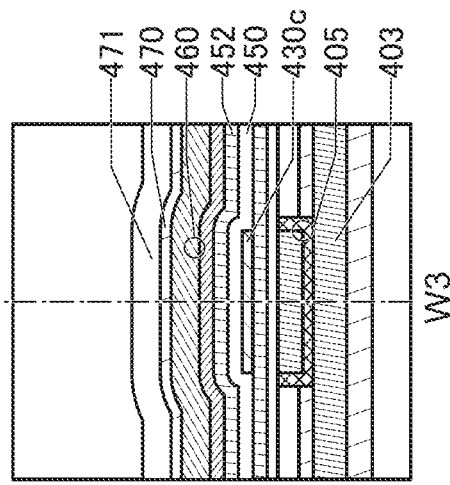
FIG. 53A
FIG. 53B

SEMICONDUCTOR DEVICE AND MANUFACTURING METHOD OF SEMICONDUCTOR DEVICE

CROSS REFERENCE TO RELATED APPLICATIONS

This application is a U.S. National Phase Application under 35 U.S.C. § 371 of International Application PCT/IB2018/052701, filed on Apr. 19, 2018, which claims the benefit of two foreign priority applications filed in Japan as Application No. 2017-090374 and 2017-090842, both filed on Apr. 28, 2017, all of which are incorporated by reference.

TECHNICAL FIELD

One embodiment of the present invention relates to a semiconductor device and a driving method thereof. Another embodiment of the present invention relates to a semiconductor wafer, a module, and an electronic device.

In this specification and the like, a semiconductor device generally means a device that can function by utilizing semiconductor characteristics. A semiconductor element such as a transistor, a semiconductor circuit, an arithmetic device, and a memory device are each an embodiment of a semiconductor device. A display device (e.g., a liquid crystal display device and a light-emitting display device), a projection device, a lighting device, an electro-optical device, a power storage device, a memory device, a semiconductor circuit, an imaging device, an electronic device, and the like may include a semiconductor device.

Note that one embodiment of the present invention is not limited to the above technical field. One embodiment of the invention disclosed in this specification and the like relates to an object, a method, or a manufacturing method. Furthermore, one embodiment of the present invention relates to a process, a machine, manufacture, or a composition of matter.

BACKGROUND ART

A technique in which a transistor is formed using a semiconductor thin film has attracted attention. The transistor is used in a wide range of electronic devices such as an integrated circuit (IC) and an image display device (also simply referred to as a display device). A silicon-based semiconductor material is widely known as a material for a semiconductor thin film applicable to the transistor. As another material, an oxide semiconductor has been attracting attention.

For example, techniques have been disclosed by each of which a display device is manufactured using a transistor whose active layer is formed of zinc oxide or an In—Ga—Zn-based oxide as an oxide semiconductor (see Patent Documents 1 and 2).

In recent years, a technique has been disclosed by which an integrated circuit of a memory device is manufactured using a transistor including an oxide semiconductor (see Patent Document 3). Furthermore, not only memory devices but also arithmetic devices and the like are manufactured using transistors including oxide semiconductors.

REFERENCE

Patent Document

[Patent Document 1] Japanese Published Patent Application No. 2007-123861

[Patent Document 2] Japanese Published Patent Application No. 2007-96055

[Patent Document 3] Japanese Published Patent Application No. 2011-119674

DISCLOSURE OF INVENTION

The integration of integrated circuits and miniaturization of transistors have progressed in accordance with an increase in performance and a reduction in size and weight of electronic devices. Thus, the process rule for fabricating a transistor has decreased year by year as follows: 45 nm, 32 nm, and 22 nm. Accordingly, transistors with fine structures including oxide semiconductors are required to have good electrical characteristics as designed.

One embodiment of the present invention is to provide a semiconductor device that can be miniaturized or highly integrated. Another embodiment of the present invention is to provide a semiconductor device having favorable electrical characteristics. Another embodiment of the present invention is to provide a semiconductor device with low off-state current. Another embodiment of the present invention is to provide a transistor with high on-state current. Another embodiment of the present invention is to provide a highly reliable semiconductor device. Another embodiment of the present invention is to provide a semiconductor device with low power consumption. Another embodiment of the present invention is to provide a semiconductor device that can be manufactured with high productivity.

Another embodiment of the present invention is to provide a semiconductor device capable of retaining data for a long time. Another embodiment of the present invention is to provide a semiconductor device capable of high-speed data writing. Another embodiment of the present invention is to provide a semiconductor device with high design flexibility. Another embodiment of the present invention is to provide a low-power semiconductor device. Another embodiment of the present invention is to provide a novel semiconductor device.

Note that the descriptions of these objects do not disturb the existence of other objects. In one embodiment of the present invention, there is no need to achieve all the objects. Other objects will be apparent from and can be derived from the description of the specification, the drawings, the claims, and the like.

One embodiment of the present invention is a transistor including an oxide semiconductor. An insulator is positioned over a gate electrode and in contact with a side surface of the gate electrode and a side surface of a gate insulating film. Note that the insulator is preferably formed by an ALD method. When the insulator is formed by an ALD method, an insulator with few defects and excellent coverage with respect to a shape of unevenness can be obtained. The provision of such an insulator in contact with the side surface of the gate insulating film can prevent outward diffusion of oxygen contained in the gate insulating film and entry of impurities such as water or hydrogen into the gate insulating film. Furthermore, since the insulator is positioned to cover the top surface and the side surface of the gate electrode, oxidation of the gate electrode can be prevented.

In another embodiment of the present invention, an insulating film is provided between gate electrodes of two transistors, a contact hole in contact with the insulating film is formed, and an electrode connected to a source region or a drain region shared by the two transistors is provided in the contact hole; thus, the two transistors can be provided so as to be close to each other. Furthermore, by providing capacitors on the same layer as the transistors, the transistors and the capacitors can be arranged with high density and the size of a semiconductor device can be decreased. Furthermore, the semiconductor device according to one embodiment of the present invention uses an oxide for a semiconductor layer, and after the oxide is processed into an island shape, two gate electrodes are provided in pairs over the island-shaped oxide. By providing the two gate electrodes in pairs over the island-shaped oxide, the transistors and the capacitors can be arranged with high density and the size of the semiconductor device can be decreased.

Another embodiment of the present invention is a semiconductor device including an oxide in a channel formation region. The semiconductor device includes a first transistor, a second transistor, a first capacitor, a second capacitor, and a wiring. The first transistor includes the oxide over a first insulator, a second insulator over the oxide, a first conductor over the second insulator, a third insulator over the first conductor, a fourth insulator in contact with the second insulator, the first conductor, and the third insulator, and a fifth insulator in contact with the fourth insulator. The second transistor includes the oxide over the first insulator, a sixth insulator over the oxide, a second conductor over the sixth insulator, a seventh insulator over the second conductor, an eighth insulator in contact with the sixth insulator, the second conductor, and the seventh insulator, and a ninth insulator in contact with the eighth insulator. The first capacitor includes the oxide, a tenth insulator in contact with one side surface of the oxide in a channel length direction and part of a top surface of the oxide, and a third conductor in contact with the tenth insulator. The second capacitor includes the oxide, an eleventh insulator in contact with the other side surface of the oxide in the channel length direction and part of the top surface of the oxide, and a fourth conductor in contact with the eleventh insulator. The oxide includes first regions each overlapping with the second insulator or the sixth insulator, second regions each overlapping with the fourth insulator or the eighth insulator, and a third region in contact with the second regions. The wiring is in contact with the fifth insulator and the ninth insulator and electrically connected to the third region.

Another embodiment of the present invention is a semiconductor device including an oxide in a channel formation region. The semiconductor device includes a first transistor, a second transistor, a first capacitor, a second capacitor, and a wiring. The first transistor includes a first conductor, a first insulator over the first conductor, a first oxide over the first insulator, a second oxide over the first oxide, a second insulator over the second oxide, a second conductor over the second insulator, a third insulator over the second conductor, a fourth insulator in contact with the second insulator, the second conductor, and the third insulator, and a fifth insulator in contact with the fourth insulator. A first opening overlapping with part of the first conductor is provided in the first oxide and the first insulator. The second oxide is electrically connected to the first conductor through the first opening. The second transistor includes a third conductor, the first insulator over the third conductor, the first oxide over the first insulator, the second oxide over the first oxide, a sixth insulator over the second oxide, a fourth conductor over the sixth insulator, a seventh insulator over the fourth conductor, an eighth insulator in contact with the sixth insulator, the fourth conductor, and the seventh insulator, and a ninth insulator in contact with the eighth insulator. A second opening overlapping with part of the third conductor is provided in the first oxide and the first insulator. The second oxide is electrically connected to the third conductor through the second opening. The first capacitor includes the second oxide, a tenth insulator in contact with one side surface of the second oxide in a channel length direction and part of a top surface of the second oxide, and a fifth conductor in contact with the tenth insulator. The second capacitor includes the second oxide, an eleventh insulator in contact with one side surface of the second oxide in the channel length direction and part of the top surface of the second oxide, and a sixth conductor in contact with the eleventh insulator. The second oxide includes first regions each overlapping with the second insulator or the sixth insulator, second regions each overlapping with the fourth insulator or the eighth insulator, and a third region in contact with the second regions. The wiring is in contact with the fifth insulator and the ninth insulator and electrically connected with the third region.

In the above semiconductor device, the oxide and the second oxide each include In, an element M (M is Al, Ga, Y, or Sn), and Zn.

In the above semiconductor device, the third region has a higher carrier density than the second regions, and the second regions have a higher carrier density than the first regions.

In the above semiconductor device, the fourth insulator and the eighth insulator each include a metal oxide.

In the above semiconductor device, the fifth insulator and the ninth insulator each include one or more elements selected from aluminum oxide, silicon oxide, silicon oxynitride, silicon nitride oxide, and silicon nitride.

In the above semiconductor device, the fifth insulator and the ninth insulator each have a structure in which silicon oxynitride and silicon nitride are stacked in this order.

Another embodiment of the present invention is a memory device in which the above semiconductor device is electrically connected to a semiconductor element including silicon in a channel formation region.

In the above memory device, the above semiconductor device is formed over the semiconductor element.

Another embodiment of the present invention is a method for manufacturing a semiconductor device, including the steps of forming a first insulator over a substrate, forming an oxide layer over the first insulator, forming a first insulating film, a first conductive film, and a second insulating film in this order over the oxide layer, processing the first insulating film, the first conductive film, and the second insulating film to form a second insulator, a third insulator, a first conductor, a second conductor, a fourth insulator, and a fifth insulator, forming a third insulating film and a fourth insulating film in this order over the first insulator, the oxide layer, the second insulator, the third insulator, the first conductor, the second conductor, the fourth insulator, and the fifth insulator, processing the third insulating film and the fourth insulating film to form a sixth insulator, a seventh insulator, an eighth insulator in contact with the sixth insulator, and a ninth insulator in contact with the seventh insulator, forming a fifth insulating film over the first insulator, the oxide layer, the eighth insulator, and the ninth insulator, processing the fifth insulating film to form a tenth insulator in contact with a side surface of the eighth insulator and an eleventh insulator in contact with a side surface of the ninth insulator, forming a sixth insulating film over the first insulator, the oxide layer, the fourth insulator, the fifth insulator, the tenth insulator, and the eleventh insulator, forming a second conductive film over the sixth insulating film, processing the sixth insulating film and the second conductive film to form a twelfth insulator in contact with at least one side surface of the oxide layer in a channel length direction and a top surface of the oxide layer, a thirteenth insulator in contact with at least the other side surface of the oxide layer in the channel length direction and the top surface of the oxide layer, a third conductor and a fourth conductor over the twelfth insulator and the thirteenth insulator, forming a fourteenth insulator over the third conductor, the fourth conductor, the tenth insulator, and the eleventh insulator, forming an opening in the fourteenth insulator, and forming a fifth conductor in the opening.

In the above method for manufacturing a semiconductor device, the opening is formed to expose part of the tenth insulator, part of the eleventh insulator, the top surface of the oxide layer, and at least part of the side surface of the oxide layer.

In the above method for manufacturing a semiconductor device, the third insulating film and the fourth insulating film are processed by anisotropic etching utilizing a dry etching method.

In the above method for manufacturing a semiconductor device, the fifth insulating film is processed by anisotropic etching utilizing a dry etching method.

Another embodiment of the present invention is a method for manufacturing a semiconductor device, including the steps of forming a first insulating film over a first conductor and a second conductor, forming a first oxide film over the first insulating film, forming an opening overlapping with at least part of the first conductor in the first oxide film and the first insulating film, forming a second oxide film over the first oxide film and the first conductor, processing the first insulating film, the first oxide film, and the second oxide film to form a first insulator, a first oxide, and a second oxide, forming a second insulating film, a first conductive film, and a third insulating film in this order over the second oxide, processing the second insulating film, the first conductive film, and the third insulating film to form a second insulator, a third insulator, a third conductor, a fourth conductor, a fourth insulator, and a fifth insulator, forming a fourth insulating film and a fifth insulating film in this order over the first insulator, the second oxide, the second insulator, the third insulator, the third conductor, the fourth conductor, the fourth insulator, and the fifth insulator, processing the fourth insulating film and the fifth insulating film to form a sixth insulator, a seventh insulator, an eighth insulator in contact with the sixth insulator, and a ninth insulator in contact with the seventh insulator, forming a sixth insulating film over the first insulator, the second oxide, the eighth insulator, and the ninth insulator, processing the sixth insulating film to form a tenth insulator in contact with a side surface of the eighth insulator and an eleventh insulator in contact with a side surface of the ninth insulator, forming a seventh insulating film over the first insulator, the second oxide, the fourth insulator, the fifth insulator, the tenth insulator, and the eleventh insulator, forming a second conductive film over the seventh insulating film, processing the seventh insulating film and the second conductive film to form a twelfth insulator in contact with at least one side surface of the second oxide in a channel length direction and a top surface of the second oxide, a thirteenth insulator in contact with at least the other side surface of the second oxide in the channel length direction and the top surface of the second oxide, and a fifth conductor over the twelfth insulator and a sixth conductor over the thirteenth insulator, forming a fourteenth insulator over the fifth conductor, the sixth conductor, the tenth insulator, and the eleventh insulator, forming an opening in the fourteenth insulator, and forming a seventh conductor in the opening.

In the above method for manufacturing a semiconductor device, the opening in the fourteenth insulator is formed to expose part of the tenth insulator, part of the eleventh insulator, the top surface of the second oxide, and at least part of the side surface of the second oxide.

In the above method for manufacturing a semiconductor device, the fourth insulating film and the fifth insulating film are processed by anisotropic etching utilizing a dry etching method.

In the above method for manufacturing a semiconductor device, the sixth insulating film is processed by anisotropic etching utilizing a dry etching method.

According to one embodiment of the present invention, a semiconductor device that can be miniaturized or highly integrated can be provided. Alternatively, according to one embodiment of the present invention, a semiconductor device having favorable electrical characteristics can be provided. Alternatively, according to one embodiment of the present invention, a semiconductor device with low off-state current can be provided. Alternatively, according to one embodiment of the present invention, a transistor with high on-state current can be provided. One embodiment of the present invention can provide a highly reliable semiconductor device. Alternatively, according to one embodiment of the present invention, a semiconductor device with low power consumption can be provided. Alternatively, according to one embodiment of the present invention, a semiconductor device that can be manufactured with high productivity can be provided.

A semiconductor device capable of retaining data for a long time can be provided. A semiconductor device capable of high-speed data writing can be provided. A semiconductor device with high design flexibility can be provided. A semiconductor device in which power consumption can be reduced can be provided. Alternatively, a novel semiconductor device can be provided.

Note that the description of these effects does not preclude the existence of other effects. One embodiment of the present invention does not have to have all the effects listed above. Other effects will be apparent from and can be derived from the description of the specification, the drawings, the claims, and the like.

BRIEF DESCRIPTION OF DRAWINGS

FIGS. 3A to 3C are a top view and cross sections of a semiconductor device according to one embodiment of the present invention.

FIGS. 12A to 12C are a top view and cross sections illustrating a method for manufacturing a semiconductor device according to one embodiment of the present invention.

FIGS. 17A to 17C are a top view and cross sections illustrating a method for manufacturing a semiconductor device according to one embodiment of the present invention.

FIGS. 26A to 26C are a circuit diagram and cross sections illustrating a structure of a memory device according to one embodiment of the present invention.

FIGS. 31A to 31D are a top view and cross sections of a semiconductor device according to one embodiment of the present invention.

FIGS. 35A to 35D are a top view and cross sections illustrating a method for manufacturing a semiconductor device according to one embodiment of the present invention.

FIGS. 36A to 36D are a top view and cross sections illustrating a method for manufacturing a semiconductor device according to one embodiment of the present invention.

FIGS. 37A to 37D are a top view and cross sections illustrating a method for manufacturing a semiconductor device according to one embodiment of the present invention.

FIGS. 38A to 38D are a top view and cross sections illustrating a method for manufacturing a semiconductor device according to one embodiment of the present invention.

FIGS. 40A to 40D are a top view and cross sections illustrating a method for manufacturing a semiconductor device according to one embodiment of the present invention.

FIGS. 42A to 42D are a top view and cross sections illustrating a method for manufacturing a semiconductor device according to one embodiment of the present invention.

FIGS. 47A to 47D are a top view and cross sections illustrating a method for manufacturing a semiconductor device according to one embodiment of the present invention.

FIGS. 53A and 53B are cross sections illustrating a structure of a memory device according to one embodiment of the present invention.

BEST MODE FOR CARRYING OUT THE INVENTION

Figure 1A:
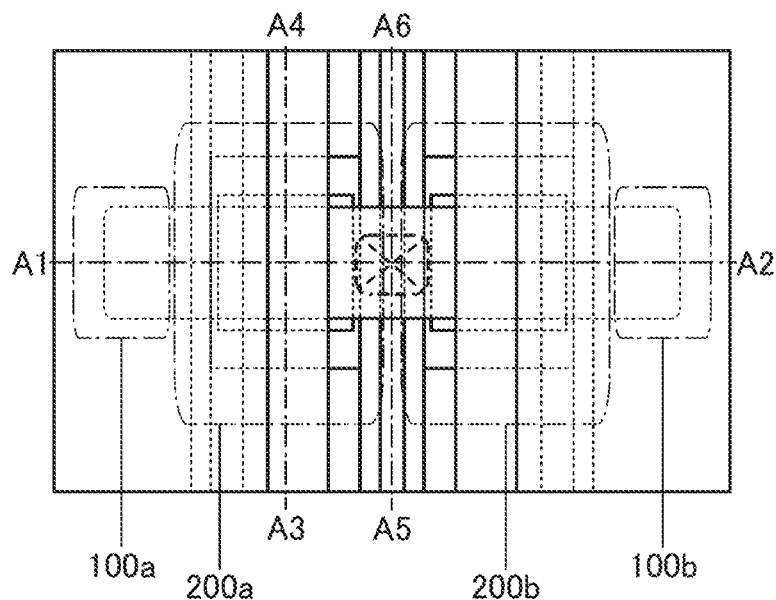
FIGS. 1A to 1C are a top view and cross sections of a semiconductor device according to one embodiment of the present invention.

Hereinafter, embodiments will be described with reference to drawings. Note that the embodiments can be implemented with various modes, and it will be readily appreciated by those skilled in the art that modes and details can be changed in various ways without departing from the spirit and scope of the present invention. Thus, the present invention should not be interpreted as being limited to the following description of the embodiments.

In the drawings, the size, the layer thickness, or the region is exaggerated for clarity in some cases. Therefore, the size, the layer thickness, or the region is not limited to the illustrated scale. Note that the drawings are schematic views showing ideal examples, and embodiments of the present invention are not limited to shapes or values shown in the drawings. For example, in the actual manufacturing process, a layer, a resist mask, or the like might be unintentionally reduced in size by treatment such as etching, which is not illustrated in some cases for easy understanding. In the drawings, the same portions or portions having similar functions are denoted by the same reference numerals in different drawings, and explanation thereof is not repeated in some cases. Furthermore, the same hatching pattern is applied to portions having similar functions, and the portions are not denoted by reference numerals in some cases.

Especially in a top view (also referred to as a "plan view"), a perspective view, or the like, some components might not be illustrated for easy understanding of the invention. In addition, some hidden lines and the like might not be shown.

Note that the ordinal numbers such as "first", "second", and the like in this specification and the like are used for convenience and do not denote the order of steps or the stacking order of layers. Therefore, for example, description can be made even when "first" is replaced with "second" or "third", as appropriate. In addition, the ordinal numbers in this specification and the like are not necessarily the same as those which specify one embodiment of the present invention.

In this specification, terms for describing arrangement, such as "over", "above", "under", and "below", are used for convenience in describing a positional relation between components with reference to drawings. Furthermore, the positional relationship between components is changed as appropriate in accordance with a direction in which each component is described. Thus, there is no limitation on terms used in this specification, and description can be made appropriately depending on the situation.

In this specification and the like, a transistor is an element having at least three terminals of a gate, a drain, and a source. The transistor includes a channel formation region between the drain (a drain terminal, a drain region, or a drain electrode) and the source (a source terminal, a source region, or a source electrode), and current can flow between the source and the drain through the channel formation region. Note that in this specification and the like, a channel formation region refers to a region through which current mainly flows.

Furthermore, functions of a source and a drain might be switched when a transistor of opposite polarity is employed or a direction of current flow is changed in circuit operation, for example. Therefore, in this specification and the like, the terms "source" and "drain" can be interchanged with each other in some cases.

Note that the channel length refers to, for example, the distance between a source (a source region or a source electrode) and a drain (a drain region or a drain electrode) in a region where a semiconductor (or a portion where a current flows in a semiconductor when a transistor is on) and a gate electrode overlap with each other or a region where a channel is formed in a plan view of the transistor. In one transistor, channel lengths in all regions are not necessarily the same. In other words, the channel length of one transistor is not fixed to one value in some cases. Therefore, in this specification, the channel length is any one of values, the maximum value, the minimum value, or the average value in a region where a channel is formed.

The channel width refers to, for example, the length of a channel formation region perpendicular to a channel length direction in a region where a semiconductor (or a portion where a current flows in a semiconductor when a transistor is on) and a gate electrode overlap with each other, or a region where a channel is formed in a top view of the transistor. In one transistor, channel widths in all regions are not necessarily the same. In other words, the channel width of one transistor is not fixed to one value in some cases. Therefore, in this specification, the channel width is any one of values, the maximum value, the minimum value, or the average value in a region where a channel is formed.

Note that depending on transistor structures, a channel width in a region where a channel is actually formed (hereinafter referred to as an "effective channel width") is different from a channel width shown in a top view of a transistor (hereinafter referred to as an "apparent channel width") in some cases. For example, in a transistor having a gate electrode covering a side surface of a semiconductor, an effective channel width is greater than an apparent channel width, and its influence cannot be ignored in some cases. For example, in a miniaturized transistor having a gate electrode covering a side surface of a semiconductor, the proportion of a channel region formed in a side surface of a semiconductor is increased. In that case, an effective channel width is greater than an apparent channel width.

In such a case, an effective channel width is difficult to measure in some cases. For example, to estimate an effective channel width from a design value, it is necessary to assume that the shape of a semiconductor is known as an assumption condition. Therefore, in the case where the shape of a semiconductor is not known accurately, it is difficult to measure an effective channel width accurately.

Therefore, in this specification, an apparent channel width is referred to as a surrounded channel width (SCW) in some cases. Furthermore, in this specification, in the case where the term "channel width" is simply used, it may represent a surrounded channel width or an apparent channel width. Alternatively, in this specification, in the case where the term "channel width" is simply used, it may represent an effective channel width in some cases. Note that a channel length, a channel width, an effective channel width, an apparent channel width, a surrounded channel width, and the like can be determined by analyzing a cross-sectional TEM image and the like.

Note that an impurity in a semiconductor refers to, for example, elements other than the main components of a semiconductor. For example, an element with a concentration lower than 0.1 atomic % can be regarded as an impurity. When an impurity is contained, the density of states (DOS) in a semiconductor may be increased, or the crystallinity may be decreased. In the case where the semiconductor is an oxide semiconductor, examples of an impurity which changes characteristics of the semiconductor include Group 1 elements, Group 2 elements, Group 13 elements, Group 14 elements, Group 15 elements, and transition metals other than the main components of the oxide semiconductor; there are hydrogen, lithium, sodium, silicon, boron, phosphorus, carbon, and nitrogen, for example. In the case of an oxide semiconductor, water also functions as an impurity in some cases. In the case of an oxide semiconductor, oxygen vacancies may be formed by entry of impurities. Furthermore, when the semiconductor is silicon, examples of an impurity which changes the characteristics of the semiconductor include oxygen, Group 1 elements except hydrogen, Group 2 elements, Group 13 elements, and Group 15 elements.

In this specification and the like, a "silicon oxynitride film" contains more oxygen than nitrogen. For example, the silicon oxynitride film preferably contains oxygen, nitrogen, silicon, and hydrogen in the concentration ranges of 55 atomic % or higher and 65 atomic % or lower, 1 atomic % or higher and 20 atomic % or lower, 25 atomic % or higher and 35 atomic % or lower, and 0.1 atomic % or higher and 10 atomic % or lower, respectively. A silicon nitride oxide film contains more nitrogen than oxygen. For example, the silicon nitride oxide film preferably contains nitrogen, oxygen, silicon, and hydrogen in the concentration ranges of 55 atomic % or higher and 65 atomic % or lower, 1 atomic % or higher and 20 atomic % or lower, 25 atomic % or higher and 35 atomic % or lower, and 0.1 atomic % or higher and 10 atomic % or lower, respectively.

In this specification and the like, the terms "film" and "layer" can be interchanged with each other depending on the case or circumstances. For example, the term "conductive layer" can be changed into the term "conductive film" in some cases. Also, the term "insulating film" can be changed into the term "insulating layer" in some cases.

In addition, in this embodiment and the like, the term "insulator" can be replaced with the term "insulating film" or "insulating layer". Moreover, the term "conductor" can be replaced with the term "conductive film" or "conductive layer". Furthermore, the term "semiconductor" can be replaced with the term "semiconductor film" or "semiconductor layer".

Furthermore, unless otherwise specified, transistors described in this specification and the like are field effect transistors. Unless otherwise specified, a transistor described in this specification and the like refers to an n-channel transistor. Thus, unless otherwise specified, the threshold voltage (also referred to as "$V_{th}$") is larger than 0 V.

In this specification and the like, the term "parallel" indicates that the angle formed between two straight lines is greater than or equal to −10° and less than or equal to 10°, and accordingly also includes the case where the angle is greater than or equal to −50 and less than or equal to 50. In addition, the term "substantially parallel" indicates that the angle formed between two straight lines is greater than or equal to −30° and less than or equal to 300. The term "perpendicular" indicates that the angle formed between two straight lines is greater than or equal to 800 and less than or equal to 1000. Thus, the case where the angle is greater than or equal to 85° and less than or equal to 950 is also included. In addition, the term "substantially perpendicular" indicates that the angle formed between two straight lines is greater than or equal to 600 and less than or equal to 1200.

In this specification, trigonal and rhombohedral crystal systems are included in a hexagonal crystal system.

Note that in this specification, a barrier film refers to a film having a function of inhibiting the passage of oxygen and impurities such as hydrogen. The barrier film that has conductivity may be referred to as a conductive barrier film.

In this specification and the like, a metal oxide means an oxide of metal in a broad sense. Metal oxides are classified into an oxide insulator, an oxide conductor (including a transparent oxide conductor), an oxide semiconductor (also simply referred to as an OS), and the like. For example, a metal oxide used in an active layer of a transistor is called an oxide semiconductor in some cases. In other words, an OS field effect transistor (FET) is a transistor including an oxide or an oxide semiconductor.

Embodiment 1

A semiconductor device of one embodiment of the present invention is a semiconductor device including an oxide in a channel formation region. The semiconductor device includes a first transistor, a second transistor, a first capacitor, a second capacitor, and a wiring.

The first transistor includes an oxide over a first insulator, a second insulator over the oxide, a first conductor over the second insulator, a third insulator over the first conductor, a fourth insulator in contact with the second insulator, the first conductor, and the third insulator, and a fifth insulator in contact with the fourth insulator. The second transistor includes the oxide over the first insulator, a sixth insulator over the oxide, a second conductor over the sixth insulator, a seventh insulator over the second conductor, an eighth insulator in contact with the sixth insulator, the second conductor, and the seventh insulator, and a ninth insulator in contact with the eighth insulator.

Furthermore, the first capacitor includes the oxide, a tenth insulator in contact with one side surface and part of the top surface of the oxide, and a third conductor in contact with the tenth insulator. The second capacitor includes the oxide, an eleventh insulator in contact with the other side surface and part of the top surface of the oxide, and a fourth conductor in contact with the eleventh insulator.

Furthermore, the oxide includes first regions overlapping with the second insulator and the sixth insulator, second regions overlapping with the fourth insulator and the eighth insulator, and a third region in contact with the second regions. The wiring is in contact with the fifth insulator and the ninth insulator and is electrically connected to the third region.

According to one embodiment of the present invention, when the connection of the plurality of transistors, the plurality of capacitors, and the wiring has the above-described structure, a semiconductor device that can be miniaturized or highly integrated can be provided.

Details are described with reference to drawings.
<Structure Example of Semiconductor Device>

An example of a semiconductor device of one embodiment of the present invention including a transistor 200a, a transistor 200b, a capacitor 100a, and a capacitor 100b is described below.

Figure 1C:
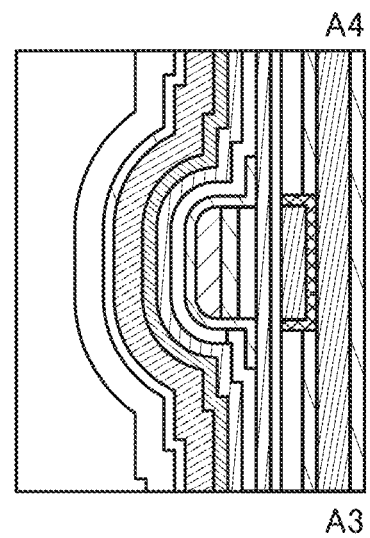
Figure 1B:
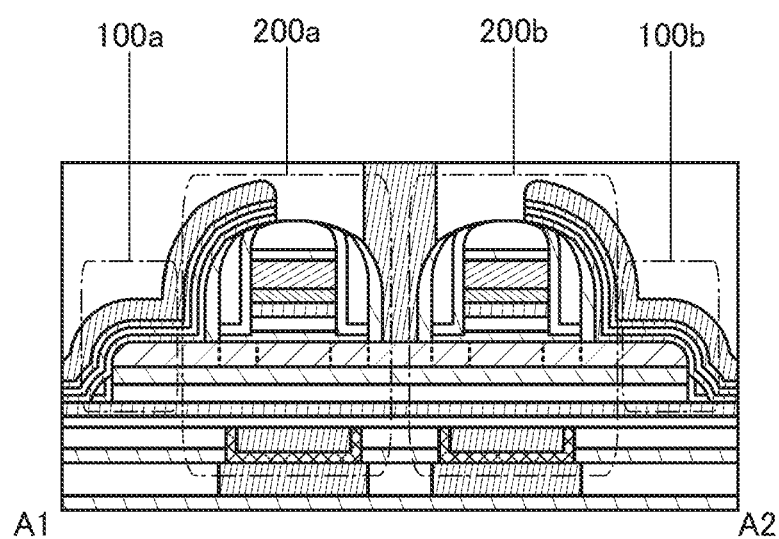
Figure 2A:
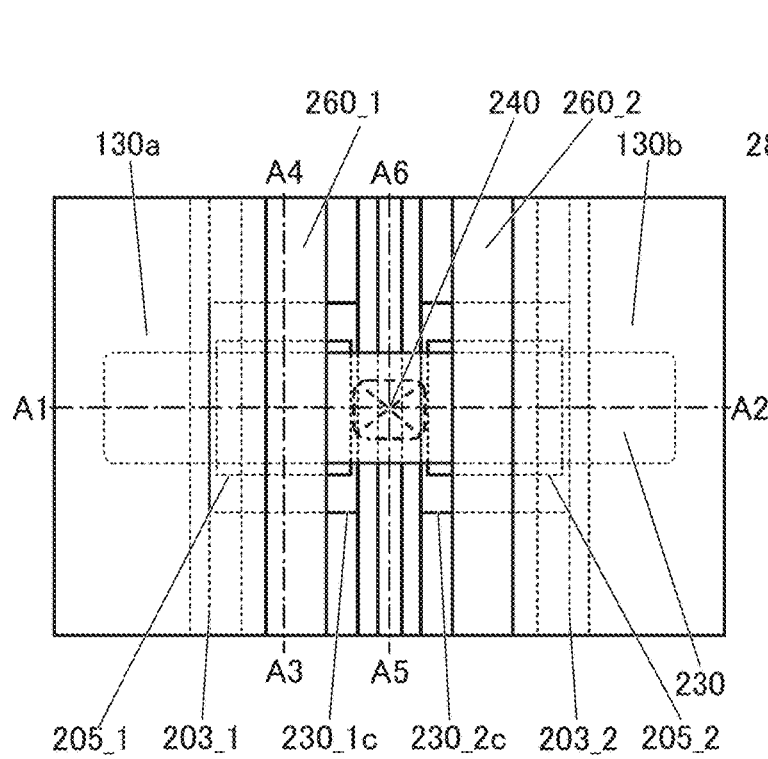
FIGS. 2A to 2C are a top view and cross sections of a semiconductor device according to one embodiment of the present invention.
Figure 2C:
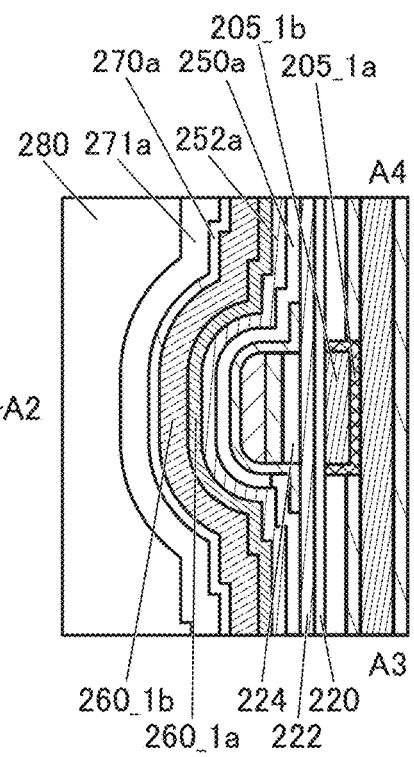
Figure 2B:
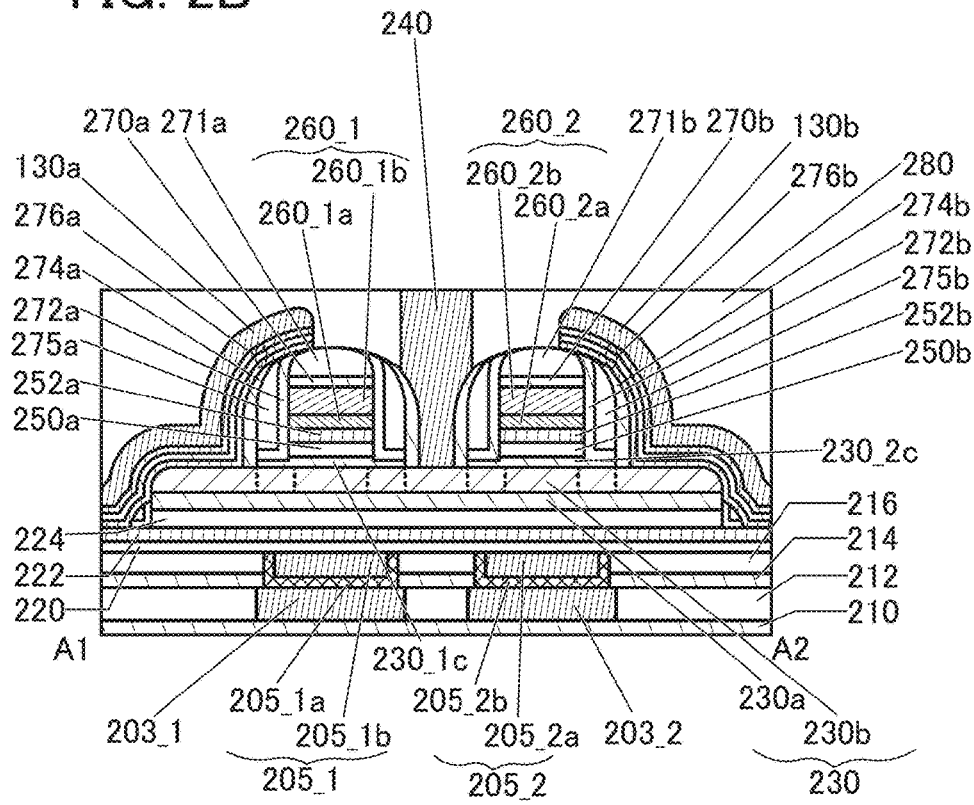

FIG. 1A is a top view of the semiconductor device including the transistor 200a, the transistor 200b, the capacitor 100a, and the capacitor 100b. Furthermore, FIG. 1B is a cross section taken along dashed-dotted line A1-A2 in FIG. 1A, which corresponds to a cross section in a channel length direction of the transistor 200a and the transistor 200b. FIG. 1C is a cross section taken along dashed-dotted line A3-A4 in FIG. 1A, which corresponds to a cross section in a channel width direction of the transistor 200a. For simplification of the drawing, some components are not illustrated in the top view in FIG. 1A. FIGS. 2A to 2C are drawings in which components in FIGS. 1A to 1C are denoted by reference numerals.

The semiconductor device of one embodiment of the present invention includes the transistor 200a, the transistor 200b, the capacitor 100a, and the capacitor 100b, and an insulator 210, an insulator 212, and an insulator 280 functioning as interlayer films as shown in FIGS. 2A to 2C. Furthermore, the semiconductor device includes a conductor 203_1 which is electrically connected to the transistor 200a and functions as a wiring, a conductor 203_2 which is electrically connected to the transistor 200b and functions as a wiring, and a conductor 240 which functions as a plug.

Note that the conductor 203_1 is formed so as to be embedded in the insulator 212. Here, the top surface of the conductor 203_1 can be substantially level with the top surface of the insulator 212. Note that the conductor 203_1 having a single layer is shown; however, the present invention is not limited thereto. For example, the conductor 203_1 may have a multilayer structure of two or more layers.

Furthermore, the conductor 203_2 is formed so as to be embedded in the insulator 212 in a manner similar to the conductor 203_1. Here, the top surface of the conductor 203_2 can be substantially level with the top surface of the insulator 212. Note that the conductor 203_2 having a single layer is shown; however, the present invention is not limited thereto. For example, the conductor 203_2 may have a multilayer structure of two or more layers.

[Transistor 200a and Transistor 200b]

As shown in FIGS. 2A to 2C, the transistor 200a includes an insulator 214 and an insulator 216 provided over a substrate (not illustrated), a conductor 205_1 embedded in the insulator 214 and the insulator 216, an insulator 220 provided over the conductor 205_1 and the insulator 216, an insulator 222 provided over the insulator 220, an insulator 224 provided over the insulator 222, an oxide 230 (an oxide 230a and an oxide 230b) provided over the insulator 224, an oxide 230_1c provided over the oxide 230, an insulator 250a provided over the oxide 230_1c, an insulator 252a provided over the insulator 250a, a conductor 260_1 (a conductor 260_1a and a conductor 260_1b) provided over the insulator 252a, an insulator 270a provided over the conductor 260_1, an insulator 271a provided over the insulator 270a, an insulator 272a provided in contact with at least the top surface of the oxide 230_1c, a side surface of the insulator 250a, a side surface of the insulator 252a, a side surface of the conductor 260_1, and a side surface of the insulator 270a, an insulator 275a provided in contact with at least the insulator 272a, and an insulator 274a provided in contact with at least the top surface of the oxide 230 and a side surface of the insulator 275a.

Furthermore, as shown in FIGS. 2A to 2C, the transistor 200b includes the insulator 214 and the insulator 216 provided over the substrate (not illustrated), a conductor 205_2 embedded in the insulator 214 and the insulator 216, the insulator 220 provided over the conductor 205_2 and the insulator 216, the insulator 222 provided over the insulator 220, the insulator 224 provided over the insulator 222, the oxide 230 (the oxide 230a and the oxide 230b) provided over the insulator 224, an oxide 230_2c provided over the oxide 230, an insulator 250b provided over the oxide 230_2c, an insulator 252b provided over the insulator 250b, a conductor 260_2 (a conductor 260_2a and a conductor 260_2b) provided over the insulator 252b, an insulator 270b provided over the conductor 260_2, an insulator 271b provided over the insulator 270b, an insulator 272b provided so as to be in contact with at least the top surface of the oxide 230_2c, a side surface of the insulator 250b, a side surface of the insulator 252b, a side surface of the conductor 2602, and a side surface of the insulator 270b, an insulator 275b provided in contact with at least the insulator 272b, and an insulator 274b provided in contact with at least the top surface of the oxide 230 and a side surface of the insulator 275b.

Note that in the transistor 200a and the transistor 200b, the oxide 230a and the oxide 230b are collectively referred to as the oxide 230 in some cases. Although the transistor 200a and the transistor 200b each have a structure in which the oxide 230a and the oxide 230b are stacked, the present invention is not limited to this structure. For example, a structure in which only the oxide 230b is provided may be employed. The conductor 260_1a and the conductor 260_1b are collectively referred to as the conductor 260_1 in some cases. Furthermore, the conductor 260_2a and the conductor 260_2b are collectively referred to as the conductor 260_2 in some cases. Note that although the transistor 200a has a structure in which the conductor 260_1a and the conductor 260_1b are stacked and the transistor 200b has a structure in which the conductor 260_2a and the conductor 260_2b are stacked, the present invention is not limited to this structure. For example, only the conductor 260_1b and the conductor 260_2b may be provided.

Note that as described above, the transistor 200a and the transistor 200b have similar structures. Thus, unless otherwise specified, the description for the transistor 200a can be referred to for the transistor 200b below. Therefore, the conductor 205_1, the oxide 2301c, the insulator 250a, the insulator 252a, the conductor 260_1, the insulator 270a, the insulator 271a, the insulator 272a, the insulator 275a, and the insulator 274a of the transistor 200a correspond to the conductor 205_2, the oxide 230_2c, the insulator 250b, the insulator 252b, the conductor 260_2, the insulator 270b, the insulator 271b, the insulator 272b, the insulator 275b, and the insulator 274b of the transistor 200b, respectively.

Figure 6:
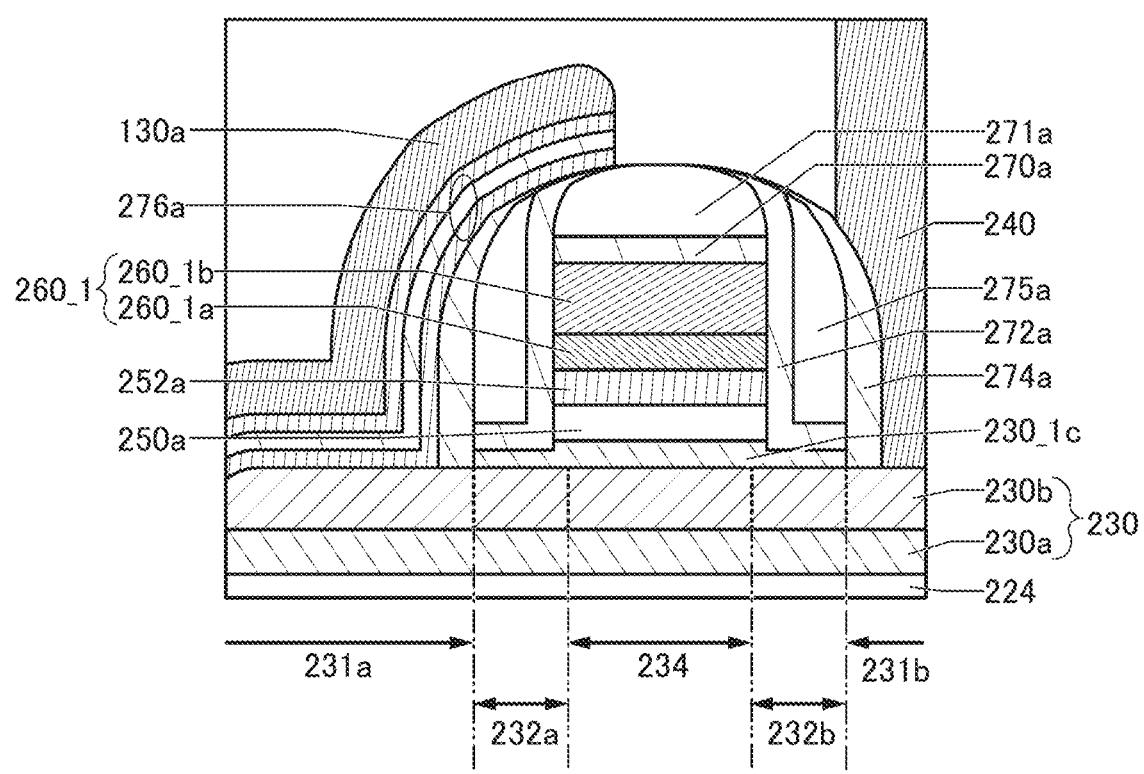
FIG. 6 is a cross section of a semiconductor device according to one embodiment of the present invention.

Here, an enlarged view of a region including a channel and a vicinity of the channel of the transistor 200a in FIG. 2B is shown in FIG. 6.

As illustrated in FIG. 6, the oxide 230 includes a region 234 functioning as a channel formation region of the transistor 200a, a region 231 (a region 231a or a region 231b) functioning as a source region or a drain region, and a junction region 232 (a junction region 232a or a junction region 232b) between the region 234 and the region 231.

Note that in this specification and the like, the region 234 is referred to as a first region in some cases. Furthermore, the junction region 232 is referred to as a second region in some cases. Furthermore, the region 231 is referred to as a third region in some cases.

The region 231 functioning as the source region or the drain region has a high carrier density and reduced resistance. The region 234 functioning as the channel formation region has a lower carrier density than the region 231 functioning as the source region or the drain region.

The junction region 232 has a lower carrier density than the region 231 functioning as the source region or the drain region and has a higher carrier density than the region 234 functioning as the channel formation region. That is, the junction region 232 functions as a junction region between the channel formation region and the source region or the drain region.

The junction region 232 prevents a high-resistance region from being formed between the region 231 functioning as the source region or the drain region and the region 234 functioning as the channel formation region, thereby increasing on-state current of the transistor.

The junction region 232 sometimes functions as an overlap region (also referred to as an Lov region) which overlaps with the conductor 260_1 that functions as a gate electrode.

Note that the region 231 is preferably in contact with the insulator 274a. The concentration of at least one of a metal element such as indium and impurity elements such as hydrogen and nitrogen in the region 231 is preferably higher than that in each of the junction region 232 and the region 234.

The junction region 232 includes a region overlapping with the insulator 272a. The concentration of at least one of a metal element such as indium and impurity elements such as hydrogen and nitrogen in the junction region 232 is preferably higher than that in the region 234. On the other hand, the concentration of at least one of a metal element such as indium and impurity elements such as hydrogen and nitrogen in the region 232 is preferably lower than that in the region 231.

The region 234 overlaps with the conductor 260_1. The region 234 is provided between the junction region 232a and the junction region 232b, and the concentration of at least one of a metal element such as indium and impurity elements such as hydrogen and nitrogen in the region 234 is preferably lower than that in each of the region 231, and the junction region 232.

In the oxide 230, a boundary between the region 231, the junction region 232, and the region 234 cannot be observed clearly in some cases. The concentration of a detected metal element such as indium and the concentration of a detected impurity element such as hydrogen and nitrogen may be gradually changed (also referred to as gradation) not only between the regions but also in each region. That is, the region closer to the region 234 preferably has a lower concentration of a metal element such as indium and impurity elements such as hydrogen and nitrogen. The concentration of impurity elements in the region 232 is lower than that in the region 231.

Furthermore, in FIG. 6, the region 234, the region 231, and the junction region 232 are formed in the oxide 230b; however, the present invention is not limited thereto. For example, these regions may be formed in the oxide 230a. Although the boundaries between the regions are indicated substantially perpendicularly to the top surface of the oxide 230 in FIG. 6, this embodiment is not limited thereto.

Note that in the transistor 200a, the oxide 230 is preferably formed using a metal oxide functioning as an oxide semiconductor (hereinafter, the metal oxide is also referred to as an oxide semiconductor). A transistor formed using an oxide semiconductor has an extremely low leakage current (off-state current) in an off state; thus, a semiconductor device with low power consumption can be provided. An oxide semiconductor can be formed by a sputtering method or the like and thus can be used in a transistor included in a highly integrated semiconductor device.

However, the transistor formed using an oxide semiconductor is likely to have its electrical characteristics changed by impurities and oxygen vacancies in the oxide semiconductor; as a result, the reliability is reduced, in some cases. Hydrogen contained in an oxide semiconductor reacts with oxygen bonded to a metal atom to be water, and thus causes oxygen vacancies, in some cases. Entry of hydrogen into the oxygen vacancies generates electrons functioning as carriers in some cases. Accordingly, a transistor including an oxide semiconductor containing oxygen vacancies in a channel formation region is likely to have normally-on characteristics. Thus, it is preferable that oxygen vacancies in the channel formation region be reduced as much as possible.

When oxygen vacancies exist at an interface between the oxide 230_1c and the insulator 250a functioning as a gate insulating film, a variation in the electrical characteristics is likely to occur or the reliability is reduced in some cases.

In view of the above, the insulator 250a which overlaps with the region 234 of the oxide 230 preferably contains oxygen at a higher proportion than oxygen in the stoichiometric composition (also referred to as "excess oxygen"). That is, excess oxygen contained in the insulator 250a is diffused into the region 234, whereby oxygen vacancies in the region 234 can be reduced.

The insulator 272a is preferably provided in contact with the surface side of the insulator 250a. For example, the insulator 272a is preferably formed using an insulating material having a function of suppressing diffusion of oxygen (e.g., at least one of oxygen atoms or oxygen molecules), that is, an insulating material through which the above oxygen is less likely to pass. When the insulator 272a has a function of suppressing diffusion of oxygen, oxygen of the insulator 250a is not diffused to the insulator 274a side and thus is supplied to the region 234 efficiently. Furthermore, the insulator 272a is preferably an insulator in which impurities such as water or hydrogen are reduced. Furthermore, the insulator 272a is preferably an insulator which has a barrier property to prevent entry of impurities such as water or hydrogen. Such a function can prevent impurities such as water or hydrogen from entering the region 234. In this manner, formation of oxygen vacancies at an interface between the oxide 230_1c and the insulator 250a can be suppressed, leading to an improvement in the reliability of the transistor 200a.

Furthermore, the transistor 200a is preferably covered with an insulator which has a barrier property and prevents entry of impurities such as water and hydrogen. The insulator having a barrier property is formed using an insulating material having a function of suppressing diffusion of impurities such as a hydrogen atom, a hydrogen molecule, a water molecule, a nitrogen atom, a nitrogen molecule, a nitrogen oxide molecule (e.g., $N_2O$, NO, and $NO_2$), and a copper atom, that is, an insulating material having a barrier property through which the above impurities are less likely to pass. Alternatively, the insulator is preferably formed using an insulating material having a function of suppressing diffusion of oxygen (e.g., at least one of oxygen atoms or oxygen molecules), that is, an insulating material through which the above oxygen is less likely to pass.

The structure of a semiconductor device including the transistor 200a and the transistor 200b of one embodiment of the present invention is described in detail below. Note that also in the following description, the description of the transistor 200a can be referred to for the structure of the transistor 200b.

The conductor 205_1 functioning as a second gate electrode of the transistor 200a is provided to overlap with the oxide 230 and the conductor 260_1.

The conductor 205_1 is preferably provided so that the length in the channel width direction is larger than that of the region 234 in the oxide 230. That is, it is preferable that the conductor 205_1 and the conductor 260_1 overlap with each other with the insulator therebetween in a region on an outer side of a side surface of the oxide 230 in the channel width direction.

Here, the conductor 260_1 functions as a first gate electrode of the transistor 200a in some cases. Furthermore, the conductor 205_1 functions as the second gate electrode of the transistor 200a in some cases. A potential applied to the conductor 205_1 can be the same as a potential applied to the conductor 260_1, or can be a ground potential or a given potential. Furthermore, by changing a potential applied to the conductor 205_1 independently of a potential applied to the conductor 260_1, the threshold voltage of the transistor 200a can be controlled. In particular, by applying a negative potential to the conductor 205_1, the threshold voltage of the transistor 200a can be higher than 0 V, and the off-state current can be reduced. Accordingly, a drain current when a voltage applied to the conductor 260_1 is 0 V can be reduced.

As illustrated in FIG. 2A, the conductor 205_1 is provided to overlap with the oxide 230 and the conductor 260_1. The conductor 205_1 is preferably provided to overlap with the conductor 260_1 even in the region on an outer side of the side surface of the oxide 230 that intersect with the channel width direction (W length direction). That is, the conductor 205_1 and the conductor 260_1 preferably overlap with each other with the insulator therebetween on an outer side of the side surface of the oxide 230 in the channel width direction.

With the above structure, in the case where potentials are applied to the conductor 260_1 and the conductor 205_1, an electric field generated from the conductor 260_1 and an electric field generated from the conductor 205_1 are connected, so that a closed circuit which covers the channel formation region in the oxide 230 can be formed.

That is, the channel formation region in the region 234 can be electrically surrounded by the electric field of the conductor 260_1 functioning as the first gate electrode and the electric field of the conductor 205_1 functioning as the second gate electrode. In this specification, such a transistor structure in which the channel formation region is electrically surrounded by the electric fields of the first gate electrode and the second gate electrode is referred to as a surrounded channel (s-channel) structure.

The conductor 260_1 is positioned to extend in the channel width direction. The conductor 260_1 can function as a top gate, and the conductor 205_1 can function as a back gate. The potential of the back gate can be the same as the potential of the top gate, the ground potential, or a given potential. By changing the potential of the back gate independently of the potential of the top gate, the threshold voltage of the transistor can be changed.

The conductor 203_1 extends in the channel width direction in a manner similar to that of the conductor 260_1, and functions as a wiring through which a potential is applied to the conductor 205_1, i.e., the back gate. When the conductor 205_1 is stacked over the conductor 203_1 functioning as the wiring for the back gate so as to be embedded in the insulators 214 and 216, the insulators 214 and 216 and the like are positioned between the conductor 203_1 and the conductor 260_1, reducing the parasitic capacitance between the conductor 203_1 and the conductor 260_1 and thereby increasing the withstand voltage. The reduction in the parasitic capacitance between the conductor 203_1 and the conductor 260_1 can improve the switching speed of the transistor, so that the transistor can have high frequency characteristics. The increase in the withstand voltage between the conductor 203_1 and the conductor 260_1 can improve the reliability of the transistor 200a. Therefore, the thicknesses of the insulator 214 and the insulator 216 are preferably large. Note that the extending direction of the conductor 203_1 is not limited to this example; for example, the conductor 203_1 may extend in the channel length direction of the transistor 200a.

In the conductor 205_1, the conductor 205_1a is formed in contact with an inner wall of an opening of the insulators 214 and 216 and the conductor 205_1b is formed more on the inside than the conductor 205_1a. Here, the top surface of the conductor 205_1b can be substantially level with the top surface of the insulator 216. Here, the top surface of the conductor 205_2b can be substantially level with the top surface of the insulator 216. Although the conductor 205_1a and the conductor 205_1b are stacked in the transistor 200a, the structure of the present invention is not limited to this structure. For example, only one of the conductor 205_1a and the conductor 205_1b may be provided.

Here, it is preferable to use a conductive material that has a function of inhibiting the passage of impurities such as water and hydrogen (that is relatively impermeable to such impurities) for the conductor 205_1a. For example, tantalum, tantalum nitride, ruthenium, ruthenium oxide, or the like is preferably used, and a single layer or stacked layers may be used. Accordingly, diffusion of impurities such as hydrogen and water from a layer under the insulator 214 into an upper layer through the conductors 205_1 and 205_2 can be inhibited. Note that it is preferable that the conductor 205_1a has a function of inhibiting the passage of at least either of impurities such as a hydrogen atom, a hydrogen molecule, a water molecule, a nitrogen atom, a nitrogen molecule, a nitrogen oxide molecule (e.g., $N_2O$, NO, or $NO_2$), or a copper atom, or an oxygen atom, an oxygen molecule, or the like. In the case where a conductive material having a function of inhibiting the passage of impurities is described below, the conductive material preferably has a function similar to that described above. When the conductor 205_1a has a function of inhibiting the passage of oxygen, the conductivity of the conductor 205_1b can be prevented from being lowered because of oxidation.

The conductor 205_1b is preferably formed using a conductive material including tungsten, copper, or aluminum as its main component. Although not shown, the conductor 205_1b may have a layered structure, and for example, stacked layers of titanium, titanium nitride, and the above-described conductive material may be formed.

The insulator 214 and the insulator 222 can function as barrier insulating films that prevent impurities such as water or hydrogen from entering the transistor from a lower layer. The insulator 214 and the insulator 222 are each preferably formed using an insulating material having a function of inhibiting the passage of impurities such as water or hydrogen. For example, it is preferable that silicon nitride or the like be used for the insulator 214 and aluminum oxide, hafnium oxide, an oxide containing silicon and hafnium (hafnium silicate), an oxide containing aluminum and hafnium (hafnium aluminate), or the like be used for the insulator 222. This can suppress diffusion of impurities such as hydrogen and water to a layer positioned above the insulator 214 and the insulator 222. Note that it is preferable that the insulator 214 and the insulator 222 have a function of inhibiting the passage of at least one of impurities such as a hydrogen atom, a hydrogen molecule, a water molecule, a nitrogen atom, a nitrogen molecule, a nitrogen oxide molecule (e.g., $N_2O$, NO, and $NO_2$), and a copper atom.

Furthermore, each of the insulator 214 and the insulator 222 is preferably formed using an insulating material that is capable of inhibiting the passage of oxygen (e.g., an oxygen atom or an oxygen molecule). With this material, oxygen contained in the insulator 224 or the like can be inhibited from diffusing into lower layers.

Furthermore, the concentration of impurities such as water, hydrogen, or nitrogen oxide in the insulator 222 is preferably lowered. The amount of hydrogen released from the insulator 222, which is converted into hydrogen molecules per unit area of the insulator 222, is less than or equal to $2\times10^{15}$ molecules/$cm^2$, preferably less than or equal to $1\times10^{15}$ molecules/$cm^2$, further preferably less than or equal to $5\times10^{14}$ molecules/$cm^2$ in thermal desorption spectroscopy (TDS) in surface temperature range of 50° C. to 500° C., for example. The insulator 222 is preferably formed using an insulator from which oxygen is released by heating.

The insulator 250a can function as a first gate insulating film of the transistor 200a. The insulators 220, 222, and 224 can function as second gate insulating films of the transistor 200a. Although the insulator 220, the insulator 222, and the insulator 224 are stacked in the transistor 200a, the present invention is not limited to this structure. For example, any two of the insulators 220, 222, and 224 may be stacked, or any one of the insulators may be used.

The oxide 230 is preferably formed using a metal oxide functioning as an oxide semiconductor. The metal oxide preferably has an energy gap of 2 eV or more, preferably 2.5 eV or more. With the use of a metal oxide having such a wide energy gap, the off-state current of the transistor can be reduced.

A transistor formed using an oxide semiconductor has an extremely low leakage current in an off state; thus, a semiconductor device with low power consumption can be provided. An oxide semiconductor can be formed by a sputtering method or the like and thus can be used in a transistor included in a highly integrated semiconductor device.

An oxide semiconductor preferably contains at least indium or zinc. In particular, indium and zinc are preferably contained. In addition, aluminum, gallium, yttrium, tin, or the like is preferably contained. Furthermore, one or more elements selected from boron, silicon, titanium, iron, nickel, germanium, zirconium, molybdenum, lanthanum, cerium, neodymium, hafnium, tantalum, tungsten, magnesium, or the like may be contained.

Here, the case where the oxide semiconductor is an In-M-Zn oxide that contains indium, an element M, and zinc is considered. The element M is aluminum, gallium, yttrium, tin, or the like. Other elements that can be used as the element M include boron, silicon, titanium, iron, nickel, germanium, zirconium, molybdenum, lanthanum, cerium, neodymium, hafnium, tantalum, tungsten, and magnesium. Note that two or more of the above elements may be used in combination as the element M.

Note that in this specification and the like, a metal oxide including nitrogen is also called a metal oxide in some cases. Moreover, a metal oxide including nitrogen may be called a metal oxynitride.

Here, the atomic ratio of the element M to constituent elements in a metal oxide used as the oxide 230a is preferably greater than that in a metal oxide used as the oxide 230b. Moreover, the atomic ratio of the element M to In in the metal oxide used as the oxide 230a is preferably greater than that in the metal oxide used as the oxide 230b. Moreover, the atomic ratio of the element In to M in the metal oxide used as the oxide 230b is preferably greater than that in the metal oxide used as the oxide 230a.

When using the above metal oxide as the oxide 230a, it is preferable that the conduction band minimum of the oxide 230a be higher than the conduction band minimum of the oxide 230b. In other words, the electron affinity of the oxide 230a is preferably smaller than the electron affinity of the oxide 230b.

Here, the conduction band minimum is gradually varied in the oxides 230a and 230b. In other words, the energy level of the conduction band minimum is continuously varied or continuously connected. To vary the conduction band minimum gradually, the density of defect states in a mixed layer formed at the interface between the oxides 230a and 230b is decreased.

Specifically, when the oxides 230a and 230b contain the same element (as a main component) in addition to oxygen, a mixed layer with a low density of defect states can be formed. For example, in the case where the oxide 230b is an In—Ga—Zn oxide, it is preferable to use an In—Ga—Zn oxide, a Ga—Zn oxide, gallium oxide, or the like for the oxide 230a.

At this time, a narrow-gap portion formed in the oxide 230b functions as a main carrier path. Since the density of defect states at the interface between the oxides 230a and 230b can be decreased, the influence of interface scattering on carrier conduction is small, and a high on-state current can be obtained.

Figure 19:
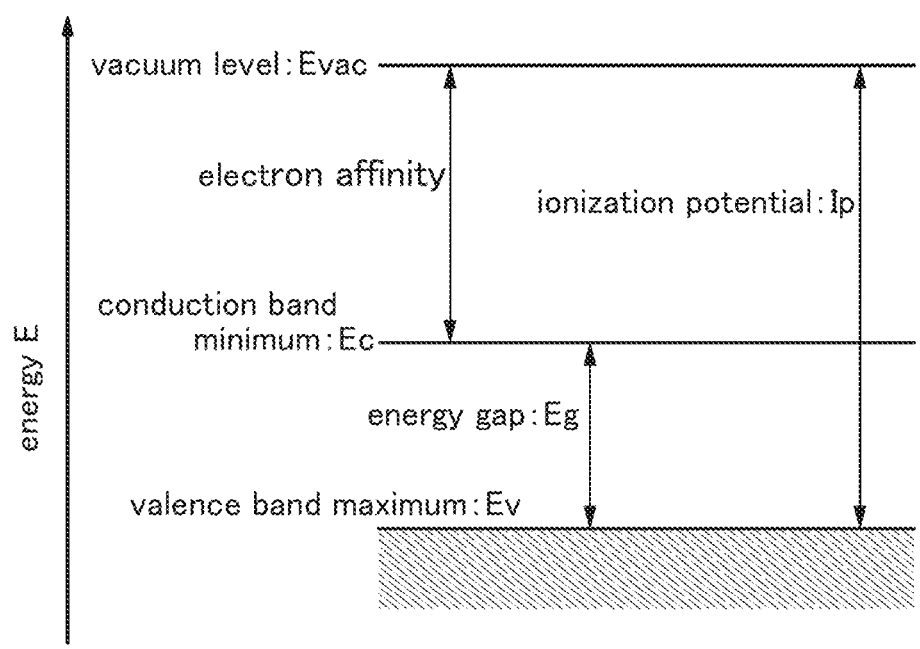
FIG. 19 shows an energy band structure of an oxide semiconductor.

The electron affinity or the energy level Ec of the conduction band minimum can be obtained from an energy gap Eg and an ionization potential Ip, which is a difference between the vacuum level Evac and the energy level Ev of the valence band maximum, as shown in FIG. 19. The ionization potential Ip can be measured using, for example, an ultraviolet photoelectron spectroscopy (UPS) apparatus. The energy gap Eg can be measured using, for example, a spectroscopic ellipsometer.

Figures 3A, 3B, 3C:
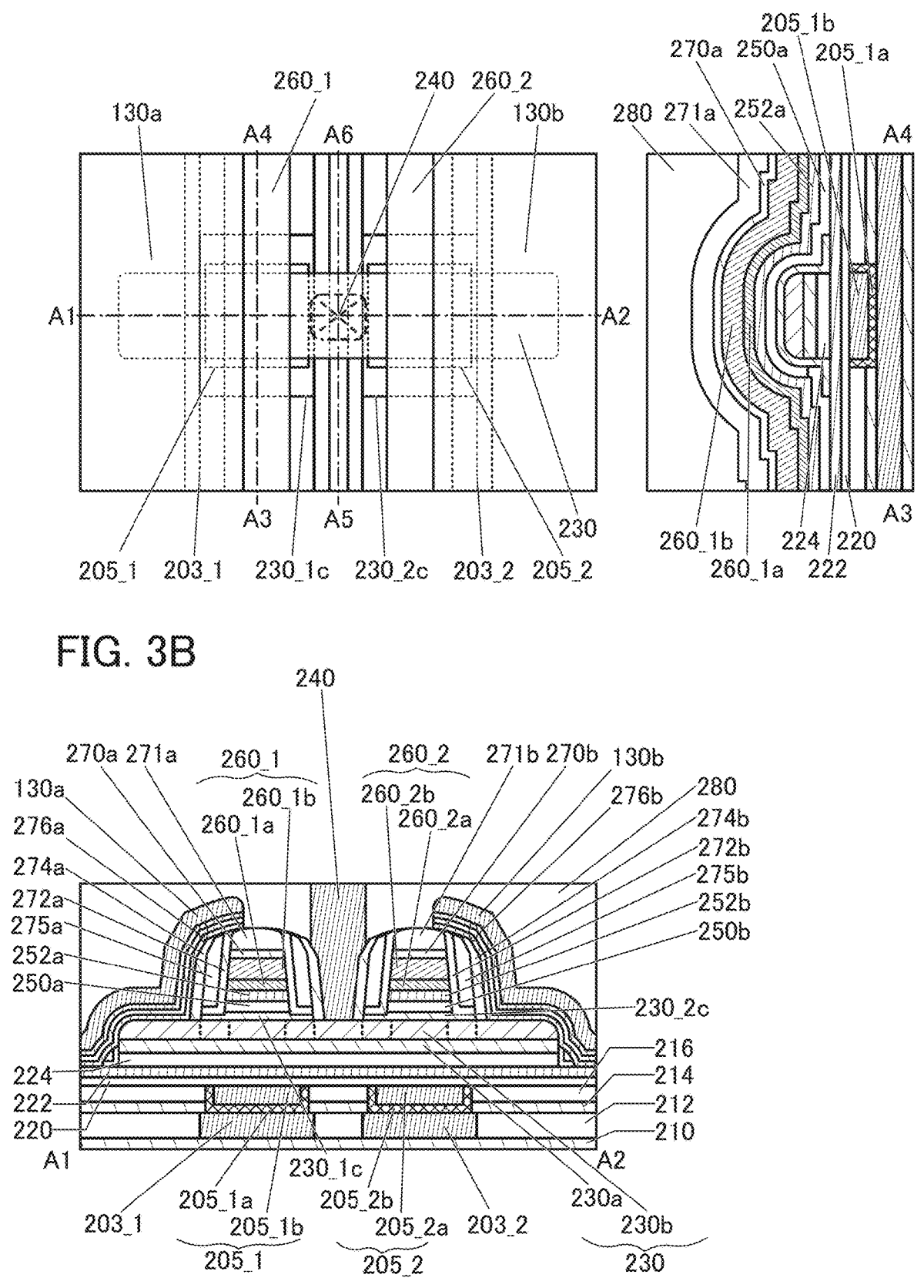

Furthermore, as shown in FIG. 2B, a side surface of a structure body including the insulator 250a, the insulator 252a, the conductor 260_1, the insulator 270a, and the insulator 271a is preferably substantially perpendicular to the top surface of the insulator 222. Note that the semiconductor device described in this embodiment is not limited thereto. For example, as shown in FIGS. 3A to 3C, an angle formed by the side surface of the structure body including the insulator 250a, the insulator 252a, the conductor 260_1, the insulator 270a, and the insulator 271a and the top surface of the insulator 222 may be an acute angle. In that case, the angle formed by the side surface of the structure body and the top surface of the insulator 222 is preferably as large as possible.

The insulator 272a is provided to be in contact with at least the side surfaces of the oxide 2301c, the insulator 250a, the insulator 252a, the conductor 260_1, and the insulator 270a. Furthermore, the insulator 275a is provided to be in contact with the insulator 272a. An insulator to be the insulator 272a is preferably formed using an ALD method. By using an ALD method, an insulator having excellent coverage and few defects such as pinholes can be formed. Therefore, the film thickness of the insulator 272a can be approximately more than or equal to 0.5 nm and less than or equal to 10 nm, preferably more than or equal to 0.5 nm and less than or equal to 3 nm. Note that a precursor used in an ALD method sometimes contains impurities such as carbon. Thus, the insulator 272a may contain impurities such as carbon. In the case where an insulator to be the insulator 252a is formed by a sputtering method and the insulator to be the insulator 272a is formed by an ALD method, for example, even when aluminum oxide is formed as the insulator to be the insulator 272a and the insulator to be the insulator 252a, the insulator 272a may contain more impurities such as carbon than the insulator 252a. Note that impurities can be quantified by X-ray photoelectron spectroscopy (XPS).

Furthermore, the insulator to be the insulator 272a may be formed by a sputtering method. By using a sputtering method, an insulator having less impurities such as water or hydrogen can be formed. In the case of using a sputtering method, a facing-target sputtering apparatus is preferably used, for example. With the use of the facing-target sputtering apparatus, deposition can be performed without exposing a deposition surface to a high electric field region between facing targets; thus, the film-formation surface is less likely to be damaged due to plasma. Since deposition damage on the oxide 230 due to plasma during the deposition of the insulator to be the insulator 272a can be small, the sputtering apparatus is preferably used. Deposition using the facing-target sputtering apparatus can also be referred to as vapor deposition SP (VDSP, registered trademark).

The region 231 and the junction region 232 of the oxide 230 are formed by impurity elements that are added when the insulator to be the insulator 274a is formed. Thus, the insulator to be the insulator 274a preferably contains at least one of hydrogen and nitrogen. Moreover, the insulator to be the insulator 274a is preferably formed using an insulating material having a function of inhibiting the passage of impurities such as water or hydrogen and oxygen. For example, the insulator to be the insulator 274a is preferably formed using silicon nitride, silicon nitride oxide, silicon oxynitride, aluminum nitride, or aluminum nitride oxide.

Instead of or in addition to the above-described method, an ion implantation method, an ion doping method by which an ionized source gas is added without mass separation, a plasma immersion ion implantation method, or the like can be used to form the region 231 and the junction region 232 of the oxide 230. The method is preferably performed after the insulator to be the insulator 272a is formed. When the method is performed through the insulator to be the insulator 272a, the damage to the oxide 230 during the implantation can be reduced.

In the case where mass separation is performed by an ion doping method, a plasma immersion ion implantation method, or the like, ion species to be added and its concentration can be controlled properly. On the other hand, in the case of not performing mass separation, ions at a high concentration can be added in a short time. Alternatively, an ion doping method in which atomic or molecular clusters are generated and ionized may be employed. Instead of the term "dopant", the term "ion", "donor", "acceptor", "impurity", "element", or the like may be used.

As the dopant, the element that forms oxygen vacancies, the element bonded to oxygen vacancies, or the like is used. Typical examples of the element are hydrogen, boron, carbon, nitrogen, fluorine, phosphorus, sulfur, chlorine, titanium, and a rare gas element. Typical examples of the rare gas element are helium, neon, argon, krypton, and xenon.

In the case where the transistor is miniaturized to have a channel length of approximately 10 nm to 30 nm, the impurity element contained in the source region or the drain region might be diffused to bring electrical connection between the source region and the drain region. In this embodiment, however, a sufficient width of the region 234 of the oxide 230 can be obtained by providing the insulator 272a and the insulator 275a; thus, the source region and the drain region can be prevented from being electrically connected to each other.

Here, the insulator 270a and the insulator 272a are preferably formed using an insulating material that has a function of inhibiting the passage of oxygen and impurities such as water and hydrogen. For example, an insulator including an oxide containing one of or both aluminum and hafnium can be used. Aluminum oxide, hafnium oxide, an oxide containing aluminum and hafnium (hafnium aluminate), or the like may be used for the insulator including an oxide containing one of or both aluminum and hafnium. In this manner, oxygen in the insulator 250a can be prevented from diffusing outward. In addition, impurities such as hydrogen and water can be prevented from entering the oxide 230 through the end portion of the insulator 250a or the like.

By provision of the insulator 270a and the insulator 272a, the top surface and the side surface of the conductor 260_1 and the side surface of the insulator 250a can be covered with an insulator having a function of inhibiting the passage of oxygen and impurities such as water and hydrogen. This can prevent oxidization of the conductor 260_1 and entry of impurities such as water and hydrogen into the oxide 230 through the conductor 260_1 and the insulator 250a. Thus, the insulator 270a and the insulator 272a function as a barrier for protecting the gate electrode and the gate insulating film.

The insulator 275a is formed by forming the insulator to be the insulator 275a and then performing anisotropic etching. By the etching, the insulator 275a is formed so as to be in contact with the insulator 272a.

The insulator 274a is formed by forming the insulator to be the insulator 274a and then performing anisotropic etching. The insulator 274a is formed so as to have a portion in contact with the top surface of the oxide 230 and the side surface of the insulator 275a by the etching.

Furthermore, the insulator 280 is preferably provided so as to cover the transistor 200a and the transistor 200b in the semiconductor device. The concentration of impurities such as water or hydrogen in the insulator 280 is preferably lowered.

An opening is formed in the insulator 280 so that an inner wall of the opening in the insulator 280 is in contact with side surfaces of the insulator 274a and the insulator 274b. In order to form such an opening, it is preferable that the etching rate of the insulator 280 be extremely lower than that of the insulator 274a and the insulator 274b at the time of forming the opening in the insulator 280. When the etching rate of the insulator 274a and the insulator 274b are set to 1, the etching rate of the insulator 280 is preferably set to 5 or more, further preferably 10 or more. In such a manner, the opening can be formed in a self-aligned manner and the space between the opening and the gate electrode can be designed smaller, so that the semiconductor device can be highly integrated.

After the opening is formed, a low-resistance region may be formed in the oxide 230 by an ion implantation method, an ion doping method by which an ionized source gas is added without mass separation, a plasma immersion ion plantation method, or the like.

Here, the conductor 240 is formed in contact with the inner wall of the opening in the insulator 280. The region 231 of the oxide 230 is positioned on at least part of a bottom portion of the opening, and thus the conductor 240 is in contact with the region 231.

The conductor 240 functions as one of a source electrode and a drain electrode of the transistor 200a and one of a source electrode and a drain electrode of the transistor 200b. With such a structure, the space between the transistor 200a and the transistor 200b that are adjacent to each other can be reduced, which leads to arrangement of transistors with high density and high integration of the semiconductor device.

Figure 4A:
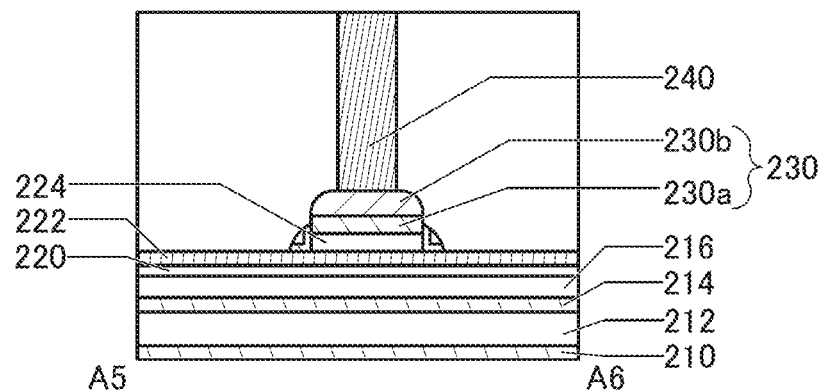
FIGS. 4A to 4C are each a cross section of a semiconductor device according to one embodiment of the present invention.
Figure 4B:
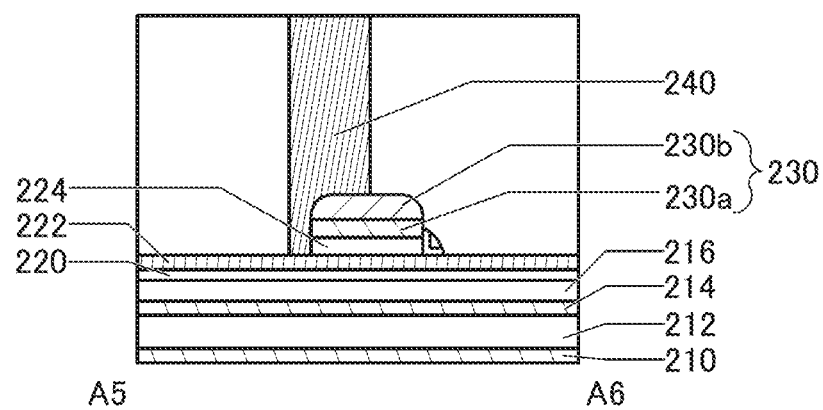
Figure 4C:
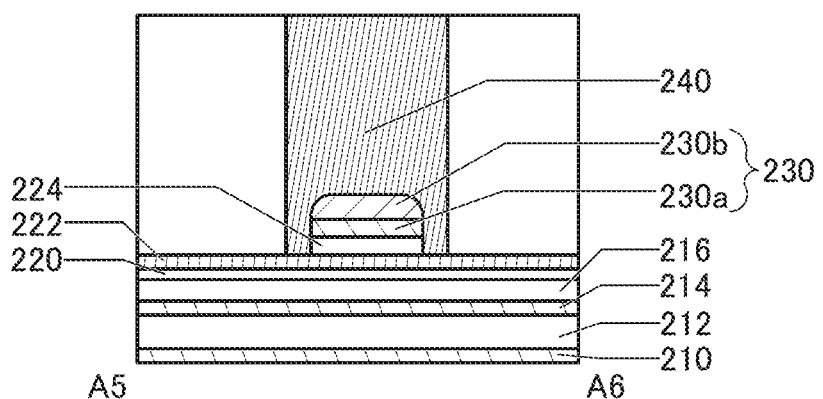

FIGS. 4A to 4C are each a cross section of a portion taken along dashed-dotted line A5-A6 in FIG. 2A and a region in the channel width direction of the transistor 200a and the transistor 200b where the conductor 240 is in contact with the oxide 230.

FIG. 4A illustrates an example in which a region where the conductor 240 is in contact with the oxide 230 is on the top surface of the oxide 230 and is smaller than the width of the oxide 230 in the channel width direction. The region where the conductor 240 is in contact with the oxide 230 is not limited to the example of FIG. 4A. For example, as shown in FIG. 4B, a region in contact with the top surface and the side surface of the oxide 230 may be included. Although FIG. 4B illustrates, as an example, a region where the conductor 240 and a side surface of the oxide 230 on the A5 side are in contact with each other, a region where the conductor 240 and a side surface of the oxide 230 on the A6 side are in contact with each other may be included. With such a structure, the area of the region where the conductor 240 is in contact with the oxide 230 can be increased in some cases; since the contact resistance between the conductor 240 and the oxide 230 can be reduced, such a structure is preferably used. Alternatively, for example, the region where the conductor 240 is in contact with the oxide 230 may be a region where the top surface of the oxide 230 and side surfaces of the oxide 230 on the A5 side and the A6 side are in contact with each other as shown in FIG. 4C. In other words, the region where the conductor 240 is in contact with the oxide 230 may have a cross-sectional shape like a saddle (such a structure can be referred to as a saddle-surface contact). With such a structure, the area of the region where the conductor 240 is in contact with the oxide 230 can be increased; since the contact resistance between the conductor 240 and the oxide 230 can be reduced, such a structure is further preferably used.

A parasitic capacitance is formed between the conductor 260_1 and the conductor 240 in the transistor 200a as shown in FIG. 2B. In a similar manner, a parasitic capacitance is formed between the conductor 260_2 and the conductor 240 in the transistor 200b.

The insulator 275a is provided in the transistor 200a and the insulator 275b is provided in the transistor 200b; thus, the parasitic capacitance of the transistor 200a and the parasitic capacitance of the transistor 200b can be reduced. For example, silicon oxide, silicon oxynitride, silicon nitride oxide, or silicon nitride can be used for the insulator 275a and the insulator 275b. When the parasitic capacitance is reduced, high-speed operation of the transistor 200a and the transistor 200b can be achieved.

The conductor 240 can be formed using a material similar to that for the conductor 205_1. Furthermore, the conductor 240 may be formed after aluminum oxide is formed on a side wall portion of the opening. By forming aluminum oxide on the side wall portion of the opening, the passage of oxygen from the outside can be inhibited and oxidation of the conductor 240 can be prevented. Furthermore, impurities such as water or hydrogen can be prevented from being diffused from the conductor 240 to the outside. The aluminum oxide can be formed by forming aluminum oxide in the opening by an ALD method or the like and then performing anisotropic etching.

[Capacitor 100a and Capacitor 100b]

Figure 5A:
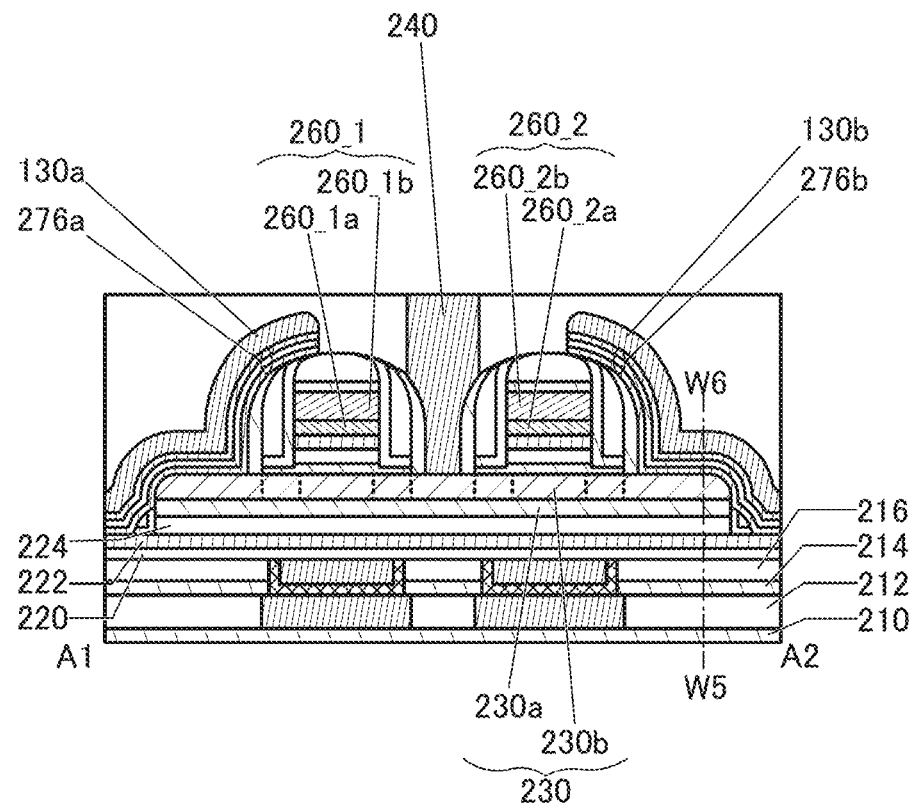
FIGS. 5A and 5B are cross sections of a semiconductor device according to one embodiment of the present invention.
Figure 5B:
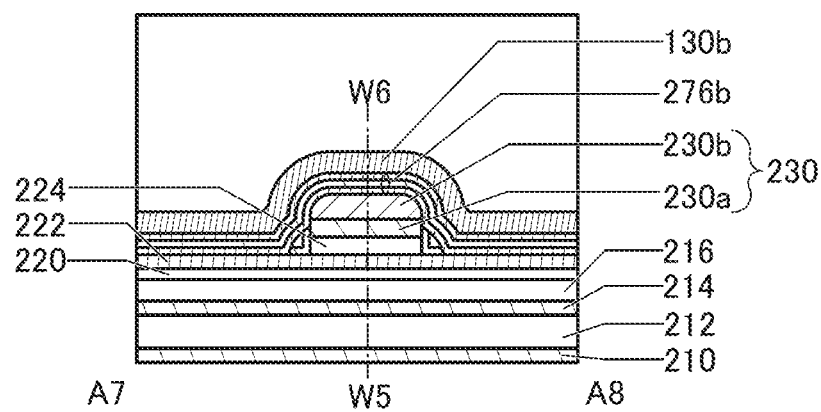

The capacitor 100a and the transistor 200a share some components as illustrated in FIGS. 2A to 2C. Furthermore, the capacitor 100b and the transistor 200b share some components. FIG. 5B is a cross section taken along dashed-dotted line W5-W6 in FIG. 5A. In other words, FIG. 5B is a cross section of the capacitor 100b in the channel width direction. As in the case of the transistor 200a, the capacitor 100a and the capacitor 100b have similar structures. Thus, unless otherwise specified, the description for the capacitor 100a can be referred to for the capacitor 100b below. In this embodiment, an example of the capacitor 100a whose one electrode is part of the region 231a provided in the oxide 230 of the transistor 200a is described.

The capacitor 100a includes part of the region 231a of the oxide 230, an insulator 276a, and a conductor 130a over the insulator 276a. Furthermore, at least part of the conductor 130a is preferably provided over to at least partly overlap with the part of the region 231a.

The part of the region 231a of the oxide 230 functions as one electrode of the capacitor 100a and the conductor 130a functions as the other electrode of the capacitor 100a. That is, the region 231a functions as the source or the drain of the transistor 200a and one electrode of the capacitor 100a. Part of the insulator 276a functions as a dielectric of the capacitor 100a.

The insulator 276a is preferably formed using an insulator having a high dielectric constant. For example, an insulator including an oxide containing one of or both aluminum and hafnium can be used. Aluminum oxide, hafnium oxide, an oxide containing aluminum and hafnium (hafnium aluminate), or the like may be used for the insulator including an oxide containing one of or both aluminum and hafnium. The insulator 276a may have a layered structure. For example, a layered structure including two or more layers selected from silicon oxide, silicon oxynitride, silicon nitride oxide, silicon nitride, aluminum oxide, hafnium oxide, an oxide containing aluminum and hafnium (hafnium aluminate), and the like may be employed. For example, it is preferable that hafnium oxide, aluminum oxide, and hafnium oxide be formed in this order by an ALD method to form a layered structure. The hafnium oxide and the aluminum oxide each have a thickness of greater than or equal to 0.5 nm and less than or equal to 5 nm. With such a layered structure, the capacitor 100a can have a large capacitance value and a low leakage current.

Here, the insulator 272a and the insulator 275a are provided on the side surface of the conductor 260_1 that functions as the first gate electrode of the transistor 200a. Since the insulator 272a and the insulator 275a are provided between the conductor 260_1 and the conductor 130a, the parasitic capacitance between the conductor 260_1 and the conductor 130a can be reduced.

The conductor 130a may have a layered structure. For example, the conductor 130a may have a layered structure of a conductive material containing titanium, titanium nitride, tantalum, or tantalum nitride as its main component and a conductive material containing tungsten, copper, or aluminum as its main component. The conductor 130a may have a single-layer structure or a layered structure of three or more layers.

In the semiconductor device of one embodiment of the present invention, the transistor 200a, the transistor 200b, the capacitor 100a, and the capacitor 100b can be provided on the same layer as described above. With such a structure, the transistors and the capacitors can be arranged with high density; thus, the semiconductor device can be highly integrated.

Note that in this specification and the like, the insulator 220, the insulator 222, and the insulator 224 are referred to as a first insulator in some cases. Furthermore, the insulator 250a and the insulator 252a are referred to as a second insulator and the insulator 250b and the insulator 252b are referred to as a sixth insulator in some case. The insulator 270a and the insulator 271a are referred to as a third insulator and the insulator 270b and the insulator 271b are referred to as a seventh insulator in some cases. The insulator 272a is referred to as a fourth insulator and the insulator 272b is referred to as an eighth insulator in some cases. The insulator 275a and the insulator 274a are referred to as a fifth insulator, the insulator 275b and the insulator 274b are referred to as a ninth insulator, the insulator 276a is referred to as a tenth insulator, and an insulator 276b is referred to as an eleventh insulator, in some cases.

Furthermore, in this specification and the like, the oxide 230 is simply referred to as an oxide in some cases. Furthermore, the conductor 260_1 is referred to as a first conductor, the conductor 260_2 is referred to as a second conductor, the conductor 130a is referred to as a third conductor, and a conductor 130b is referred to as a fourth conductor, in some cases. Furthermore, the conductor 240 is referred to as a wiring in some cases.

<Material for Semiconductor Device>

Materials that can be used for a semiconductor device are described below.

<Substrate>

As a substrate for formation of the semiconductor device, for example, an insulator substrate, a semiconductor substrate, or a conductor substrate may be used. As the insulator substrate, a glass substrate, a quartz substrate, a sapphire substrate, a stabilized zirconia substrate (e.g., an yttria-stabilized zirconia substrate), or a resin substrate is used, for example. As the semiconductor substrate, a semiconductor substrate of silicon, germanium, or the like, or a compound semiconductor substrate of silicon carbide, silicon germanium, gallium arsenide, indium phosphide, zinc oxide, or gallium oxide can be used, for example. A semiconductor substrate in which an insulator region is provided in the above semiconductor substrate, e.g., a silicon on insulator (SOI) substrate or the like is used. As the conductor substrate, a graphite substrate, a metal substrate, an alloy substrate, a conductive resin substrate, or the like is used. A substrate including a metal nitride, a substrate including a metal oxide, or the like is used. An insulator substrate provided with a conductor or a semiconductor, a semiconductor substrate provided with a conductor or an insulator, a conductor substrate provided with a semiconductor or an insulator, or the like is used. Alternatively, any of these substrates over which an element is provided may be used. As the element provided over the substrate, a capacitor, a resistor, a switching element, a light-emitting element, a memory element, or the like is used.

Alternatively, a flexible substrate may be used as the substrate. As a method for providing a transistor over a flexible substrate, there is a method in which the transistor is formed over a non-flexible substrate and then the transistor is separated and transferred to the substrate which is a flexible substrate. In that case, a separation layer is preferably provided between the non-flexible substrate and the transistor. As the substrate, a sheet, a film, or a foil containing a fiber may be used. The substrate may have elasticity. The substrate may have a property of returning to its original shape when bending or pulling is stopped. Alternatively, the substrate may have a property of not returning to its original shape. The substrate has a region with a thickness of, for example, greater than or equal to 5 μm and less than or equal to 700 μm, preferably greater than or equal to 10 μm and less than or equal to 500 μm, further preferably greater than or equal to 15 μm and less than or equal to 300 μm. When the substrate has a small thickness, the weight of the semiconductor device including the transistor can be reduced. When the substrate has a small thickness, even in the case of using glass or the like, the substrate may have elasticity or a property of returning to its original shape when bending or pulling is stopped. Therefore, an impact applied to the semiconductor device over the substrate due to dropping or the like can be reduced. That is, a durable semiconductor device can be provided.

For the substrate which is a flexible substrate, metal, an alloy, resin, glass, or fiber thereof can be used, for example. The flexible substrate preferably has a lower coefficient of linear expansion because deformation due to an environment is suppressed. The flexible substrate is formed using, for example, a material whose coefficient of linear expansion is lower than or equal to $1\times10^{-3}$/K, lower than or equal to $5\times10^{-5}$/K, or lower than or equal to $1\times10^{-5}$/K. Examples of the resin include polyester, polyolefin, polyamide (e.g., nylon or aramid), polyimide, polycarbonate, and acrylic. In particular, aramid is preferably used for the flexible substrate because of its low coefficient of linear expansion.

<Insulator>

Examples of an insulator include an insulating oxide, an insulating nitride, an insulating oxynitride, an insulating nitride oxide, an insulating metal oxide, an insulating metal oxynitride, and an insulating metal nitride oxide.

The transistor is surrounded by an insulator that has a function of inhibiting the passage of oxygen and impurities such as hydrogen, whereby stable electrical characteristics of the transistor can be obtained. For example, an insulator that has a function of inhibiting the passage of oxygen and impurities such as hydrogen may be used as each of the insulator 210, the insulator 214, the insulator 222, the insulator 270a, the insulator 270b, the insulator 272a, and the insulator 272b.

The insulator that has a function of inhibiting the passage of oxygen and impurities such as hydrogen can have, for example, a single-layer structure or a layered structure including an insulator including boron, carbon, nitrogen, oxygen, fluorine, magnesium, aluminum, silicon, phosphorus, chlorine, argon, gallium, germanium, yttrium, zirconium, lanthanum, neodymium, hafnium, or tantalum.

For example, the insulator 210, the insulator 214, the insulator 222, the insulator 270a, the insulator 270b, the insulator 272a, and the insulator 272b may be formed using a metal oxide such as aluminum oxide, magnesium oxide, gallium oxide, germanium oxide, yttrium oxide, zirconium oxide, lanthanum oxide, neodymium oxide, hafnium oxide, an oxide containing silicon and hafnium, an oxide containing aluminum and hafnium, or tantalum oxide, or silicon nitride oxide or silicon nitride. Note that, for example, the insulator 210, the insulator 214, the insulator 222, the insulator 270a, the insulator 270b, the insulator 272a, and the insulator 272b preferably contain aluminum oxide, hafnium oxide, and the like.

The insulator 274a and the insulator 274b may each be formed to have, for example, a single-layer structure or a layered structure including an insulator containing boron, carbon, nitrogen, oxygen, fluorine, magnesium, aluminum, silicon, phosphorus, chlorine, argon, gallium, germanium, yttrium, zirconium, lanthanum, neodymium, hafnium, or tantalum. For example, silicon oxide, silicon oxynitride, or silicon nitride is preferably used for the insulator 274a and the insulator 274b.

It is preferable that the insulator 222, the insulator 224, the insulator 250a, the insulator 250b, the insulator 252a, the insulator 252b, the insulator 276a, and the insulator 276b include an insulator with a high relative dielectric constant. For example, the insulator 222, the insulator 224, the insulator 250a, the insulator 250b, the insulator 252a, and the insulator 252b each preferably include gallium oxide, hafnium oxide, zirconium oxide, oxide containing aluminum and hafnium, oxynitride containing aluminum and hafnium, oxide containing silicon and hafnium, oxynitride containing silicon and hafnium, nitride containing silicon and hafnium, or the like. Alternatively, the insulator 250a and the insulator 250b each preferably have a layered structure of silicon oxide or silicon oxynitride and an insulator with a high dielectric constant. Because silicon oxide and silicon oxynitride have thermal stability, combination of silicon oxide or silicon oxynitride with an insulator with a high dielectric constant allows the layered structure to be thermally stable and have a high dielectric constant. For example, when aluminum oxide, gallium oxide, or hafnium oxide in each of the insulators 250a and 250b is in contact with the oxide 230, entry of silicon included in silicon oxide or silicon oxynitride into the oxide 230_1c and the oxide 230_2c can be suppressed. Furthermore, for example, when silicon oxide or silicon oxynitride is in contact with the oxide 230_1c and the oxide 230_2c in each of the insulators 250a and 250b, trap centers might be formed at the interface between aluminum oxide, gallium oxide, or hafnium oxide and silicon oxide or silicon oxynitride. The trap centers can shift the threshold voltage of the transistor in the positive direction by trapping electrons in some cases.

The insulator 212, the insulator 216, the insulator 280, the insulator 275a, and the insulator 275b preferably include an insulator with a low relative permittivity. For example, the insulator 212, the insulator 216, the insulator 280, the insulator 275a, and the insulator 275b preferably include silicon oxide, silicon oxynitride, silicon nitride oxide, silicon nitride, silicon oxide to which fluorine is added, silicon oxide to which carbon is added, silicon oxide to which carbon and nitrogen are added, porous silicon oxide, a resin, or the like. Alternatively, each of the insulator 212, the insulator 216, the insulator 280, the insulator 275a, and the insulator 275b preferably has a layered structure of a resin and one of the following materials: silicon oxide, silicon oxynitride, silicon nitride oxide, silicon nitride, silicon oxide to which fluorine is added, silicon oxide to which carbon is added, silicon oxide to which carbon and nitrogen are added, and porous silicon oxide. When silicon oxide or silicon oxynitride, which is thermally stable, is combined with resin, the layered structure can have thermal stability and low relative permittivity. Examples of the resin include polyester, polyolefin, polyamide (e.g., nylon or aramid), polyimide, polycarbonate, and acrylic.

<Conductor>

The conductor 203_1, the conductor 203_2, the conductor 205_1, the conductor 205_2, the conductor 260_1, the conductor 260_2, the conductor 240, the conductor 130a, and the conductor 130b can be formed using a material containing one or more metal elements selected from aluminum, chromium, copper, silver, gold, platinum, tantalum, nickel, titanium, molybdenum, tungsten, hafnium, vanadium, niobium, manganese, magnesium, zirconium, beryllium, indium, ruthenium, and the like. Alternatively, a semiconductor having a high electric conductivity typified by polycrystalline silicon including an impurity element such as phosphorus, or silicide such as nickel silicide may be used.

For the above-described conductors, especially for the conductor 260_1, the conductor 260_2, a conductive material containing oxygen and a metal element included in a metal oxide that can be used for the oxide 230 may be used. A conductive material containing the above metal element and nitrogen may be used. For example, a conductive material containing nitrogen such as titanium nitride or tantalum nitride may be used. Indium tin oxide, indium oxide containing tungsten oxide, indium zinc oxide containing tungsten oxide, indium oxide containing titanium oxide, indium tin oxide containing titanium oxide, indium zinc oxide, or indium tin oxide to which silicon is added may be used. Indium gallium zinc oxide containing nitrogen may be used. With the use of such a material, hydrogen contained in the oxide 230 can be captured in some cases. Alternatively, hydrogen entering from an external insulator or the like can be captured in some cases.

A stack of a plurality of conductive layers formed with the above materials may be used. For example, a layered structure formed using a combination of a material including any of the metal elements listed above and a conductive material including oxygen may be used. Alternatively, a layered structure formed using a combination of a material including any of the metal elements listed above and a conductive material including nitrogen may be used. Alternatively, a layered structure formed using a combination of a material including any of the metal elements listed above, a conductive material including oxygen, and a conductive material including nitrogen may be used.

When oxide is used for the channel formation region of the transistor, a layered structure formed using a material containing the above-described metal element and a conductive material containing oxygen is preferably used for the gate electrode. In this case, the conductive material containing oxygen is preferably formed on the channel formation region side. In that case, the conductive material including oxygen is preferably provided on the channel formation region side so that oxygen released from the conductive material is easily supplied to the channel formation region.

<Metal Oxide>

The oxide 230 is preferably formed using a metal oxide functioning as an oxide semiconductor. A metal oxide that can be used as the semiconductor layer and the oxide 230 of one embodiment of the present invention is described below.

An oxide semiconductor preferably contains at least indium or zinc. In particular, indium and zinc are preferably contained. In addition, aluminum, gallium, yttrium, tin, or the like is preferably contained. Furthermore, one or more elements selected from boron, silicon, titanium, iron, nickel, germanium, zirconium, molybdenum, lanthanum, cerium, neodymium, hafnium, tantalum, tungsten, magnesium, or the like may be contained.

Here, the case where the oxide semiconductor is an In-M-Zn oxide that contains indium, an element M, and zinc is considered. The element M is aluminum, gallium, yttrium, tin, or the like. Other elements that can be used as the element M include boron, silicon, titanium, iron, nickel, germanium, zirconium, molybdenum, lanthanum, cerium, neodymium, hafnium, tantalum, tungsten, and magnesium. Note that two or more of the above elements may be used in combination as the element M.

[Composition of Metal Oxide]

Described below is the composition of a cloud-aligned composite oxide semiconductor (CAC-OS) applicable to a transistor disclosed in one embodiment of the present invention.

In this specification and the like, "c-axis aligned crystal (CAAC)" or "cloud-aligned composite (CAC)" might be stated. CAAC refers to an example of a crystal structure, and CAC refers to an example of a function or a material composition.

A CAC-OS or a CAC metal oxide has a conducting function in a part of the material and has an insulating function in another part of the material; as a whole, the CAC-OS or the CAC metal oxide has a function of a semiconductor. In the case where the CAC-OS or the CAC metal oxide is used in an active layer of a transistor, the conducting function is to allow electrons (or holes) functioning as carriers to flow, and the insulating function is to not allow electrons functioning as carriers to flow. By the complementary action of the conducting function and the insulating function, the CAC-OS or the CAC metal oxide can have a switching function (on/off function). In the CAC-OS or CAC-metal oxide, separation of the functions can maximize each function.

The CAC-OS or the CAC metal oxide includes conductive regions and insulating regions. The conductive regions have the above-described conducting function, and the insulating regions have the above-described insulating function. In some cases, the conductive regions and the insulating regions in the material are separated at the nanoparticle level. In some cases, the conductive regions and the insulating regions are unevenly distributed in the material. The conductive regions are observed to be coupled in a cloud-like manner with their boundaries blurred, in some cases.

Furthermore, in the CAC-OS or the CAC metal oxide, the conductive regions and the insulating regions each have a size of more than or equal to 0.5 nm and less than or equal to 10 nm, preferably more than or equal to 0.5 nm and less than or equal to 3 nm and are dispersed in the material, in some cases.

Furthermore, the CAC-OS or the CAC metal oxide includes components having different bandgaps. For example, the CAC-OS or the CAC metal oxide includes a component having a wide gap due to the insulating region and a component having a narrow gap due to the conductive region. In the case of such a composition, carriers mainly flow in the component having a narrow gap. The component having a narrow gap complements the component having a wide gap, and carriers also flow in the component having a wide gap in conjunction with the component having a narrow gap. Therefore, in the case where the above-described CAC-OS or the CAC metal oxide is used in a channel formation region of a transistor, high current drive capability in the on state of the transistor, that is, a high on-state current and high field-effect mobility, can be obtained.

In other words, CAC-OS or CAC-metal oxide can be called a matrix composite or a metal matrix composite.

[Structure of Metal Oxide]

An oxide semiconductor is classified into a single crystal oxide semiconductor and a non-single-crystal oxide semiconductor. Examples of a non-single-crystal oxide semiconductor include a c-axis-aligned crystalline oxide semiconductor (CAAC-OS), a polycrystalline oxide semiconductor, a nanocrystalline oxide semiconductor (nc-OS), an amorphous-like oxide semiconductor (a-like OS), and an amorphous oxide semiconductor.

The CAAC-OS has c-axis alignment, its nanocrystals are connected in the a-b plane direction, and its crystal structure has distortion. Note that the distortion is a portion where the direction of a lattice arrangement changes between a region with a regular lattice arrangement and another region with a regular lattice arrangement in a region in which nanocrystals are connected.

The shape of the nanocrystal is basically hexagon. However, the shape is not always a regular hexagon and is a non-regular hexagon in some cases. A pentagonal lattice arrangement, a heptagonal lattice arrangement, and the like are included in the distortion in some cases. Note that a clear crystal grain boundary cannot be observed even in the vicinity of distortion in the CAAC-OS. That is, formation of a grain boundary is inhibited due to the distortion of lattice arrangement. This is probably because the CAAC-OS can tolerate distortion owing to a low density of arrangement of oxygen atoms in the a-b plane direction, an interatomic bond distance changed by substitution of a metal element, and the like.

The CAAC-OS tends to have a layered crystal structure (also referred to as a layered structure) in which a layer containing indium and oxygen (hereinafter, In layer) and a layer containing the element M, zinc, and oxygen (hereinafter, (M,Zn) layer) are stacked. Note that indium and the element M can be replaced with each other, and when the element M of the (M,Zn) layer is replaced with indium, the layer can also be referred to as an (In,M,Zn) layer. Also, when indium in the In layer is replaced with the element M, the layer can be referred to as an (In,M) layer.

The CAAC-OS is an oxide semiconductor with high crystallinity. By contrast, in the CAAC-OS, a reduction in electron mobility due to the grain boundary is less likely to occur because a clear grain boundary cannot be observed. Entry of impurities, formation of defects, or the like might decrease the crystallinity of an oxide semiconductor. This means that the CAAC-OS has small amounts of impurities and defects (e.g., oxygen vacancies). Thus, an oxide semiconductor including a CAAC-OS is physically stable. Therefore, the oxide semiconductor including a CAAC-OS is resistant to heat and has high reliability.

In the nc-OS, a microscopic region (for example, a region with a size greater than or equal to 1 nm and less than or equal to 10 nm, in particular, a region with a size greater than or equal to 1 nm and less than or equal to 3 nm) has a periodic atomic arrangement. There is no regularity of crystal orientation between different nanocrystals in the nc-OS. Thus, the orientation of the whole film is not observed. Accordingly, the nc-OS cannot be distinguished from an a-like OS or an amorphous oxide semiconductor, depending on an analysis method.

An a-like OS has a structure between those of the nc-OS and the amorphous oxide semiconductor. The a-like OS contains a void or a low-density region. That is, the a-like OS has low crystallinity as compared with the nc-OS and the CAAC-OS.

An oxide semiconductor can have various structures which show various different properties. Two or more of the amorphous oxide semiconductor, the polycrystalline oxide semiconductor, the a-like OS, the nc-OS, and the CAAC-OS may be included in an oxide semiconductor of one embodiment of the present invention.

[Transistor Including Oxide Semiconductor]

Next, the case where the oxide semiconductor is used for a transistor is described.

Note that when the oxide semiconductor is used for a transistor, the transistor can have high field-effect mobility. In addition, the transistor can have high reliability.

An oxide semiconductor with a low carrier density is preferably used for the transistor. In order to reduce the carrier density of the oxide semiconductor, the impurity concentration in the oxide semiconductor is reduced so that the density of defect states can be reduced. In this specification and the like, a state with a low impurity concentration and a low density of defect states is referred to as a highly purified intrinsic or substantially highly purified intrinsic state. For example, an oxide semiconductor whose carrier density is lower than $8\times10^{11}/cm^3$, preferably lower than $1\times10^{11}/cm^3$, further preferably lower than $1\times10^{10}/cm^3$, and greater than or equal to $1\times10^{-9}/cm^3$ is used.

A highly purified intrinsic or substantially highly purified intrinsic oxide semiconductor has a low density of defect states and accordingly has a low density of trap states in some cases.

Charge trapped by the trap states in the oxide semiconductor takes a long time to be released and may behave like fixed charge. Thus, a transistor whose channel formation region is formed in an oxide semiconductor having a high density of trap states has unstable electrical characteristics in some cases.

To obtain stable electrical characteristics of the transistor, it is effective to reduce the concentration of impurities in the oxide semiconductor. In order to reduce the concentration of impurities in the oxide semiconductor, the concentration of impurities in a film which is adjacent to the oxide semiconductor is preferably reduced. As examples of the impurities, hydrogen, nitrogen, alkali metal, alkaline earth metal, iron, nickel, silicon, and the like are given.

[Impurities]

Here, the influence of impurities in the oxide semiconductor is described.

When silicon or carbon that is one of Group 14 elements is contained in the oxide semiconductor, defect states are formed. Thus, the concentration of silicon or carbon in the oxide semiconductor and around an interface with the oxide semiconductor (measured by secondary ion mass spectrometry (SIMS)) is set lower than or equal to $2\times10^{18}$ atoms/cm$^3$, and preferably lower than or equal to $2\times10^{17}$ atoms/cm$^3$.

When the oxide semiconductor contains alkali metal or alkaline earth metal, defect states are formed and carriers are generated, in some cases. Thus, a transistor including an oxide semiconductor that contains alkali metal or alkaline earth metal is likely to be normally-on. Therefore, it is preferable to reduce the concentration of alkali metal or alkaline earth metal of the oxide semiconductor. Specifically, the concentration of alkali metal or alkaline earth metal in the oxide semiconductor measured by SIMS is set lower than or equal to $1\times10^{18}$ atoms/cm$^3$, and preferably lower than or equal to $2\times10^{16}$ atoms/cm$^3$.

When the oxide semiconductor contains nitrogen, the oxide semiconductor easily becomes n-type by generation of electrons functioning as carriers and an increase of carrier density. Thus, a transistor whose semiconductor includes an oxide semiconductor that contains nitrogen is likely to be normally-on. For this reason, nitrogen in the oxide semiconductor is preferably reduced as much as possible; the nitrogen concentration measured by SIMS is set, for example, lower than $5\times10^{19}$ atoms/cm$^3$, preferably lower than or equal to $5\times10^{18}$ atoms/cm$^3$, further preferably lower than or equal to $1\times10^{18}$ atoms/cm$^3$, and still further preferably lower than or equal to $5\times10^{17}$ atoms/cm$^3$.

Hydrogen contained in an oxide semiconductor reacts with oxygen bonded to a metal atom to be water, and thus causes oxygen vacancies, in some cases. Entry of hydrogen into the oxygen vacancies generates electrons functioning as carriers in some cases. Furthermore, in some cases, bonding of part of hydrogen to oxygen bonded to a metal atom causes generation of an electron functioning as a carrier. Thus, a transistor including an oxide semiconductor which contains hydrogen is likely to be normally on. Accordingly, it is preferable that hydrogen in the oxide semiconductor be reduced as much as possible. Specifically, the hydrogen concentration measured by SIMS is set lower than $1\times10^{20}$ atoms/cm$^3$, preferably lower than $1\times10^{19}$ atoms/cm$^3$, further preferably lower than $5\times10^{18}$ atoms/cm$^3$, and still further preferably lower than $1\times10^{18}$ atoms/cm$^3$.

When an oxide semiconductor with sufficiently reduced impurity concentration is used for a channel formation region in a transistor, the transistor can have stable electrical characteristics.

<Manufacturing Method of Semiconductor Device>

Next, a manufacturing method of the semiconductor device of the present invention that includes the transistor 200a, the transistor 200b, the capacitor 100a, and the capacitor 100b is described with reference to FIGS. 7A to 7C to FIGS. 18A to 18C. FIG. 7A, FIG. 8A, FIG. 9A, FIG. 10A, FIG. 11A, FIG. 12A, FIG. 13A, FIG. 14A, FIG. 15A, FIG. 16A, FIG. 17A, and FIG. 18A are top views. FIG. 7B, FIG. 8B, FIG. 9B, FIG. 10B, FIG. 11B, FIG. 12B, FIG. 13B, FIG. 14B, FIG. 15B, FIG. 16B, FIG. 17B, and FIG. 18B are cross sections taken along dashed-dotted lines A1-A2 in FIG. 7A, FIG. 8A, FIG. 9A, FIG. 10A, FIG. 11A, FIG. 12A, FIG. 13A, FIG. 14A, FIG. 15A, FIG. 16A, FIG. 17A, and FIG. 18A. FIG. 7C, FIG. 8C, FIG. 9C, FIG. 10C, FIG. 11C, FIG. 12C, FIG. 13C, FIG. 14C, FIG. 15C, FIG. 16C, FIG. 17C, and FIG. 18C are cross sections taken along dashed-dotted lines A3-A4 in FIG. 7A, FIG. 8A, FIG. 9A, FIG. 10A, FIG. 11A, FIG. 12A, FIG. 13A, FIG. 14A, FIG. 15A, FIG. 16A, FIG. 17A, and FIG. 18A.

First, a substrate (not illustrated) is prepared, and the insulator 210 is formed over the substrate. The insulator 210 can be formed by a sputtering method, a chemical vapor deposition (CVD) method, a molecular beam epitaxy (MBE) method, a pulsed laser deposition (PLD) method, an ALD method, or the like.

Note that CVD methods can be classified into a plasma enhanced CVD (PECVD) method using plasma, a thermal CVD (TCVD) method using heat, a photo CVD method using light, and the like. Moreover, the CVD method can include a metal CVD (MCVD) method and a metal organic CVD (MOCVD) method depending on a source gas.

By using the PECVD method, a high-quality film can be formed at a relatively low temperature. Furthermore, a thermal CVD method does not use plasma and thus causes less plasma damage to an object. For example, a wiring, an electrode, an element (e.g., transistor or capacitor), or the like included in a semiconductor device might be charged up by receiving charges from plasma. In that case, accumulated charges might break the wiring, electrode, element, or the like included in the semiconductor device. By contrast, when a thermal CVD method not using plasma is employed, such plasma damage is not caused and the yield of the semiconductor device can be increased. A thermal CVD method does not cause plasma damage during deposition, so that a film with few defects can be obtained.

An ALD method also causes less damage to an object. An ALD method does not cause plasma damage during deposition, so that a film with few defects can be obtained.

Unlike in a deposition method in which particles ejected from a target or the like are deposited, in a CVD method and an ALD method, a film is formed by reaction at a surface of an object. Thus, a CVD method and an ALD method enable favorable step coverage almost regardless of the shape of an object. In particular, an ALD method enables excellent step coverage and excellent thickness uniformity and can be favorably used for covering a surface of an opening with a high aspect ratio, for example. On the other hand, an ALD method has a relatively low deposition rate; thus, it is sometimes preferable to combine an ALD method with another deposition method with a high deposition rate such as a CVD method.

When a CVD method or an ALD method is used, composition of a film to be formed can be controlled with a flow rate ratio of the source gases. For example, by a CVD method or an ALD method, a film with a certain composition can be formed depending on a flow rate ratio of the source gases. Moreover, with a CVD method or an ALD method, by changing the flow rate ratio of the source gases while forming the film, a film whose composition is continuously changed can be formed. In the case where the film is formed while changing the flow rate ratio of the source gases, as compared to the case where the film is formed using a plurality of deposition chambers, time taken for the film formation can be reduced because time taken for transfer and pressure adjustment is omitted. Thus, semiconductor devices can be manufactured with improved productivity.

In this embodiment, aluminum oxide is formed as the insulator 210 by a sputtering method. The insulator 210 may have a multilayer structure. For example, the multilayer structure may be formed in such a manner that an aluminum oxide is formed by a sputtering method and an aluminum oxide is formed over the aluminum oxide by an ALD method. Alternatively, the multilayer structure may be formed in such a manner that an aluminum oxide is formed by an ALD method and an aluminum oxide is formed over the aluminum oxide by a sputtering method.

Next, a conductive film to be the conductor 203_1 and the conductor 203_2 is formed over the insulator 210. The conductive film to be the conductor 203_1 and the conductor 203_2 can be formed by a sputtering method, a CVD method, an MBE method, a PLD method, an ALD method, or the like. The conductive film to be the conductor 203_1 and the conductor 203_2 can be a multilayer film. In this embodiment, tungsten is formed as the conductive film to be the conductor 203_1 and the conductor 203_2.

Next, the conductive film to be the conductor 203_1 and the conductor 203_2 is processed by a lithography method to form the conductor 203_1 and the conductor 203_2.

In the lithography method, first, a resist is exposed to light through a mask. Next, a region exposed to light is removed or left using a developing solution, so that a resist mask is formed. Then, etching through the resist mask is conducted. The resist mask is formed by, for example, exposure of the resist to light using KrF excimer laser light, ArF excimer laser light, extreme ultraviolet (EUV) light, or the like. Alternatively, a liquid immersion technique may be employed in which a portion between a substrate and a projection lens is filled with liquid (e.g., water) to perform light exposure. An electron beam or an ion beam may be used instead of the above-mentioned light. Note that a photomask is not necessary in the case of using an electron beam or an ion beam. To remove the resist mask, dry etching treatment such as ashing or wet etching treatment can be used. Alternatively, wet etching treatment can be performed after dry etching treatment. Further alternatively, dry etching treatment can be performed after wet etching treatment.

A hard mask formed of an insulator or a conductor may be used instead of the resist mask. In the case where a hard mask is used, a hard mask with a desired shape can be formed in the following manner: an insulating film or a conductive film that is the material of the hard mask is formed over the conductive film to be the conductor 203_1 and the conductor 203_2, a resist mask is formed thereover, and then the material of the hard mask is etched. The etching of the conductive film to be the conductor 203_1 and the conductor 203_2 may be performed after or without removal of the resist mask. In the latter case, the resist mask may be removed during the etching. The hard mask may be removed by etching after the etching of the conductive film to be the conductor 203_1 and the conductor 203_2. The hard mask does not need to be removed in the case where the material of the hard mask does not affect the following process or can be utilized in the following process.

As a dry etching apparatus, a capacitively coupled plasma (CCP) etching apparatus including parallel plate type electrodes can be used. The capacitively coupled plasma etching apparatus including the parallel plate type electrodes may have a structure in which a high-frequency power source is applied to one of the parallel plate type electrodes. Alternatively, the capacitively coupled plasma etching apparatus may have a structure in which different high-frequency power sources are applied to one of the parallel plate type electrodes. Alternatively, the capacitively coupled plasma etching apparatus may have a structure in which high-frequency power sources with the same frequency are applied to the parallel plate type electrodes. Alternatively, the capacitively coupled plasma etching apparatus may have a structure in which high-frequency power sources with different frequencies are applied to the parallel plate type electrodes. Alternatively, a dry etching apparatus including a high-density plasma source can be used. As the dry etching apparatus including a high-density plasma source, an inductively coupled plasma (ICP) etching apparatus can be used, for example.

Next, an insulating film to be the insulator 212 is formed over the insulator 210, the conductor 203_1, and the conductor 203_2. The insulating film to be the insulator 212 can be formed by a sputtering method, a CVD method, an MBE method, a PLD method, an ALD method, or the like. In this embodiment, as the insulating film to be the insulator 212, silicon oxide is formed by a CVD method.

Here, the thickness of the insulating film to be the insulator 212 is preferably greater than or equal to the thickness of the conductor 203_1 and the thickness of the conductor 203_2. For example, when each of the thickness of the conductor 203_1 and the conductor 203_2 is 1, the thickness of the insulating film to be the insulator 212 is greater than or equal to 1 and less than or equal to 3. In this embodiment, the thickness of the conductor 203_1 and the thickness of the conductor 203_2 are 150 nm and the thickness of the insulating film to be the insulator 212 is 350 nm.

Next, chemical mechanical polishing (CMP) treatment is performed on the insulating film to be the insulator 212, so that part of the insulating film to be the insulator 212 is removed and a surface of the conductor 203_1 and a surface of the conductor 203_2 are exposed. Thus, the conductor 203_1, the conductor 203_2, and the insulator 212 whose top surfaces are flat can be formed (see FIGS. 7A to 7C).

Here, a method for forming the conductor 203_1 and the conductor 203_2 that is different from the above is described below.

Then, the insulator 212 is formed over the insulator 210. The insulator 212 can be formed by a sputtering method, a CVD method, an MBE method, a PLD method, an ALD method, or the like.

Then, openings are formed in the insulator 212 to reach the insulator 210. Examples of the openings include grooves and slits. Regions where the openings are formed may be referred to as opening portions. The openings can be formed by wet etching; however, dry etching is preferably for microfabrication. The insulator 210 is preferably an insulator that functions as an etching stopper film used in forming the groove by etching the insulator 212. For example, in the case where a silicon oxide film is used as the insulator 212 in which the groove is to be formed, the insulator 210 is preferably formed using a silicon nitride film, an aluminum oxide film, or a hafnium oxide film.

After formation of the openings, a conductive film to be the conductor 203_1 and the conductor 203_2 is formed. The conductive film desirably contains a conductor that has a function of inhibiting the passage of oxygen. For example, tantalum nitride, tungsten nitride, or titanium nitride can be used. Alternatively, a layered film formed using the conductor and tantalum, tungsten, titanium, molybdenum, aluminum, copper, or a molybdenum-tungsten alloy can be used. The conductive film to be the conductor 203_1 and the conductor 203_2 can be formed by a sputtering method, a CVD method, an MBE method, a PLD method, an ALD method, or the like.

In this embodiment, the conductive film to be the conductor 203_1 and the conductor 203_2 has a multilayer structure. First, tantalum nitride or a stacked film of tantalum nitride and titanium nitride formed thereover is formed by a sputtering method. With the use of such metal nitride for a lower layer of the conductive film to be the conductor 203_1 and the conductor 203_2, a metal that is easily diffused, such as copper, can be prevented from diffusing to the outside from the conductor 203_1 and the conductor 203_2 even when the metal is used for an upper layer of the conductive film to be the conductor 203_1 and the conductor 203_2 that is described below.

Next, the upper layer of the conductive film to be the conductor 203_1 and the conductor 203_2 is formed. The conductive film to be the conductor 203_1 and the conductor 203_2 can be formed by a plating method, a sputtering method, a CVD method, an MBE method, a PLD method, an ALD method, or the like. In this embodiment, as the conductive film of the upper layer of the conductive film to be the conductor 203_1 and the conductor 203_2, a low-resistant conductive material such as copper is formed.

Next, by CMP treatment, the upper layer of the conductive film to be the conductor 203_1 and the conductor 203_2 and the lower layer of the conductive film to be the conductor 203_1 and the conductor 203_2 are partly removed to expose the insulator 212. As a result, the conductive film to be the conductor 203_1 and the conductor 203_2 remains only in the opening portions. Thus, the conductor 203_1 and the conductor 203_2 whose top surfaces are flat can be formed. Note that the insulator 212 is partly removed by the CMP treatment in some cases. The above is the description of the different formation method of the conductor 203_1 and the conductor 203_2.

Next, the insulator 214 is formed over the conductor 203_1 and the conductor 203_2. The insulator 214 can be formed by a sputtering method, a CVD method, an MBE method, a PLD method, an ALD method, or the like. In this embodiment, as the insulator 214, silicon nitride is formed by a CVD method. Even when metal that is likely to be diffused to the conductor 203_1 and the conductor 203_2, such as copper, is used for the insulator 214, the use of an insulator through which copper is less likely to pass like silicon nitride, as the insulator 214 can prevent the metal from being diffused into the layers above the insulator 214.

Next, the insulator 216 is formed over the insulator 214. The insulator 216 can be formed by a sputtering method, a CVD method, an MBE method, a PLD method, an ALD method, or the like. In this embodiment, silicon oxide is formed as the insulator 216 by a CVD method.

Then, a depression was formed in the insulator 214 and the insulator 216. Examples of the depression include a hole and an opening. The depression may be formed by wet etching; however, dry etching is preferred for microfabrication.

After the formation of depressions, a conductive film to be the conductor 205_1a and the conductor 205_2a is formed. The conductive film to be the conductor 205_1a and the conductor 205_2a desirably contains a conductor having a function of inhibiting the passage of oxygen. For example, tantalum nitride, tungsten nitride, or titanium nitride can be used. Alternatively, a layered film formed using the conductor and tantalum, tungsten, titanium, molybdenum, aluminum, copper, or a molybdenum-tungsten alloy can be used. The conductive film to be the conductor 205_1a and the conductor 205_2a can be formed by a sputtering method, a CVD method, an MBE method, a PLD method, an ALD method, or the like.

In this embodiment, tantalum nitride is formed by a sputtering method as the conductive film to be the conductor 205_1a and the conductor 205_2a.

Next, a conductive film to be the conductor 205_1a and the conductor 205_2a is formed over the conductive film to be the conductor 205_1b and the conductor 205_2b. The conductive film to be the conductor 205_1b and the conductor 205_2b can be formed by a sputtering method, a CVD method, an MBE method, a PLD method, an ALD method, or the like.

In this embodiment, as the conductive film to be the conductor 205_1b and the conductor 205_2b, titanium nitride is formed by a CVD method and tungsten is formed by a CVD method over the titanium nitride.

Next, CMP treatment is performed so that the conductive film to be the conductor 205_1a and the conductor 205_2a and the conductive film to be the conductor 205_1b and the conductor 205_2b which are over the insulator 216 are removed. As a result, the conductive film to be the conductor 205_1a and the conductor 205_2a and the conductive film to be the conductor 205_1b and the conductor 205_2b remain only in the depressions; thus, the conductor 205_1 and the conductor 205_2 whose top surfaces are flat can be formed (see FIGS. 7A, 7B, and 7C).

Next, the insulator 220 is formed over the insulator 216, the conductor 205_1, and the conductor 205_2. The insulator 220 can be formed by a sputtering method, a CVD method, an MBE method, a PLD method, an ALD method, or the like.

Then, the insulator 222 is formed over the insulator 220. The insulator 222 can be formed by a sputtering method, a CVD method, an MBE method, a PLD method, an ALD method, or the like.

Then, the insulator 224 is formed over the insulator 222. The insulator 224 can be formed by a sputtering method, a CVD method, an MBE method, a PLD method, an ALD method, or the like.

Next, first heat treatment is preferably performed. The first heat treatment can be performed at a temperature higher than or equal to 250° C. and lower than or equal to 650° C., preferably higher than or equal to 300° C. and lower than or equal to 500° C., further preferably higher than or equal to 320° C. and lower than or equal to 450° C. The first heat treatment is performed in nitrogen, an inert gas atmosphere, or an atmosphere containing an oxidizing gas at 10 ppm or more, 1% or more, or 10% or more. The first heat treatment may be performed under a reduced pressure. Alternatively, the first heat treatment may be performed in such a manner that heat treatment is performed in nitrogen or an inert gas atmosphere, and then another heat treatment is performed in an atmosphere containing an oxidizing gas at 10 ppm or more, 1% or more, or 10% or more in order to compensate for released oxygen. By the first heat treatment, impurities such as hydrogen and water included in the insulator 224 can be removed, for example. Alternatively, in the first heat treatment, plasma treatment using oxygen may be performed under a reduced pressure. The plasma treatment containing oxygen is preferably performed using an apparatus including a power source for generating high-density plasma using microwaves, for example. Alternatively, a power source for applying a radio frequency (RF) to a substrate side may be provided. The use of high-density plasma enables high-density oxygen radicals to be produced, and application of the RF to the substrate side allows oxygen radicals generated by the high-density plasma to be efficiently introduced into the insulator 224. Alternatively, after plasma treatment using an inert gas with the apparatus, plasma treatment using oxygen in order to compensate for released oxygen may be performed. Note that first heat treatment is not necessarily performed in some cases.

This heat treatment can also be performed after the deposition of the insulator 220, after the deposition of the insulator 222, and after the deposition of the insulator 224. Although each heat treatment can be performed under the conditions for the heat treatment, the heat treatment after the formation of the insulator 220 is preferably performed in an atmosphere containing nitrogen.

In this embodiment, the first heat treatment is performed in a nitrogen atmosphere at 400° C. for one hour after formation of the insulator 224.

Figure 7A:
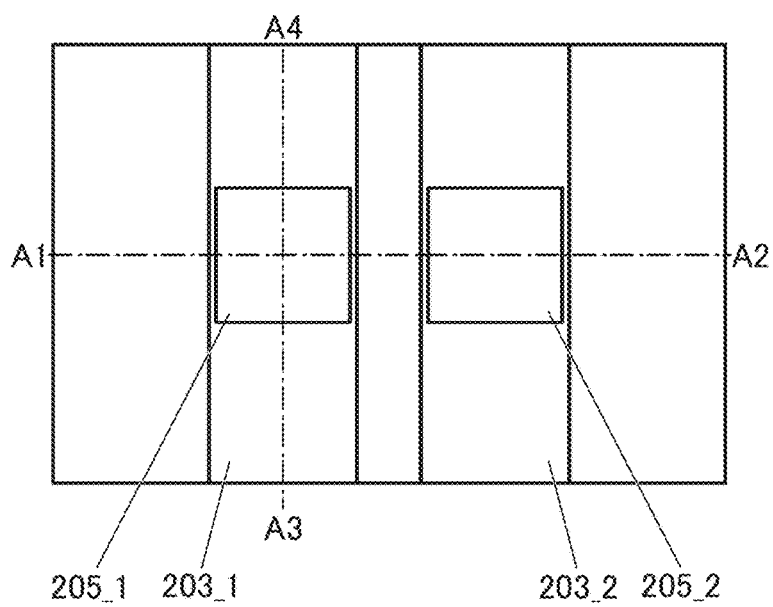
FIGS. 7A to 7C are a top view and cross sections illustrating a method for manufacturing a semiconductor device according to one embodiment of the present invention.
Figure 7C:
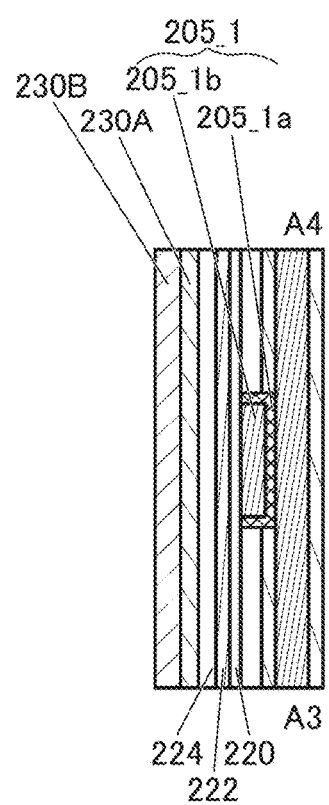
Figure 7B:
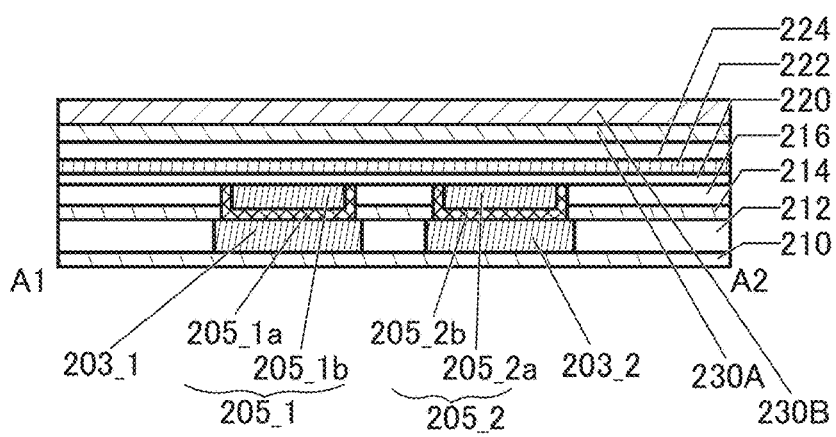
Figure 8A:
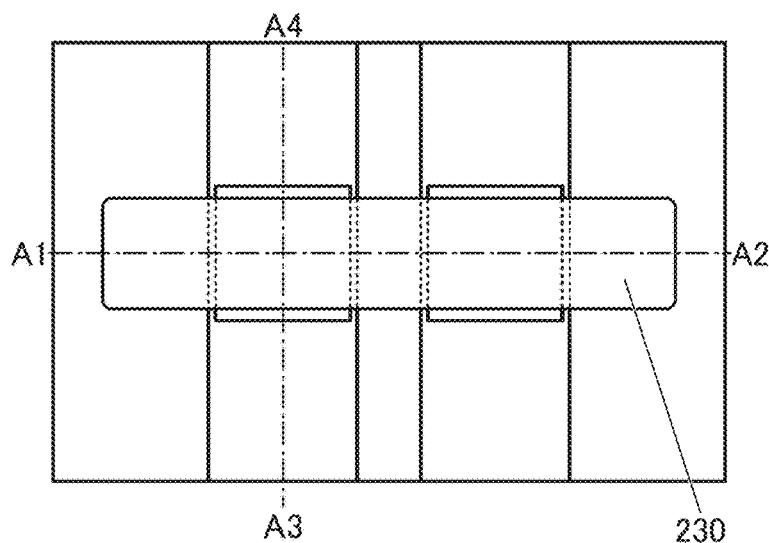
FIGS. 8A to 8C are a top view and cross sections illustrating a method for manufacturing a semiconductor device according to one embodiment of the present invention.
Figure 8C:
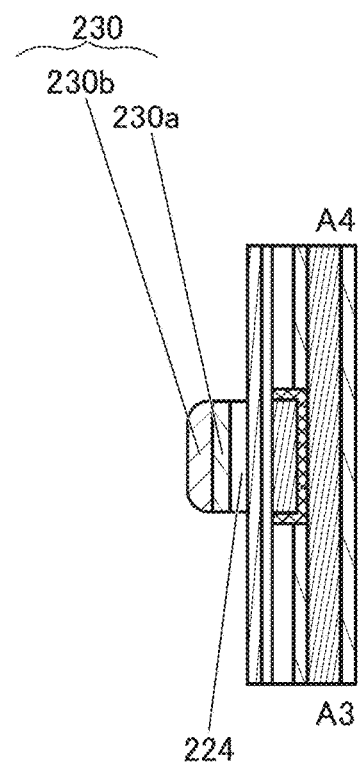
Figure 8B:
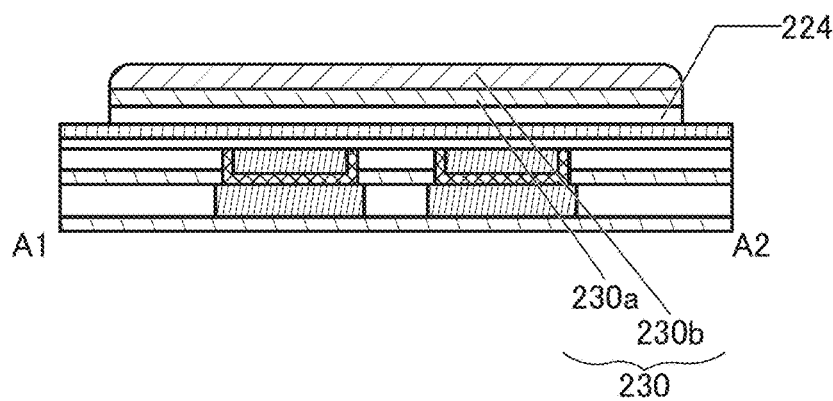

Next, an oxide film 230A and an oxide film 230B are formed in this order over the insulator 224 (see FIGS. 7A to 7C). Note that it is preferable to form the oxide film 230A and the oxide film 230B successively without exposure to the air. When the oxide films are formed without exposure to the air, impurities or moisture from the air can be prevented from being attached to the oxide film 230A, so that an interface between the oxide films 230A and 230B and the vicinity of the interface can be kept clean.

The oxide film 230A and the oxide film 230B can be formed by a sputtering method, a CVD method, an MBE method, a PLD method, an ALD method, or the like.

In the case where the oxide films 230A and 230B are formed by a sputtering method, for example, oxygen or a mixed gas of oxygen and a rare gas is used as a sputtering gas. By increasing the proportion of oxygen in the sputtering gas, the amount of excess oxygen in the oxide film to be deposited can be increased. In the case where the oxide films 230A and 230B are formed by a sputtering method, the above-described In-M-Zn oxide target can be used.

In particular, when the oxide film 230A is formed, part of oxygen contained in the sputtering gas is supplied to the insulator 224, in some cases.

Note that the proportion of oxygen in the sputtering gas for formation of the oxide film 230A is preferably 70% or higher, further preferably 80% or higher, and still further preferably 100%.

When the oxide film 230B is formed, the proportion of oxygen in the sputtering gas is set to be higher than or equal to 1% and lower than or equal to 30%, preferably higher than or equal to 5% and lower than or equal to 20%, so that an oxygen-deficient oxide semiconductor is formed. A transistor including an oxygen-deficient oxide semiconductor can have relatively high field-effect mobility.

Note that when an oxygen-deficient oxide semiconductor is used as the oxide film 230B, an oxide film containing excess oxygen is preferably used as the oxide film 230A. Oxygen doping treatment may be performed after the formation of the oxide film 230A.

In this embodiment, the oxide film 230A is formed by a sputtering method using a target containing In, Ga, and Zn at an atomic ratio of 1:3:4, and the oxide film 230B is formed by a sputtering method using a target containing In, Ga, and Zn at an atomic ratio of 4:2:4.1.

After that, second heat treatment may be performed. For the second heat treatment, the conditions for the first heat treatment can be used. By the second heat treatment, impurities such as hydrogen and water contained in the oxide films 230A and 230B can be removed, for example. In this embodiment, treatment is performed in a nitrogen atmosphere at 400° C. for one hour, and successively another treatment is performed in an oxygen atmosphere at 400° C. for one hour.

Next, the oxide film 230A and the oxide film 230B are processed into island shapes to form the oxide 230a and the oxide 230b. At this time, the insulator 224 in a region that does not overlap with the oxide 230a and the oxide 230b is etched and the surface of the insulator 222 is exposed in some cases (see FIGS. 8A to 8C).

Here, the oxide 230 is formed to at least partly overlap with the conductor 205. A side surface of the oxide 230 is preferably substantially perpendicular to the top surface of the insulator 222, in which case a plurality of the transistors 200 can be provided with high density in a small area. Note that an angle formed by the side surface of the oxide 230 and the top surface of the insulator 222 may be an acute angle. In that case, the angle formed by the side surface of the oxide 230 and the top surface of the insulator 222 is preferably larger.

The oxide 230 has a curved surface between the side surface and the top surface. That is, an end portion of the side surface and an end portion of the top surface are preferably curved (such a curved shape is also referred to as a rounded shape). The radius of curvature of the curved surface at an end portion of the oxide 230b is greater than or equal to 3 nm and less than or equal to 10 nm, preferably greater than or equal to 5 nm and less than or equal to 6 nm.

Note that when the end portions are not angular, the coverage with films formed later in the film formation process can be improved.

Note that the oxide films may be processed by a lithography method. The processing can be performed by a dry etching method or a wet etching method. A dry etching method is suitable for minute processing.

Instead of the resist mask, a hard mask formed of an insulator or a conductor may be used as an etching mask. In the case where a hard mask is used, a hard mask with a desired shape can be formed in the following manner: an insulating film or a conductive film that is the material of the hard mask is formed over the oxide film 230B, a resist mask is formed thereover, and then the material of the hard mask is etched. The etching of the oxide films 230A and 230B may be performed after or without removal of the resist mask. In the latter case, the resist mask may be removed during the etching. The hard mask may be removed by etching after the etching of the oxide films 230A and 230B. The hard mask does not need to be removed in the case where the material of the hard mask does not affect the following process or can be utilized in the following process.

In some cases, treatment such as dry etching performed in the above process causes the attachment or diffusion of impurities due to an etching gas or the like to a surface or an inside of the oxide 230a, the oxide 230b, or the like. The impurity is fluorine or chlorine, for example.

In order to remove the impurities, cleaning is performed. As the cleaning, any of wet cleaning using a cleaning solution or the like, plasma treatment using plasma, cleaning by heat treatment, and the like can be performed by itself or in appropriate combination.

The wet cleaning may be performed using an aqueous solution in which oxalic acid, phosphoric acid, hydrofluoric acid, or the like is diluted with carbonated water or pure water. Alternatively, ultrasonic cleaning using pure water or carbonated water may be performed. In this embodiment, ultrasonic cleaning using pure water or carbonated water is performed.

Next, third heat treatment may be performed. For the third heat treatment, the conditions for the first heat treatment can be used. Note that the third heat treatment is not necessarily performed in some cases. In this embodiment, the third heat treatment is not performed.

Figure 9A:
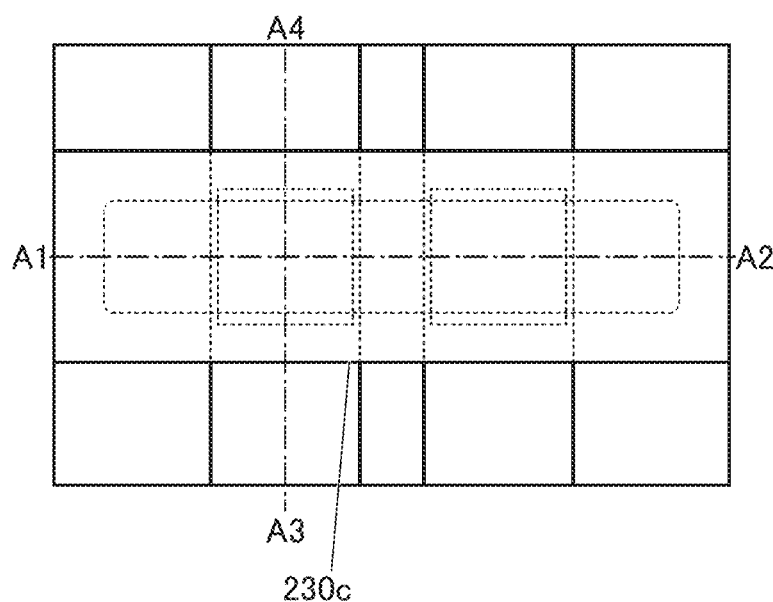
FIGS. 9A to 9C are a top view and cross sections illustrating a method for manufacturing a semiconductor device according to one embodiment of the present invention.
Figure 9C:
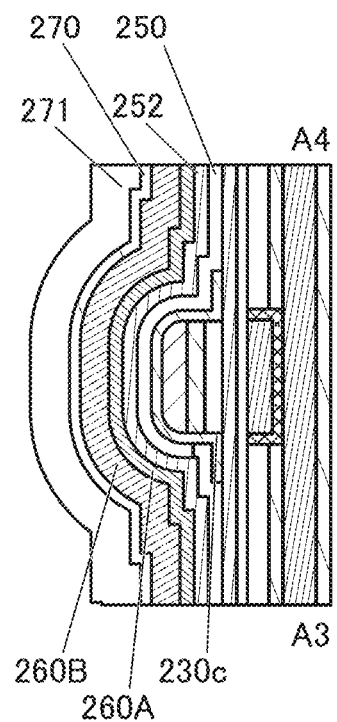
Figure 9B:
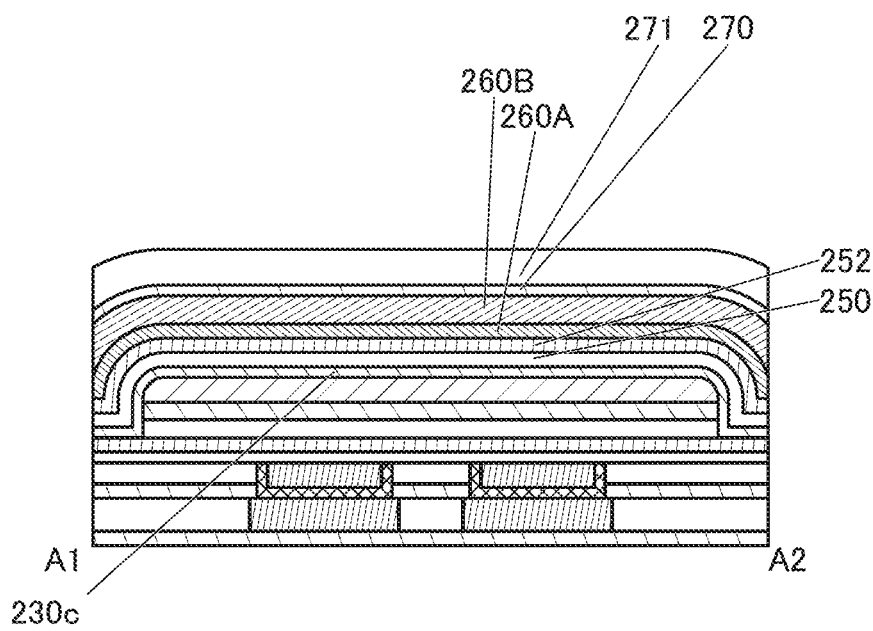
Figure 10A:
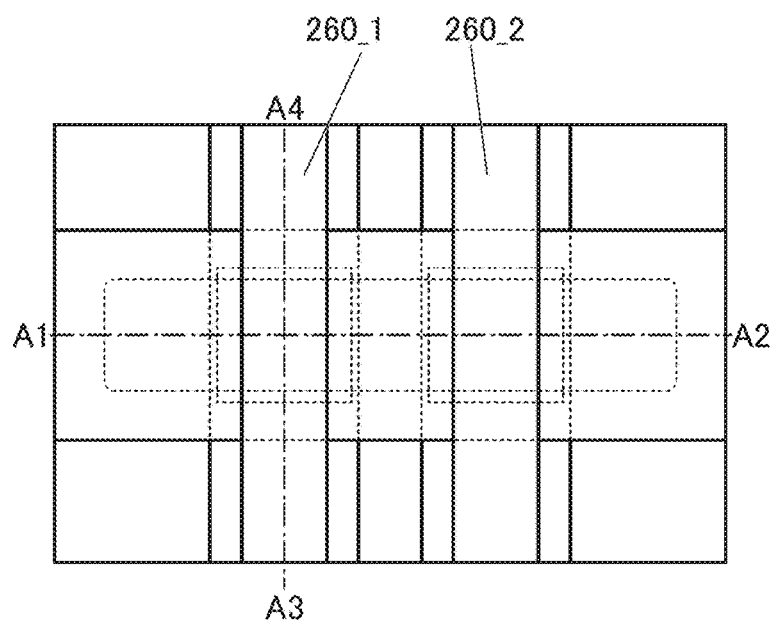
FIGS. 10A to 10C are a top view and cross sections illustrating a method for manufacturing a semiconductor device according to one embodiment of the present invention.
Figure 10C:
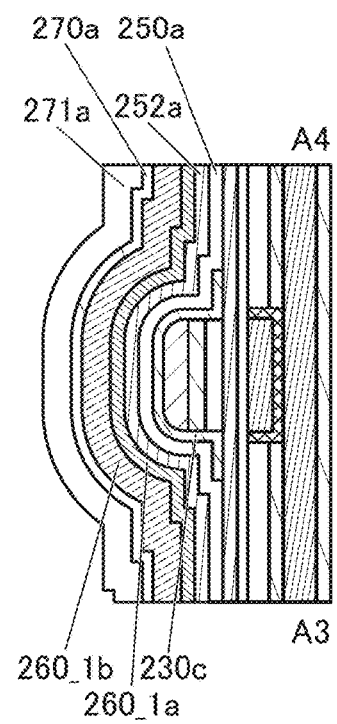
Figure 10B:
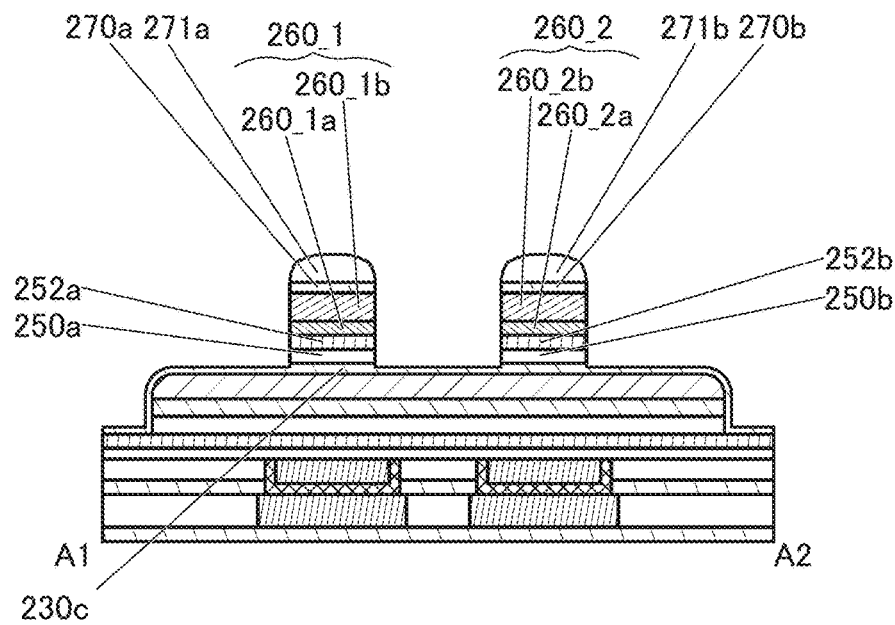
Figure 11A:
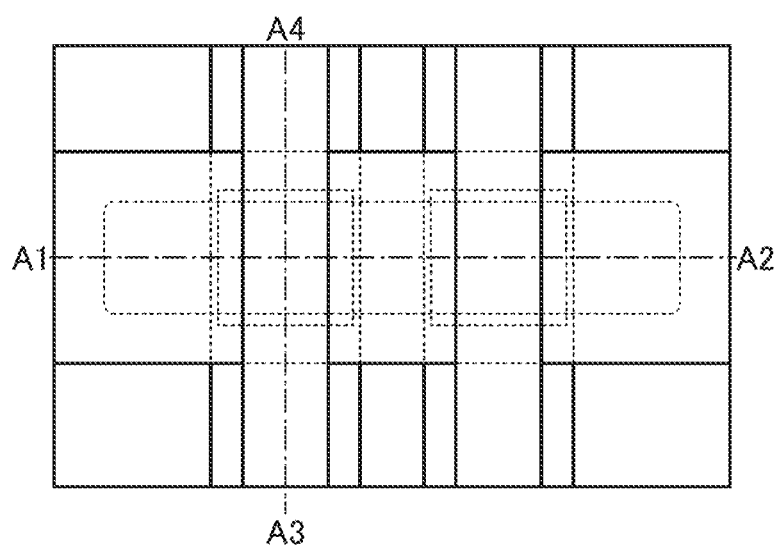
FIGS. 11A to 11C are a top view and cross sections illustrating a method for manufacturing a semiconductor device according to one embodiment of the present invention.
Figure 11C:
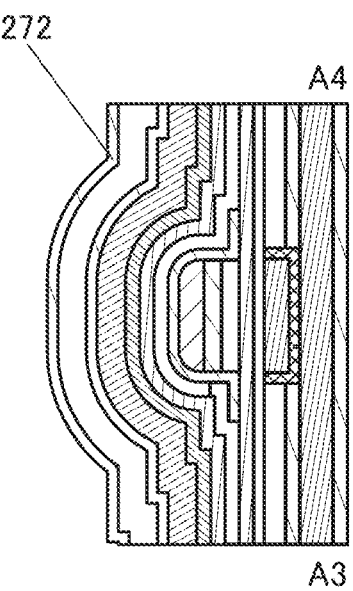
Figure 11B:
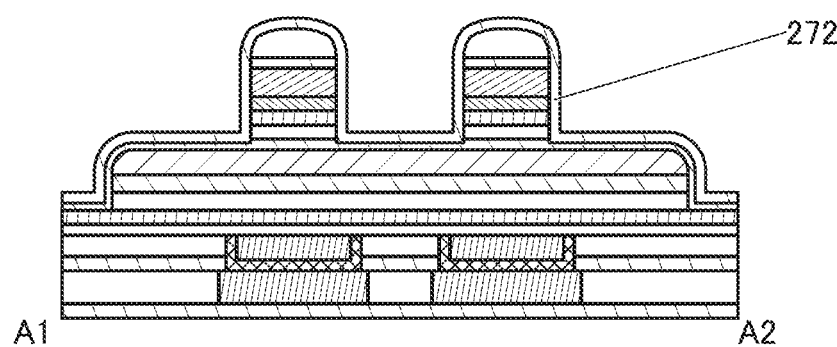
Figure 13A:
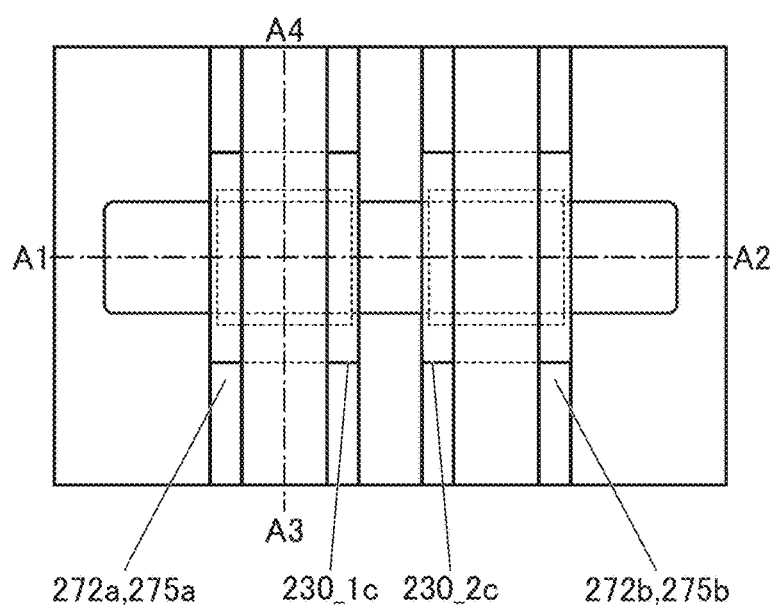
FIGS. 13A to 13C are a top view and cross sections illustrating a method for manufacturing a semiconductor device according to one embodiment of the present invention.
Figure 13C:
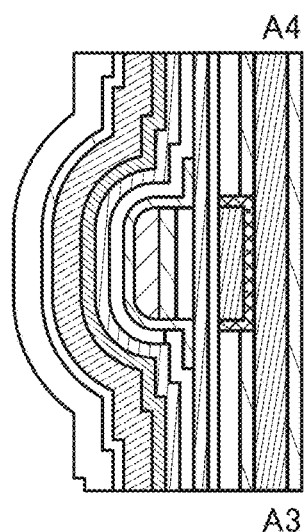
Figure 13B:
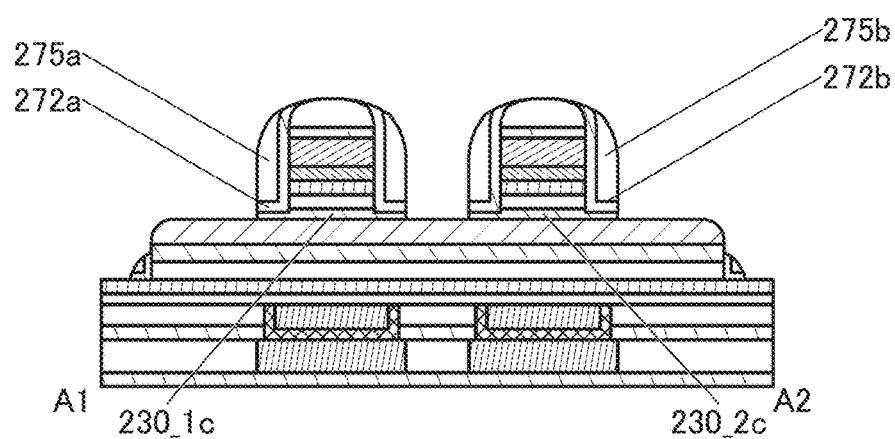
Figure 14A:
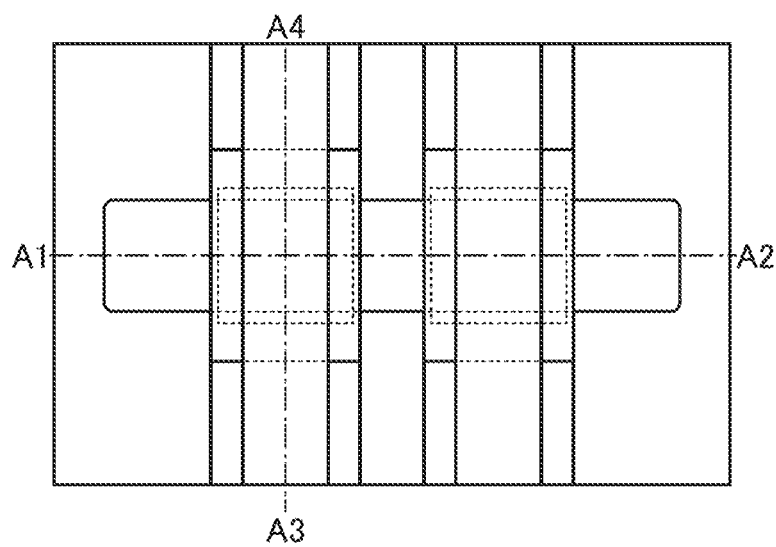
FIGS. 14A to 14C are a top view and cross sections illustrating a method for manufacturing a semiconductor device according to one embodiment of the present invention.
Figure 14C:
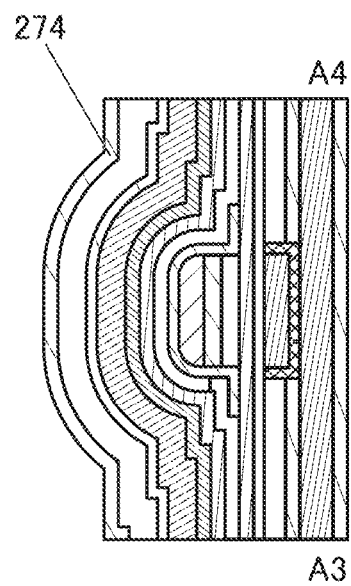
Figure 14B:
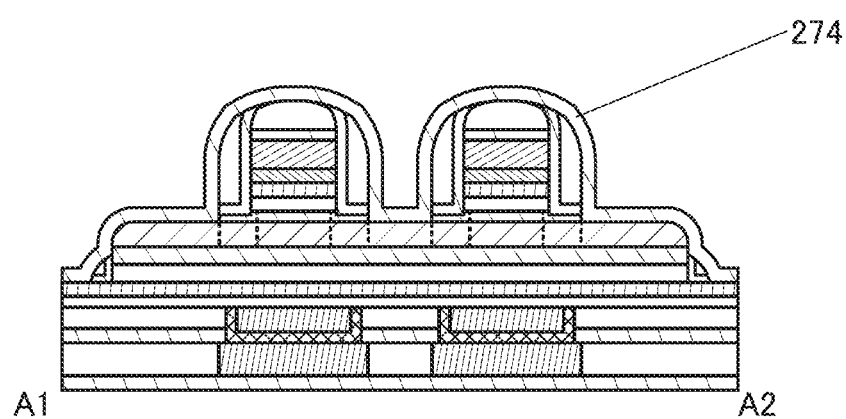

Next, an oxide film to be the oxide 230c is formed over the insulator 222 and the oxide 230b and is processed to form the oxide 230c (see FIGS. 9A to 9C).

The oxide film to be the oxide 230c can be formed by a sputtering method, a CVD method, an MBE method, a PLD method, an ALD method, or the like.

The oxide film to be the oxide 230c may be processed into an island shape to form the oxide 230c. When the oxide film to be the oxide 230c is processed into an island shape before the formation of the insulator 250a, the insulator 250b, the conductor 260_1, and the conductor 260_2, part of the oxide film to be the oxide 230c positioned below the insulator 250a, the insulator 250b, the conductor 260_1, and the conductor 2602, which are formed in a later process, can be removed. Thus, the oxide film to be the oxides 230c for adjacent cells is separated and the leakage current between the cells can be prevented, which is preferable.

The oxide film to be the oxide 230c can be processed by a dry etching method and a wet etching method.

Next, an insulating film 250, an insulating film 252, a conductive film 260A, a conductive film 260B, an insulating film 270, and an insulating film 271 are formed in this order over the insulator 222 and the oxide 230c (see FIGS. 9A to 9C).

The insulating film 250 and the insulating film 252 can be formed by a sputtering method, a CVD method, an MBE method, a PLD method, an ALD method, or the like. Here, when the insulating film 252 is formed in an atmosphere containing oxygen by a sputtering method, oxygen can be added to the insulating film 250.

Here, fourth heat treatment can be performed. For the fourth heat treatment, the conditions for the first heat treatment can be used. The fourth heat treatment can reduce the moisture concentration and the hydrogen concentration in the insulating film 250. Note that the fourth heat treatment is not necessarily performed in some cases.

The conductive film 260A and the conductive film 260B can be deposited by a sputtering method, a CVD method, an MBE method, a PLD method, an ALD method, or the like.

The insulating film 270 and the insulating film 271 can be formed by a sputtering method, a CVD method, an MBE method, a PLD method, an ALD method, or the like. In particular, the insulating film 270 is preferably formed by an ALD method. When the insulating film 270 is deposited by an ALD method, the film thickness can be approximately 0.5 nm to 10 nm inclusive, preferably approximately 0.5 nm to 3 nm inclusive. Note that the formation of the insulating film 270 can be omitted.

The insulating film 271 can be used as a hard mask used when the conductive film 260A and the conductive film 260B are processed. Furthermore, the insulating film 271 can have a layered structure. For example, silicon nitride oxide and silicon nitride over the silicon nitride oxide may be provided.

Here, fifth heat treatment can be performed. For the heat treatment, the conditions for the first heat treatment can be used. Note that the fifth heat treatment is not necessarily performed in some cases.

Next, the insulating film 271 is etched by a lithography method to form the insulator 271a and the insulator 271b. Then, the insulating film 250, the insulating film 252, the conductive film 260A, the conductive film 260B, and the insulating film 270 are etched using the insulator 271a and the insulator 271b as hard masks to form the insulator 250a, the insulator 252a, the conductor 260_1a, the conductor 260_1b, the insulator 270a, the insulator 250b, the insulator 252b, the conductor 260_2a, the conductor 260_2b, and the insulator 270b (see FIGS. 10A to 10C).

Here, a cross section of a structure including the insulator 250a, the insulator 252a, the conductor 260_1a, the conductor 260_1b, and the insulator 270a is preferably tapered as little as possible. Similarly, a cross section of a structure including the insulator 250b, the insulator 252b, the conductor 260_2a, the conductor 260_2b, and the insulator 270b is preferably tapered as little as possible. An angle between the bottom surface of the oxide 230 and each of the side surfaces of the insulator 250a, the insulator 252a, the conductor 260_1a, the conductor 260_1b, and the insulator 270a is preferably greater than or equal to 800 and less than or equal to 1000. Similarly, an angle between the bottom surface of the oxide 230 and each of the side surfaces of the insulator 250b, the insulator 252b, the conductor 260_2a, the conductor 260_2b, and the insulator 270b is preferably greater than or equal to 800 and less than or equal to 1000. In that case, the insulator 275a and the insulator 274a are likely to be left in a later formation step of the insulator 275a and the insulator 274a. Similarly, the insulator 275b and the insulator 274b are likely to be left when the insulator 275b and the insulator 274b are formed.

Note that an upper portion of the oxide 230c in a region not overlapping with the insulator 250a and the insulator 250b may be etched by the above etching. In that case, the oxide 230c is thicker in a region overlapping with the insulator 250a and the insulator 250b than in the region not overlapping with the insulator 250a and the insulator 250b.

Next, an insulating film 272 is formed to cover the oxide 230c, the insulator 250a, the insulator 252a, the conductor 260_1, the insulator 270a, the insulator 271a, the insulator 250b, the insulator 252b, the conductor 260_2, the insulator 270b, and the insulator 271b. The insulating film 272 can be deposited by a sputtering method, a CVD method, an MBE method, a PLD method, an ALD method, or the like. In this embodiment, aluminum oxide is formed by an ALD method as the insulating film 272 (see FIGS. 11A to 11C).

Here, the region 231 and the junction region 232 may be formed by an ion implantation method, an ion doping method by which an ionized source gas is added without mass separation, a plasma immersion ion implantation method, or the like. The ion cannot reach the oxide 230 in the region overlapping with the insulator 250a and the insulator 250b, whereas the ion can reach the oxide 230 in the region not overlapping with the insulator 250a and the insulator 250b; thus, the region 231 and the junction region 232 can be formed in a self-aligned manner. Furthermore, damage to the oxide 230 during the implantation can be reduced by performing the above-described method through the insulating film 272.

In the case of performing mass separation by an ion doping method, a plasma immersion ion implantation method, and the like, ion species to be added and its concentration can be controlled properly. On the other hand, in the case of not performing mass separation, ions at a high concentration can be added in a short time. Alternatively, an ion doping method in which atomic or molecular clusters are generated and ionized may be employed. Instead of the term "dopant", the term "ion", "donor", "acceptor", "impurity", "element", or the like may be used.

As the dopant, the element that forms oxygen vacancies, the element bonded to oxygen vacancies, or the like is used. Typical examples of the element are hydrogen, boron, carbon, nitrogen, fluorine, phosphorus, sulfur, chlorine, titanium, and a rare gas element. Typical examples of the rare gas element are helium, neon, argon, krypton, and xenon.

Next, the insulating film 275 is formed. The insulating film 275 can be formed by a sputtering method, a CVD method, an MBE method, a PLD method, or an ALD method. In this embodiment, as the insulating film 275, silicon oxide is formed by a CVD method (see FIGS. 12A to 12C).

Next, the insulating film 275 is subjected to anisotropic etching, whereby the oxide 230c, the insulating film 272, and the insulating film 275 are processed into the oxide 230_1c, the insulator 272a, the insulator 275a, the oxide 230_2c, the insulator 272b, and the insulator 275b. The insulator 275a is formed to be in contact with the insulator 272a and the insulator 275b is formed to be in contact with the insulator 272b. Dry etching is preferably performed as the anisotropic etching. In this manner, the oxide 230c, the insulating film 272, and the insulating film 275 in regions on a plane substantially parallel to the substrate surface can be removed, so that the oxide 2301c, the oxide 230_2c, the insulator 275a, and the insulator 275b can be formed in a self-aligned manner (see FIGS. 13A to 13C).

Next, an insulating film 274 is formed. The insulating film 274 is preferably formed in an atmosphere containing at least one of nitrogen and hydrogen. In that case, oxygen vacancies are formed mainly in a region of the oxide 230b that overlaps with neither the insulator 250a nor the insulator 250b and the oxygen vacancies and impurity elements such as nitrogen or hydrogen are bonded to each other, leading to an increase in carrier density. In this manner, the region 231 and the junction region 232 with reduced resistance can be formed. In particular, in addition to oxygen vacancies formed by the ion implantation, oxygen vacancies can be formed in the region 231 owing to the formation of the insulating film 274; thus, the region 231 can have a higher carrier density. For the insulating film 274, for example, silicon nitride or silicon nitride oxide can be deposited by a CVD method. In this embodiment, silicon nitride oxide is used for the insulating film 274. Here, the insulating film 274 and the oxide 230b are not in contact with each other in regions of the oxide 230b that overlap with the insulator 275a and the insulator 275b; thus, excessive bonds of oxygen vacancies of the oxide 230b that are generated by the formation of the insulating film 274 and impurity elements such as nitrogen or hydrogen can be inhibited (see FIGS. 14A to 14C).

As described above, in the method for manufacturing a semiconductor device described in this embodiment, a source region and a drain region can be formed in a self-aligned manner owing to the formation of the insulating film 274, even in a minute transistor whose channel length is approximately 10 nm to 30 nm. Thus, minute or highly integrated semiconductor devices can be manufactured with high yield.

Figure 15A:
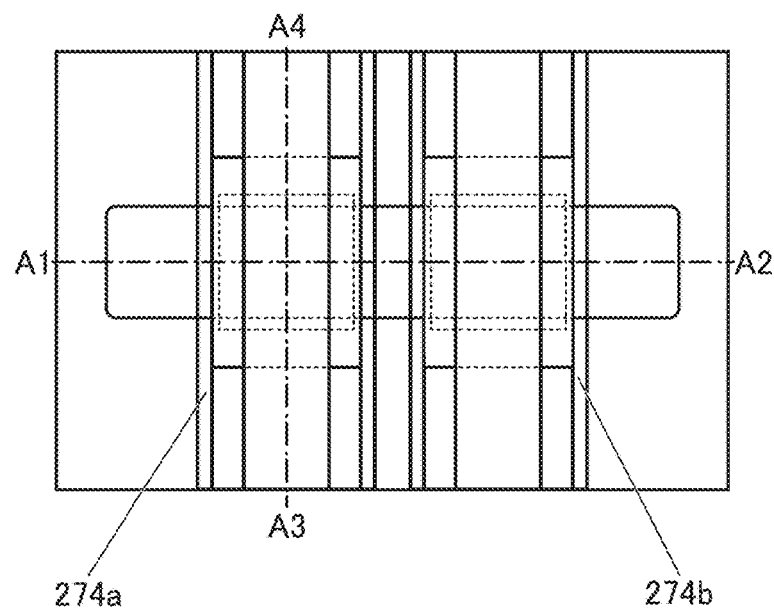
FIGS. 15A to 15C are a top view and cross sections illustrating a method for manufacturing a semiconductor device according to one embodiment of the present invention.
Figure 15C:
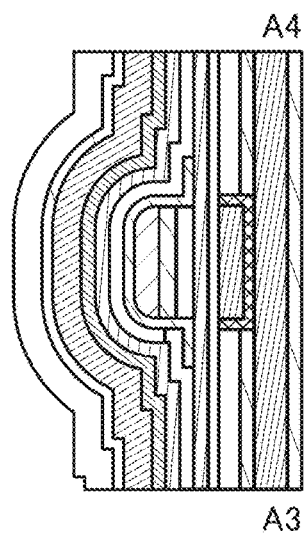
Figure 15B:
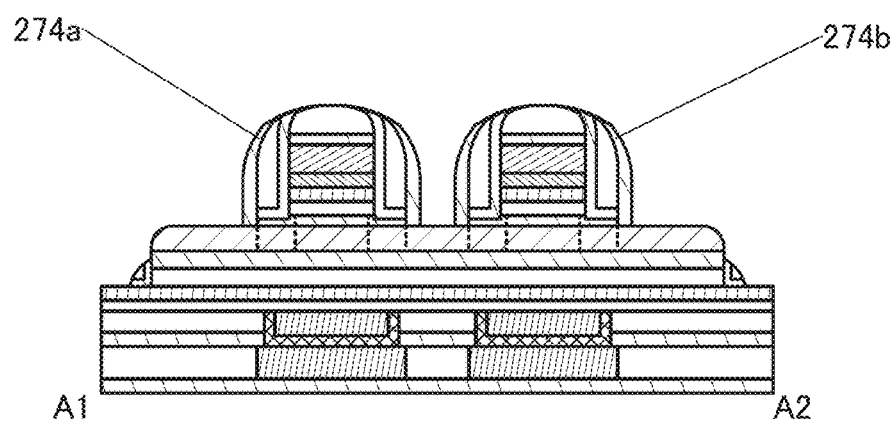
Figure 16A:
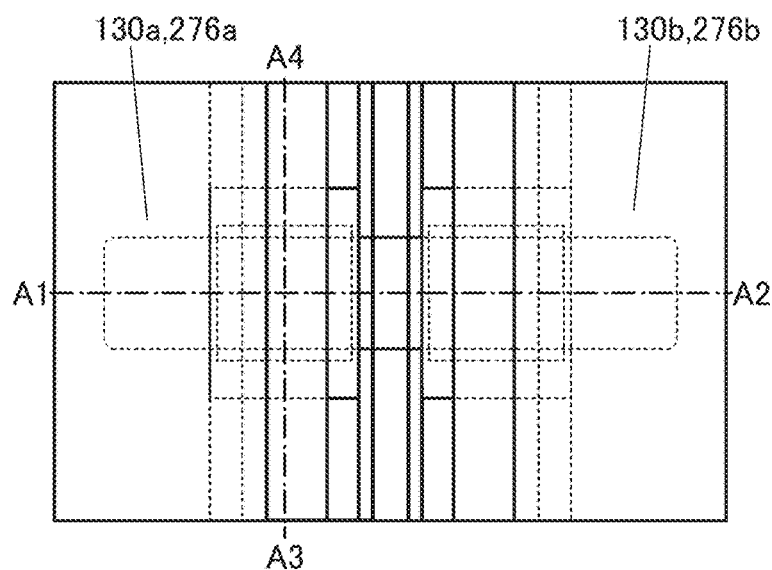
FIGS. 16A to 16C are a top view and cross sections illustrating a method for manufacturing a semiconductor device according to one embodiment of the present invention.
Figure 16C:
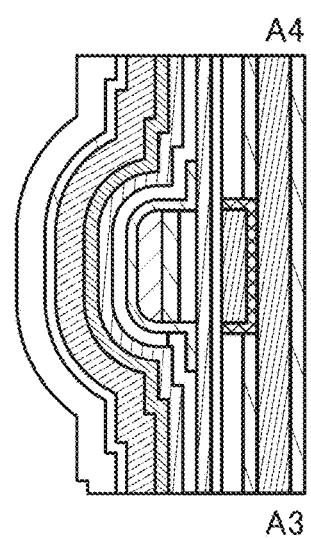
Figure 16B:
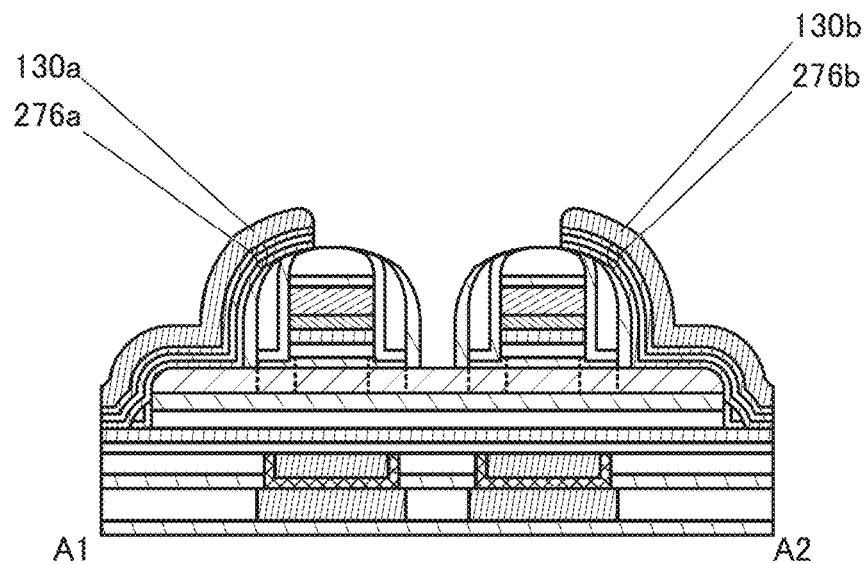
Figure 18A:
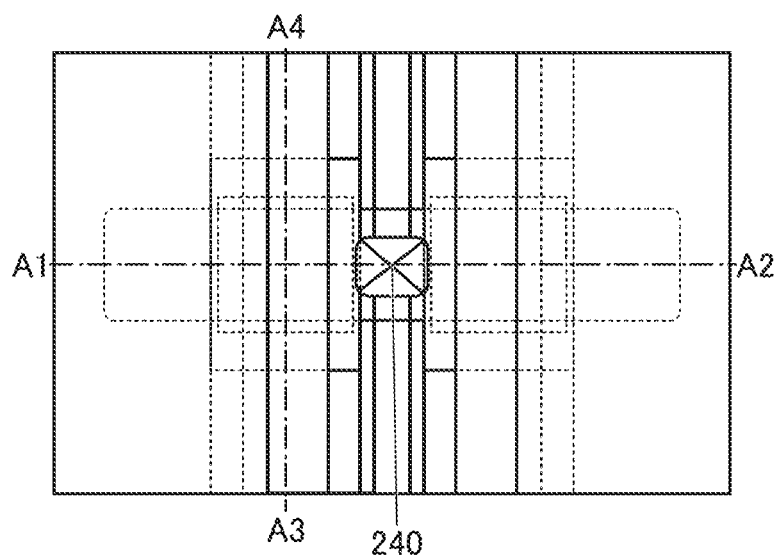
FIGS. 18A to 18C are a top view and cross sections illustrating a method for manufacturing a semiconductor device of one embodiment of the present invention.
Figure 18C:
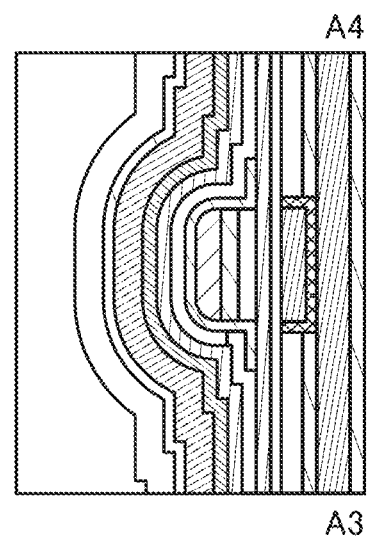
Figure 18B:
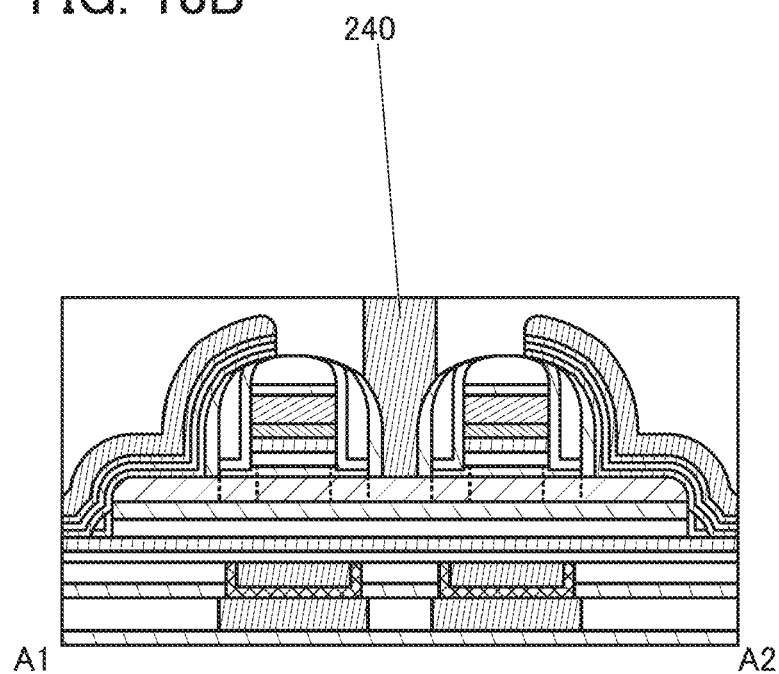

Next, the insulating film 274 is subjected to anisotropic etching to form the insulator 274a and the insulator 274b. Dry etching is preferably performed as the anisotropic etching. In this manner, the insulating film 274 in regions on the plane substantially parallel to the substrate surface is removed, so that the insulator 274a and the insulator 274b can be formed in a self-aligned manner (FIGS. 15A to 15C).

Next, an insulating film to be the insulator 276a and the insulator 276b is formed. The insulating film to be the insulator 276a and the insulator 276b can be formed by a sputtering method, a CVD method, an MBE method, a PLD method, an ALD method, or the like. The insulating film to be the insulator 276a and the insulator 276b functions as the dielectrics of the capacitor 100a and the capacitor 100b. Thus, the insulating film to be the insulator 276a and the insulator 276b is preferably formed using an insulating film having a high dielectric constant. For example, an insulator including an oxide containing one of or both aluminum and hafnium can be used. Aluminum oxide, hafnium oxide, an oxide containing aluminum and hafnium (hafnium aluminate), or the like can be used for the insulator including an oxide containing one of or both aluminum and hafnium.

Furthermore, the insulating film to be the insulator 276a and the insulator 276b may have a layered structure including two or more materials selected from silicon oxide, silicon oxynitride, silicon nitride oxide, silicon nitride, aluminum oxide, hafnium oxide, an oxide containing aluminum and hafnium (hafnium aluminate), and the like. In this embodiment, hafnium oxide, aluminum oxide, and hafnium oxide are formed in this order by an ALD method.

Next, a conductive film to be the conductor 130a and the conductor 130b is formed. The conductive film to be the conductor 130a and the conductor 130b can be formed by a sputtering method, a CVD method, an MBE method, a PLD method, an ALD method, or the like.

Next, part of the conductive film to be the conductor 130a and the conductor 130b is etched by a lithography method to form the conductor 130a and the conductor 130b. Part of the insulating film to be the insulator 276a and the insulator 276b may be successively etched to form the insulator 276a and the insulator 276b. In that case, different etching gases may be used for the etching of the part of the conductive film to be the conductor 130a and the conductor 130b and the etching of the part of the insulating film to be the insulator 276a and the insulator 276b (see FIGS. 16A to 16C).

Next, the insulator 280 is formed. The insulator 280 can be formed by a sputtering method, a CVD method, an MBE method, a PLD method, an ALD method, or the like. Alternatively, the insulator 280 can be formed by a spin coating method, a dipping method, a droplet discharging method (such as an ink-jet method), a printing method (such as screen printing or offset printing), a doctor knife method, a roll coater method, a curtain coater method, or the like. In this embodiment, silicon oxynitride is used for the insulator 280.

The insulator 280 is preferably formed to have a flat top surface. For example, the insulator 280 may have a flat top surface right after the formation. Alternatively, for example, the insulator 280 may have a flat top surface by removing the insulator or the like from the top surface after the formation so that the top surface becomes parallel to a reference surface such as a rear surface of the substrate. Such treatment is referred to as planarization treatment. As the planarization treatment, for example, chemical mechanical polishing (CMP) treatment, dry etching treatment, or the like can be performed. In this embodiment, CMP treatment is performed as the planarization treatment. Note that the top surface of the insulator 280 does not necessarily have planarity.

Next, an opening reaching the region 231 of the oxide 230 is formed in the insulator 280 (see FIGS. 17A to 17C). The opening is formed by a lithography method. Here, the opening is provided so that the conductor 240 can be in contact with a side surface of the insulator 274a and a side surface of the insulator 274b. The opening is preferably formed under a condition where the insulator 274a and the insulator 274b are hardly etched, in other words, the etching rate of the insulator 280 is preferably higher than that of the insulator 274a and the insulator 274b. When the etching rate of the insulator 274a and the insulator 274b is set to 1, the etching rate of the insulator 280 is preferably set to 5 or more, further preferably 10 or more. With such an opening condition, the opening can be positioned near the region 231 in a self-aligned manner; thus, a miniaturized transistor can be manufactured. Tolerance of misalignment of the conductor 260_1, the conductor 260_2, and the opening can be extended in a lithography process; thus, the yield should be improved.

Here, the region 231 may be subjected to ion implantation by an ion implantation method, an ion doping method by which an ionized source gas is added without mass separation, a plasma immersion ion implantation method, or the like. Ions cannot reach the oxide 230 except in the opening because of the insulator 280. In other words, ions are implanted into the opening in a self-aligned manner. Due to this ion implantation, the carrier density of the region 231 in the opening can be increased, and thus the contact resistance between the conductor 240 and the region 231 can be reduced in some cases.

In the case where mass separation is performed by an ion doping method, a plasma immersion ion implantation method, or the like, ion species to be added and its concentration can be controlled properly. On the other hand, in the case of not performing mass separation, ions at a high concentration can be added in a short time. Alternatively, an ion doping method in which atomic or molecular clusters are generated and ionized may be employed. Instead of the term "dopant", the term "ion", "donor", "acceptor", "impurity", "element", or the like may be used.

As the dopant, the element that forms oxygen vacancies, the element bonded to oxygen vacancies, or the like is used. Typical examples of the element are hydrogen, boron, carbon, nitrogen, fluorine, phosphorus, sulfur, chlorine, titanium, and a rare gas element. Typical examples of the rare gas element are helium, neon, argon, krypton, and xenon.

Next, a conductive film to be the conductor 240 is formed. The conductive film to be the conductor 240 desirably has a layered structure which includes a conductor having a function of inhibiting the passage of impurities such as water or hydrogen. For example, a layered structure of tantalum nitride, titanium nitride, or the like and tungsten, molybdenum, copper, or the like can be employed. The conductive film to be the conductor 240 can be formed by a sputtering method, a CVD method, an MBE method, a PLD method, an ALD method, or the like.

Next, CMP treatment is performed to remove the conductive film to be the conductor 240 that is over the insulator 280. As a result, the conductive film remains only in the opening, so that the conductor 240 having flat top surface can be formed (see FIGS. 18A to 18C).

Furthermore, the conductor 240 may be formed after aluminum oxide is formed on a side wall portion of the opening. By forming aluminum oxide on the side wall portion of the opening, the passage of oxygen from the outside can be inhibited and oxidation of the conductor 240 can be prevented. Furthermore, impurities such as water or hydrogen can be prevented from being diffused from the conductor 240 to the outside. The aluminum oxide can be formed by forming aluminum oxide in the opening by an ALD method or the like and then performing anisotropic etching.

Through the above steps, the semiconductor device including the transistor 200*a*, the transistor 200*b*, the capacitor 100*a*, and the capacitor 100*b* illustrated in FIGS. 1A to 1C can be manufactured.

<Modification Example of Semiconductor Device>

Figure 20:
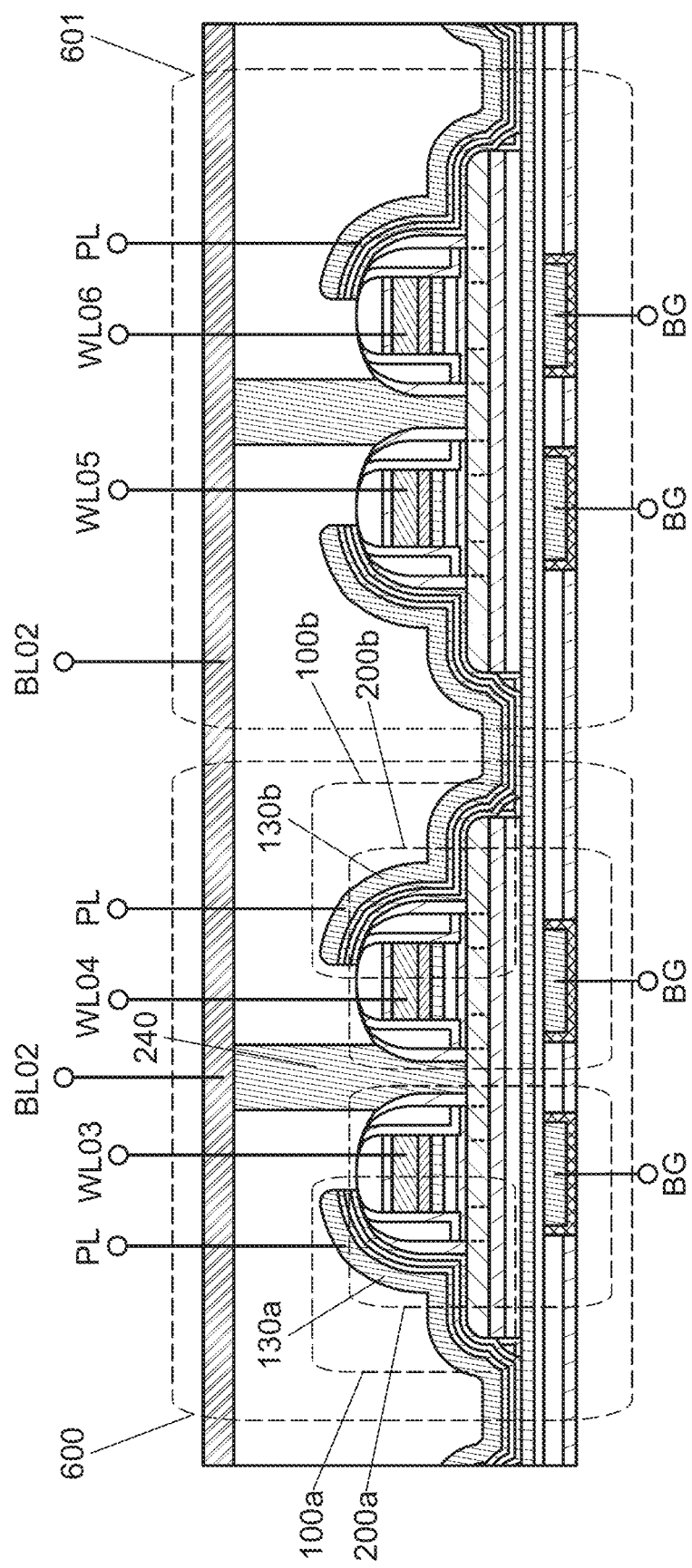
FIG. 20 is a cross section illustrating a structure of a memory device according to one embodiment of the present invention.

In the above description, the semiconductor device including the transistor 200*a*, the transistor 200*b*, the capacitor 100*a*, and the capacitor 100*b* is given as a structural example; however, the semiconductor device according to this present embodiment is not limited to this example. For example, as illustrated in FIG. 20, a structure in which a cell 600 and a cell 601 having a structure similar to that of the cell 600 are connected through a capacitor portion may be employed. Note that in this specification, the semiconductor device including the transistor 200*a*, the transistor 200*b*, the capacitor 100*a*, and the capacitor 100*b* is referred to as a cell. The above descriptions for the transistor 200*a*, the transistor 200*b*, the capacitor 100*a*, and the capacitor 100*b* can be referred to for the structures of the transistor 200*a*, the transistor 200*b*, the capacitor 100*a*, and the capacitor 100*b*.

FIG. 20 is a cross section of the cell 600 including the transistor 200*a*, the transistor 200*b*, the capacitor 100*a*, and the capacitor 100*b* and the cell 601 having a structure similar to that of the cell 600 that are connected through a capacitor portion.

As shown in FIG. 20, the conductor 130*b* functioning as the other electrode of the capacitor 100*b* which is included in the cell 600 also functions as the other electrode of a capacitor which is included in the cell 601. Furthermore, the conductor 130*a* that functions as the other electrode of the capacitor 100*a* included in the cell 600 also functions as the other electrode of a capacitor included in the adjacent cell on the left side of the cell 600, although not shown. The same applies to the cell on the cell on the right side of the cell 601. Thus, a cell array can be formed. With this structure of the cell array, the space between the adjacent cells can be reduced; thus, the projected area of the cell array can be reduced and high integration can be achieved.

When the transistor 200*a*, the transistor 200*b*, the capacitor 100*a*, and the capacitor 100*b* are formed to have the structures described in this embodiment as described above, the area of the cell can be reduced and the semiconductor device can be miniaturized or highly integrated.

[Configuration of Cell Array]

Figure 21:
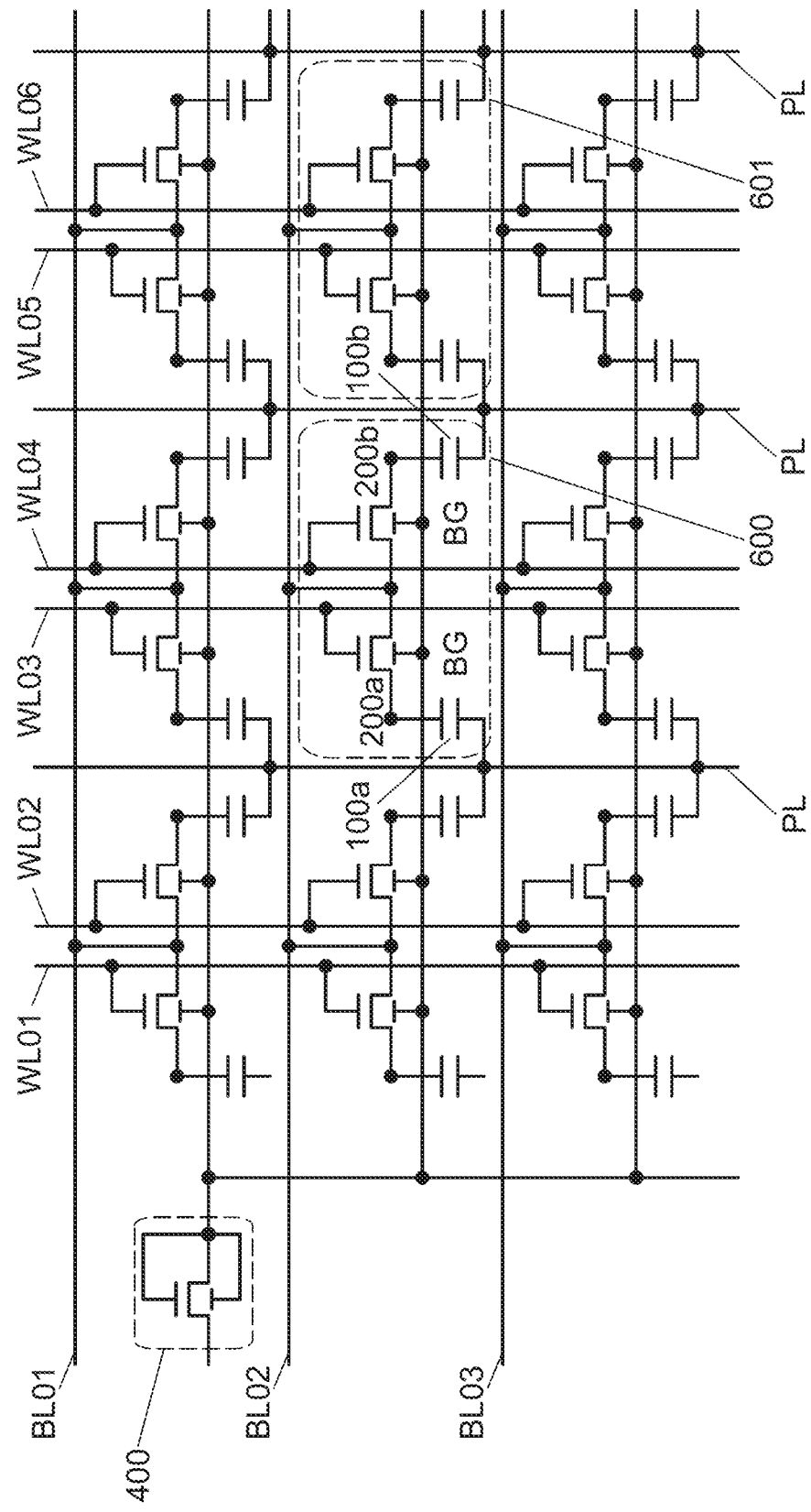
FIG. 21 is a circuit diagram of a memory device according to one embodiment of the present invention.

FIG. 21 illustrates an example of a cell array of this embodiment. For example, the cells each having the structure illustrated in FIG. 20 can be arranged in a matrix to form a cell array.

FIG. 21 is a circuit diagram showing an embodiment in which the structure of the cell in FIG. 20 is arranged in a matrix. In the cell array shown in FIG. 21, wirings BL extend in a row direction and wirings WL extend in a column direction.

As illustrated in FIG. 21, one of the source and the drain of each of the transistor 200*a* and the transistor 200*b* which are included in the cell is electrically connected to the common wiring BL (BL01, BL02, and BL03). Furthermore, the wiring BL are also electrically connected to one of the source and the drain of each of the transistors 200*a* and 200*b* included in the cells 600 and 601 arranged in the row direction. The first gate of the transistor 200*a* and the first gate of the transistor 200*b* which are included in the cell 600 are electrically connected to different wirings WL (WL01 to WL06). Furthermore, these wirings WL are electrically connected to the first gates of the transistors 200*a* and the first gates of the transistors 200*b* which are included in the cells 600 arranged in the column direction.

For example, the conductor 240 is electrically connected to the BL02, the conductor 260_1 is electrically connected to the WL03, and the conductor 260_2 is electrically connected to the WL04 as shown in the cell 600 which is connected to the BL02, the WL03, and the WL04 in FIG. 21.

In addition, the transistor 200*a* and the transistor 200*b* which are included in each of the cell 600 and the cell 601 may each be provided with a second gate BG. The threshold voltage of the transistor can be controlled by a potential applied to the BG. The BG is connected to a transistor 400 and the potential applied to the BG can be controlled by the transistor 400. Furthermore, the conductor 130*a* of the capacitor 100*a* and the conductor 130*b* of the capacitor 100*b* which are included in the cell 600 are electrically connected to different wirings PL.

Figure 22:
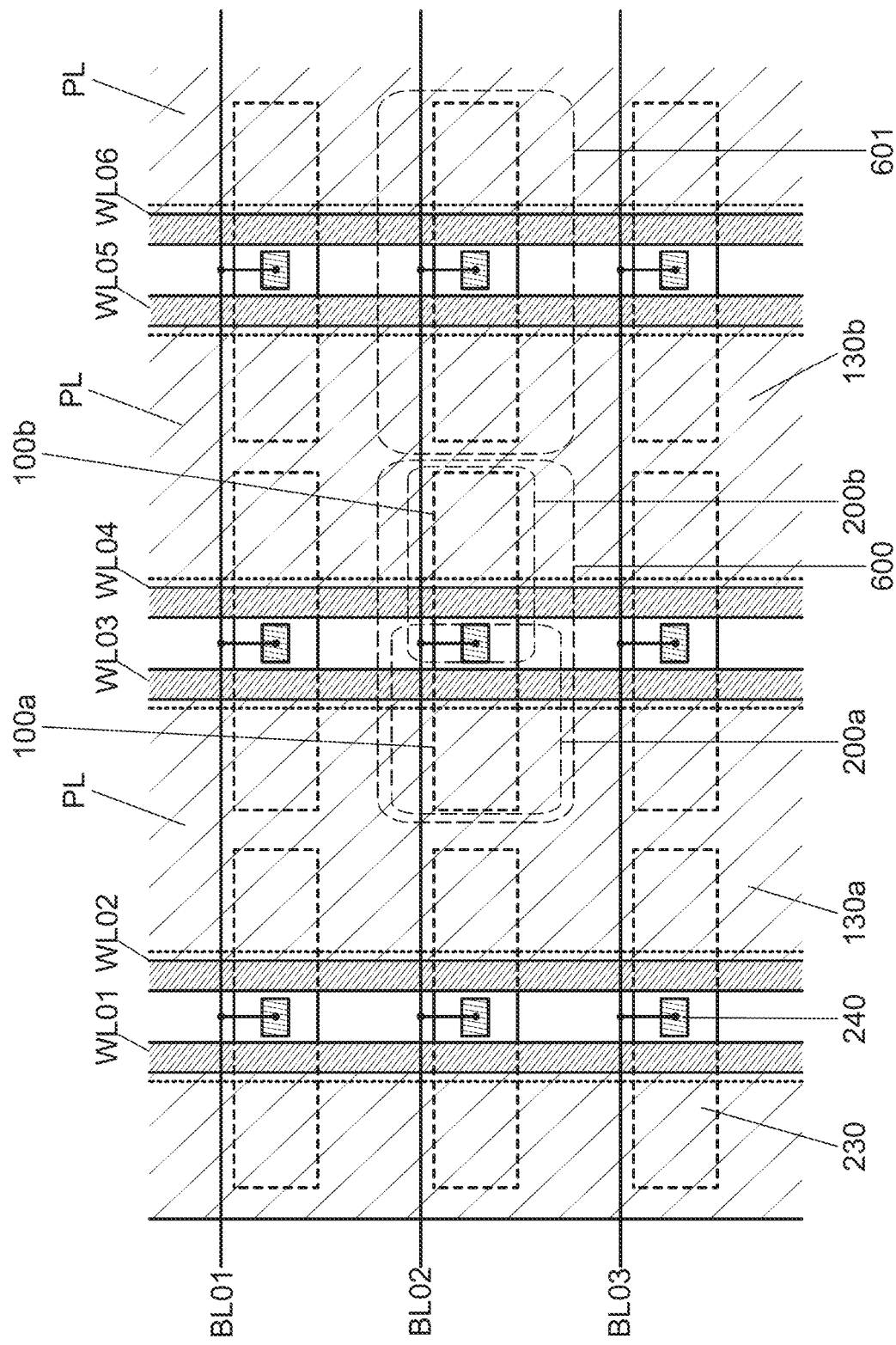
FIG. 22 is a top view illustrating a configuration example of a memory device according to one embodiment of the present invention.

Furthermore, FIG. 22 illustrates a schematic view showing a layout of the wirings WL and the oxides 230 of the circuit diagram shown in FIG. 21. As shown in FIG. 22, the oxides 230 and the wirings WL are arranged in a matrix; thus, the semiconductor device of the circuit diagram shown in FIG. 21 can be formed. Here, the wirings BL are preferably provided in a layer different from the wirings WL and the oxides 230.

Figure 23:
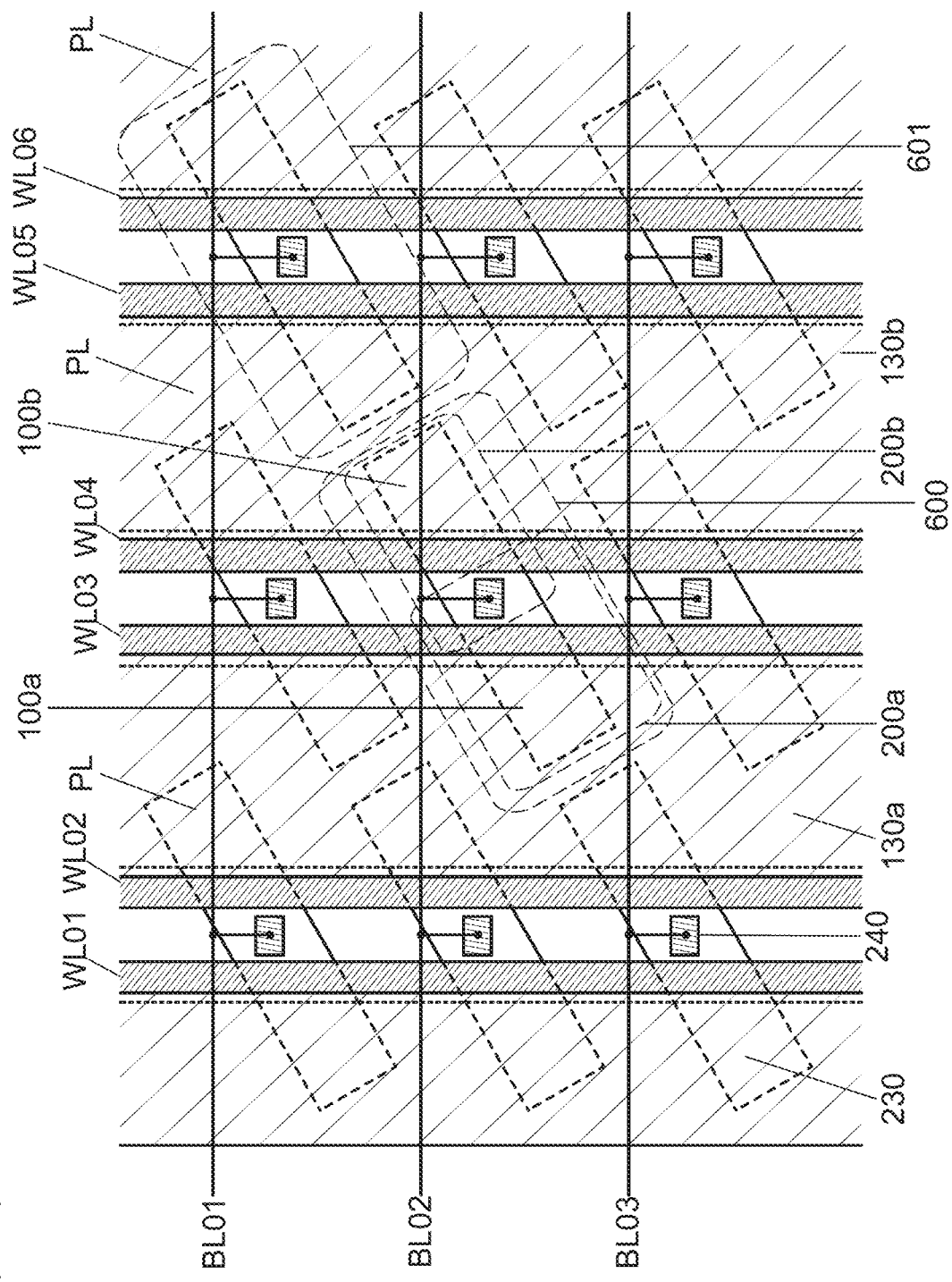
FIG. 23 is a top view illustrating a configuration example of a memory device according to one embodiment of the present invention.

Furthermore, the oxides 230 and the wirings WL are provided so that the long sides of the oxides 230 are substantially orthogonal to the extending direction of the wirings WL in FIG. 22; however, the present invention is not limited thereto. For example, as shown in FIG. 23, the long side of the oxide 230 is not orthogonal to the extending direction of the wirings WL and the long side of the oxide 230 may be inclined to the extending direction of the wirings WL. For example, the oxide 230 and the wiring WL may be provided so that an angle between the long side of the oxide 230 and the wiring WL is more than or equal to 200 and less than or equal to 700, preferably more than or equal to 300 and less than or equal to 600.

By arranging the oxides 230 such that they are inclined to the extending direction of the wirings WL, an area occupied by the cell array can be made small.

Figure 24:
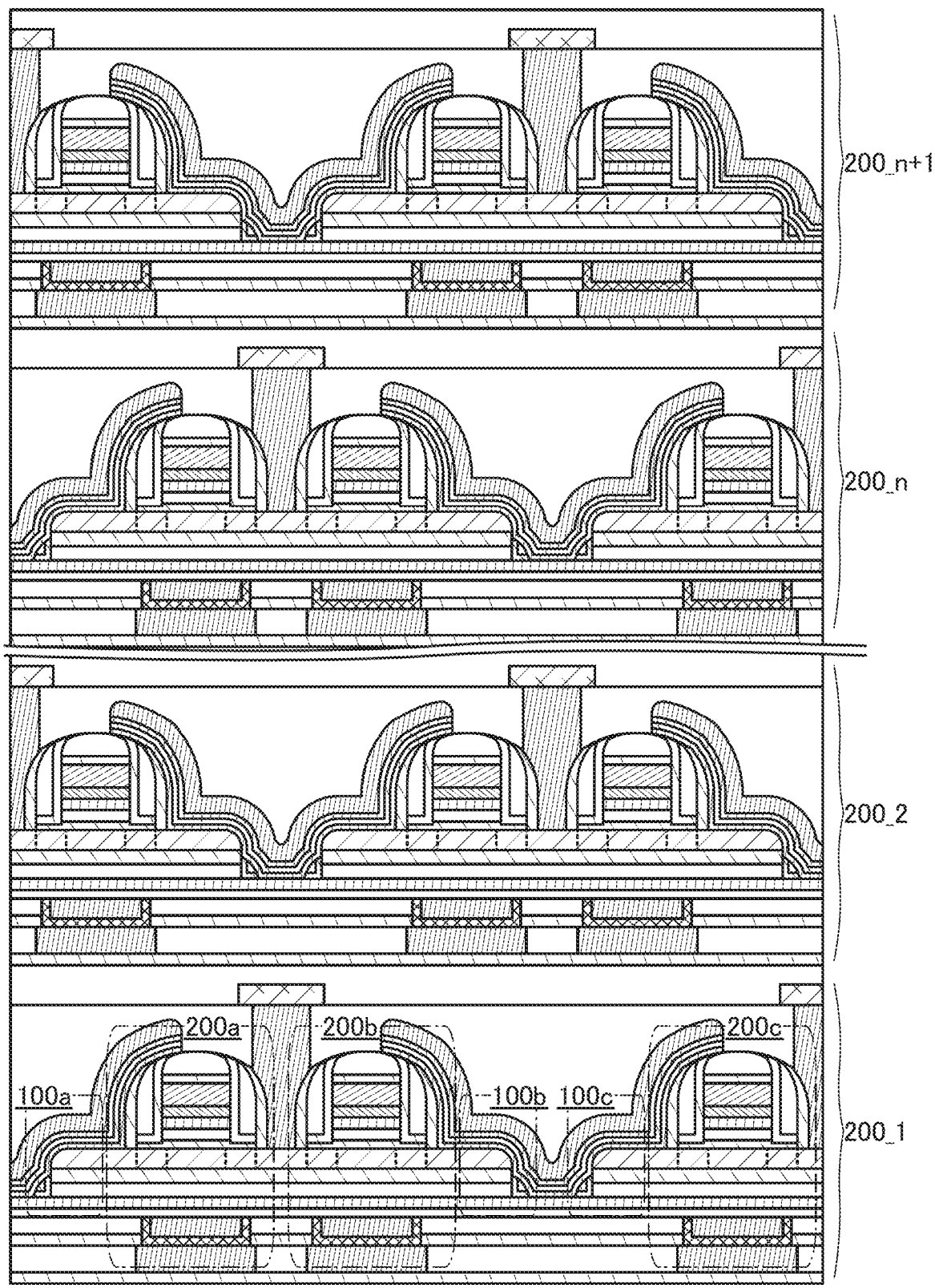
FIG. 24 is a cross section illustrating a structure of a memory device according to one embodiment of the present invention.

Furthermore, stacked cell arrays may be used instead of the single-layer cell array. FIG. 24 shows a cross section of n+1 layers of cell arrays that are stacked. As shown in FIG. 24, by stacking a plurality of cell arrays, the cells can be integrated without an increase in the area occupied by the cell arrays. In other words, a 3D cell array can be formed.

Alternatively, according to one embodiment of the present invention, a semiconductor device that can be miniaturized or highly integrated can be provided. Alternatively, according to one embodiment of the present invention, a semiconductor device having favorable electrical characteristics can be provided. Alternatively, according to one embodiment of the present invention, a semiconductor device with low off-state current can be provided. Alternatively, according to one embodiment of the present invention, a transistor with high on-state current can be provided. One embodiment of the present invention can provide a highly reliable semiconductor device. Alternatively, according to one embodiment of the present invention, a semiconductor device with low power consumption can be provided. Alternatively, according to one embodiment of the present invention, a semiconductor device that can be manufactured with high productivity can be provided.

As described above, the structures, methods, and the like described in this embodiment can be combined with any of the structures, methods, and the like described in the other embodiments as appropriate.

Embodiment 2

In this embodiment, one embodiment of a semiconductor device will be described with reference to FIGS. 25A and 25B.

[Memory Device 1]

Figure 25A:
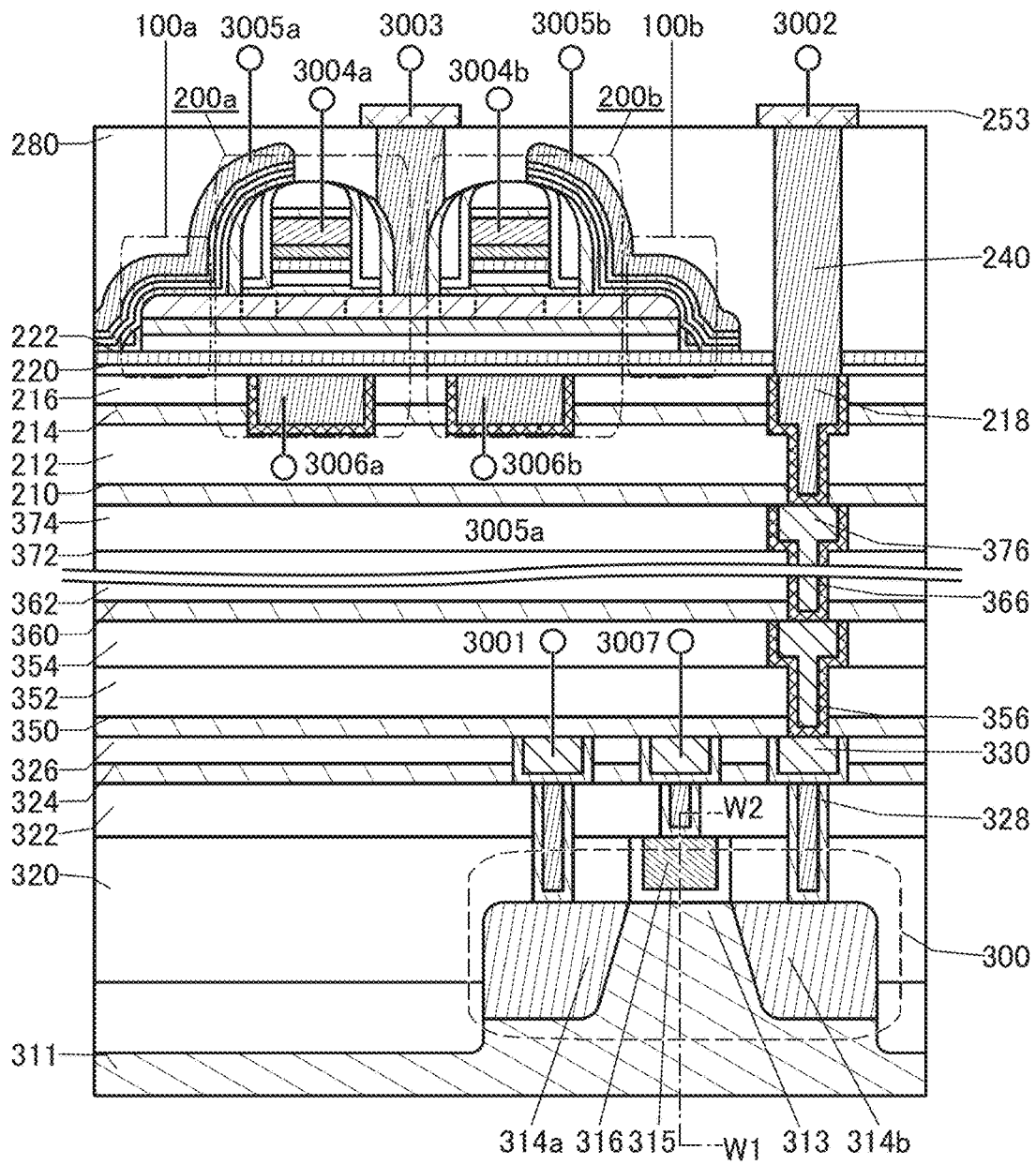
FIGS. 25A and 25B are cross sections illustrating a structure of a memory device according to one embodiment of the present invention.

The memory device shown in FIG. 25A includes the transistor 200a, the capacitor 100a, the transistor 200b, the capacitor 100b, and the transistor 300. FIG. 25A is a cross section of the transistor 200a, the transistor 200b, and the transistor 300 in the channel length direction. FIG. 25B is a cross section taken along dashed-dotted line W1-W2 in FIG. 25A. Thus, FIG. 25B is a cross section of the transistor 300 and the vicinity thereof in the channel width direction.

The transistor 200a and the transistor 200b are transistors in which a channel is formed in a semiconductor layer including an oxide semiconductor. Since the off-state current of the transistor 200a and the transistor 200b are small, by using the transistor 200a and the transistor 200b in a memory device, stored data can be retained for a long time. In other words, such a memory device does not require refresh operation or has an extremely low frequency of the refresh operation, which leads to a sufficient reduction in power consumption.

In the memory device of FIG. 25A, a wiring 3001 is electrically connected to one of the source and the drain of the transistor 300. A wiring 3002 is electrically connected to the other of the source and the drain of the transistor 300. A wiring 3007 is electrically connected to the gate of the transistor 300. Furthermore, a wiring 3003 is electrically connected to one of the source and the drain of the transistor 200a and one of the source and the drain of the transistor 200b. A wiring 3004a is electrically connected to the first gate of the transistor 200a, a wiring 3004b is electrically connected to the first gate of the transistor 200b, a wiring 3006a is electrically connected to the second gate of the transistor 200a, and a wiring 3006b is electrically connected to the second gate of the transistor 200b. Furthermore, a wiring 3005a is electrically connected to one electrode of the capacitor 100a and a wiring 3005b is electrically connected to one electrode of the capacitor 100b.

The semiconductor device illustrated in FIG. 25A can be used for a memory device including an oxide transistor, such as a DOSRAM described later. Since the potential of the other of the source and the drain (also referred to the other electrode of the capacitor 100a and the capacitor 100b) can be retained owing to the low off-state current of the transistor 200a and the transistor 200b, data can be written, retained, and read.

<Structure of Memory Device 1>

The semiconductor device of one embodiment of the present invention includes the transistor 300, the transistor 200a, the transistor 200b, the capacitor 100a, and the capacitor 100b as illustrated in FIG. 25A. The transistor 200a and the transistor 200b are provided above the transistor 300, and the transistor 200a, the transistor 200b, the capacitor 100a, and the capacitor 100b are positioned in the same layer. Note that the above embodiment can be referred to for the structure of the transistor 200a, the transistor 200b, the capacitor 100a, and the capacitor 100b.

The transistor 300 is provided over a substrate 311 and includes a conductor 316, an insulator 315, a semiconductor region 313 that is a part of the substrate 311, and low-resistance regions 314a and 314b functioning as a source region and a drain region.

Figure 25B:
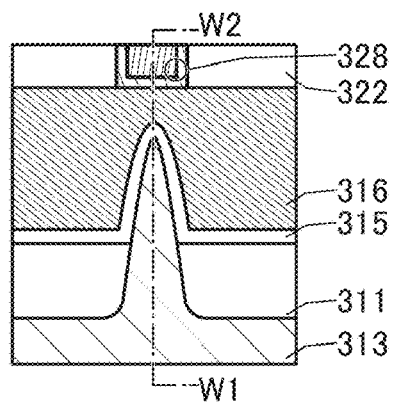

As shown in FIG. 25B, the top surface and the side surface are in the channel width direction of the semiconductor region 313 of the transistor 300 are covered with the conductor 316 with the insulator 315 provided therebetween. The effective channel width is increased in the FIN-type transistor 300, whereby the on-state characteristics of the transistor 300 can be improved. In addition, since contribution of the electric field of the gate electrode can be increased, the off-state characteristics of the transistor 300 can be improved.

The transistor 300 may be a p-channel transistor or an n-channel transistor.

It is preferable that a region of the semiconductor region 313 where a channel is formed, a region in the vicinity thereof, the low-resistance regions 314a and 314b functioning as a source region and a drain region, and the like contain a semiconductor such as a silicon-based semiconductor, further preferably single crystal silicon. Alternatively, a material including germanium (Ge), silicon germanium (SiGe), gallium arsenide (GaAs), gallium aluminum arsenide (GaAlAs), or the like may be contained. Silicon whose effective mass is controlled by applying stress to the crystal lattice and thereby changing the lattice spacing may be contained. Alternatively, the transistor 300 may be a high-electron-mobility transistor (HEMT) with GaAs and GaAlAs or the like.

The low-resistance regions 314a and 314b contain an element which imparts n-type conductivity, such as arsenic or phosphorus, or an element which imparts p-type conductivity, such as boron, in addition to a semiconductor material used for the semiconductor region 313.

The conductor 316 functioning as a gate electrode can be formed using a semiconductor material such as silicon containing the element which imparts n-type conductivity, such as arsenic or phosphorus, or the element which imparts p-type conductivity, such as boron, or a conductive material such as a metal material, an alloy material, or a metal oxide material.

Note that a material used for a conductor determines the work function, whereby a threshold voltage can be adjusted. Specifically, it is preferable to use titanium nitride, tantalum nitride, or the like as the conductor. Furthermore, in order to ensure the conductivity and embeddability of the conductor, it is preferable to use a laminated layer of metal materials such as tungsten and aluminum as the conductor. In particular, tungsten is preferable in terms of heat resistance.

Note that the transistor 300 illustrated in FIG. 25A is only an example and the structure of the transistor 300 is not limited to that illustrated therein; an appropriate transistor may be used in accordance with a circuit configuration or a driving method.

An insulator 320, an insulator 322, an insulator 324, and an insulator 326 are stacked sequentially and cover the transistor 300.

The insulator 320, the insulator 322, the insulator 324, and the insulator 326 can be formed using, for example, silicon oxide, silicon oxynitride, silicon nitride oxide, silicon nitride, aluminum oxide, aluminum oxynitride, aluminum nitride oxide, aluminum nitride, or the like.

The insulator 322 may function as a planarization film for eliminating a level difference caused by the transistor 300 or the like underlying the insulator 322. For example, the top surface of the insulator 322 may be planarized by planarization treatment using a chemical mechanical polishing (CMP) method or the like to increase the level of planarity.

The insulator 324 is preferably formed using a film with a barrier property that prevents hydrogen and impurities from diffusing from the substrate 311, the transistor 300, or the like into regions where the transistor 200a and the transistor 200b are provided.

As an example of the film having a barrier property with respect to hydrogen, silicon nitride formed by a CVD method can be given. Here, diffusion of hydrogen into a semiconductor element including an oxide semiconductor, such as the transistor 200a and the transistor 200b, degrades the characteristics of the semiconductor element in some cases. Therefore, a film that prevents hydrogen diffusion is preferably provided between the transistor 200a, the transistor 200b, and the transistor 300. Specifically, the film that prevents hydrogen diffusion is a film from which hydrogen is less likely to be released.

The amount of released hydrogen can be measured by thermal desorption spectroscopy (TDS), for example. The amount of hydrogen released from the insulator 324 that is converted into hydrogen molecules per unit area of the insulator 324 is less than or equal to $2\times10^{15}$ molecules/cm$^2$, preferably less than or equal to $1\times10^{15}$ molecules/cm$^2$, further preferably less than or equal to $5\times10^{14}$ molecules/cm$^2$ in TDS analysis in a film-surface temperature range of higher than or equal to 50° C. and lower than or equal to 500° C., for example.

Note that the dielectric constant of the insulator 326 is preferably lower than that of the insulator 324. For example, the relative dielectric constant of the insulator 326 is preferably lower than 4, further preferably lower than 3. For example, the relative permittivity of the insulator 326 is preferably 0.7 times or less that of the insulator 324, further preferably 0.6 times or less that of the insulator 324. In the case where a material with a low dielectric constant is used as an interlayer film, the parasitic capacitance between wirings can be reduced.

The conductor 328, the conductor 330, and the like that are electrically connected to the transistor 300 are provided in the insulator 320, the insulator 322, the insulator 324, and the insulator 326. Note that the conductor 328 and the conductor 330 each function as a plug or a wiring. A plurality of conductors functioning as plugs or wirings are collectively denoted by the same reference numeral in some cases. Furthermore, in this specification and the like, a wiring and a plug electrically connected to the wiring may be a single component. That is, there are cases where a part of a conductor functions as a wiring and a part of a conductor functions as a plug.

As a material of each of plugs and wirings (e.g., the conductor 328 and the conductor 330), a conductive material such as a metal material, an alloy material, a metal nitride material, or a metal oxide material can be used in a single-layer structure or a layered structure. It is preferable to use a high-melting-point material that has both heat resistance and conductivity, such as tungsten or molybdenum, and it is particularly preferable to use tungsten. Alternatively, a low-resistance conductive material such as aluminum or copper is preferably used. The use of a low-resistance conductive material can reduce wiring resistance.

A wiring layer may be provided over the insulator 326 and the conductor 330. For example, an insulator 350, an insulator 352, and an insulator 354 are sequentially stacked in FIG. 25A. Furthermore, a conductor 356 is formed in the insulator 350, the insulator 352, and the insulator 354. The conductor 356 functions as a plug or a wiring. Note that the conductor 356 can be formed using a material similar to that used for forming the conductor 328 and the conductor 330.

Note that for example, the insulator 350 is preferably formed using an insulator having a barrier property with respect to hydrogen, like the insulator 324. Furthermore, the conductor 356 preferably includes a conductor having a barrier property against hydrogen. The conductor having a barrier property with respect to hydrogen is formed particularly in an opening portion of the insulator 350 having a barrier property with respect to hydrogen. In such a structure, the transistor 300 can be separated from the transistors 200a and 200b by a barrier layer, so that the diffusion of hydrogen from the transistor 300 into the transistors 200a and 200b can be inhibited.

Note that as the conductor having a barrier property with respect to hydrogen, tantalum nitride may be used, for example. By stacking tantalum nitride and tungsten, which has high conductivity, diffusion of hydrogen from the transistor 300 can be prevented while the conductivity of a wiring is ensured. In this case, a tantalum nitride layer having a barrier property with respect to hydrogen is preferably in contact with the insulator 350 having a barrier property with respect to hydrogen.

In the above, a wiring layer including the conductor 356 is described; however, the memory device of this embodiment is not limited thereto. The memory device may have three or less wiring layers which are similar to the wiring layer including the conductor 356 or may have five or more wiring layers which are similar to the wiring layer including a conductor 356.

Furthermore, a wiring layer may be provided over the insulator 354 and the conductor 356. For example, a wiring layer including an insulator 360, an insulator 362, and a conductor 366 and a wiring layer including an insulator 372, an insulator 374, and a conductor 376 are stacked in this order in FIG. 25A. Furthermore, a plurality of wiring layers may be provided between a wiring layer including the insulator 360, the insulator 362, and the conductor 366 and a wiring layer including the insulator 372, the insulator 374, and the conductor 376. Note that the conductor 366 and the conductor 376 function as plugs or wirings. Furthermore, the insulator 360 to the insulator 374 can be formed using a material similar to that used for forming the insulator.

The insulator 210 and the insulator 212 are stacked sequentially over the insulator 374. It is preferable to use a substance with a barrier property against oxygen or hydrogen for any of the insulator 210 and the insulator 212.

The insulator 210 is preferably formed using, for example, a film having a barrier property that prevents hydrogen or impurities from the substrate 311, a region where the transistor 300 is formed, or the like from diffusing to a region where the transistor 200a and the transistor 200b are formed. Therefore, the insulator 210 can be formed using a material similar to that used for forming the insulator 324.

As an example of the film having a barrier property with respect to hydrogen, silicon nitride deposited by a CVD method can be given. Here, diffusion of hydrogen into the semiconductor element including an oxide semiconductor, such as the transistor 200a and the transistor 200b, degrades the characteristics of the semiconductor element in some cases. Therefore, a film that prevents hydrogen diffusion is preferably provided between the transistors 200*a* and 200*b* and the transistor 300. Specifically, the film that prevents hydrogen diffusion is a film from which hydrogen is less likely to be released.

For the film having a barrier property against hydrogen used for the insulator 210, for example, a metal oxide such as aluminum oxide, hafnium oxide, or tantalum oxide is preferably used.

In particular, aluminum oxide has an excellent blocking effect that prevents permeation of oxygen and impurities such as hydrogen and moisture which cause a change in electrical characteristics of the transistor. Accordingly, the use of aluminum oxide can prevent entry of impurities such as hydrogen and moisture into the transistor 200*a* and the transistor 200*b* in and after a manufacturing process of the transistor. In addition, release of oxygen from the oxide in the transistor 200*a* and the transistor 200*b* can be prevented. Therefore, aluminum oxide is suitably used as a protective film for the transistor 200*a* and the transistor 200*b*.

The insulator 212 can be formed using a material similar to that for the insulator 320, for example. In the case where a material with a relatively low permittivity is used for an interlayer film, the parasitic capacitance between wirings can be reduced. A silicon oxide film or a silicon oxynitride film can be used for the insulator 212, for example.

A conductor 218, a conductor included in the transistor 200*a* and the transistor 200*b*, and the like are provided in the insulators 210, 212, 214, and 216. Note that the conductor 218 functions as a plug or a wiring that is electrically connected to the transistors 200*a* and 200*b* or the transistor 300. The conductor 218 can be formed using a material similar to that used for forming the conductor 328 and the conductor 330.

In particular, part of the conductor 218 which is in contact with the insulators 210 and 214 is preferably a conductor with a barrier property against oxygen, hydrogen, and water. In such a structure, the transistors 300, 200*a*, and 200*b* can be completely separated by the layer with a barrier property against oxygen, hydrogen, and water. As a result, the diffusion of hydrogen from the transistor 300 to the transistors 200*a* and 200*b* can be prevented.

The transistor 200*a*, the transistor 200*b*, the capacitor 100*a*, and the capacitor 100*b* are provided over the insulator 212. Note that the structure of the transistor 200*a*, the transistor 200*b*, the capacitor 100*a*, and the capacitor 100*b* described in the above embodiment can be used as the structure of the transistor 200*a*, the transistor 200*b*, the capacitor 100*a*, and the capacitor 100*b*. Note that the transistor 200*a*, the transistor 200*b*, the capacitor 100*a*, and the capacitor 100*b* in FIG. 25A are just an example and are not limited to the structure shown therein; an appropriate transistor may be used in accordance with a circuit structure or a driving method.

Furthermore, the conductor 240 is provided in contact with the conductor 218 so that a conductor 253 which is connected to the transistor 300 can be extracted in a top direction of the transistor 200*a* and the transistor 200*b*. The wiring 3002 is extracted in a top direction of the transistor 200*a* and the transistor 200*b* in FIG. 25A; however, one embodiment of the present invention is not limited thereto. The wiring 3001, the wiring 3007, and the like may be extracted in a top direction of the transistor 200*a* and the transistor 200*b*.

The above is the description of the structure example. With the use of the structure, a change in electrical characteristics can be prevented and reliability can be improved in a semiconductor device including a transistor including an oxide semiconductor. A transistor including an oxide semiconductor with high on-state current can be provided. A transistor including an oxide semiconductor with low off-state current can be provided. A semiconductor device with low power consumption can be provided.

<Memory Device 2>

The semiconductor device illustrated in FIGS. 26A to 26C is a memory device including the transistor 400, the transistor 200*a*, the transistor 200*b*, the capacitor 100*a*, and the capacitor 100*b*. One embodiment of the memory device is described below with reference to FIGS. 26A to 26C.

FIG. 26A is a circuit diagram showing an example of the connection relation of the transistor 400, the transistor 200*a*, the transistor 200*b*, the capacitor 100*a*, and the capacitor 100*b* in the semiconductor device described in this embodiment. Furthermore, a cross section of the semiconductor device including a wiring 1003 to a wiring 1010 that correspond to those in FIG. 26A is shown in FIG. 26B. Furthermore, a cross section taken along dashed-dotted line W3-W4 in FIG. 26B is shown in FIG. 26C. FIG. 26C is a cross section in the channel width direction of a channel formation region of the transistor 400.

As shown in FIGS. 26A to 26C, a gate of the transistor 200*a* is electrically connected to a wiring 1004*a* and one of a source and a drain of the transistor 200*a* is electrically connected to the wiring 1003. Furthermore, the other of the source and the drain of the transistor 200*a* functions as one of the electrodes of the capacitor 100*a*. The other electrode of the capacitor 100*a* is electrically connected to the wiring 1005*a*. A gate of the transistor 200*b* is electrically connected to a wiring 1004*b* and one of a source and a drain of the transistor 200*b* is electrically connected to the wiring 1003. Furthermore, the other of the source and drain of the transistor 200*b* also functions as one of the electrodes of the capacitor 100*b*. The other electrode of the capacitor 100*b* is electrically connected to the wiring 1005*b*. The drain of the transistor 400 is electrically connected to the wiring 1010. As illustrated in FIG. 26B, the second gate of the transistor 200*a* and a source, a first gate, and a second gate of the transistor 400 are electrically connected through a wiring 1006*a*, a wiring 1006*b*, a wiring 1007, a wiring 1008, and a wiring 1009.

The on/off state of the transistor 200*a* can be controlled by application of a potential to the wiring 1004*a*. When the transistor 200*a* is on to apply a potential to the wiring 1003, charges can be supplied to the capacitor 100*a* through the transistor 200*a*. At this time, by making the transistor 200*a* off, the charges supplied to the capacitor 100*a* can be held. By application of a given potential to the wiring 1005*a*, the potential of a connection portion between the transistor 200*a* and the capacitor 100*a* can be controlled by capacitive coupling. For example, when a ground potential is applied to the wiring 1005*a*, the charges are held easily.

Similarly, the on/off states of the transistor 200*b* can be controlled by application of a potential to the wiring 1004*b*. When the transistor 200*b* is turned on to apply a potential to the wiring 1003, charges can be supplied to the capacitor 100*b* through the transistor 200*b*. At this time, by turning the transistor 200*b* off, the charges supplied to the capacitor 100*b* can be held. By application of a given potential to the wiring 1005*b*, the potential of a connection portion between the transistor 200*b* and the capacitor 100*b* can be controlled with use of capacitive coupling. For example, when a ground potential is applied to the wiring 1005*b*, the charges are held easily. Furthermore, by application of a negative potential to the wiring 1010, the negative potential is applied to the second gates of the transistor 200*a* and the transistor 200*b* through the transistor 400, whereby the threshold voltages of the transistor 200*a* and the transistor 200*b* can be higher than 0 V, the off-state current can be reduced, and the drain current when the first gate voltage is 0 V can be noticeably reduced.

With a structure in which the first gate and the second gate of the transistor 400 are diode-connected to the source thereof, and the source of the transistor 400 is connected to the second gates of the transistor 200*a* and the transistor 200*b*, the second gate voltage of each of the transistor 200*a* and the transistor 200*b* can be controlled by the wiring 1010. When negative potentials of the second gates of the transistor 200*a* and the transistor 200*b* are held in this structure, a first gate-source voltage and a second gate-source voltage of the transistor 400 are 0 V. In the transistor 400, a drain current when the first gate voltage is 0 V is extremely low and the threshold voltage is higher than the threshold voltages of the transistor 200*a* and the transistor 200*b*; thus, with such a structure, the negative potentials of the second gates of the transistor 200*a* and the transistor 200*b* can be held for a long time even without power supply to the transistor 400.

Furthermore, the negative potentials of the second gates of the transistor 200*a* and the transistor 200*b* are held, so that the drain current when the voltage of the first gate of the transistor 200*a* and the first gate of the transistor 200*b* is 0 V can be extremely low even without supply of power to the transistor 200*a* and the transistor 200*b*. In other words, the charges can be held in the capacitor 100*a* and the capacitor 100*b* for a long time even without supply of power to the transistor 200*a*, the transistor 200*b*, and the transistor 400. For example, with use of the semiconductor device as a memory element, data can be held for a long time without power supply. Therefore, a memory device with a low refresh frequency or a memory device that does not need refresh operation can be provided.

Note that the connection relation of the transistor 200*a*, the transistor 200*b*, the transistor 400, the capacitor 100*a*, and the capacitor 100*b* is not limited to that illustrated in FIGS. 26A and 26B. The connection relation can be modified as appropriate in accordance with a necessary circuit configuration.

<Structure of Memory Device 2>

FIG. 26B is a cross section of the memory device including the capacitor 100*a*, the capacitor 100*b*, the transistor 200*a*, the transistor 200*b*, and the transistor 400. Note that in the memory device illustrated in FIGS. 26A to 26C, components having the same functions as the components in the semiconductor device and the memory device described in the above embodiment and <Structure of memory device 1> are denoted by the same reference numerals.

The memory device of one embodiment of the present invention includes the transistor 400, the transistor 200*a*, the transistor 200*b*, the capacitor 100*a*, and the capacitor 100*b* as illustrated in FIGS. 26A to 26C. The transistor 400, the transistor 200*a*, the transistor 200*b*, the capacitor 100*a*, and the capacitor 100*b* are provided in the same layer.

Note that the capacitors and the transistors included in the semiconductor device described in the above embodiments and with reference to FIGS. 1A to 1C may be used as the transistor 200*a*, the transistor 200*b*, the capacitor 100*a*, and the capacitor 100*b*. Note that the capacitor 100*a*, the capacitor 100*b*, the transistor 200*a*, the transistor 200*b*, and the transistor 400 illustrated in FIGS. 26A to 26C are only an example and are not limited to the structure shown therein; an appropriate transistor may be used in accordance with a circuit configuration or a driving method.

The transistor 400 and the transistor 200 are formed in the same layer and thus can be fabricated in parallel. The transistor 400 includes a conductor 460 (a conductor 460*a* and a conductor 460*b*) functioning as a first gate electrode, a conductor 405 (a conductor 405*a* and a conductor 405*b*) functioning as a second gate electrode, an insulator 470 and an insulator 472 in contact with the conductor 460, an insulator 471 over the insulator 470, an insulator 475 provided on a side surface of the conductor 460 with the insulator 472 provided therebetween, an insulator 474 in contact with the insulator 475, the insulator 220, the insulator 222, an insulator 424 (an insulator 424*a* and an insulator 424*b*), an insulator 450, and an insulator 452 functioning as the gate insulating layers, and an oxide 430*c* including a region where a channel is formed, an oxide 431*a* and an oxide 431*b* functioning as one of a source and a drain, and an oxide 432*a* and an oxide 432*b* functioning as the other of the source and the drain. Furthermore, the conductor 405 (the conductor 405*a* and the conductor 405*b*) functioning as the second gate electrode is electrically connected to a conductor 403 functioning as a wiring.

In the transistor 400, the conductor 405 is in the same layer as the conductor 205. The insulator 424 is in the same layer as the insulator 224. The oxides 431*a* and 432*a* are in the same layer as the oxide 230*a*, and the oxides 431*b* and 432*b* are in the same layer as the oxide 230*b*. The oxide 430*c* is in the same layer as the oxides 230_1*c* and 230_2*c*. The insulator 450 is in the same layer as the insulator 250*a* and the insulator 250*b*. The insulator 452 is in the same layer as the insulator 252*a* and the insulator 252*b*. The conductor 460 (the conductor 460*a* and the conductor 460*b*) is in the same layer as the conductor 260_1 (the conductor 260_1*a* and the conductor 260_1*b*). Furthermore, the insulator 470 is in the same layer as the insulator 270*a* and the insulator 270*b*. Furthermore, the insulator 472 is in the same layer as the insulator 272*a* and the insulator 272*b*. The insulator 474 is in the same layer as the insulator 274*a* and the insulator 274*b*. The insulator 475 is in the same layer as the insulator 275*a* and the insulator 275*b*.

In the oxide 430*c* functioning as an active layer of the transistor 400, oxygen vacancies and impurities such as hydrogen or water are reduced, as in the oxide 230 or the like. Accordingly, the threshold voltage of the transistor 400 can be higher than 0 V, an off-state current can be reduced, and the drain current when the second gate voltage and the first gate voltage are 0 V can be extremely low.

With the use of the structure, a change in electrical characteristics can be suppressed and reliability can be improved in a semiconductor device including a transistor including an oxide semiconductor. The power consumption of a semiconductor device using a transistor including an oxide semiconductor can be reduced. A semiconductor device using a transistor including an oxide semiconductor can be miniaturized or highly integrated. Alternatively, a miniaturized or highly integrated semiconductor device can be provided with high productivity.

As described above, the structures, methods, and the like described in this embodiment can be combined with any of the structures, methods, and the like described in the other embodiments as appropriate.

Embodiment 3

In this embodiment, a DOSRAM (registered trademark) is described as an example of a memory device including a transistor in which an oxide is used for a semiconductor (hereinafter referred to as an OS transistor) and a capacitor, which is one embodiment of the present invention, with reference to FIG. 27 and FIGS. 28A and 28B. The term "DOSRAM" is an abbreviation of "dynamic oxide semiconductor RAM", which indicates a RAM including one transistor (1T) and one capacitor (1C).

A memory device in which OS transistors are used in memory cells (hereinafter referred to as an OS memory) is applied to the DOSRAM. The OS memory is a memory including at least a capacitor and an OS transistor that controls the charging and discharging of the capacitor. The OS memory has excellent retention characteristics because the OS transistor has an extremely low off-state current, and thus can function as a nonvolatile memory.

<<DOSRAM 1400>>

Figure 27:
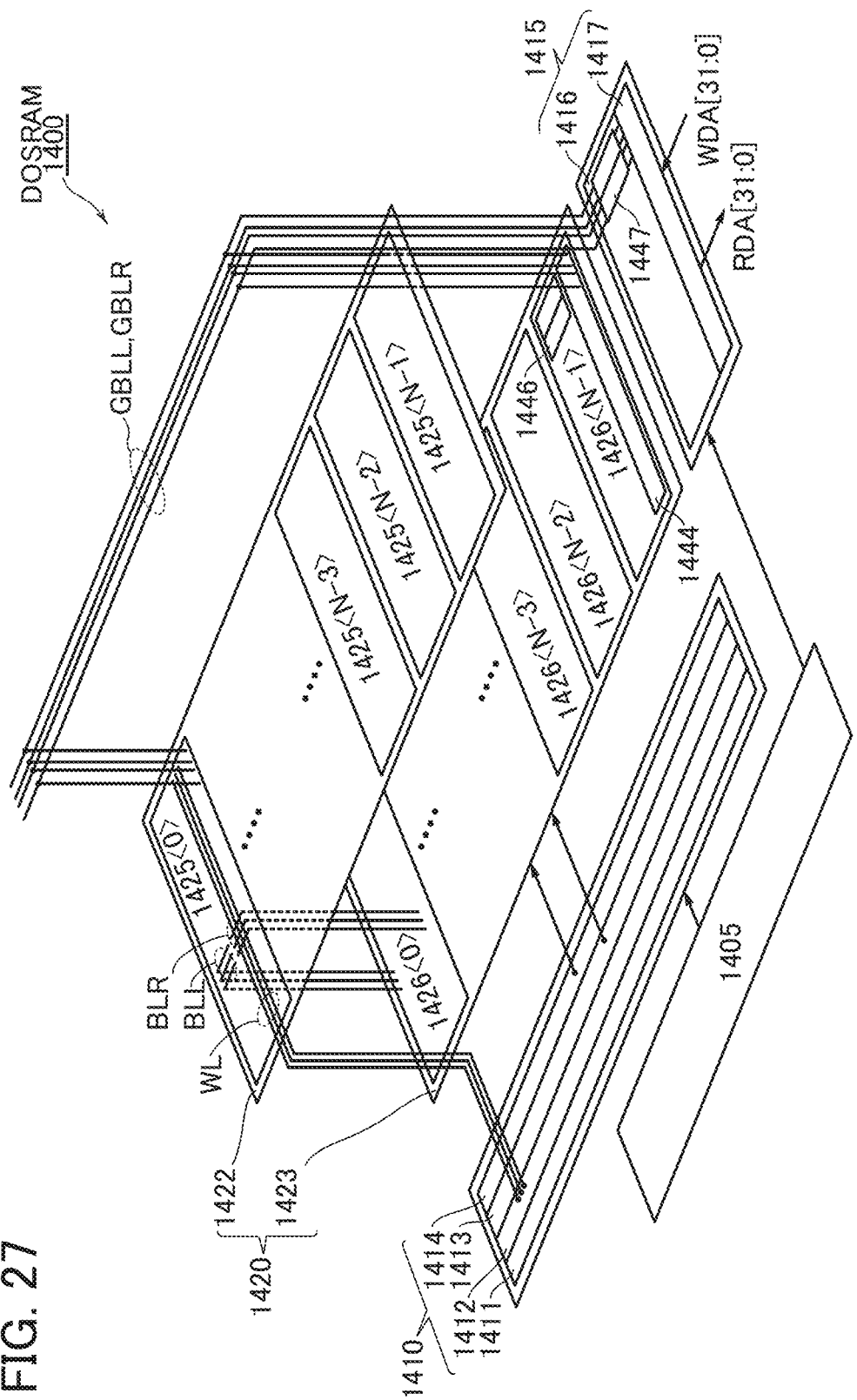
FIG. 27 is a block diagram illustrating a configuration example of a memory device according to one embodiment of the present invention.
Figure 28A:
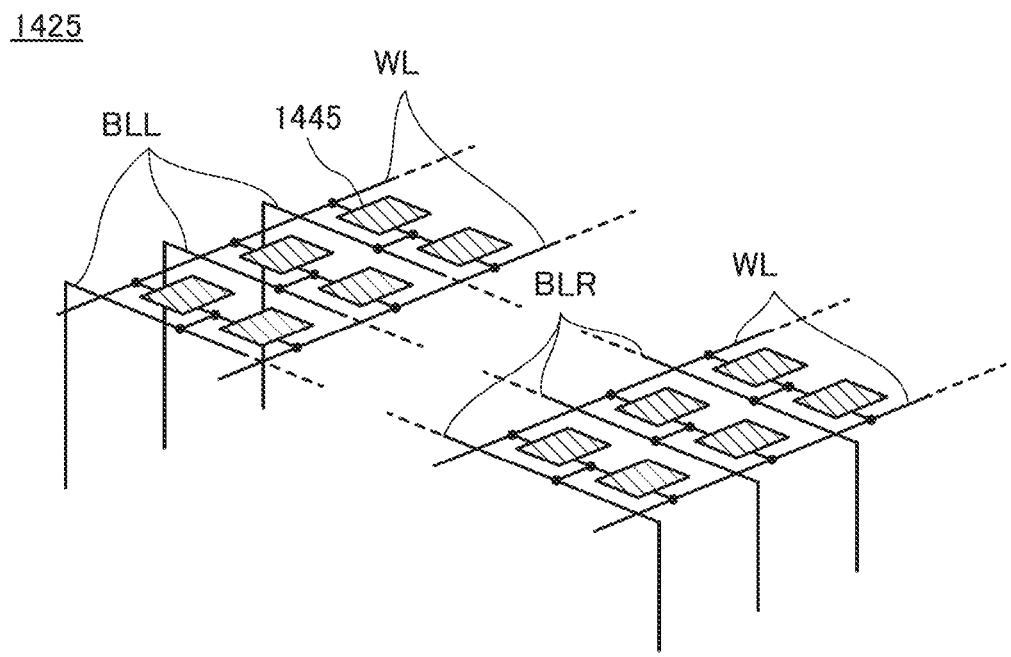
FIGS. 28A and 28B are a block diagram and a circuit diagram illustrating a configuration example of a memory device according to one embodiment of the present invention.

FIG. 27 illustrates a configuration example of the DOSRAM. As illustrated in FIG. 27, a DOSRAM 1400 includes a controller 1405, a row circuit 1410, a column circuit 1415, and a memory cell and sense amplifier array 1420 (hereinafter referred to as the MC-SA array 1420).

The row circuit 1410 includes a decoder 1411, a word line driver circuit 1412, a column selector 1413, and a sense amplifier driver circuit 1414. The column circuit 1415 includes a global sense amplifier array 1416 and an input/output circuit 1417. The global sense amplifier array 1416 includes a plurality of global sense amplifiers 1447. The MC-SA array 1420 includes a memory cell array 1422, a sense amplifier array 1423, and global bit lines GBLL and GBLR.

(MC-SA Array 1420)

The MC-SA array 1420 has a stacked-layer structure where the memory cell array 1422 is stacked over the sense amplifier array 1423. The global bit lines GBLL and GBLR are stacked over the memory cell array 1422. The DOSRAM 1400 adopts a hierarchical bit line structure, where the bit lines are layered into local and global bit lines.

The memory cell array 1422 includes N local memory cell arrays 1425<0> to 1425<N−1>, where N is an integer greater than or equal to 2. FIG. 28A illustrates a configuration example of the local memory cell array 1425. The local memory cell array 1425 includes a plurality of memory cells 1445, a plurality of word lines WL, and a plurality of bit lines BLL and BLR. In the example in FIG. 28A, the local memory cell array 1425 has an open bit-line architecture but may have a folded bit-line architecture.

Figure 28B:
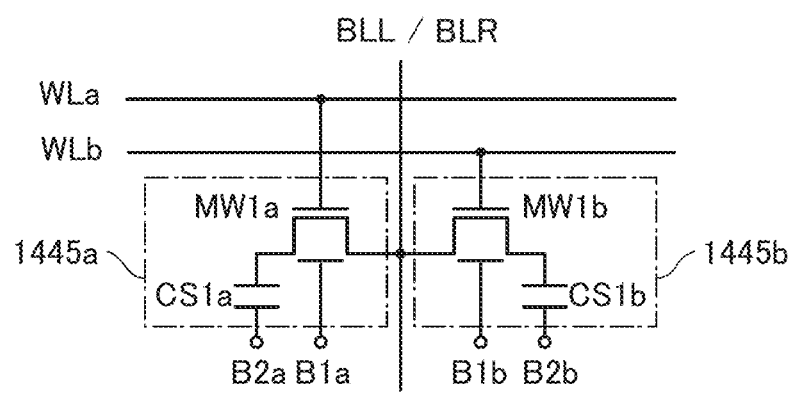

FIG. 28B illustrates a circuit configuration example of a pair of memory cells 1445a and 1445b connected to the same bit line BLL (BLR). The memory cell 1445a includes a transistor MW1a, a capacitor CS1a, and terminals B1a and B2a. The memory cell 1445a is connected to a word line WLa and the bit line BLL (BLR). The memory cell 1445b includes a transistor MW1b, a capacitor CS1b, and terminals B1b and B2b. The memory cell 1445b is connected to a word line WLb and the bit line BLL (BLR). Hereinafter, in the case where the description applies to either the memory cell 1445a or the memory cell 1445b, the memory cell 1445 and its components are described without using the letter "a" or "b", in some cases.

The transistor MW1a has a function of controlling the charging and discharging of the capacitor CS1a, and the transistor MW1b has a function of controlling the charging and discharging of the capacitor CS1b. A gate of the transistor MW1a is electrically connected to the word line WLa, a first terminal of the transistor MW1a is electrically connected to the bit line BLL (BLR), and a second terminal of the transistor MW1a is electrically connected to a first terminal of the capacitor CS1a. A gate of the transistor MW1b is electrically connected to the word line WLb, a first terminal of the transistor MW1b is electrically connected to the bit line BLL (BLR), and a second terminal of the transistor MW1b is electrically connected to a first terminal of the capacitor CS1b.

The transistor MW1 has a function of controlling the charging and discharging of the capacitor CS1. A second terminal of the capacitor CS1 is electrically connected to the terminal B2. A constant voltage (e.g., low power supply voltage) is applied to the terminal B2.

In the case where the semiconductor device described in any of the above embodiments is used for the memory cells 1445a and 1445b, the transistor 200a can be used as the transistor MW1a, the transistor 200b can be used as the transistor MW1b, the capacitor 100a can be used as the capacitor CS1a, and the capacitor 100b can be used as the capacitor CS1b. In that case, the area occupied by each set consisting of one transistor and one capacitor in the top view can be reduced; accordingly, the memory device of this embodiment can be highly integrated. As a result, storage capacity per unit area of the memory device of this embodiment can be increased.

The transistor MW1 includes a back gate, and the back gate is electrically connected to the terminal B1. This makes it possible to change the threshold voltage of the transistor MW1 with a voltage applied to the terminal B1. For example, a fixed voltage (e.g., negative constant voltage) may be applied to the terminal B1; alternatively, the voltage applied to the terminal B1 may be changed in response to the operation of the DOSRAM 1400.

The back gate of the transistor MW1 may be electrically connected to the gate, the first terminal, or the second terminal of the transistor MW1. The transistor MW1 does not necessarily include the back gate.

The sense amplifier array 1423 includes N local sense amplifier arrays 1426<0> to 1426<N−1>. The local sense amplifier arrays 1426 each include one switch array 1444 and a plurality of sense amplifiers 1446. Each of the sense amplifiers 1446 is electrically connected to a bit line pair. The sense amplifiers 1446 each have a function of precharging the corresponding bit line pair, a function of amplifying a voltage difference of the bit line pair, and a function of retaining the voltage difference. The switch array 1444 has a function of selecting a bit line pair and electrically connecting the selected bit line pair and a global bit line pair to each other.

Here, two bit lines that are compared simultaneously by the sense amplifier are collectively referred to as the bit line pair, and two global bit lines that are compared simultaneously by the global sense amplifier are collectively referred to as the global bit line pair. The bit line pair can be referred to as a pair of bit lines, and the global bit line pair can be referred to as a pair of global bit lines. Here, the bit line BLL and the bit line BLR form one bit line pair, and the global bit line GBLL and the global bit line GBLR form one global bit line pair. In the following description, the expressions "bit line pair (BLL, BLR)" and "global bit line pair (GBLL, GBLR)" are also used.

(Controller 1405)

The controller 1405 has a function of controlling the overall operation of the DOSRAM 1400. The controller 1405 has a function of performing logic operation on a command signal that is input from the outside and determining an operation mode, a function of generating control signals for the row circuit 1410 and the column circuit 1415 so that the determined operation mode is executed, a function of retaining an address signal that is input from the outside, and a function of generating an internal address signal.

(Row Circuit 1410)

The row circuit 1410 has a function of driving the MC-SA array 1420. The decoder 1411 has a function of decoding an address signal. The word line driver circuit 1412 generates a selection signal for selecting the word line WL of a row that is to be accessed.

The column selector 1413 and the sense amplifier driver circuit 1414 are circuits for driving the sense amplifier array 1423. The column selector 1413 has a function of generating a selection signal for selecting the bit line of a column that is to be accessed. With the selection signal from the column selector 1413, the switch array 1444 of each local sense amplifier array 1426 is controlled. With the control signal from the sense amplifier driver circuit 1414, each of the plurality of local sense amplifier arrays 1426 is driven independently.

(Column Circuit 1415)

The column circuit 1415 has a function of controlling the input of data signals WDA[31:0], and a function of controlling the output of data signals RDA[31:0]. The data signals WDA[31:0] are write data signals, and the data signals RDA[31:0] are read data signals.

Each of the global sense amplifiers 1447 is electrically connected to the global bit line pair (GBLL, GBLR). The global sense amplifiers 1447 each have a function of amplifying a voltage difference of the global bit line pair (GBLL, GBLR), and a function of retaining the voltage difference. Data is written to and read from the global bit line pair (GBLL, GBLR) by the input/output circuit 1417.

The write operation of the DOSRAM 1400 is briefly described. Data is written to the global bit line pair by the input/output circuit 1417. The data of the global bit line pair is retained by the global sense amplifier array 1416. By the switch array 1444 of the local sense amplifier array 1426 specified by an address signal, the data of the global bit line pair is written to the bit line pair of a column where data is to be written. The local sense amplifier array 1426 amplifies the written data, and then retains the amplified data. In the specified local memory cell array 1425, the word line WL of the row where data is to be written is selected by the row circuit 1410, and the data retained at the local sense amplifier array 1426 is written to the memory cell 1445 of the selected row.

The read operation of the DOSRAM 1400 is briefly described. One row of the local memory cell array 1425 is specified with an address signal. In the specified local memory cell array 1425, the word line WL of a row where data is to be read is selected, and data of the memory cell 1445 is written to the bit line. The local sense amplifier array 1426 detects a voltage difference of the bit line pair of each column as data, and retains the data. The switch array 1444 writes the data of a column specified by the address signal to the global bit line pair; the data is chosen from the data retained at the local sense amplifier array 1426. The global sense amplifier array 1416 determines and retains the data of the global bit line pair. The data retained at the global sense amplifier array 1416 is output to the input/output circuit 1417. Thus, the read operation is completed.

The DOSRAM 1400 has no limitations on the number of rewrites in principle and data can be read and written with low energy consumption, because data is rewritten by charging and discharging the capacitor CS1. A simple circuit configuration of the memory cell 1445 allows a high memory capacity.

The transistor MW1 is an OS transistor. The extremely low off-state current of the OS transistor can inhibit charge leakage from the capacitor CS1. Therefore, the retention time of the DOSRAM 1400 is considerably longer than that of a DRAM. This allows less frequent refresh, which can reduce power needed for refresh operations. Thus, the DOSRAM 1400 is suitably used for a memory device that can rewrite a large volume of data with a high frequency, for example, a frame memory used for image processing.

Since the MC-SA array 1420 has a stacked-layer structure, the bit line can be shortened to a length that is close to the length of the local sense amplifier array 1426. A shorter bit line results in smaller bit line capacitance, which allows the storage capacitance of the memory cell 1445 to be reduced. In addition, providing the switch array 1444 in the local sense amplifier array 1426 allows the number of long bit lines to be reduced. For the reasons described above, a load to be driven during access to the DOSRAM 1400 is reduced, enabling a reduction in power consumption.

The structure described in this embodiment can be used in appropriate combination with any of the structures described in the other embodiments.

Embodiment 4

A semiconductor device of one embodiment of the present invention is a semiconductor device including an oxide in a channel formation region. The semiconductor device includes a first transistor, a second transistor, a first capacitor, a second capacitor, and a wiring. The first transistor includes a first conductor, a first insulator over the first conductor, a first oxide over the first insulator, a second oxide over the first oxide, a second insulator over the second oxide, a second conductor over the second insulator, a third insulator over the second conductor, a fourth insulator in contact with the second insulator, the second conductor, and the third insulator, and a fifth insulator in contact with the fourth insulator. A first opening which overlaps with part of the first conductor is provided in the first oxide and the first insulator. The second oxide is electrically connected to the first conductor through the first opening. The second transistor includes a third conductor, the first insulator over the third conductor, the first oxide over the first insulator, the second oxide over the first oxide, a sixth insulator over the second oxide, a fourth conductor over the sixth insulator, a seventh insulator over the fourth conductor, an eighth insulator in contact with the sixth insulator, the fourth conductor, and the seventh insulator, and a ninth insulator in contact with the eighth insulator.

A second opening overlapping with part of the third conductor is provided in the first oxide and the first insulator. The second oxide is electrically connected to the third conductor through the second opening. The first capacitor includes the second oxide, a tenth insulator in contact with one side surface of the second oxide in the channel length direction and part of the top surface of the second oxide, and a fifth conductor in contact with the tenth insulator. The second capacitor includes the second oxide, an eleventh insulator in contact with one side surface of the second oxide in the channel length direction and part of the top surface of the second oxide, and a sixth conductor in contact with the eleventh insulator.

Furthermore, the second oxide includes first regions each overlapping with the second insulator or the sixth insulator, second regions each overlapping with the fourth insulator or the eighth insulator, and a third region in contact with the second regions. The wiring is in contact with the fifth insulator and the ninth insulator and is electrically connected to the third region.

According to one embodiment of the present invention, when the connection of the plurality of transistors, the plurality of capacitors, and the wiring has the above-described structure, a semiconductor device that can be miniaturized or highly integrated can be provided.

Details are described with reference to drawings.

<Structure Example of Semiconductor Device>

An example of a semiconductor device of one embodiment of the present invention including the transistor 200*a*, the transistor 200*b*, the capacitor 100*a*, and the capacitor 100*b* is described below.

Figure 29C:
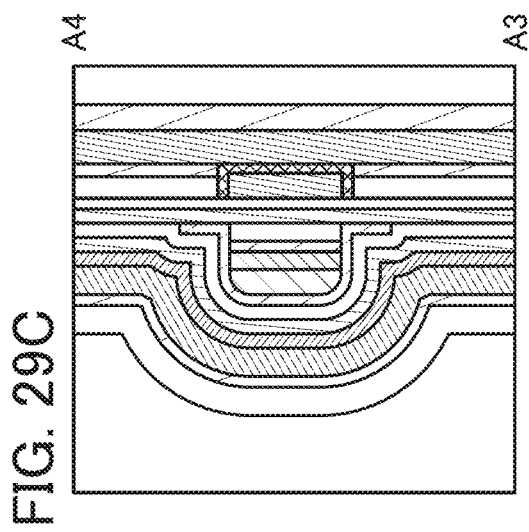
FIGS. 29A to 29D are a top view and cross sections of a semiconductor device according to one embodiment of the present invention.
Figure 29D:
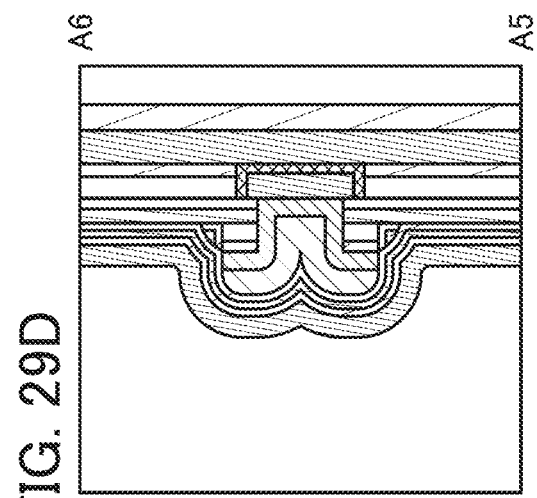
Figure 29A:
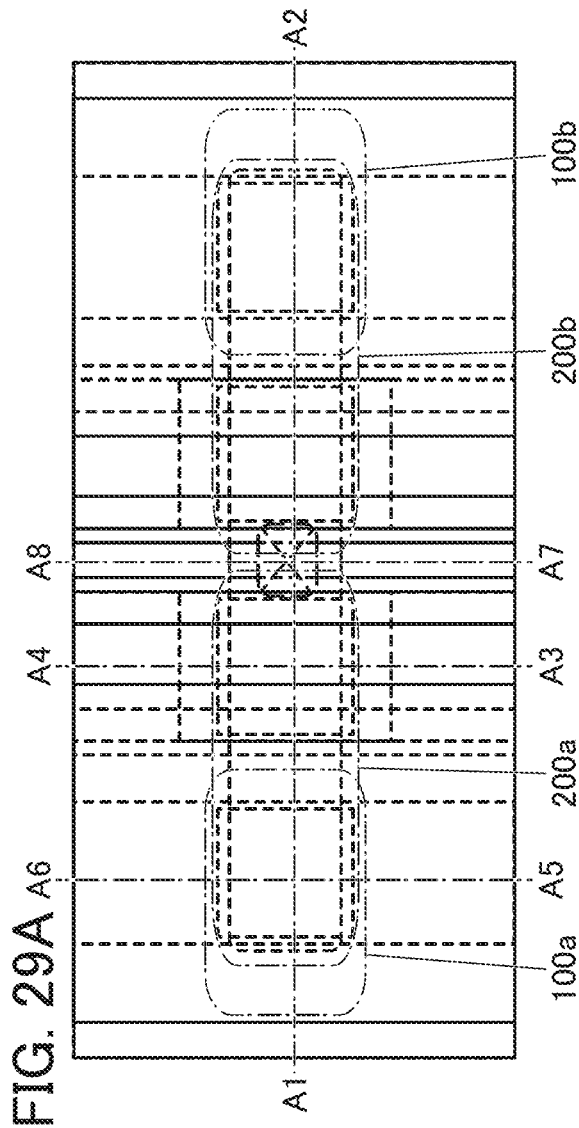
Figure 29B:
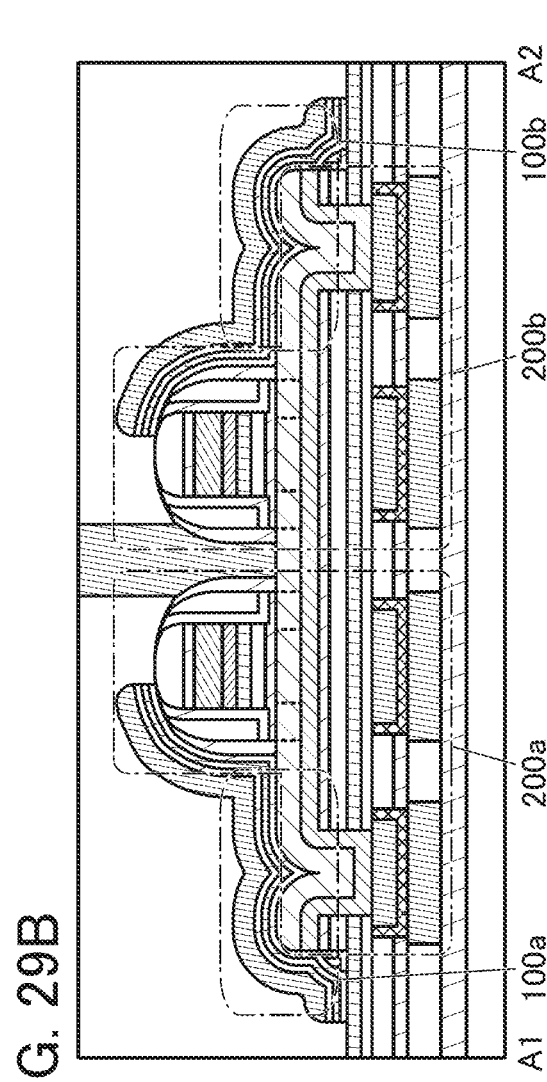

FIG. 29A is a top view of a semiconductor device including the transistor 200*a*, the transistor 200*b*, the capacitor 100*a*, and the capacitor 100*b*. Furthermore, FIG. 29B is a cross section taken along dashed-dotted line A1-A2 in FIG. 29A, which corresponds to a cross section in the channel length direction of the transistor 200*a* and the transistor 200*b*. FIG. 29C is a cross section taken along dashed-dotted line A3-A4 in FIG. 29A, which corresponds to a cross section in a channel width direction of the transistor 200*a*. Furthermore, FIG. 29D is a cross section taken along dashed-dotted line A5-A6 in FIG. 29A. For simplification of the drawing, some components are not illustrated in the top view in FIG. 29A. FIGS. 30A to 30D are drawings in which components in FIGS. 29A to 29D are denoted by reference numerals.

The semiconductor device of one embodiment of the present invention includes the transistor 200*a*, the transistor 200*b*, the capacitor 100*a*, and the capacitor 100*b*, and an insulator 201, the insulator 210, the insulator 212, and the insulator 280 functioning as interlayer films as shown in FIGS. 30A to 30D. Furthermore, the semiconductor device includes a conductor 204_1 and a conductor 203_1 which are electrically connected to the transistor 200*a* and function as wirings, a conductor 204_2 and conductor 203_2 which are electrically connected to the transistor 200*b* and function as wirings, and a conductor 240 which functions as a plug.

Note that the conductor 204_1 and the conductor 203_1 are formed so as to be embedded in the insulator 212. Here, the top surfaces of the conductor 204_1 and the conductor 203_1 can be substantially level with the top surface of the insulator 212. Note that the conductor 204_1 and the conductor 203_1 each having a single-layer structure are shown; however, the present invention is not limited thereto. For example, the conductor 204_1 and the conductor 203_1 may each have a multilayer structure of two or more layers.

Furthermore, the conductor 204_2 and the conductor 203_2 are formed so as to be embedded in the insulator 212 in a manner similar to that of the conductor 204_1 and the conductor 203_1. Here, the top surface of the conductor 204_2 and the top surface of the conductor 203_2 can be substantially level with the top surface of the insulator 212. Note that the conductor 204_2 and the conductor 203_2 each having a single-layer structure are shown; however, the present invention is not limited thereto. For example, the conductor 204_2 and the conductor 203_2 may each have a multilayer structure of two or more layers.

[Transistor 200*a* and Transistor 200*b*]

As shown in FIGS. 30A to 30D, the transistor 200*a* includes the insulator 214 and the insulator 216 provided over a substrate (not illustrated), a conductor 206_1 and the conductor 205_1 embedded in the insulator 214 and the insulator 216, the insulator 220 provided over the conductor 206_1, the conductor 205_1, and the insulator 216, the insulator 222 provided over the insulator 220, the insulator 224 provided over the insulator 222, an oxide 530 (an oxide 530*a*, an oxide 530*b*, and an oxide 530*c*) provided over the insulator 224, the oxide 530_*d*1 provided over the oxide 530, an insulator 250*a* provided over the oxide 530_*d*1, an insulator 252*a* provided over the insulator 250*a*, a conductor 260_1 provided over the insulator 252*a*, an insulator 270*a* provided over the conductor 260_1, an insulator 271*a* provided over the insulator 270*a*, an insulator 272*a* provided in contact with at least the top surface of the oxide 530_*d*1, the side surface of the insulator 250*a*, the side surface of the insulator 252*a*, the side surface of the conductor 260_1, and the side surface of the insulator 270*a*, an insulator 275*a* provided in contact with at least the insulator 272*a*, and an insulator 274*a* provided in contact with at least the top surface of the oxide 530 and the side surface of the insulator 275*a*.

Furthermore, as shown in FIGS. 30A to 30D, the transistor 200*b* includes the insulator 214 and the insulator 216 provided over the substrate (not illustrated), a conductor 206_2 and the conductor 205_2 provided so as to be embedded in the insulator 214 and the insulator 216, the insulator 220 provided over the conductor 206_2, the conductor 205_2, and the insulator 216, the insulator 222 provided over the insulator 220, the insulator 224 provided over the insulator 222, the oxide 530 (the oxide 530*a*, the oxide 530*b*, and the oxide 530*c*) provided over the insulator 224, the oxide 530_*d*2 provided over the oxide 530, an insulator 250*b* provided over the oxide 530_*d*2, an insulator 252*b* provided over the insulator 250*b*, the conductor 260_2 provided over the insulator 252*b*, an insulator 270*b* provided over the conductor 260_2, an insulator 271*b* provided over the insulator 270*b*, an insulator 272*b* provided so as to be in contact with at least the top surface of the oxide 530_*d*2, the side surface of the insulator 250*b*, the side surface of the insulator 252*b*, the side surface of the conductor 260_2, and the side surface of the insulator 270*b*, the insulator 275*b* provided in contact with at least the insulator 272*b*, and an insulator 274*b* provided in contact with at least the top surface of the oxide 530 and the side surface of the insulator 275*b*.

Note that in the transistor 200*a* and the transistor 200*b*, the oxide 530*a*, the oxide 530*b*, and the oxide 530*c* are collectively referred to as the oxide 530 in some cases. Although the transistor 200*a* and the transistor 200*b* each have a structure in which the oxide 530*a*, the oxide 530*b*, and the oxide 530*c* are stacked, the present invention is not limited to this structure. For example, a structure in which only the oxide 530*b* and the oxide 530*c* are provided may be employed. For example, a two-layer structure or a stacked-layer structure of four or more layers may be employed.

Note that as described above, the transistor 200*a* and the transistor 200*b* have similar structures. Thus, unless otherwise specified, the description for the transistor 200*a* can be referred to for the transistor 200*b* below. Therefore, the conductor 206_1, the conductor 205_1, the oxide 530_*d*1, the insulator 250*a*, the insulator 252*a*, the conductor 260_1, the insulator 270*a*, the insulator 271*a*, the insulator 272*a*, the insulator 275*a*, and the insulator 274*a* of the transistor 200*a* correspond to the conductor 206_2, the conductor 205_2, the oxide 530_*d*2, the insulator 250*b*, the insulator 252*b*, the conductor 260_2, the insulator 270*b*, the insulator 271*b*, the insulator 272*b*, the insulator 275*b*, and the insulator 274*b* of the transistor 200*b*, respectively.

Figure 30C:
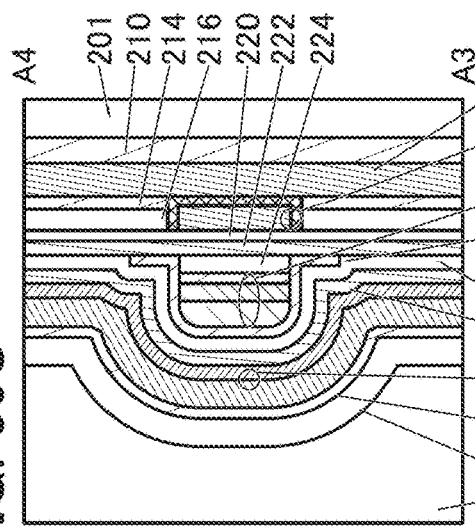
FIGS. 30A to 30D are a top view and cross sections of a semiconductor device according to one embodiment of the present invention.
Figure 30D:
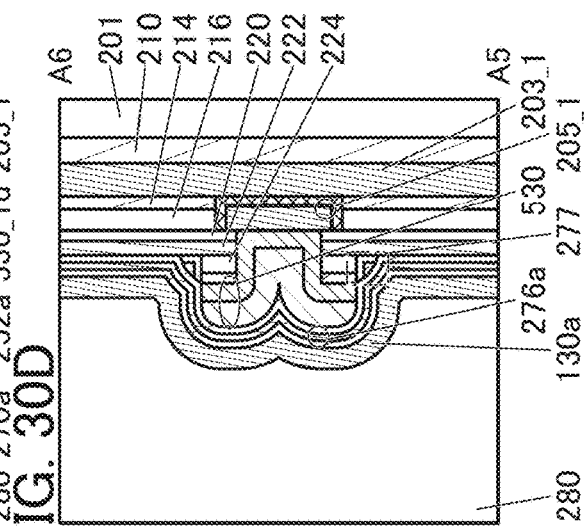
Figure 30A:
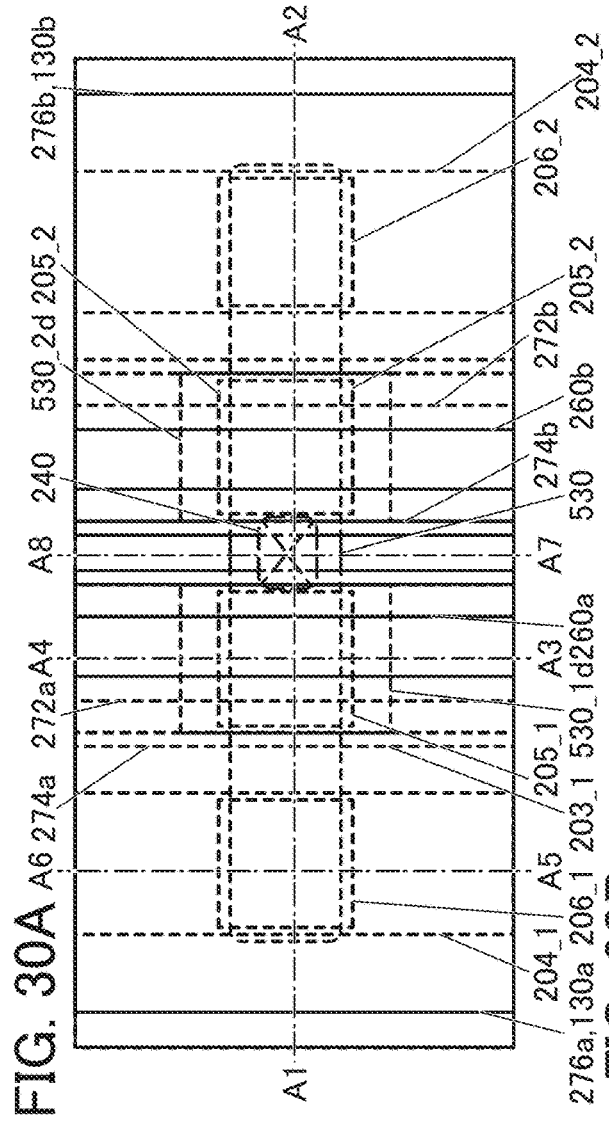
Figure 30B:
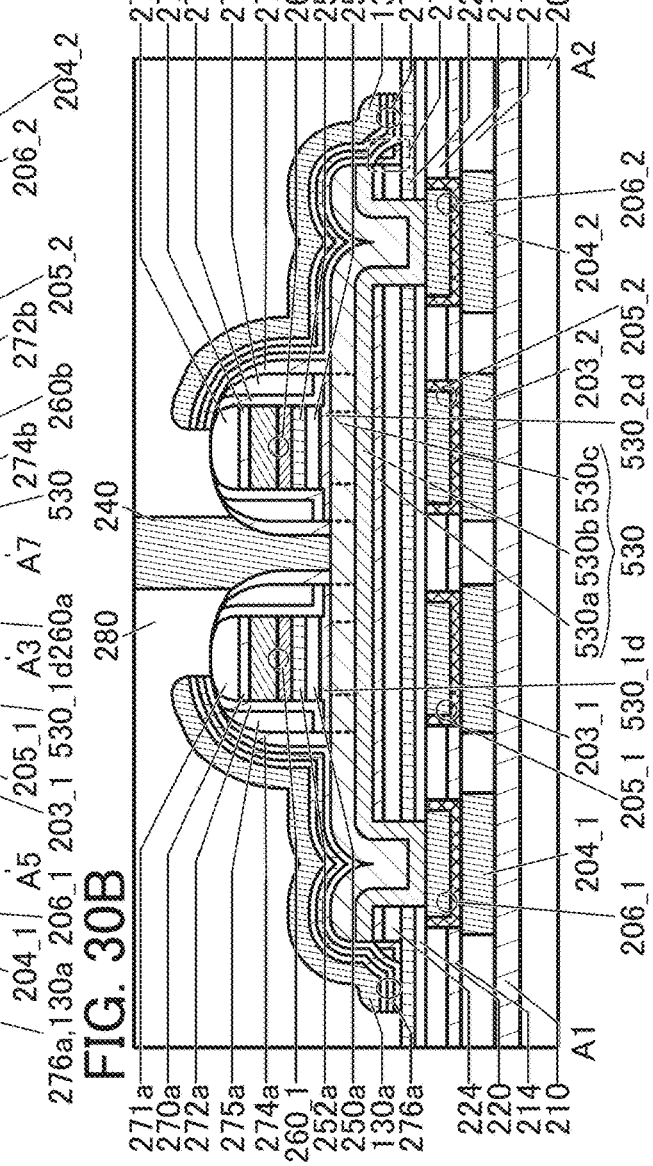
Figure 33:
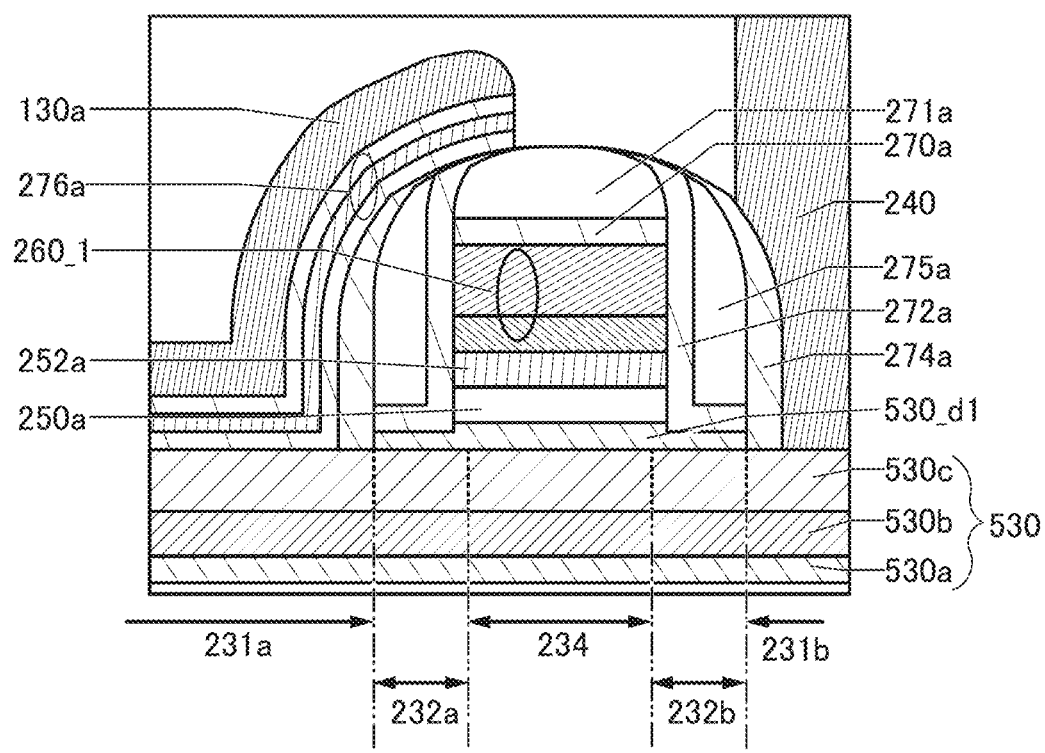
FIG. 33 is a cross section of a semiconductor device according to one embodiment of the present invention.
Figure 34C:
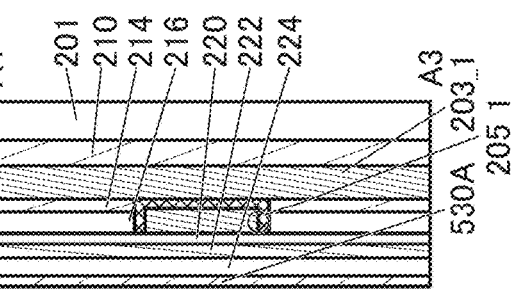
FIGS. 34A to 34D are a top view and cross sections illustrating a method for manufacturing a semiconductor device according to one embodiment of the present invention.
Figure 34D:
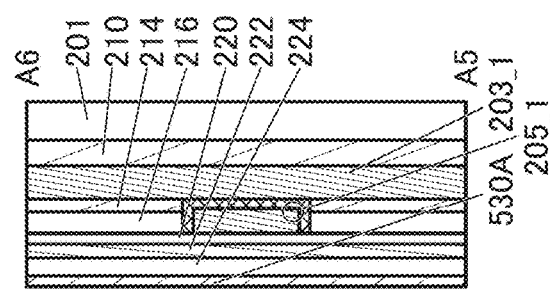
Figure 34A:
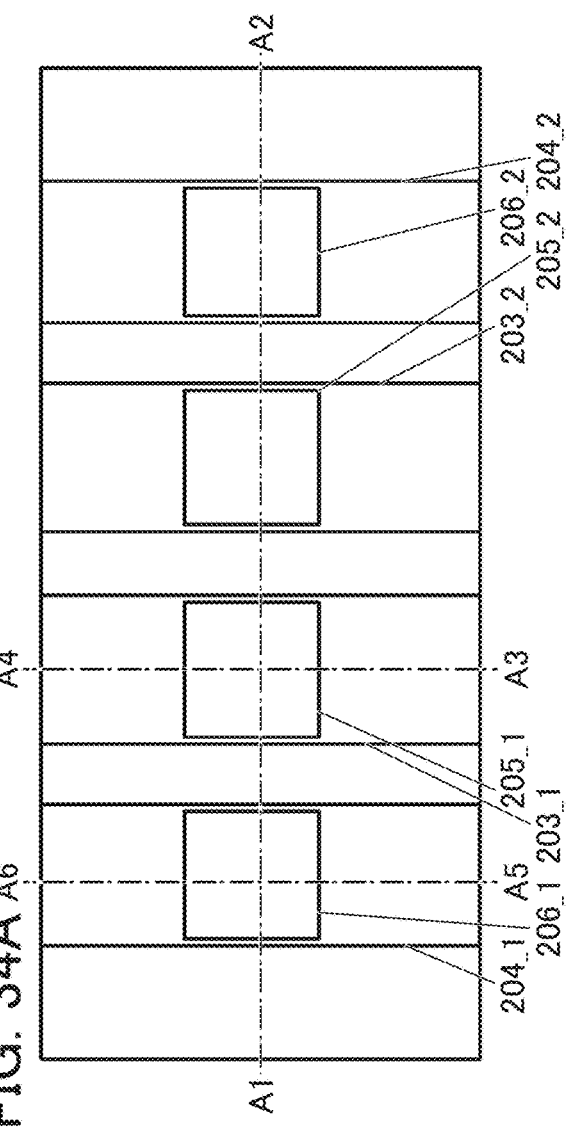
Figure 34B:
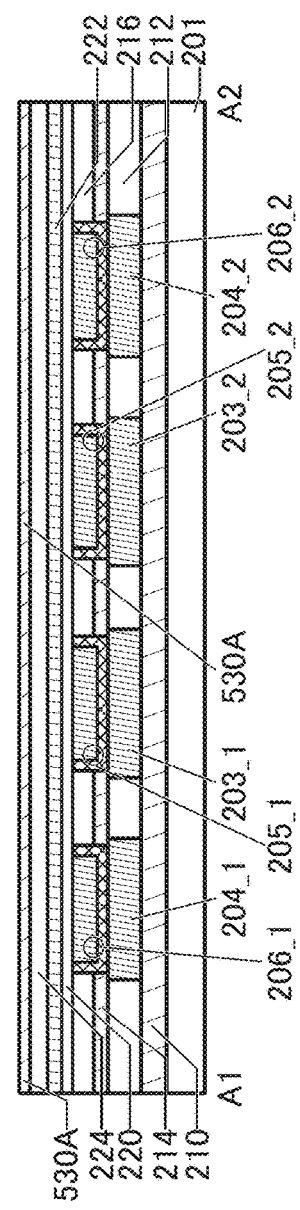
Figure 39A:
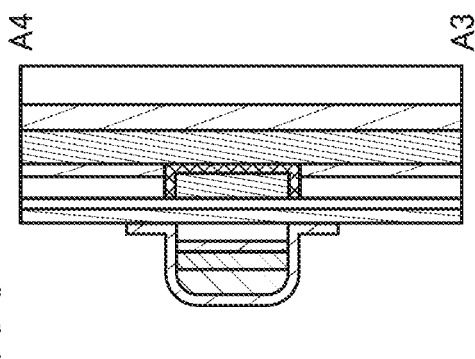
FIGS. 39A to 39D are a top view and cross sections illustrating a method for manufacturing a semiconductor device according to one embodiment of the present invention.
Figure 39C:
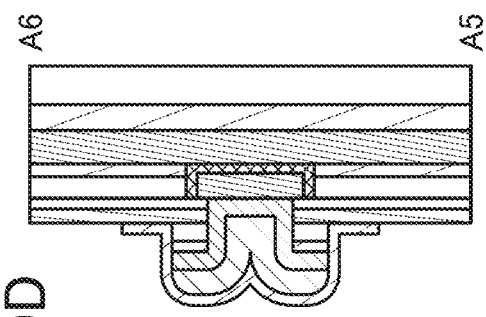
Figure 39B:
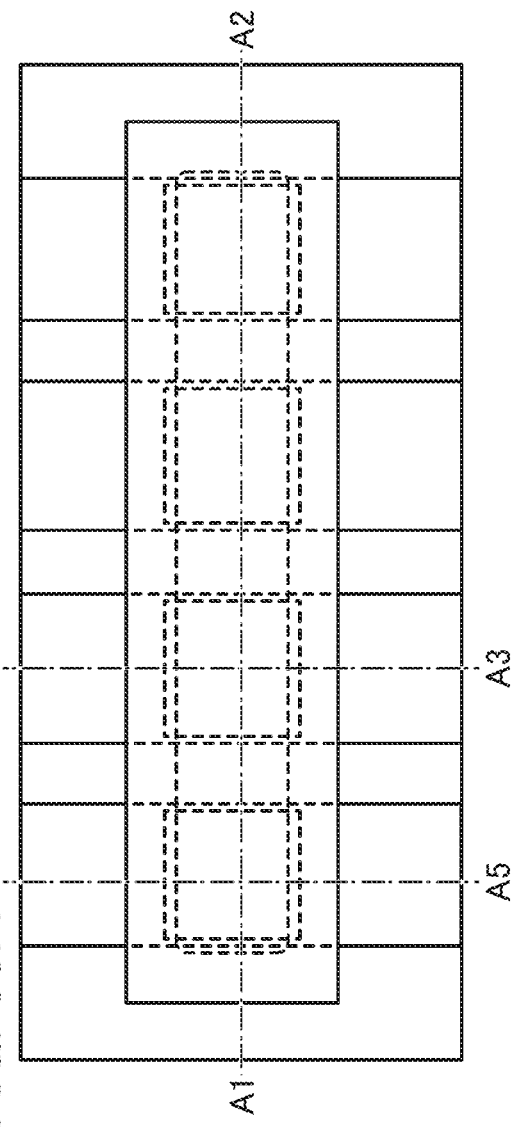
Figure 39D:
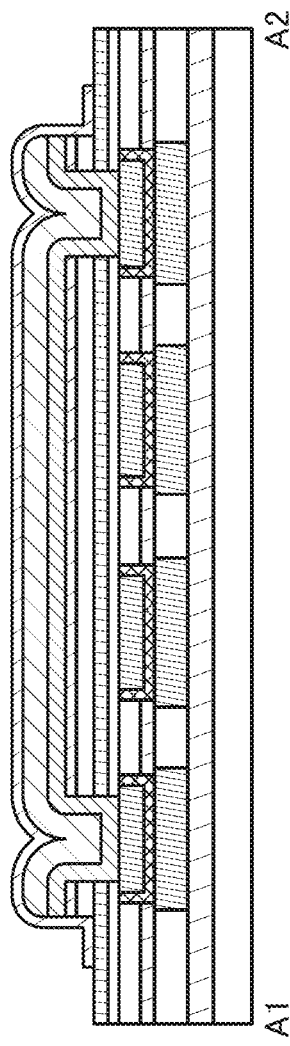
Figure 41A:
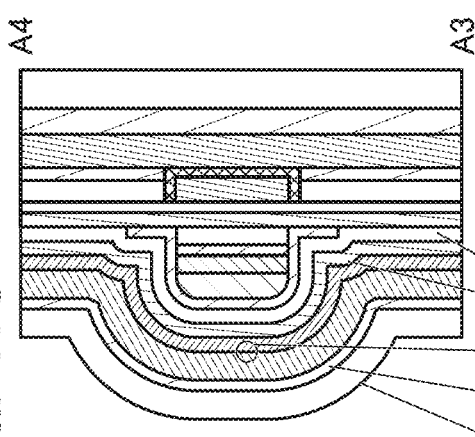
FIGS. 41A to 41D are a top view and cross sections illustrating a method for manufacturing a semiconductor device according to one embodiment of the present invention.
Figure 41C:
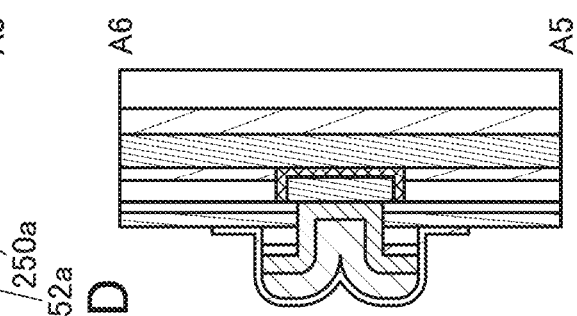
Figure 41B:
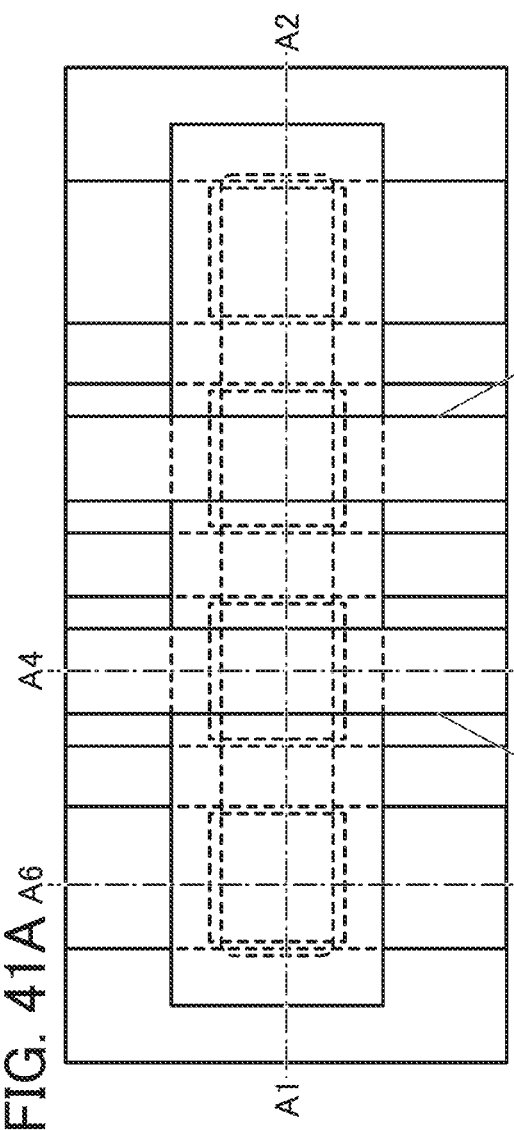
Figure 41D:
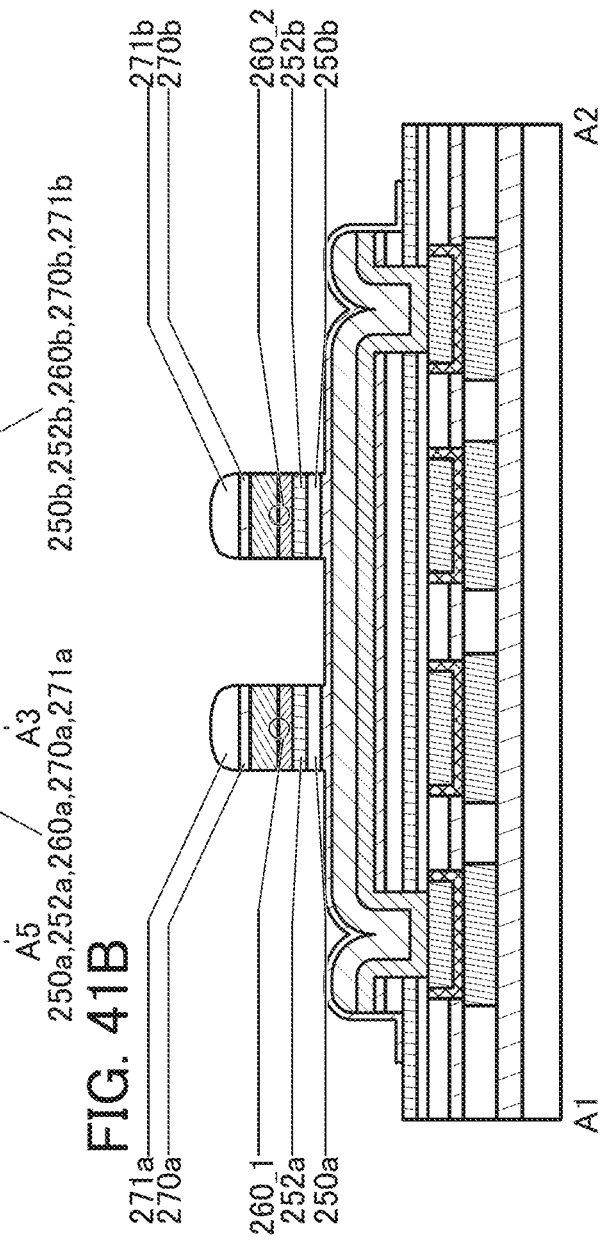
Figure 43A:
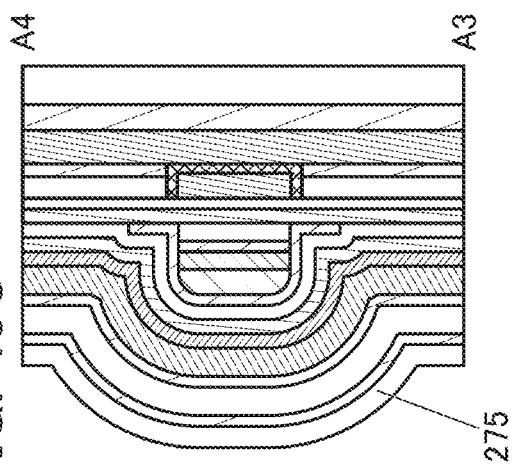
FIGS. 43A to 43D are a top view and cross sections illustrating a method for manufacturing a semiconductor device according to one embodiment of the present invention.
Figure 43C:
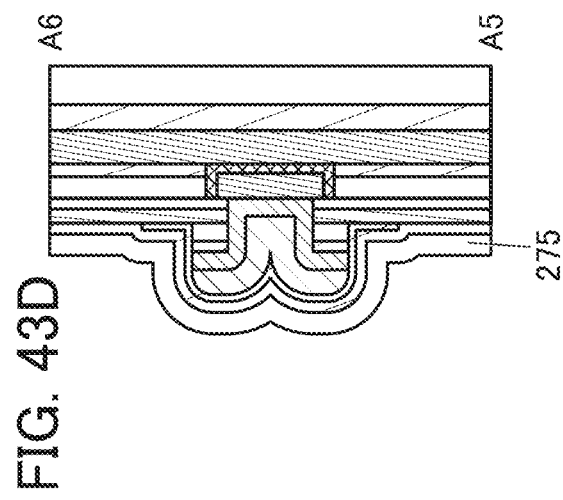
Figure 43B:
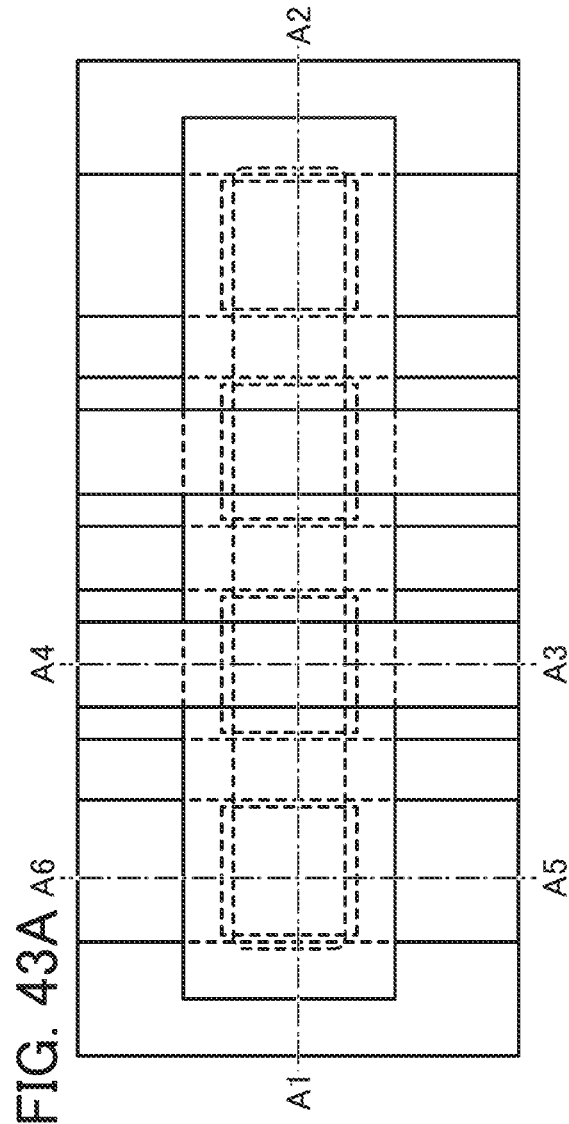
Figure 43D:
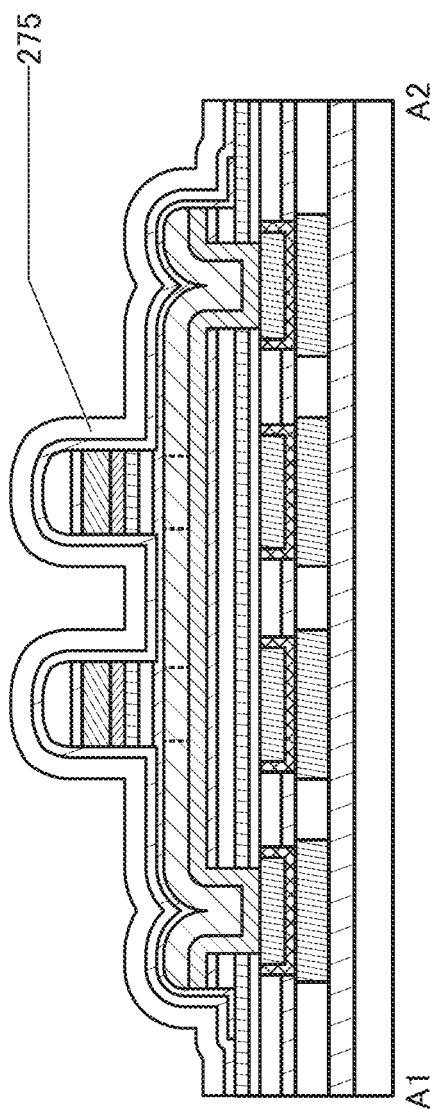
Figure 44C:
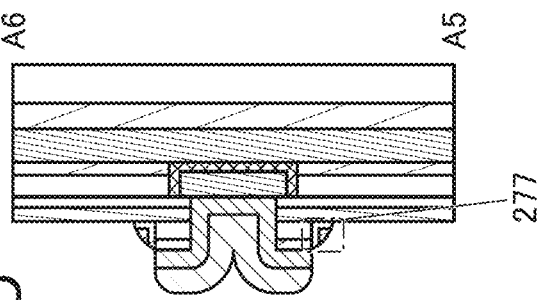
FIGS. 44A to 44D are a top view and cross sections illustrating a method for manufacturing a semiconductor device according to one embodiment of the present invention.
Figure 44D:
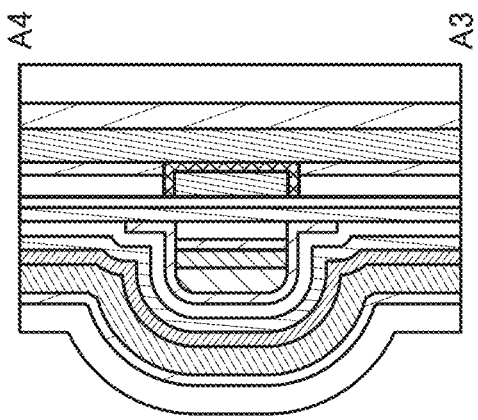
Figure 44A:
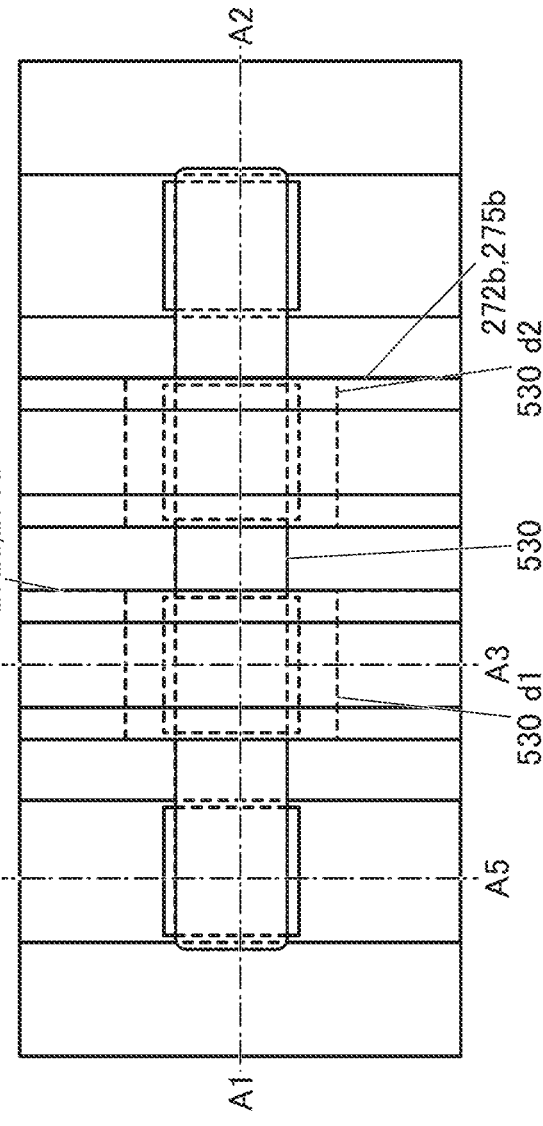
Figure 44B:
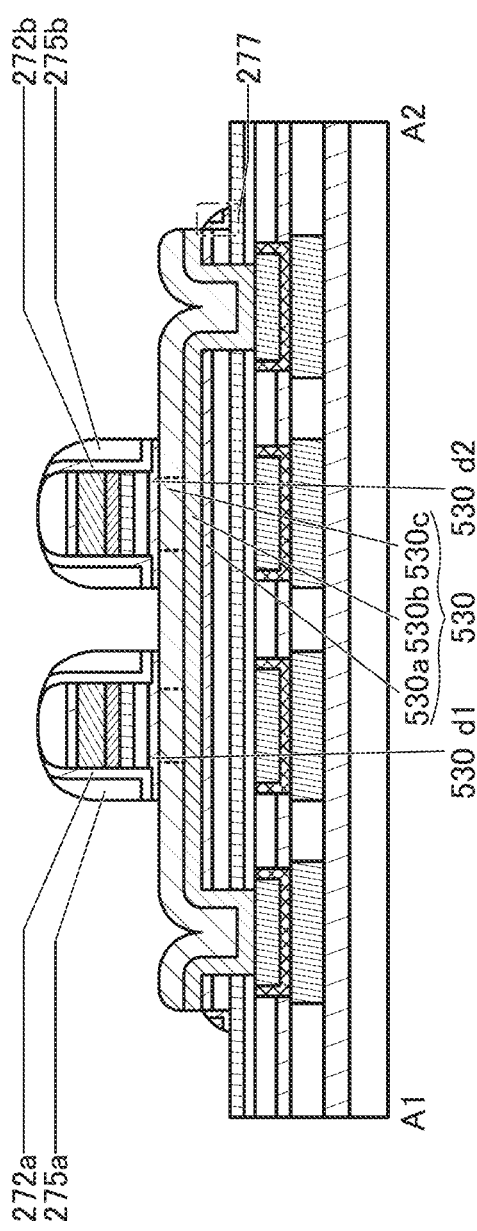
Figure 45A:
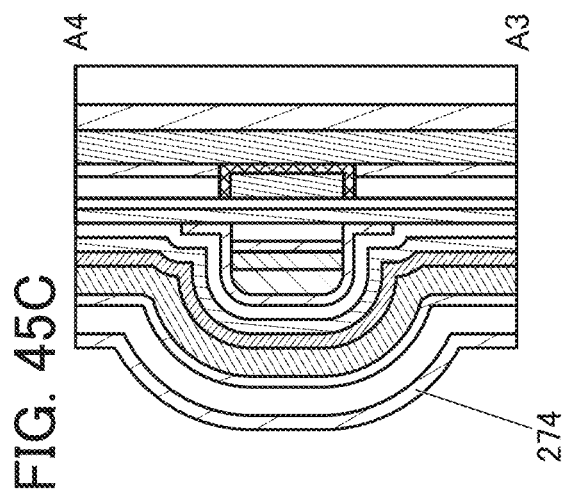
FIGS. 45A to 45D are a top view and cross sections illustrating a method for manufacturing a semiconductor device according to one embodiment of the present invention.
Figure 45C:
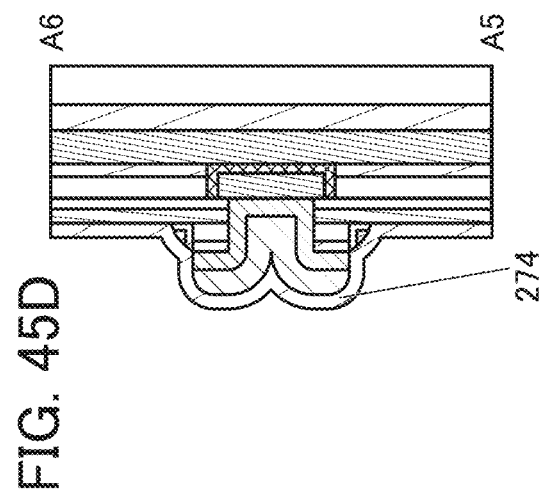
Figure 45B:
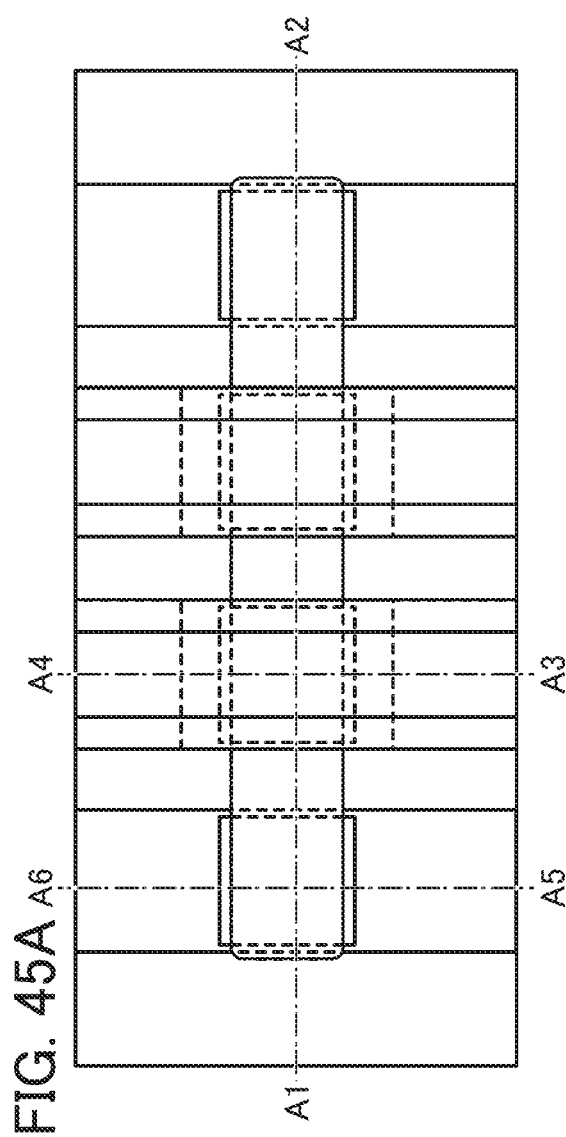
Figure 45D:
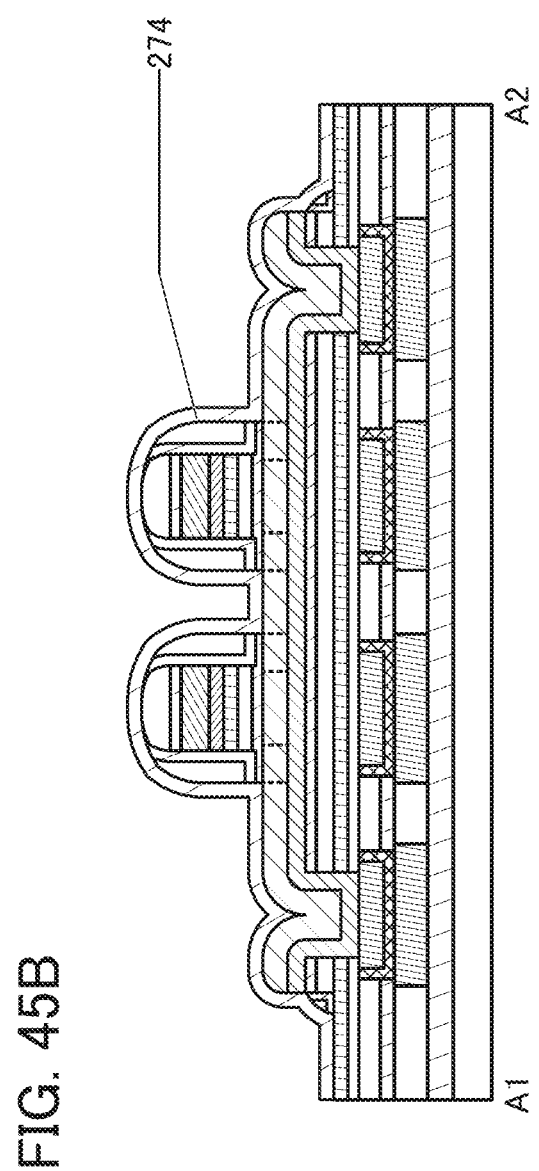
Figure 46C:
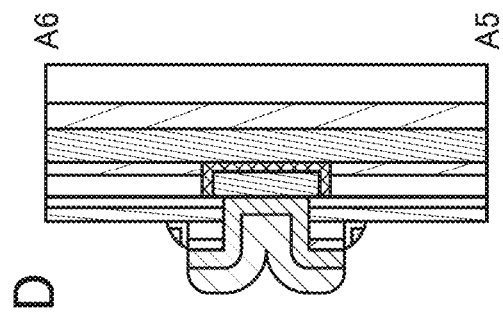
FIGS. 46A to 46D are a top view and cross sections illustrating a method for manufacturing a semiconductor device according to one embodiment of the present invention.
Figure 46D:
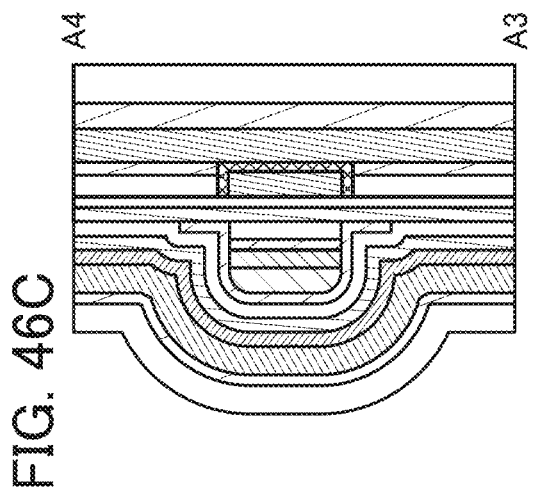
Figure 46A:
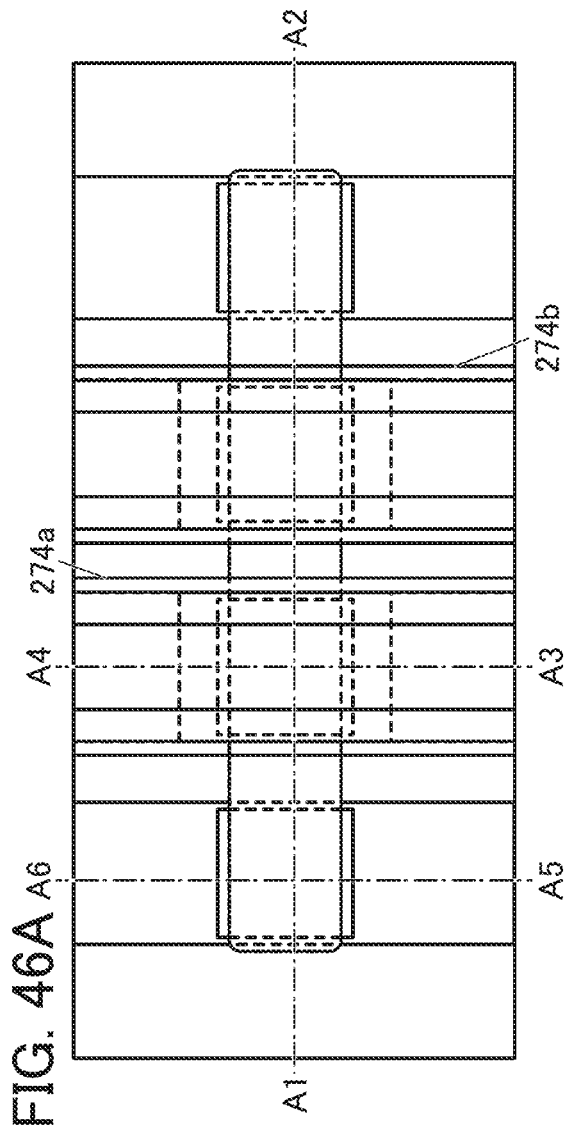
Figure 46B:
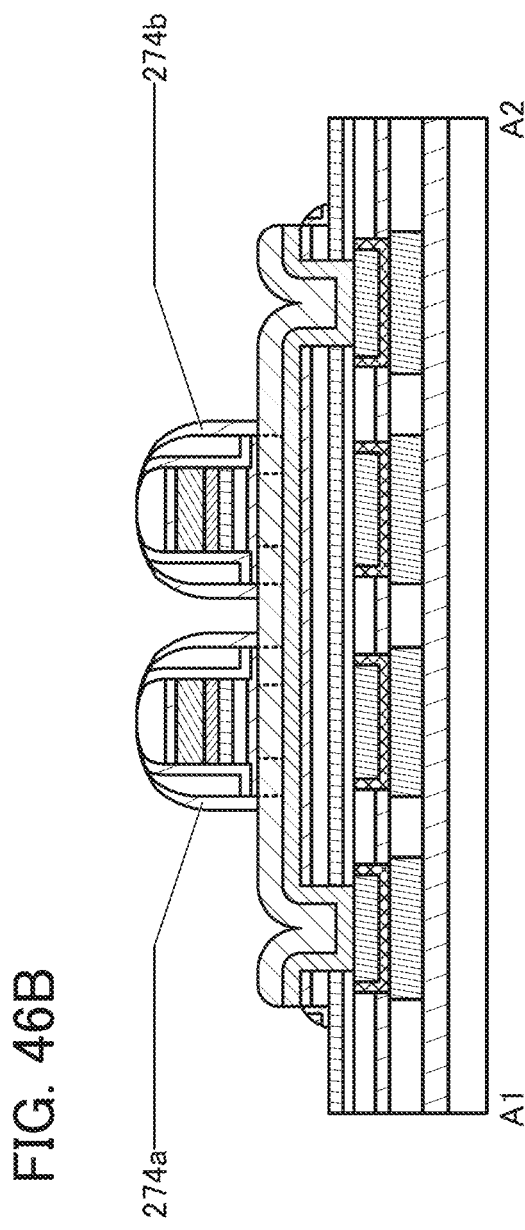
Figure 48A:
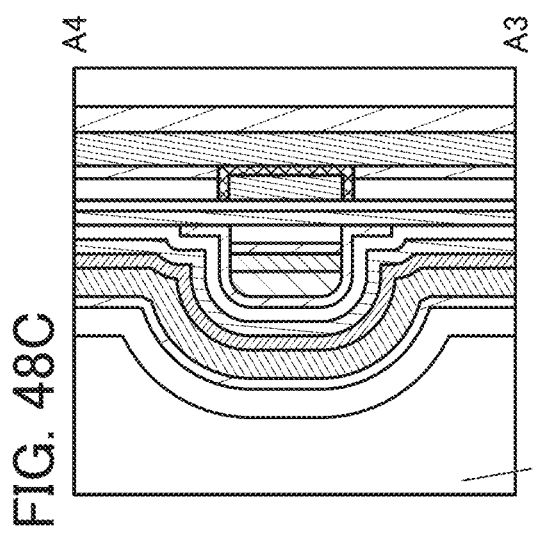
FIGS. 48A to 48D are a top view and cross sections illustrating a method for manufacturing a semiconductor device according to one embodiment of the present invention.
Figure 48C:
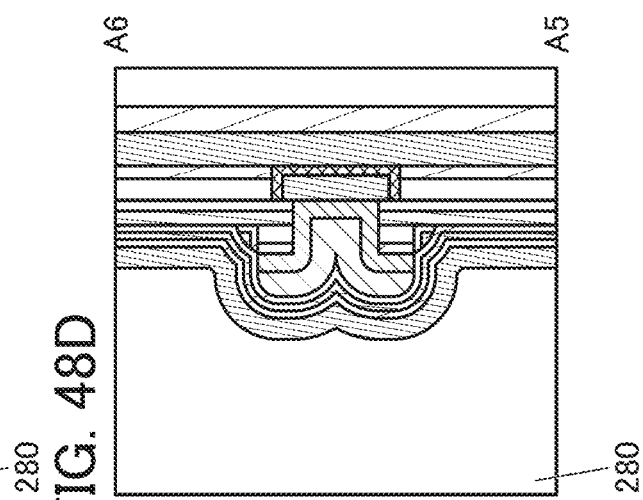
Figure 48B:
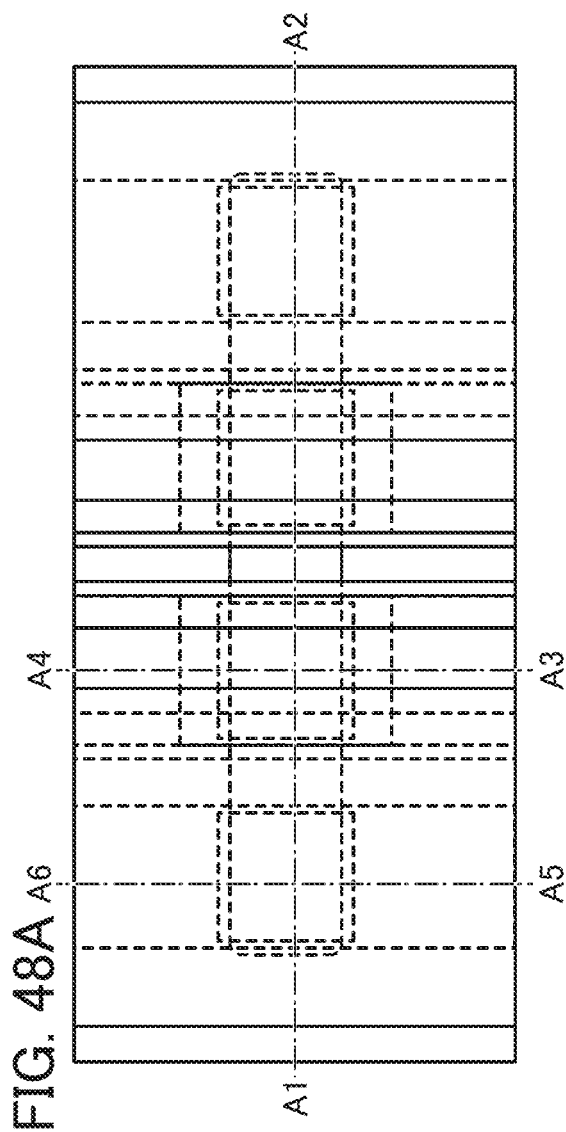
Figure 48D:
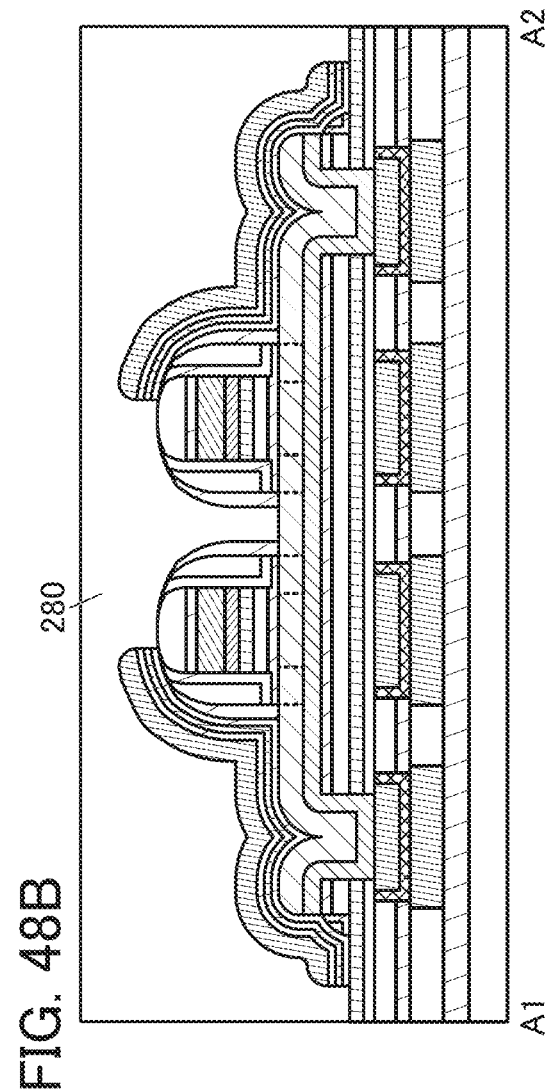
Figure 49A:
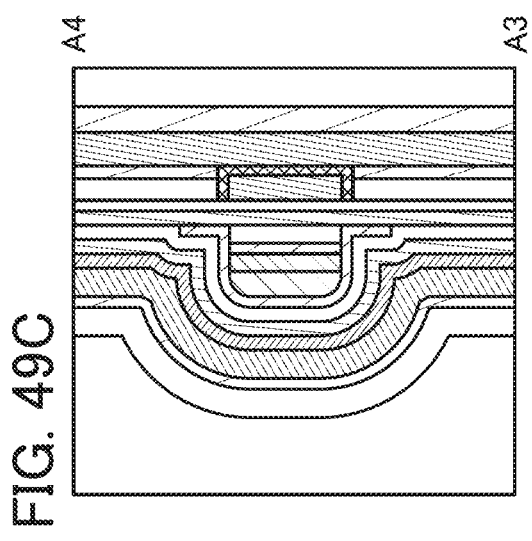
FIGS. 49A to 49D are a top view and cross sections illustrating a method for manufacturing a semiconductor device according to one embodiment of the present invention.
Figure 49C:
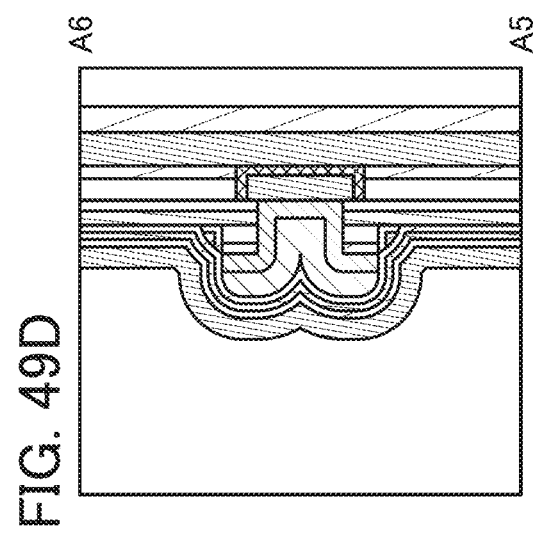
Figure 49B:
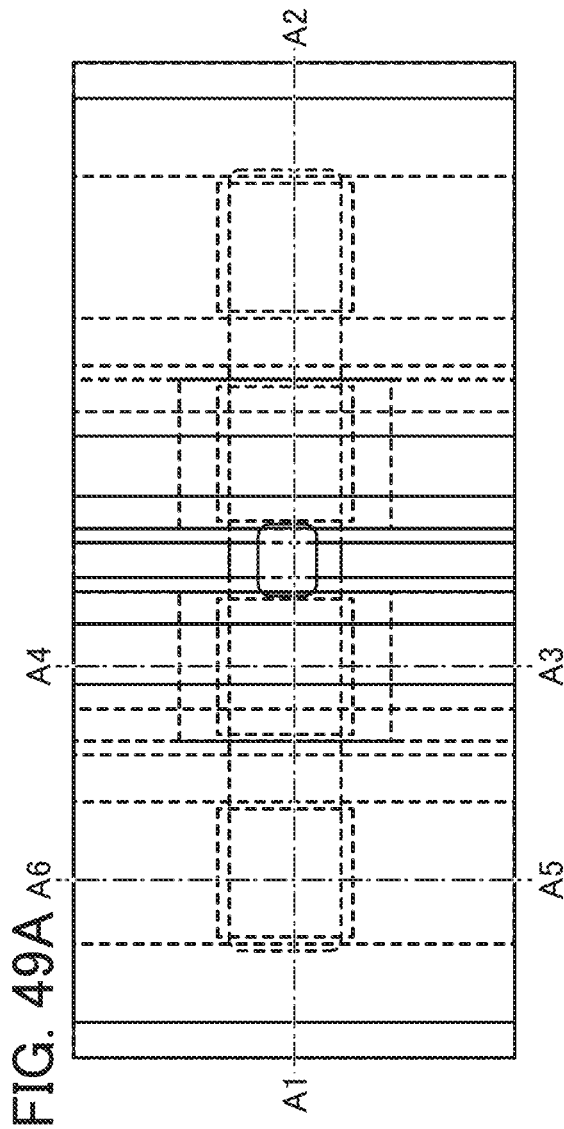
Figure 49D:
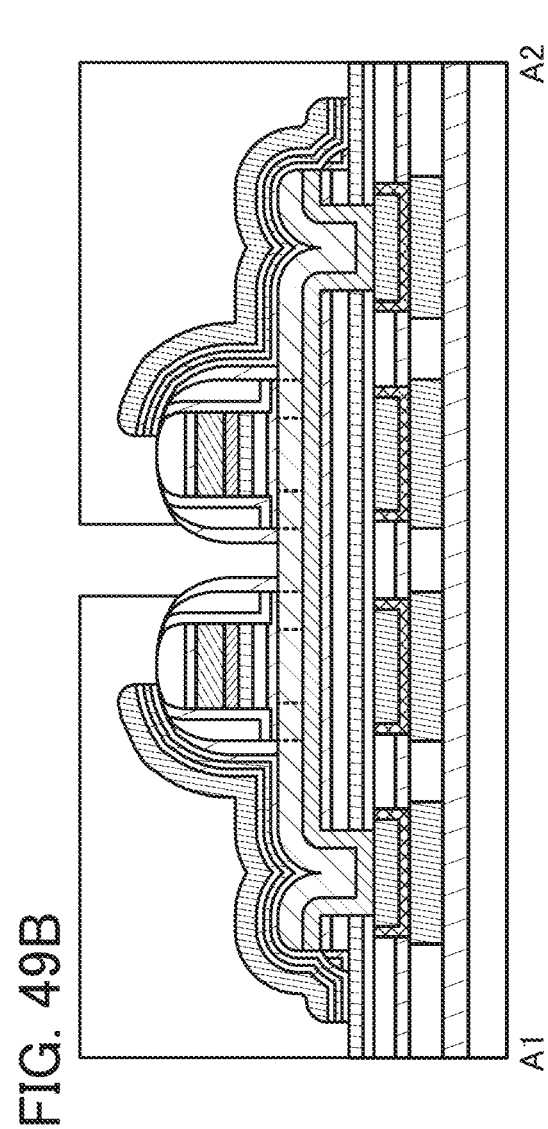
Figure 50C:
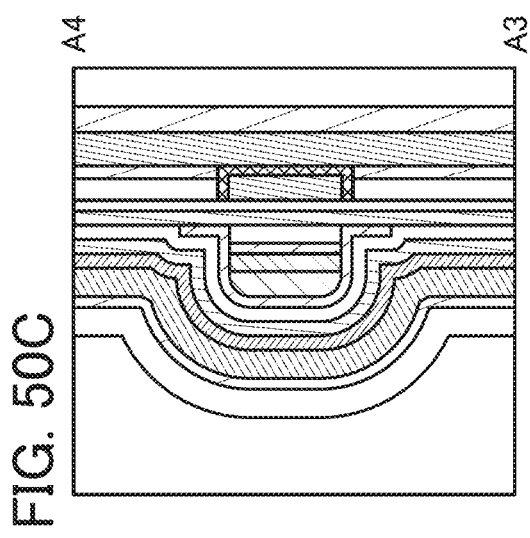
FIGS. 50A to 50D are a top view and cross sections illustrating a method for manufacturing a semiconductor device according to one embodiment of the present invention.
Figure 50D:
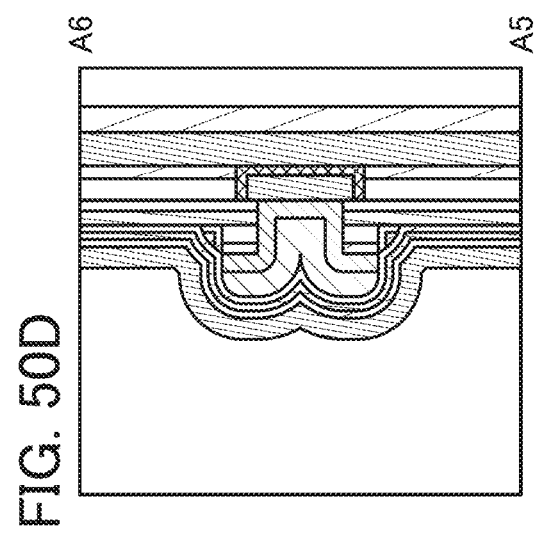
Figure 50A:
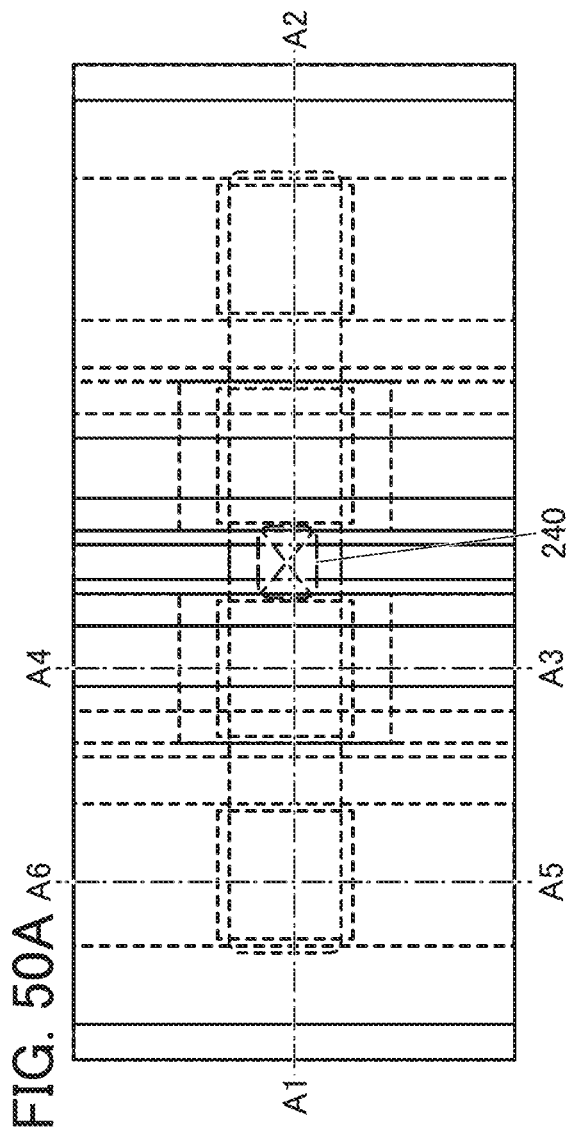
Figure 50B:
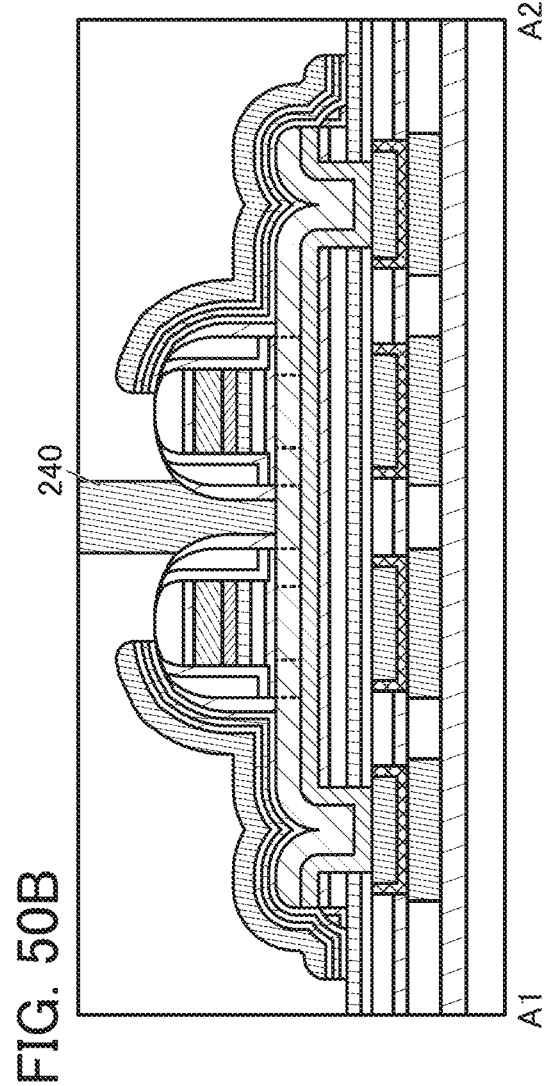

Here, an enlarged view of a region including a channel and a vicinity of the channel of the transistor 200*a* in FIG. 30B is shown in FIG. 33.

As illustrated in FIG. 33, the oxide 530 includes the region 234 functioning as a channel formation region of the transistor 200a, the region 231 (the region 231a or the region 231b) functioning as a source region or a drain region, and the junction region 232 (the junction region 232a or the junction region 232b) between the region 234 and the region 231.

Note that in this specification and the like, the region 234 is referred to as a first region in some cases. Furthermore, the junction region 232 is referred to as a second region in some cases. Furthermore, the region 231 is referred to as a third region in some cases.

The region 231 functioning as the source region or the drain region has a high carrier density and reduced resistance. The region 234 functioning as the channel formation region has a lower carrier density than the region 231 functioning as the source region or the drain region. The junction region 232 has a lower carrier density than the region 231 functioning as the source region or the drain region and has a higher carrier density than the region 234 functioning as the channel formation region. That is, the junction region 232 functions as a junction region between the channel formation region and the source region or the drain region.

The junction region 232 prevents a high-resistance region from being formed between the region 231 functioning as the source region or the drain region and the region 234 functioning as the channel formation region, thereby increasing on-state current of the transistor.

The junction region 232 sometimes functions as an overlap region (also referred to as an Lov region) which overlaps with the conductor 260_1 that functions as a gate electrode.

Note that the region 231 is preferably in contact with the insulator 274a. The concentration of at least one of a metal element such as indium and impurity elements such as hydrogen and nitrogen in the region 231 is preferably higher than that in each of the junction region 232 and the region 234.

The junction region 232 includes a region overlapping with the insulator 272a. The concentration of at least one of a metal element such as indium and impurity elements such as hydrogen and nitrogen in the junction region 232 is preferably higher than that in the region 234. On the other hand, the concentration of at least one of a metal element such as indium and impurity elements such as hydrogen and nitrogen in the region 232 is preferably lower than that in the region 231.

The region 234 overlaps with the conductor 260_1. The region 234 is provided between the junction region 232a and the junction region 232b, and the concentration of at least one of a metal element such as indium and impurity elements such as hydrogen and nitrogen in the region 234 is preferably lower than that in each of the region 231, and the junction region 232.

In the oxide 530, a boundary between the region 231, the junction region 232, and the region 234 cannot be observed clearly in some cases. The concentration of a detected metal element such as indium and the concentration of a detected impurity element such as hydrogen and nitrogen may be gradually changed (also referred to as gradation) not only between the regions but also in each region. That is, the region closer to the region 234 preferably has a lower concentration of a metal element such as indium and impurity elements such as hydrogen and nitrogen. The concentration of impurity elements in the region 232 is lower than that in the region 231.

Furthermore, in FIG. 33, the region 234, the region 231, and the junction region 232 are formed in the oxide 530c; however, the present invention is not limited thereto. For example, these regions may be formed in the oxide 530b. Although the boundaries between the regions are indicated substantially perpendicularly to the top surface of the oxide 530 in FIG. 33, this embodiment is not limited thereto.

Note that in the transistor 200a, the oxide 530 is preferably formed using a metal oxide functioning as an oxide semiconductor. A transistor formed using an oxide semiconductor has an extremely low leakage current (off-state current) in an off state; thus, a semiconductor device with low power consumption can be provided. An oxide semiconductor can be formed by a sputtering method or the like and thus can be used in a transistor included in a highly integrated semiconductor device.

However, the transistor formed using an oxide semiconductor is likely to have its electrical characteristics changed by impurities and oxygen vacancies in the oxide semiconductor; as a result, the reliability is reduced, in some cases. Hydrogen contained in an oxide semiconductor reacts with oxygen bonded to a metal atom to be water, and thus causes oxygen vacancies, in some cases. Entry of hydrogen into the oxygen vacancies generates electrons functioning as carriers in some cases. Accordingly, a transistor including an oxide semiconductor containing oxygen vacancies in a channel formation region is likely to have normally-on characteristics. Thus, it is preferable that oxygen vacancies in the channel formation region be reduced as much as possible.

When oxygen vacancies exist at an interface between the oxide 530_d1 and the insulator 250a functioning as a gate insulating film, a variation in the electrical characteristics is likely to occur or the reliability is reduced in some cases.

In view of the above, the insulator 250a which overlaps with the region 234 of the oxide 530 preferably contains oxygen at a higher proportion than oxygen in the stoichiometric composition (also referred to as "excess oxygen"). That is, excess oxygen contained in the insulator 250a is diffused into the region 234, whereby oxygen vacancies in the region 234 can be reduced.

The insulator 272a is preferably provided in contact with the surface side of the insulator 250a. For example, the insulator 272a is preferably formed using an insulating material having a function of suppressing diffusion of oxygen (e.g., at least one of oxygen atoms or oxygen molecules), that is, an insulating material through which the above oxygen is less likely to pass. When the insulator 272a has a function of suppressing diffusion of oxygen, oxygen of the insulator 250a is not diffused to the insulator 274a side and thus is supplied to the region 234 efficiently. Furthermore, the insulator 272a is preferably an insulator in which impurities such as water or hydrogen are reduced. Furthermore, the insulator 272a is preferably an insulator which has a barrier property to prevent entry of impurities such as water or hydrogen. Such a function can prevent impurities such as water or hydrogen from entering the region 234. In this manner, formation of oxygen vacancies at an interface between the oxide 530_d1 and the insulator 250a can be suppressed, leading to an improvement in the reliability of the transistor 200a.

Furthermore, the transistor 200a is preferably covered with an insulator which has a barrier property and prevents entry of impurities such as water and hydrogen. The insulator having a barrier property is formed using an insulating material having a function of suppressing diffusion of impurities such as a hydrogen atom, a hydrogen molecule, a water molecule, a nitrogen atom, a nitrogen molecule, a nitrogen oxide molecule (e.g., $N_2O$, NO, and $NO_2$), and a copper atom, that is, an insulating material having a barrier property through which the above impurities are less likely to pass. Alternatively, the insulator is preferably formed using an insulating material having a function of suppressing diffusion of oxygen (e.g., at least one of oxygen atoms or oxygen molecules), that is, an insulating material through which the above oxygen is less likely to pass.

The structure of a semiconductor device including the transistor 200*a* and the transistor 200*b* of one embodiment of the present invention is described in detail below. Note that also in the following description, the description of the transistor 200*a* can be referred to for the structure of the transistor 200*b*.

The conductor 205_1 functioning as the second gate electrode of the transistor 200*a* is provided to overlap with the oxide 530 and the conductor 260_1.

The conductor 205_1 is preferably provided so that the length in the channel width direction is larger than that of the region 234 in the oxide 530. That is, it is preferable that the conductor 205_1 and the conductor 260_1 overlap with each other with the insulator therebetween in a region on an outer side of a side surface of the oxide 530 in the channel width direction.

Here, the conductor 260_1 functions as the first gate electrode of the transistor 200*a* in some cases. Furthermore, the conductor 205_1 functions as the second gate electrode of the transistor 200*a* in some cases. A potential applied to the conductor 205_1 can be the same as a potential applied to the conductor 260_1, or can be a ground potential or a given potential. Furthermore, by changing a potential applied to the conductor 205_1 independently of a potential applied to the conductor 260_1, the threshold voltage of the transistor 200*a* can be controlled. In particular, by applying a negative potential to the conductor 205_1, the threshold voltage of the transistor 200*a* can be higher than 0 V, and the off-state current can be reduced. Accordingly, a drain current when a voltage applied to the conductor 260_1 is 0 V can be reduced.

As illustrated in FIG. 30A, the conductor 205_1 is provided to overlap with the oxide 530 and the conductor 260_1. The conductor 205_1 is preferably provided to overlap with the conductor 260_1 even in the region on an outer side of the side surface of the oxide 530 that intersect with the channel width direction (W length direction). That is, the conductor 205_1 and the conductor 260_1 preferably overlap with each other with the insulator therebetween in the region on an outer side of the side surface of the oxide 530 in the channel width direction.

With the above structure, in the case where potentials are applied to the conductor 260_1 and the conductor 205_1, an electric field generated from the conductor 260_1 and an electric field generated from the conductor 205_1 are connected, so that a closed circuit which covers the channel formation region in the oxide 530 can be formed.

That is, the channel formation region in the region 234 can be electrically surrounded by the electric field of the conductor 260_1 functioning as the first gate electrode and the electric field of the conductor 205_1 functioning as the second gate electrode. In this specification, such a transistor structure in which the channel formation region is electrically surrounded by the electric fields of the first gate electrode and the second gate electrode is referred to as a surrounded channel (s-channel) structure.

The conductor 260_1 is positioned to extend in the channel width direction. The conductor 260_1 can function as a first gate, and the conductor 205_1 can function as a second gate. The potential of the second gate can be the same as the potential of the first gate, the ground potential, or a given potential. By changing the potential of the second gate independently of the potential of the first gate, the threshold voltage of the transistor can be changed.

The conductor 203_1 extends in the channel width direction in a manner similar to that of the conductor 260_1, and functions as a wiring through which a potential is applied to the conductor 205_1, i.e., the second gate. When the conductor 205_1 is stacked over the conductor 203_1 functioning as the wiring for the second gate so as to be embedded in the insulators 214 and 216, the insulators 214 and 216 and the like are positioned between the conductor 203_1 and the conductor 260_1, reducing the parasitic capacitance between the conductor 203_1 and the conductor 260_1 and thereby increasing the withstand voltage. The reduction in the parasitic capacitance between the conductor 203_1 and the conductor 260_1 can improve the switching speed of the transistor, so that the transistor can have high frequency characteristics. The increase in the withstand voltage between the conductor 203_1 and the conductor 260_1 can improve the reliability of the transistor 200*a*. Therefore, the thicknesses of the insulator 214 and the insulator 216 are preferably large. Note that the extending direction of the conductor 203_1 is not limited to this example; for example, the conductor 203_1 may extend in the channel length direction of the transistor 200*a*.

The conductor 206_1 and the conductor 205_1 are formed to be embedded in the opening in the insulator 214 and the insulator 216. The top surfaces of the conductor 206_1 and the conductor 205_1 can be positioned at substantially the same level as the top surface of the insulator 216. The conductor 206_1 and the conductor 205_1 may be stacked in the transistor 200*a*.

Here, it is preferable to use conductive materials that have a function of inhibiting the passage of impurities such as water and hydrogen (that is relatively impermeable to such impurities) for the lower layer of the conductor 206_1 and the lower layer of the conductor 205_1 in the case where the conductor 206_1 and the conductor 205_1 have a layered structure. For example, tantalum, tantalum nitride, ruthenium, ruthenium oxide, or the like is preferably used, and a single layer or stacked layers may be used. Accordingly, diffusion of impurities such as hydrogen and water from a layer under the insulator 214 into an upper layer through the conductor 206_1 and the conductor 205_1 can be inhibited. Note that it is preferable that the lower layer of the conductor 206_1 and the lower layer of the conductor 205_1 have a function of inhibiting the passage of at least either of impurities such as a hydrogen atom, a hydrogen molecule, a water molecule, a nitrogen atom, a nitrogen molecule, a nitrogen oxide molecule (e.g., $N_2O$, NO, or $NO_2$), or a copper atom, or an oxygen atom, an oxygen molecule, or the like. Furthermore, in the following description, the same preferably applies to a conductive material having a function of inhibiting the passage of impurities. When the lower layer of the conductor 206_1 and the lower layer of the conductor 205_1 have a function of inhibiting the passage of oxygen, the conductivity of the upper layer of the conductor 206_1 and the upper layer of the conductor 205_1 can be prevented from being lowered because of oxidation.

Furthermore, the upper layer of the conductor 206_1 and the upper layer of the conductor 205_1 are preferably formed using a conductive material including tungsten, copper, or aluminum as its main component. Although not shown, the upper layer of the conductor 206_1 and the upper layer of the conductor 205_1 may have a layered structure, and for example, stacked layers of titanium, titanium nitride, and the above-described conductive material may be formed.

Furthermore, the insulator 220, the insulator 222, the insulator 224, and the oxide 530a have openings. Furthermore, the oxide 530b is electrically connected to the conductor 206_1 through the opening. The oxide 530b is electrically connected to the conductor 206_1 without the oxide 530a therebetween; thus, the series resistance and the contact resistance can be reduced. With such a structure, a semiconductor device with favorable electrical characteristics can be obtained. Specifically, a transistor with high on-state current and a semiconductor device including the transistor are achieved.

The insulator 214 and the insulator 222 can function as barrier insulating films that prevent impurities such as water or hydrogen from entering the transistor from a lower layer. The insulator 214 and the insulator 222 are each preferably formed using an insulating material having a function of inhibiting the passage of impurities such as water or hydrogen. For example, it is preferable that silicon nitride or the like be used for the insulator 214 and aluminum oxide, hafnium oxide, an oxide containing silicon and hafnium (hafnium silicate), an oxide containing aluminum and hafnium (hafnium aluminate), or the like be used for the insulator 222. This can suppress diffusion of impurities such as hydrogen and water to a layer positioned above the insulator 214 and the insulator 222. Note that it is preferable that the insulator 214 and the insulator 222 have a function of inhibiting the passage of at least one of impurities such as a hydrogen atom, a hydrogen molecule, a water molecule, a nitrogen atom, a nitrogen molecule, a nitrogen oxide molecule (e.g., $N_2O$, NO, and $NO_2$), and a copper atom.

Furthermore, each of the insulator 214 and the insulator 222 is preferably formed using an insulating material that is capable of inhibiting the passage of oxygen (e.g., an oxygen atom or an oxygen molecule). With this material, oxygen contained in the insulator 224 or the like can be inhibited from diffusing into lower layers.

Furthermore, the concentration of impurities such as water, hydrogen, or nitrogen oxide in the insulator 222 is preferably lowered. The amount of hydrogen released from the insulator 222, which is converted into hydrogen molecules per unit area of the insulator 222, is less than or equal to $2 \times 10^{15}$ molecules/cm$^2$, preferably less than or equal to $1 \times 10^{15}$ molecules/cm$^2$, further preferably less than or equal to $5 \times 10^{14}$ molecules/cm$^2$ in thermal desorption spectroscopy (TDS) in surface temperature range of 50° C. to 500° C., for example. The insulator 222 is preferably formed using an insulator from which oxygen is released by heating.

The insulator 250a can function as a first gate insulating film of the transistor 200a. The insulators 220, 222, and 224 can function as second gate insulating films of the transistor 200a. Although the insulator 220, the insulator 222, and the insulator 224 are stacked in the transistor 200a, the present invention is not limited to this structure. For example, any two of the insulators 220, 222, and 224 may be stacked, or any one of the insulators may be used.

The oxide 530 is preferably formed using a metal oxide functioning as an oxide semiconductor. The metal oxide preferably has an energy gap of 2 eV or more, preferably 2.5 eV or more. With the use of a metal oxide having such a wide energy gap, the off-state current of the transistor can be reduced.

A transistor formed using an oxide semiconductor has an extremely low leakage current in an off state; thus, a semiconductor device with low power consumption can be provided. An oxide semiconductor can be formed by a sputtering method or the like and thus can be used in a transistor included in a highly integrated semiconductor device.

An oxide semiconductor preferably contains at least indium or zinc. In particular, indium and zinc are preferably contained. In addition, aluminum, gallium, yttrium, tin, or the like is preferably contained. Furthermore, one or more elements selected from boron, silicon, titanium, iron, nickel, germanium, zirconium, molybdenum, lanthanum, cerium, neodymium, hafnium, tantalum, tungsten, magnesium, or the like may be contained.

Here, the case where the oxide semiconductor is an In-M-Zn oxide that contains indium, an element M, and zinc is considered. The element M is aluminum, gallium, yttrium, tin, or the like. Other elements that can be used as the element M include boron, silicon, titanium, iron, nickel, germanium, zirconium, molybdenum, lanthanum, cerium, neodymium, hafnium, tantalum, tungsten, and magnesium. Note that two or more of the above elements may be used in combination as the element M.

Note that in this specification and the like, a metal oxide including nitrogen is also called a metal oxide in some cases. Moreover, a metal oxide including nitrogen may be called a metal oxynitride.

Here, the atomic ratio of the element M to constituent elements in a metal oxide used as the oxide 530a is preferably greater than that in metal oxides used as the oxide 530b and the oxide 530c. Moreover, the atomic ratio of the element M to In in the metal oxide used as the oxide 530a is preferably greater than that in the metal oxides used as the oxide 530b and the oxide 530c. Moreover, the atomic ratio of the element In to M in the metal oxides used as the oxide 530b and the oxide 530c is preferably greater than that in the metal oxide used as the oxide 530a.

When using the above metal oxide as the oxide 530a, it is preferable that the conduction band minimum of the oxide 530a be higher than that of the oxide 530b and that of the oxide 530c. In other words, the electron affinity of the oxide 530a is preferably smaller than that of the oxide 530b and that of the oxide 530c.

Here, the conduction band minimum is gradually varied in the oxides 530a and 530b. In other words, the energy level of the conduction band minimum is continuously varied or continuously connected. To vary the conduction band minimum gradually, the density of defect states in a mixed layer formed at the interface between the oxides 530a and 530b is decreased.

Specifically, when the oxides 530a and 530b contain the same element (as a main component) in addition to oxygen, a mixed layer with a low density of defect states can be formed. For example, in the case where the oxide 530b is an In—Ga—Zn oxide, it is preferable to use an In—Ga—Zn oxide, a Ga—Zn oxide, gallium oxide, or the like for the oxide 530a.

At this time, a narrow-gap portion formed in the oxides 530b and 530c functions as a main carrier path. Since the density of defect states at the interface between the oxides 530a and 530b can be decreased, the influence of interface scattering on carrier conduction is small, and a high on-state current can be obtained.

The electron affinity or the energy level Ec of the conduction band minimum can be obtained from an energy gap Eg and an ionization potential Ip, which is a difference between the vacuum level Evac and the energy level Ev of the valence band maximum, as shown in FIG. 19. The ionization potential Ip can be measured using, for example, an ultraviolet photoelectron spectroscopy (UPS) apparatus. The energy gap Eg can be measured using, for example, a spectroscopic ellipsometer.

Furthermore, as shown in FIG. 30B, a side surface of a structure body including the insulator 250a, the insulator 252a, the conductor 260_1, the insulator 270a, and the insulator 271a is preferably substantially perpendicular to the top surface of the insulator 222. Note that the semiconductor device described in this embodiment is not limited thereto. For example, as shown in FIGS. 31A to 31D, an angle formed by the side surface of the structure body including the insulator 250a, the insulator 252a, the conductor 260_1, the insulator 270a, and the insulator 271a and the top surface of the insulator 222 may be an acute angle. In that case, the angle formed by the side surface of the structure body and the top surface of the insulator 222 is preferably as large as possible.

The insulator 272a is provided to be in contact with at least the side surfaces of the oxide 530_d1, the insulator 250a, the insulator 252a, the conductor 260_1, and the insulator 270a. Furthermore, the insulator 275a is provided to be in contact with the insulator 272a. An insulator to be the insulator 272a is preferably formed using an ALD method. By using an ALD method, an insulator having excellent coverage and few defects such as pinholes can be formed. Therefore, the film thickness of the insulator 272a can be approximately more than or equal to 0.5 nm and less than or equal to 10 nm, preferably more than or equal to 0.5 nm and less than or equal to 3 nm. Note that a precursor used in an ALD method sometimes contains impurities such as carbon. Thus, the insulator 272a may contain impurities such as carbon. In the case where an insulator to be the insulator 252a is formed by a sputtering method and the insulator to be the insulator 272a is formed by an ALD method, for example, even when aluminum oxide is formed as the insulator to be the insulator 272a and the insulator to be the insulator 252a, the insulator 272a may contain more impurities such as carbon than the insulator 252a. Note that impurities can be quantified by X-ray photoelectron spectroscopy (XPS).

Furthermore, the insulator to be the insulator 272a may be formed by a sputtering method. By using a sputtering method, an insulator having less impurities such as water or hydrogen can be formed. In the case of using a sputtering method, a facing-target sputtering apparatus is preferably used, for example. With the use of the facing-target sputtering apparatus, deposition can be performed without exposing a deposition surface to a high electric field region between facing targets; thus, the film-formation surface is less likely to be damaged due to plasma. Since deposition damage on the oxide 530 due to plasma during the deposition of the insulator to be the insulator 272a can be small, the sputtering apparatus is preferably used. Deposition using the facing-target sputtering apparatus can also be referred to as vapor deposition SP (VDSP, registered trademark).

The region 231 and the junction region 232 of the oxide 530 are formed by impurity elements that are added when the insulator to be the insulator 274a is formed. Thus, the insulator to be the insulator 274a preferably contains at least one of hydrogen and nitrogen. Moreover, the insulator to be the insulator 274a is preferably formed using an insulating material having a function of inhibiting the passage of impurities such as water or hydrogen and oxygen. For example, the insulator to be the insulator 274a is preferably formed using silicon nitride, silicon nitride oxide, silicon oxynitride, aluminum nitride, or aluminum nitride oxide.

Instead of or in addition to the above-described method, an ion implantation method, an ion doping method by which an ionized source gas is added without mass separation, a plasma immersion ion implantation method, or the like can be used to form the region 231 and the junction region 232 of the oxide 530. The method is preferably performed after the insulator to be the insulator 272a is formed. When the method is performed through the insulator to be the insulator 272a, the damage to the oxide 530 during the implantation can be reduced.

In the case where mass separation is performed by an ion doping method, a plasma immersion ion implantation method, or the like, ion species to be added and its concentration can be controlled properly. On the other hand, in the case of not performing mass separation, ions at a high concentration can be added in a short time. Alternatively, an ion doping method in which atomic or molecular clusters are generated and ionized may be employed. Instead of the term "dopant", the term "ion", "donor", "acceptor", "impurity", "element", or the like may be used.

As the dopant, the element that forms oxygen vacancies, the element bonded to oxygen vacancies, or the like is used. Typical examples of the element are hydrogen, boron, carbon, nitrogen, fluorine, phosphorus, sulfur, chlorine, titanium, and a rare gas element. Typical examples of the rare gas element are helium, neon, argon, krypton, and xenon.

In the case where the transistor is miniaturized to have a channel length of approximately 10 nm to 30 nm, the impurity element contained in the source region or the drain region might be diffused to bring electrical connection between the source region and the drain region. In this embodiment, however, a sufficient width of the region 234 of the oxide 530 can be obtained by providing the insulator 272a and the insulator 275a; thus, the source region and the drain region can be prevented from being electrically connected to each other.

Here, the insulator 270a and the insulator 272a are preferably formed using an insulating material that has a function of inhibiting the passage of oxygen and impurities such as water and hydrogen. For example, an insulator including an oxide containing one of or both aluminum and hafnium can be used. Aluminum oxide, hafnium oxide, an oxide containing aluminum and hafnium (hafnium aluminate), or the like may be used for the insulator including an oxide containing one of or both aluminum and hafnium. In this manner, oxygen in the insulator 250a can be prevented from diffusing outward. In addition, impurities such as hydrogen and water can be prevented from entering the oxide 530 through the end portion of the insulator 250a or the like.

By provision of the insulator 270a and the insulator 272a, the top surface and the side surface of the conductor 260_1 and the side surface of the insulator 250a can be covered with an insulator having a function of inhibiting the passage of oxygen and impurities such as water and hydrogen. This can prevent oxidization of the conductor 260_1 and entry of impurities such as water and hydrogen into the oxide 530 through the conductor 260_1 and the insulator 250a. Thus, the insulator 270a and the insulator 272a function as a barrier for protecting the gate electrode and the gate insulating film.

The insulator 275a is formed by forming the insulator to be the insulator 275a and then performing anisotropic etching. By the etching, the insulator 275a is formed so as to be in contact with the insulator 272a.

The insulator 274a is formed by forming the insulator to be the insulator 274a and then performing anisotropic etching. The insulator 274a is formed so as to have a portion in contact with the top surface of the oxide 530 and the side surface of the insulator 275a by the etching.

Furthermore, the insulator 280 is preferably provided so as to cover the transistor 200a and the transistor 200b in the semiconductor device. The concentration of impurities such as water or hydrogen in the insulator 280 is preferably lowered.

An opening is formed in the insulator 280 so that an inner wall of the opening in the insulator 280 is in contact with side surfaces of the insulator 274a and the insulator 274b. In order to form such an opening, it is preferable that the etching rate of the insulator 280 be extremely lower than that of the insulator 274a and the insulator 274b at the time of forming the opening in the insulator 280. When the etching rate of the insulator 274a and the insulator 274b are set to 1, the etching rate of the insulator 280 is preferably set to 5 or more, further preferably 10 or more. In such a manner, the opening can be formed in a self-aligned manner and the space between the opening and the gate electrode can be designed smaller, so that the semiconductor device can be highly integrated.

After the opening is formed, a low-resistance region may be formed in the oxide 530 by an ion implantation method, an ion doping method by which an ionized source gas is added without mass separation, a plasma immersion ion plantation method, or the like.

Here, the conductor 240 is formed in contact with the inner wall of the opening in the insulator 280. The region 231 of the oxide 530 is positioned on at least part of a bottom portion of the opening, and thus the conductor 240 is in contact with the region 231.

The conductor 240 functions as one of a source electrode and a drain electrode of the transistor 200a and one of a source electrode and a drain electrode of the transistor 200b. With such a structure, the space between the transistor 200a and the transistor 200b that are adjacent to each other can be reduced, which leads to arrangement of transistors with high density and high integration of the semiconductor device.

Figure 32A:
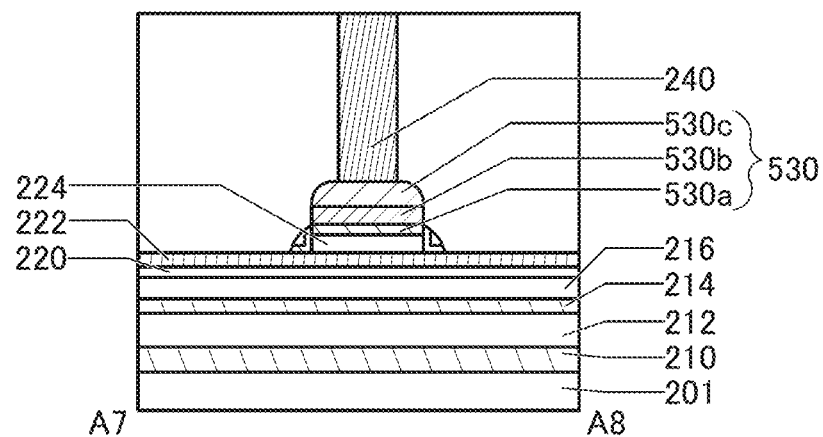
FIGS. 32A to 32C are each a cross section of a semiconductor device according to one embodiment of the present invention.
Figure 32B:
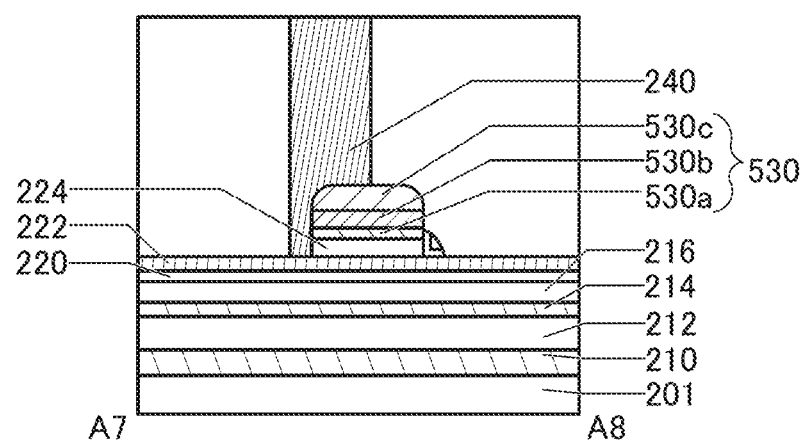
Figure 32C:
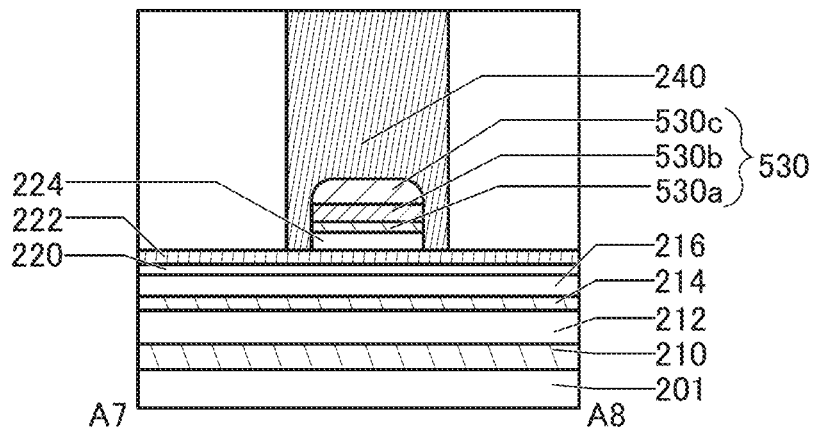

FIGS. 32A to 32C are each a cross section of a portion taken along dashed-dotted line A7-A8 in FIG. 29A and a region in the channel width direction of the transistor 200a and the transistor 200b where the conductor 240 is in contact with the oxide 530.

FIG. 32A illustrates an example in which a region where the conductor 240 is in contact with the oxide 530 is on the top surface of the oxide 530 and is smaller than the width of the oxide 530 in the channel width direction. The region where the conductor 240 is in contact with the oxide 530 is not limited to the example of FIG. 32A. For example, as shown in FIG. 32B, a region in contact with the top surface and the side surface of the oxide 530 may be included. Although FIG. 32B illustrates, as an example, a region where the conductor 240 and a side surface of the oxide 530 on the A7 side are in contact with each other, a region where the conductor 240 and a side surface of the oxide 530 on the A8 side are in contact with each other may be included. With such a structure, the area of the region where the conductor 240 is in contact with the oxide 530 can be increased in some cases; since the contact resistance between the conductor 240 and the oxide 530 can be reduced, such a structure is preferably used. Alternatively, for example, the region where the conductor 240 is in contact with the oxide 530 may be a region where the top surface of the oxide 530 and side surfaces of the oxide 530 on the A7 side and the A8 side are in contact with each other as shown in FIG. 32C. In other words, the region where the conductor 240 is in contact with the oxide 530 may have a cross-sectional shape like a saddle (such a structure can be referred to as a saddle-surface contact). With such a structure, the area of the region where the conductor 240 is in contact with the oxide 530 can be increased; since the contact resistance between the conductor 240 and the oxide 530 can be reduced, such a structure is further preferably used.

A parasitic capacitance is formed between the conductor 260_1 and the conductor 240 in the transistor 200a as shown in FIG. 30B. In a similar manner, a parasitic capacitance is formed between the conductor 260_2 and the conductor 240 in the transistor 200b.

The insulator 275a is provided in the transistor 200a and the insulator 275b is provided in the transistor 200b; thus, the parasitic capacitance of the transistor 200a and the parasitic capacitance of the transistor 200b can be reduced. For example, silicon oxide, silicon oxynitride, silicon nitride oxide, or silicon nitride can be used for the insulator 275a and the insulator 275b. When the parasitic capacitance is reduced, high-speed operation of the transistor 200a and the transistor 200b can be achieved.

The conductor 240 can be formed using a material similar to that for the conductor 205_1. Furthermore, the conductor 240 may be formed after aluminum oxide is formed on a side wall portion of the opening. By forming aluminum oxide on the side wall portion of the opening, the passage of oxygen from the outside can be inhibited and oxidation of the conductor 240 can be prevented. Furthermore, impurities such as water or hydrogen can be prevented from being diffused from the conductor 240 to the outside. The aluminum oxide can be formed by forming aluminum oxide in the opening by an ALD method or the like and then performing anisotropic etching.

[Capacitor 100a and Capacitor 100b]

The capacitor 100a and the transistor 200a share some components as illustrated in FIGS. 30A to 30D. Furthermore, the capacitor 100b and the transistor 200b share some components. As in the case of the transistor 200a, the capacitor 100a and the capacitor 100b have similar structures. Thus, unless otherwise specified, the description for the capacitor 100a can be referred to for the capacitor 100b below. In this embodiment, an example of the capacitor 100a whose one electrode is part of the region 231a provided in the oxide 530 of the transistor 200a is described.

The capacitor 100a includes part of the region 231a of the oxide 530, an insulator 276a, and a conductor 130a over the insulator 276a. Furthermore, at least part of the conductor 130a is preferably provided over to at least partly overlap with the part of the region 231a.

The part of the region 231a of the oxide 530 functions as one electrode of the capacitor 100a and the conductor 130a functions as the other electrode of the capacitor 100a. That is, the region 231a functions as the source or the drain of the transistor 200a and one electrode of the capacitor 100a. Part of the insulator 276a functions as a dielectric of the capacitor 100a.

The insulator 276a is preferably formed using an insulator having a high dielectric constant. For example, an insulator including an oxide containing one of or both aluminum and hafnium can be used. Aluminum oxide, hafnium oxide, an oxide containing aluminum and hafnium (hafnium aluminate), or the like may be used for the insulator including an oxide containing one of or both aluminum and hafnium. The insulator 276a may have a layered structure. For example, a layered structure including two or more layers selected from silicon oxide, silicon oxynitride, silicon nitride oxide, silicon nitride, aluminum oxide, hafnium oxide, an oxide containing aluminum and hafnium (hafnium aluminate), and the like may be employed. For example, it is preferable that hafnium oxide, aluminum oxide, and hafnium oxide be formed in this order by an ALD method to form a layered structure. The hafnium oxide and the aluminum oxide each have a thickness of greater than or equal to 0.5 nm and less than or equal to 5 nm. With such a layered structure, the capacitor 100a can have a large capacitance value and a low leakage current.

Here, the insulator 272a and the insulator 275a are provided on the side surface of the conductor 260_1 that functions as the first gate electrode of the transistor 200a. Since the insulator 272a and the insulator 275a are provided between the conductor 260_1 and the conductor 130a, the parasitic capacitance between the conductor 260_1 and the conductor 130a can be reduced.

The conductor 130a may have a layered structure. For example, the conductor 130a may have a layered structure of a conductive material containing titanium, titanium nitride, tantalum, or tantalum nitride as its main component and a conductive material containing tungsten, copper, or aluminum as its main component. The conductor 130a may have a single-layer structure or a layered structure of three or more layers.

In the semiconductor device of one embodiment of the present invention, the transistor 200a, the transistor 200b, the capacitor 100a, and the capacitor 100b can be provided on the same layer as described above. With such a structure, the transistors and the capacitors can be arranged with high density; thus, the semiconductor device can be highly integrated.

Note that in this embodiment, the insulator 220, the insulator 222, and the insulator 224 are referred to as a first insulator in some cases. Furthermore, the insulator 250a and the insulator 252a are referred to as a second insulator and the insulator 250b and the insulator 252b are referred to as a sixth insulator in some case. The insulator 270a and the insulator 271a are referred to as a third insulator and the insulator 270b and the insulator 271b are referred to as a seventh insulator in some cases. The insulator 272a is referred to as a fourth insulator and the insulator 272b is referred to as an eighth insulator in some cases. The insulator 275a and the insulator 274a are referred to as a fifth insulator, the insulator 275b and the insulator 274b are referred to as a ninth insulator, the insulator 276a is referred to as a tenth insulator, and an insulator 276b is referred to as an eleventh insulator in some cases.

Furthermore, in this embodiment, the oxide 530 is simply referred to as an oxide in some cases. In addition, the oxide 530a is referred to as a first oxide and the oxides 530b and 530c are referred to as a second oxide, in some cases. Furthermore, the conductor 206_1 is referred to as a first conductor, the conductor 260_1 is referred to as a second conductor, the conductor 206_2 is referred to as a third conductor, the conductor 260_2 is referred to as a fourth conductor, the conductor 130a is referred to as a fifth conductor, and the conductor 130b is referred to as a sixth conductor in some cases. Furthermore, the conductor 240 is referred to as a wiring in some cases.

<Material for Semiconductor Device>

Materials that can be used for a semiconductor device are described below.

<Conductor>

The conductor 204_1, the conductor 204_2, the conductor 203_1, the conductor 203_2, the conductor 206_1, the conductor 206_2, the conductor 205_1, the conductor 205_2, the conductor 260_1, the conductor 2602, the conductor 240, the conductor 130a, and the conductor 130b can be formed using a material containing one or more metal elements selected from aluminum, chromium, copper, silver, gold, platinum, tantalum, nickel, titanium, molybdenum, tungsten, hafnium, vanadium, niobium, manganese, magnesium, zirconium, beryllium, indium, ruthenium, and the like. Alternatively, a semiconductor having a high electric conductivity typified by polycrystalline silicon including an impurity element such as phosphorus, or silicide such as nickel silicide may be used.

The description of the components of the semiconductor device of Embodiment 1 can be referred to for other components.

<Manufacturing Method of Semiconductor Device>

Next, a manufacturing method of the semiconductor device of the present invention that includes the transistor 200a, the transistor 200b, the capacitor 100a, and the capacitor 100b is described with reference to FIGS. 34A to 34D to FIGS. 50A to 50D. FIG. 34A, FIG. 35A, FIG. 36A, FIG. 37A, FIG. 38A, FIG. 39A, FIG. 40A, FIG. 41A, FIG. 42A, FIG. 43A, FIG. 44A, FIG. 45A, FIG. 46A, FIG. 47A, FIG. 48A, FIG. 49A, and FIG. 50A are top views. FIG. 34B, FIG. 35B, FIG. 36B, FIG. 37B, FIG. 38B, FIG. 39B, FIG. 40B, FIG. 41B, FIG. 42B, FIG. 43B, FIG. 44B, FIG. 45B, FIG. 46B, FIG. 47B, FIG. 48B, FIG. 49B, and FIG. 50B are cross sections taken along dashed-dotted lines A1-A2 in FIG. 34A, FIG. 35A, FIG. 36A, FIG. 37A, FIG. 38A, FIG. 39A, FIG. 40A, FIG. 41A, FIG. 42A, FIG. 43A, FIG. 44A, FIG. 45A, FIG. 46A, FIG. 47A, FIG. 48A, FIG. 49A, and FIG. 50A. FIG. 34C, FIG. 35C, FIG. 36C, FIG. 37C, FIG. 38C, FIG. 39C, FIG. 40C, FIG. 41C, FIG. 42C, FIG. 43C, FIG. 44C, FIG. 45C, FIG. 46C, FIG. 47C, FIG. 48C, FIG. 49C, and FIG. 50C are cross sections taken along dashed-dotted lines A3-A4 in FIG. 34A, FIG. 35A, FIG. 36A, FIG. 37A, FIG. 38A, FIG. 39A, FIG. 40A, FIG. 41A, FIG. 42A, FIG. 43A, FIG. 44A, FIG. 45A, FIG. 46A, FIG. 47A, FIG. 48A, FIG. 49A, and FIG. 50A. Furthermore, FIG. 34D, FIG. 35D, FIG. 36D, FIG. 37D, FIG. 38D, FIG. 39D, FIG. 40D, FIG. 41D, FIG. 42D, FIG. 43D, FIG. 44D, FIG. 45D, FIG. 46D, FIG. 47D, FIG. 48D, FIG. 49D, and FIG. 50D are cross sections taken along dashed-dotted line A5-A6 in FIG. 34A, FIG. 35A, FIG. 36A, FIG. 37A, FIG. 38A, FIG. 39A, FIG. 40A, FIG. 41A, FIG. 42A, FIG. 43A, FIG. 44A, FIG. 45A, FIG. 46A, FIG. 47A, FIG. 48A, FIG. 49A, and FIG. 50A.

First, a substrate (not illustrated) is prepared, and the insulator 201 is formed over the substrate. The insulator 201 can be formed by a sputtering method, a chemical vapor deposition (CVD) method, a molecular beam epitaxy (MBE) method, a pulsed laser deposition (PLD) method, an ALD method, or the like.

CVD methods can be classified into a plasma enhanced CVD (PECVD) method using plasma, a thermal CVD (TCVD) method using heat, a photo CVD method using light, and the like. Moreover, the CVD method can include a metal CVD (MCVD) method and a metal organic CVD (MOCVD) method depending on a source gas.

By using the PECVD method, a high-quality film can be formed at a relatively low temperature. Furthermore, a thermal CVD method does not use plasma and thus causes less plasma damage to an object. For example, a wiring, an electrode, an element (e.g., transistor or capacitor), or the like included in a semiconductor device might be charged up by receiving charges from plasma. In that case, accumulated charges might break the wiring, electrode, element, or the like included in the semiconductor device. By contrast, when a thermal CVD method not using plasma is employed, such plasma damage is not caused and the yield of the semiconductor device can be increased. A thermal CVD method does not cause plasma damage during deposition, so that a film with few defects can be obtained.

An ALD method also causes less damage to an object. An ALD method does not cause plasma damage during deposition, so that a film with few defects can be obtained.

Unlike in a deposition method in which particles ejected from a target or the like are deposited, in a CVD method and an ALD method, a film is formed by reaction at a surface of an object. Thus, a CVD method and an ALD method enable favorable step coverage almost regardless of the shape of an object. In particular, an ALD method enables excellent step coverage and excellent thickness uniformity and can be favorably used for covering a surface of an opening with a high aspect ratio, for example. On the other hand, an ALD method has a relatively low deposition rate; thus, it is sometimes preferable to combine an ALD method with another deposition method with a high deposition rate such as a CVD method.

When a CVD method or an ALD method is used, composition of a film to be formed can be controlled with a flow rate ratio of the source gases. For example, by a CVD method or an ALD method, a film with a certain composition can be formed depending on a flow rate ratio of the source gases. Moreover, with a CVD method or an ALD method, by changing the flow rate ratio of the source gases while forming the film, a film whose composition is continuously changed can be formed. In the case where the film is formed while changing the flow rate ratio of the source gases, as compared to the case where the film is formed using a plurality of deposition chambers, time taken for the film formation can be reduced because time taken for transfer and pressure adjustment is omitted. Thus, semiconductor devices can be manufactured with improved productivity.

Then, the insulator 210 is formed over the insulator 201. The insulator 210 can be formed by a sputtering method, a chemical vapor deposition method, a molecular beam epitaxy method, a pulsed laser deposition method, an ALD method, or the like.

In this embodiment, aluminum oxide is formed as the insulator 210 by a sputtering method. The insulator 210 may have a multilayer structure. For example, the multilayer structure may be formed in such a manner that an aluminum oxide is formed by a sputtering method and an aluminum oxide is formed over the aluminum oxide by an ALD method. Alternatively, the multilayer structure may be formed in such a manner that an aluminum oxide is formed by an ALD method and an aluminum oxide is formed over the aluminum oxide by a sputtering method.

Next, a conductive film to be the conductor 204_1, the conductor 204_2, the conductor 203_1, and the conductor 203_2 is formed over the insulator 210. The conductive film to be the conductor 204_1, the conductor 204_2, the conductor 203_1, and the conductor 203_2 can be formed by a sputtering method, a CVD method, an MBE method, a PLD method, an ALD method, or the like. The conductive film to be the conductor 204_1, the conductor 204_2, the conductor 203_1, and the conductor 203_2 can be a multilayer film. In this embodiment, tungsten is formed as the conductive film to be the conductor 204_1, the conductor 204_2, the conductor 203_1, and the conductor 203_2.

Next, the conductive film to be the conductor 204_1, the conductor 204_2, the conductor 203_1, and the conductor 203_2 is processed by a lithography method to form the conductor 204_1, the conductor 204_2, the conductor 203_1, and the conductor 203_2.

In the lithography method, first, a resist is exposed to light through a mask. Next, a region exposed to light is removed or left using a developing solution, so that a resist mask is formed. Then, etching through the resist mask is conducted. The resist mask is formed by, for example, exposure of the resist to light using KrF excimer laser light, ArF excimer laser light, extreme ultraviolet (EUV) light, or the like. Alternatively, a liquid immersion technique may be employed in which a portion between a substrate and a projection lens is filled with liquid (e.g., water) to perform light exposure. An electron beam or an ion beam may be used instead of the above-mentioned light. Note that a photomask is not necessary in the case of using an electron beam or an ion beam. To remove the resist mask, dry etching treatment such as ashing or wet etching treatment can be used. Alternatively, wet etching treatment can be performed after dry etching treatment. Further alternatively, dry etching treatment can be performed after wet etching treatment.

A hard mask formed of an insulator or a conductor may be used instead of the resist mask. In the case where a hard mask is used, a hard mask with a desired shape can be formed in the following manner: an insulating film or a conductive film that is the material of the hard mask is formed over the conductive film to be the conductor 204_1, the conductor 204_2, the conductor 203_1, and the conductor 203_2, a resist mask is formed thereover, and then the material of the hard mask is etched. The etching of the conductive film to be the conductor 204_1, the conductor 204_2, the conductor 203_1, and the conductor 203_2 may be performed after or without removal of the resist mask. In the latter case, the resist mask may be removed during the etching. The hard mask may be removed by etching after the etching of the conductive film to be the conductor 204_1, the conductor 204_2, the conductor 203_1, and the conductor 203_2. The hard mask does not need to be removed in the case where the material of the hard mask does not affect the following process or can be utilized in the following process.

As a dry etching apparatus, a capacitively coupled plasma (CCP) etching apparatus including parallel plate type electrodes can be used. The capacitively coupled plasma etching apparatus including the parallel plate type electrodes may have a structure in which a high-frequency power source is applied to one of the parallel plate type electrodes. Alternatively, the capacitively coupled plasma etching apparatus may have a structure in which different high-frequency power sources are applied to one of the parallel plate type electrodes. Alternatively, the capacitively coupled plasma etching apparatus may have a structure in which high-frequency power sources with the same frequency are applied to the parallel plate type electrodes. Alternatively, the capacitively coupled plasma etching apparatus may have a structure in which high-frequency power sources with different frequencies are applied to the parallel plate type electrodes. Alternatively, a dry etching apparatus including a high-density plasma source can be used. As the dry etching apparatus including a high-density plasma source, an inductively coupled plasma (ICP) etching apparatus can be used, for example.

Next, an insulating film to be the insulator 212 is formed over the insulator 210, the conductor 204_1, the conductor 204_2, the conductor 203_1, and the conductor 203_2. The insulating film to be the insulator 212 can be formed by a sputtering method, a CVD method, an MBE method, a PLD method, an ALD method, or the like. In this embodiment, as the insulating film to be the insulator 212, silicon oxide is formed by a CVD method.

Here, the thickness of the insulating film to be the insulator 212 is preferably greater than or equal to the thickness of each of the conductor 204_1, the conductor 204_2, the conductor 203_1, and the conductor 203_2. For example, when the thickness of each of the conductor 204_1, the conductor 204_2, the conductor 203_1, and the conductor 203_2 is 1, the thickness of the insulating film to be the insulator 212 is greater than or equal to 1 and less than or equal to 3. In this embodiment, the thickness of each of the conductor 204_1, the conductor 204_2, the conductor 203_1, and the conductor 203_2 is 150 nm and the thickness of the insulating film to be the insulator 212 is 350 nm.

Next, chemical mechanical polishing (CMP) treatment is performed on the insulating film to be the insulator 212, so that part of the insulating film to be the insulator 212 is removed and surfaces of the conductor 204_1, the conductor 204_2, the conductor 203_1, the conductor 203_2 are exposed. Thus, the conductor 204_1, the conductor 204_2, the conductor 203_1, the conductor 203_2, and the insulator 212 whose top surfaces are flat can be formed (see FIGS. 34A to 34D).

Here, a method for forming the conductor 204_1, the conductor 204_2, the conductor 203_1, and the conductor 203_2 that is different from the above is described below.

Then, the insulator 212 is formed over the insulator 210. The insulator 212 can be formed by a sputtering method, a CVD method, an MBE method, a PLD method, an ALD method, or the like.

Then, openings are formed in the insulator 212 to reach the insulator 210. Examples of the openings include grooves and slits. Regions where the openings are formed may be referred to as opening portions. The openings can be formed by wet etching; however, dry etching is preferably for microfabrication. The insulator 210 is preferably an insulator that functions as an etching stopper film used in forming the groove by etching the insulator 212. For example, in the case where a silicon oxide film is used as the insulator 212 in which the groove is to be formed, the insulator 210 is preferably formed using a silicon nitride film, an aluminum oxide film, or a hafnium oxide film.

After formation of the openings, a conductive film to be the conductor 204_1, the conductor 204_2, the conductor 203_1, and the conductor 203_2 is formed. The conductive film desirably contains a conductor that has a function of inhibiting the passage of oxygen. For example, tantalum nitride, tungsten nitride, or titanium nitride can be used. Alternatively, a layered film formed using the conductor and tantalum, tungsten, titanium, molybdenum, aluminum, copper, or a molybdenum-tungsten alloy can be used. The conductive film to be the conductor 204_1, the conductor 204_2, the conductor 203_1, and the conductor 203_2 can be formed by a sputtering method, a CVD method, an MBE method, a PLD method, an ALD method, or the like.

In this embodiment, the conductive film to be the conductor 204_1, the conductor 204_2, the conductor 203_1, and the conductor 203_2 has a multilayer structure. First, tantalum nitride or a stacked film of tantalum nitride and titanium nitride formed thereover is formed by a sputtering method. With the use of such metal nitride for a lower layer of the conductive film to be the conductor 204_1, the conductor 204_2, the conductor 203_1, and the conductor 203_2, a metal that is easily diffused, such as copper, can be prevented from diffusing to the outside from the conductor 204_1, the conductor 204_2, the conductor 203_1, and the conductor 203_2 even when the metal is used for an upper layer of the conductive film to be the conductor 204_1, the conductor 204_2, the conductor 203_1, and the conductor 203_2 that is described below.

Next, the upper layer of the conductive film to be the conductor 204_1, the conductor 204_2, the conductor 203_1, and the conductor 203_2 is formed. The conductive film to be the conductor 204_1, the conductor 204_2, the conductor 203_1, and the conductor 203_2 can be formed by a plating method, a sputtering method, a CVD method, an MBE method, a PLD method, an ALD method, or the like. In this embodiment, as the conductive film of the upper layer of the conductive film to be the conductor 204_1, the conductor 204_2, the conductor 203_1, and the conductor 203_2, a low-resistant conductive material such as copper is formed.

Next, by CMP treatment, the upper layer of the conductive film to be the conductor 204_1, the conductor 204_2, the conductor 203_1, and the conductor 203_2 and the lower layer of the conductive film to be the conductor 204_1, the conductor 204_2, the conductor 203_1, and the conductor 203_2 are partly removed to expose the insulator 212. As a result, the conductive film to be the conductor 204_1, the conductor 204_2, the conductor 203_1, and the conductor 203_2 remains only in the opening portions. Thus, the conductor 204_1, the conductor 204_2, the conductor 203_1, and the conductor 203_2 whose top surfaces are flat can be formed. Note that the insulator 212 is partly removed by the CMP treatment in some cases. The above is the description of the different formation method of the conductor 204_1, the conductor 204_2, the conductor 203_1, and the conductor 203_2.

Next, the insulator 214 is formed over the conductor 204_1, the conductor 204_2, the conductor 203_1, and the conductor 203_2. The insulator 214 can be formed by a sputtering method, a CVD method, an MBE method, a PLD method, an ALD method, or the like. In this embodiment, as the insulator 214, silicon nitride is formed by a CVD method. Even when metal that is likely to be diffused to the conductor 203_1 and the conductor 203_2, such as copper, is used for the insulator 214, the use of an insulator through which copper is less likely to pass like silicon nitride, as the insulator 214 can prevent the metal from being diffused into the layers above the insulator 214.

Next, the insulator 216 is formed over the insulator 214. The insulator 216 can be formed by a sputtering method, a CVD method, an MBE method, a PLD method, an ALD method, or the like. In this embodiment, silicon oxide is formed as the insulator 216 by a CVD method.

Then, a depression was formed in the insulator 214 and the insulator 216. Examples of the depression include a hole and an opening. The depression may be formed by wet etching; however, dry etching is preferred for microfabrication.

After the formation of depressions, a conductive film to be the conductor 206_1, the conductor 206_2, the conductor 205_1, and the conductor 205_2 is formed. The conductive film to be the conductor 206_1, the conductor 206_2, the conductor 205_1, and the conductor 205_2 desirably contains a conductor having a function of inhibiting the passage of oxygen. For example, tantalum nitride, tungsten nitride, or titanium nitride can be used. Alternatively, a layered film formed using the conductor and tantalum, tungsten, titanium, molybdenum, aluminum, copper, or a molybdenum-tungsten alloy can be used. The conductive film to be the conductor 206_1, the conductor 206_2, the conductor 205_1, and the conductor 205_2 can be formed by a sputtering method, a CVD method, an MBE method, a PLD method, an ALD method, or the like.

In this embodiment, tantalum nitride is formed by a sputtering method for a lower layer of the conductive film to be the conductor 206_1, the conductor 206_2, the conductor 205_1, and the conductor 205_2.

Next, a conductive film is formed as an upper layer of the conductive film to be the conductor 206_1, the conductor 206_2, the conductor 205_1, and the conductor 205_2 over the lower layer of the conductive film to be the conductor 206_1, the conductor 206_2, the conductor 205_1, and the conductor 205_2. The upper layer of the conductive film to be the conductor 206_1, the conductor 206_2, the conductor 205_1, and the conductor 205_2 can be formed by a sputtering method, a CVD method, an MBE method, a PLD method, an ALD method, or the like.

In this embodiment, as the conductive film used as the upper layer of the conductive film to be the conductor 206_1, the conductor 206_2, the conductor 205_1, and the conductor 205_2, titanium nitride film is formed by a CVD method and tungsten film is formed by a CVD method over the titanium nitride film.

Next, CMP treatment is performed so that the conductive film to be the conductor 206_1, the conductor 206_2, the conductor 205_1, and the conductor 205_2 which is over the insulator 216 is removed. As a result, the conductive film to be the conductor 206_1, the conductor 206_2, the conductor 205_1, and the conductor 205_2 remains only in the depressions; thus, the conductor 206_1, the conductor 206_2, the conductor 205_1, and the conductor 205_2 whose top surfaces are flat can be formed (see FIGS. 34A to 34C).

Next, the insulator 220 is formed over the insulator 216, the conductor 205_1, and the conductor 205_2. The insulator 220 can be formed by a sputtering method, a CVD method, an MBE method, a PLD method, an ALD method, or the like.

Then, the insulator 222 is formed over the insulator 220. The insulator 222 can be formed by a sputtering method, a CVD method, an MBE method, a PLD method, an ALD method, or the like.

Then, the insulator 224 is formed over the insulator 222. The insulator 224 can be formed by a sputtering method, a CVD method, an MBE method, a PLD method, an ALD method, or the like.

Next, first heat treatment is preferably performed. The first heat treatment can be performed at a temperature higher than or equal to 250° C. and lower than or equal to 650° C., preferably higher than or equal to 300° C. and lower than or equal to 500° C., further preferably higher than or equal to 320° C. and lower than or equal to 450° C. The first heat treatment is performed in nitrogen, an inert gas atmosphere, or an atmosphere containing an oxidizing gas at 10 ppm or more, 1% or more, or 10% or more. The first heat treatment may be performed under a reduced pressure. Alternatively, the first heat treatment may be performed in such a manner that heat treatment is performed in nitrogen or an inert gas atmosphere, and then another heat treatment is performed in an atmosphere containing an oxidizing gas at 10 ppm or more, 1% or more, or 10% or more in order to compensate for released oxygen. By the first heat treatment, impurities such as hydrogen and water included in the insulator 224 can be removed, for example. Alternatively, in the first heat treatment, plasma treatment using oxygen may be performed under a reduced pressure. The plasma treatment containing oxygen is preferably performed using an apparatus including a power source for generating high-density plasma using microwaves, for example. Alternatively, a power source for applying a radio frequency (RF) to a substrate side may be provided. The use of high-density plasma enables high-density oxygen radicals to be produced, and application of the RF to the substrate side allows oxygen radicals generated by the high-density plasma to be efficiently introduced into the insulator 224. Alternatively, after plasma treatment using an inert gas with the apparatus, plasma treatment using oxygen in order to compensate for released oxygen may be performed. Note that first heat treatment is not necessarily performed in some cases.

This heat treatment can also be performed after the deposition of the insulator 220, after the deposition of the insulator 222, and after the deposition of the insulator 224. Although each heat treatment can be performed under the conditions for the heat treatment, the heat treatment after the formation of the insulator 220 is preferably performed in an atmosphere containing nitrogen.

In this embodiment, the first heat treatment is performed in a nitrogen atmosphere at 400° C. for one hour after formation of the insulator 224.

Next, an oxide film 530A to be the oxide 530a is formed over the insulator 224.

The oxide film 530A can be formed by a sputtering method, a CVD method, an MBE method, a PLD method, an ALD method, or the like.

In the case where the oxide film 530A is formed by a sputtering method, for example, oxygen or a mixed gas of oxygen and a rare gas is used as a sputtering gas. By increasing the proportion of oxygen in the sputtering gas, the amount of excess oxygen in the oxide film to be deposited can be increased. In the case where the oxide film is formed by a sputtering method, the above-described In-M-Zn oxide target can be used.

In particular, part of oxygen contained in the sputtering gas is supplied to the insulator 224 in some cases, at the formation of the oxide film 530A. Note that the proportion of oxygen in the sputtering gas for formation of the oxide film 530A is preferably 70% or higher, further preferably 80% or higher, and still further preferably 100%.

In this embodiment, the oxide film 530A is formed by a sputtering method using a target containing In, Ga, and Zn at an atomic ratio of 1:3:4. Note that oxide film is preferably formed by appropriate selection of film formation conditions and an atomic ratio to have characteristics required for the oxide 530.

Next, openings reaching the conductor 206_1 and the conductor 206_2 are formed in the insulator 220, the insulator 222, the insulator 224, and the oxide film 530A by a lithography method. First, a mask is formed over the oxide film 530A. The mask used for forming the openings can be a resist mask or a hard mask (see FIGS. 35A to 35D).

Next, the insulator 220, the insulator 222, the insulator 224, and the oxide film 530A are processed using the mask to expose the surface of the conductor 206_1 and a surface of the conductor 206_2, so that openings are formed. The processing can be performed by a dry etching method or a wet etching method. A dry etching method is suitable for minute processing. Note that the insulator 220, the insulator 222, and the insulator 224 are processed through the oxide film 530A. When a portion of a surface of the conductor 206_1 and a portion of a surface of the conductor 206_2 are exposed, a mask formed of a resist mask or a hard mask is formed over the oxide film 530A, and the insulator 220, the insulator 222, the insulator 224, and the oxide film 530A are processed. In other words, the mask is not formed on a surface of the insulator which functions as the gate insulating film (the insulator 220, the insulator 222, and the insulator 224). Therefore, the mask is not attached to the surface of the insulator which functions as the gate insulating film; thus, the gate insulating film can be prevented from being contaminated and damaged by an impurity contained in the resist mask and the like, a component which is contained in the hard mask, and components which are contained in plasma and a chemical solution to remove the mask. Thus, a method for manufacturing a highly reliable semiconductor device can be provided.

Next, an oxide film 530B and an oxide film 530C are formed over the oxide film 530A. The oxide film 530B and the oxide film 530C are also formed inside the openings and electrically connected to the conductor 206_1 and the conductor 206_2 through the openings. The oxide film 530B and the oxide film 530C are connected to the conductor 206_1 and the conductor 206_2 without through the oxide film 530A; thus, the series resistance and the contact resistance can be reduced. With such a structure, a semiconductor device which has favorable electrical characteristics can be provided. Specifically, a transistor with an increased on-state current and a semiconductor device including the transistor can be provided (see FIGS. 36A to 36D).

The oxide film 530B and the oxide film 530C can be formed by a sputtering method, a CVD method, an MBE method, a PLD method, an ALD method, or the like.

The oxide film 530B and the oxide film 530C are preferably formed successively without exposure to the air. In that case, an impurity or moisture in the air can be prevented from being attached onto the oxide film 530B, and the interface between the oxide film 530B and the oxide film 530C and the vicinity thereof can be kept clean.

In the case where the oxide films 530B and 530C are formed by a sputtering method, for example, oxygen or a mixed gas of oxygen and a rare gas is used as a sputtering gas. By increasing the proportion of oxygen in the sputtering gas, the amount of excess oxygen in the oxide film to be deposited can be increased. In the case where the oxide films 530B and 530C are formed by a sputtering method, the above-described In-M-Zn oxide target can be used.

In the case where the oxide film 530B is formed by a sputtering method and the proportion of oxygen in the sputtering gas is set to be higher than or equal to 1% and lower than or equal to 30%, preferably higher than or equal to 5% and lower than or equal to 20%, an oxygen-deficient oxide semiconductor is formed. A transistor including an oxygen-deficient oxide semiconductor can have relatively high field-effect mobility.

In this embodiment, the oxide film 530B is formed by a sputtering method using a target containing In, Ga, and Zn at an atomic ratio of 1:1:1, and the oxide film 530C is formed by a sputtering method using a target containing In, Ga, and Zn at an atomic ratio of 4:2:4.1.

After that, second heat treatment may be performed. For the second heat treatment, the conditions for the first heat treatment can be used. By the second heat treatment, impurities such as hydrogen and water contained in the oxide films 530A and 530B can be removed, for example. In this embodiment, treatment is performed in a nitrogen atmosphere at 400° C. for one hour, and successively another treatment is performed in an oxygen atmosphere at 400° C. for one hour.

Next, the oxide film 530A, the oxide film 530B, and the oxide film 530C are processed into island shapes to form the oxide 530a, the oxide 530b, and the oxide 530c. At this time, the insulator 224 in a region that does not overlap with the oxide 530a and the oxide 530b is etched and the surface of the insulator 222 is exposed in some cases (see FIGS. 37A to 37D).

Here, the oxide 530 is formed to at least partly overlap with the conductor 205. A side surface of the oxide 530 is preferably substantially perpendicular to the top surface of the insulator 222, in which case a plurality of the transistors 200 can be provided with high density in a small area. Note that an angle formed by the side surface of the oxide 530 and the top surface of the insulator 222 may be an acute angle. In that case, the angle formed by the side surface of the oxide 530 and the top surface of the insulator 222 is preferably larger.

The oxide 530 has a curved surface between the side surface and the top surface. That is, an end portion of the side surface and an end portion of the top surface are preferably curved (such a curved shape is also referred to as a rounded shape). The radius of curvature of the curved surface at an end portion of the oxide 530b is greater than or equal to 3 nm and less than or equal to 10 nm, preferably greater than or equal to 5 nm and less than or equal to 6 nm.

Note that when the end portions are not angular, the coverage with films formed later in the film formation process can be improved.

Note that the oxide films may be processed by a lithography method. The processing can be performed by a dry etching method or a wet etching method. A dry etching method is suitable for minute processing.

Instead of the resist mask, a hard mask formed of an insulator or a conductor may be used as an etching mask. In the case where a hard mask is used, a hard mask with a desired shape can be formed in the following manner: an insulating film or a conductive film that is the material for the hard mask is formed over the oxide film 530C, a resist mask is formed thereover, and then the material of the hard mask is etched. The etching of the oxide film 530A, the oxide film 530B, and the oxide film 530C may be performed after or without removal of the resist mask. In the latter case, the resist mask may be removed during the etching. The hard mask may be removed by etching after the etching of the oxide films 530A, 530B, and 530C. The hard mask does not need to be removed in the case where the material of the hard mask does not affect the following process or can be utilized in the following process.

In some cases, treatment such as dry etching performed in the above process causes the attachment or diffusion of impurities due to an etching gas or the like to a surface or an inside of the oxide 530a, the oxide 530b, the oxide 530c, or the like. The impurity is fluorine or chlorine, for example.

In order to remove the impurities, cleaning is performed. As the cleaning, any of wet cleaning using a cleaning solution or the like, plasma treatment using plasma, cleaning by heat treatment, and the like can be performed by itself or in appropriate combination.

The wet cleaning may be performed using an aqueous solution in which oxalic acid, phosphoric acid, hydrofluoric acid, or the like is diluted with carbonated water or pure water. Alternatively, ultrasonic cleaning using pure water or carbonated water may be performed. In this embodiment, ultrasonic cleaning using pure water or carbonated water is performed.

Next, third heat treatment may be performed. For the third heat treatment, the conditions for the first heat treatment can be used. Note that the third heat treatment is not necessarily performed in some cases. In this embodiment, the third heat treatment is not performed.

Next, an oxide film 530D to be the oxide 530_d1 and the oxide 530_d2 is formed over the insulator 222, the oxide 530a, the oxide 530b, and the oxide 530c (see FIGS. 38A to 38D).

The oxide film 530D can be formed by a sputtering method, a CVD method, an MBE method, a PLD method, an ALD method, or the like. The oxide film 530D is formed by a method similar to that of the oxide film 530A, the oxide film 530B, or the oxide film 530C in accordance with characteristics required for the oxide 530_d1 and the oxide 530_d2. In this embodiment, the oxide film 530D is formed by a sputtering method using a target containing In, Ga, and Zn at an atomic ratio of 1:3:4.

The oxide film 530D may be processed into an island shape as shown in FIGS. 39A to 39D. When the oxide film 530D is processed into an island shape before the formation of the insulator 250a, the insulator 250b, the conductor 260_1, and the conductor 260_2, part of the oxide film 530D positioned below the insulator 250a, the insulator 250b, the conductor 260_1, and the conductor 260_2, which are formed in a later process, can be removed. Thus, the oxide film 530D for adjacent cells 600 is separated and the leakage current flowing through the oxide film 530D can be prevented, which is preferable.

The oxide film 530D can be processed by a dry etching method and a wet etching method. The method used for the processing of the oxide film 530A, the oxide film 530B, and the oxide film 530C can be used.

Then, the insulating film 250, the insulating film 252, a conductive film 260 (the conductive film 260A and the conductive film 260B), the insulating film 270, and the insulating film 271 are formed in this order over the insulator 222 and the oxide film 530D (see FIGS. 40A to 40D).

The insulating film 250 and the insulating film 252 can be formed by a sputtering method, a CVD method, an MBE method, a PLD method, an ALD method, or the like. Here, when the insulating film 252 is formed in an atmosphere containing oxygen by a sputtering method, oxygen can be added to the insulating film 250.

Here, fourth heat treatment can be performed. For the fourth heat treatment, the conditions for the first heat treatment can be used. The fourth heat treatment can reduce the moisture concentration and the hydrogen concentration in the insulating film 250. Note that the fourth heat treatment is not necessarily performed in some cases.

The conductive film 260A and the conductive film 260B can be deposited by a sputtering method, a CVD method, an MBE method, a PLD method, an ALD method, or the like.

The insulating film 270 and the insulating film 271 can be formed by a sputtering method, a CVD method, an MBE method, a PLD method, an ALD method, or the like. In particular, the insulating film 270 is preferably formed by an ALD method. When the insulating film 270 is deposited by an ALD method, the film thickness can be approximately 0.5 nm to 10 nm inclusive, preferably approximately 0.5 nm to 3 nm inclusive. Note that the formation of the insulating film 270 can be omitted.

The insulating film 271 can be used as a hard mask used when the conductive film 260A and the conductive film 260B are processed. Furthermore, the insulating film 271 can have a layered structure. For example, silicon nitride oxide and silicon nitride over the silicon nitride oxide may be provided.

Here, fifth heat treatment can be performed. For the heat treatment, the conditions for the first heat treatment can be used. Note that the fifth heat treatment is not necessarily performed in some cases.

Next, the insulating film 271 is etched by a lithography method to form the insulator 271a and the insulator 271b. Next, the insulating film 250, the insulating film 252, the conductive film 260A, the conductive film 260B, and the insulating film 270 are etched using the insulator 271a and the insulator 271b as hard masks to form the insulator 250a, the insulator 252a, the conductor 260_1a, the conductor 260_1b, the insulator 270a, the insulator 250b, the insulator 252b, the conductor 260_2a, the conductor 260_2b, and the insulator 270b (see FIGS. 41A to 41D).

Here, a cross section of a structure including the insulator 250a, the insulator 252a, the conductor 260_1a, the conductor 260_1b, and the insulator 270a is preferably tapered as little as possible. Similarly, a cross section of a structure including the insulator 250b, the insulator 252b, the conductor 260_2a, the conductor 260_2b, and the insulator 270b is preferably tapered as little as possible. An angle between the bottom surface of the oxide 530 and each of the side surfaces of the insulator 250a, the insulator 252a, the conductor 260_1a, the conductor 260_1b, and the insulator 270a is preferably greater than or equal to 800 and less than or equal to 1000. Similarly, an angle between the bottom surface of the oxide 530 and each of the side surfaces of the insulator 250b, the insulator 252b, the conductor 260_2a, the conductor 260_2b, and the insulator 270b is preferably greater than or equal to 800 and less than or equal to 1000. In that case, the insulator 275a and the insulator 274a are likely to be left in a later formation step of the insulator 275a and the insulator 274a. Similarly, the insulator 275b and the insulator 274b are likely to be left when the insulator 275b and the insulator 274b are formed.

Note that an upper portion of the oxide film 530D in a region not overlapping with the insulator 250a and the insulator 250b may be etched by the above etching. In that case, the oxide film 530D is thicker in a region overlapping with the insulator 250a and the insulator 250b than in the region not overlapping with the insulator 250a and the insulator 250b.

Next, an insulating film 272 is formed to cover the oxide film 530D, the insulator 250a, the insulator 252a, the conductor 260_1, the insulator 270a, the insulator 271a, the insulator 250b, the insulator 252b, the conductor 260_2, the insulator 270b, and the insulator 271b. The insulating film 272 can be deposited by a sputtering method, a CVD method, an MBE method, a PLD method, an ALD method, or the like. In this embodiment, aluminum oxide is formed by an ALD method as the insulating film 272 (see FIGS. 42A to 42D).

Here, the region 231 and the junction region 232 may be formed by an ion implantation method, an ion doping method by which an ionized source gas is added without mass separation, a plasma immersion ion implantation method, or the like. The ion cannot reach the oxide 530 in the region overlapping with the insulator 250a and the insulator 250b, whereas the ion can reach the oxide 530 in the region not overlapping with the insulator 250a and the insulator 250b; thus, the region 231 and the junction region 232 can be formed in a self-aligned manner. Furthermore, damage to the oxide 530 during the implantation can be reduced by performing the above-described method through the insulating film 272.

In the case of performing mass separation by an ion doping method, a plasma immersion ion implantation method, and the like, ion species to be added and its concentration can be controlled properly. On the other hand, in the case of not performing mass separation, ions at a high concentration can be added in a short time. Alternatively, an ion doping method in which atomic or molecular clusters are generated and ionized may be employed. Instead of the term "dopant", the term "ion", "donor", "acceptor", "impurity", "element", or the like may be used.

As the dopant, the element that forms oxygen vacancies, the element bonded to oxygen vacancies, or the like is used. Typical examples of the element are hydrogen, boron, carbon, nitrogen, fluorine, phosphorus, sulfur, chlorine, titanium, and a rare gas element. Typical examples of the rare gas element are helium, neon, argon, krypton, and xenon.

Next, the insulating film 275 is formed. The insulating film 275 can be formed by a sputtering method, a CVD method, an MBE method, a PLD method, or an ALD method. In this embodiment, as the insulating film 275, silicon oxide is formed by a CVD method (see FIGS. 43A to 43D).

Next, the insulating film 275 is subjected to anisotropic etching, whereby the oxide film 530D, the insulating film 272, and the insulating film 275 are processed into the oxide 530_d1, the insulator 272a, the insulator 275a, the oxide 530_d2, the insulator 272b, and the insulator 275b. The insulator 275a is formed to be in contact with the insulator 272a and the insulator 275b is formed to be in contact with the insulator 272b. Dry etching is preferably performed as the anisotropic etching. In this manner, the oxide film 530D, the insulating film 272, and the insulating film 275 in regions on a plane substantially parallel to the substrate surface can be removed, so that the insulator 275a and the insulator 275b can be formed in a self-aligned manner. At this time, an oxide 277 is formed in contact with part of a side surface of the oxide 530 in some cases (see FIGS. 44A to 44D).

Next, an insulating film 274 is formed. The insulating film 274 is preferably formed in an atmosphere containing at least one of nitrogen and hydrogen. In that case, oxygen vacancies are formed mainly in a region of the oxide 530c that overlaps with neither the insulator 250a nor the insulator 250b and the oxygen vacancies and impurity elements such as nitrogen or hydrogen are bonded to each other, leading to an increase in carrier density. In this manner, the region 231 and the junction region 232 with reduced resistance can be formed. In particular, in addition to oxygen vacancies formed by the ion implantation, oxygen vacancies can be formed in the region 231 owing to the formation of the insulating film 274; thus, the region 231 can have a higher carrier density. For the insulating film 274, for example, silicon nitride or silicon nitride oxide can be deposited by a CVD method. In this embodiment, silicon nitride oxide is used for the insulating film 274. Here, the insulating film 274 and the oxide 530c are not in contact with each other in regions of the oxide 530c that overlap with the insulator 275a and the insulator 275b; thus, excessive bonds of oxygen vacancies of the oxide 530c that are generated by the formation of the insulating film 274 and impurity elements such as nitrogen or hydrogen can be inhibited (see FIGS. 45A to 45D).

As described above, in the method for manufacturing a semiconductor device described in this embodiment, a source region and a drain region can be formed in a self-aligned manner owing to the formation of the insulating film 274, even in a minute transistor whose channel length is approximately 10 nm to 30 nm. Thus, minute or highly integrated semiconductor devices can be manufactured with high yield.

Next, the insulating film 274 is subjected to anisotropic etching to form the insulator 274a and the insulator 274b. Dry etching is preferably performed as the anisotropic etching. In this manner, the insulating film 274 in regions on the plane substantially parallel to the substrate surface is removed, so that the insulator 274a and the insulator 274b can be formed in a self-aligned manner (FIGS. 46A to 46D).

Next, an insulating film to be the insulator 276a and the insulator 276b is formed. The insulating film to be the insulator 276a and the insulator 276b can be formed by a sputtering method, a CVD method, an MBE method, a PLD method, an ALD method, or the like. The insulating film to be the insulator 276a and the insulator 276b functions as the dielectrics of the capacitor 100a and the capacitor 100b. Thus, the insulating film to be the insulator 276a and the insulator 276b is preferably formed using an insulating film having a high dielectric constant. For example, an insulator including an oxide containing one of or both aluminum and hafnium can be used. As the insulator including an oxide containing one of or both aluminum and hafnium, aluminum oxide, hafnium oxide, an oxide containing aluminum and hafnium (hafnium aluminate), or the like can be used.

Furthermore, the insulating film to be the insulator 276a and the insulator 276b may have a layered structure including two or more materials selected from silicon oxide, silicon oxynitride, silicon nitride oxide, silicon nitride, aluminum oxide, hafnium oxide, an oxide containing aluminum and hafnium (hafnium aluminate), and the like. In this embodiment, hafnium oxide, aluminum oxide, and hafnium oxide are formed in this order by an ALD method.

Next, a conductive film to be the conductor 130a and the conductor 130b is formed. The conductive film to be the conductor 130a and the conductor 130b can be formed by a sputtering method, a CVD method, an MBE method, a PLD method, an ALD method, or the like.

Next, part of the conductive film to be the conductor 130a and the conductor 130b is etched by a lithography method to form the conductor 130a and the conductor 130b. Part of the insulating film to be the insulator 276a and the insulator 276b may be successively etched to form the insulator 276a and the insulator 276b. In that case, different etching gases may be used for the etching of the part of the conductive film to be the conductor 130a and the conductor 130b and the etching of the part of the insulating film to be the insulator 276a and the insulator 276b (see FIGS. 47A to 47D).

Next, the insulator 280 is formed. The insulator 280 can be formed by a sputtering method, a CVD method, an MBE method, a PLD method, an ALD method, or the like. Alternatively, the insulator 280 can be formed by a spin coating method, a dipping method, a droplet discharging method (such as an ink-jet method), a printing method (such as screen printing or offset printing), a doctor knife method, a roll coater method, a curtain coater method, or the like. In this embodiment, silicon oxynitride is used for the insulator 280 (see FIGS. 48A to 48D).

The insulator 280 is preferably formed to have a flat top surface. For example, the insulator 280 may have a flat top surface right after the formation. Alternatively, for example, the insulator 280 may have a flat top surface by removing the insulator or the like from the top surface after the formation so that the top surface becomes parallel to a reference surface such as a rear surface of the substrate. Such treatment is referred to as planarization treatment. As the planarization treatment, for example, chemical mechanical polishing (CMP) treatment, dry etching treatment, or the like can be performed. In this embodiment, CMP treatment is performed as the planarization treatment. Note that the top surface of the insulator 280 does not necessarily have planarity.

Next, an opening reaching the region 231 of the oxide 530 is formed in the insulator 280 (see FIGS. 49A to 49D). The opening is formed by a lithography method. Here, the opening is provided so that the conductor 240 can be in contact with a side surface of the insulator 274a and a side surface of the insulator 274b. The opening is preferably formed under a condition where the insulator 274a and the insulator 274b are hardly etched, in other words, the etching rate of the insulator 280 is preferably higher than that of the insulator 274a and the insulator 274b. When the etching rate of the insulator 274a and the insulator 274b is set to 1, the etching rate of the insulator 280 is preferably set to 5 or more, further preferably 10 or more. With such an opening condition, the opening can be positioned near the region 231 in a self-aligned manner; thus, a miniaturized transistor can be manufactured. Tolerance of misalignment of the conductor 260_1, the conductor 2602, and the opening can be extended in a lithography process; thus, the yield should be improved.

Here, the region 231 may be subjected to ion implantation by an ion implantation method, an ion doping method by which an ionized source gas is added without mass separation, a plasma immersion ion implantation method, or the like. Ions cannot reach the oxide 230 except in the opening because of the insulator 280. In other words, ions are implanted into the opening in a self-aligned manner. Due to this ion implantation, the carrier density of the region 231 in the opening can be increased, and thus the contact resistance between the conductor 240 and the region 231 can be reduced in some cases.

In the case where mass separation is performed by an ion doping method, a plasma immersion ion implantation method, or the like, ion species to be added and its concentration can be controlled properly. On the other hand, in the case of not performing mass separation, ions at a high concentration can be added in a short time. Alternatively, an ion doping method in which atomic or molecular clusters are generated and ionized may be employed. Instead of the term "dopant", the term "ion", "donor", "acceptor", "impurity", "element", or the like may be used.

As the dopant, the element that forms oxygen vacancies, the element bonded to oxygen vacancies, or the like is used. Typical examples of the element are hydrogen, boron, carbon, nitrogen, fluorine, phosphorus, sulfur, chlorine, titanium, and a rare gas element. Typical examples of the rare gas element are helium, neon, argon, krypton, and xenon.

Next, a conductive film to be the conductor 240 is formed. The conductive film to be the conductor 240 desirably has a layered structure which includes a conductor having a function of inhibiting the passage of impurities such as water or hydrogen. For example, a layered structure of tantalum nitride, titanium nitride, or the like and tungsten, molybdenum, copper, or the like can be employed. The conductive film to be the conductor 240 can be formed by a sputtering method, a CVD method, an MBE method, a PLD method, an ALD method, or the like.

Next, CMP treatment is performed to remove the conductive film to be the conductor 240 that is over the insulator 280. As a result, the conductive film remains only in the opening, so that the conductor 240 having flat top surface can be formed (see FIGS. 50A to 50D).

Furthermore, the conductor 240 may be formed after aluminum oxide is formed on a side wall portion of the opening. By forming aluminum oxide on the side wall portion of the opening, the passage of oxygen from the outside can be inhibited and oxidation of the conductor 240 can be prevented. Furthermore, impurities such as water or hydrogen can be prevented from being diffused from the conductor 240 to the outside. The aluminum oxide can be formed by forming aluminum oxide in the opening by an ALD method or the like and then performing anisotropic etching.

Through the above steps, the semiconductor device including the transistor 200a, the transistor 200b, the capacitor 100a, and the capacitor 100b illustrated in FIGS. 29A to 29D can be manufactured.

Embodiment 5

Figure 51:
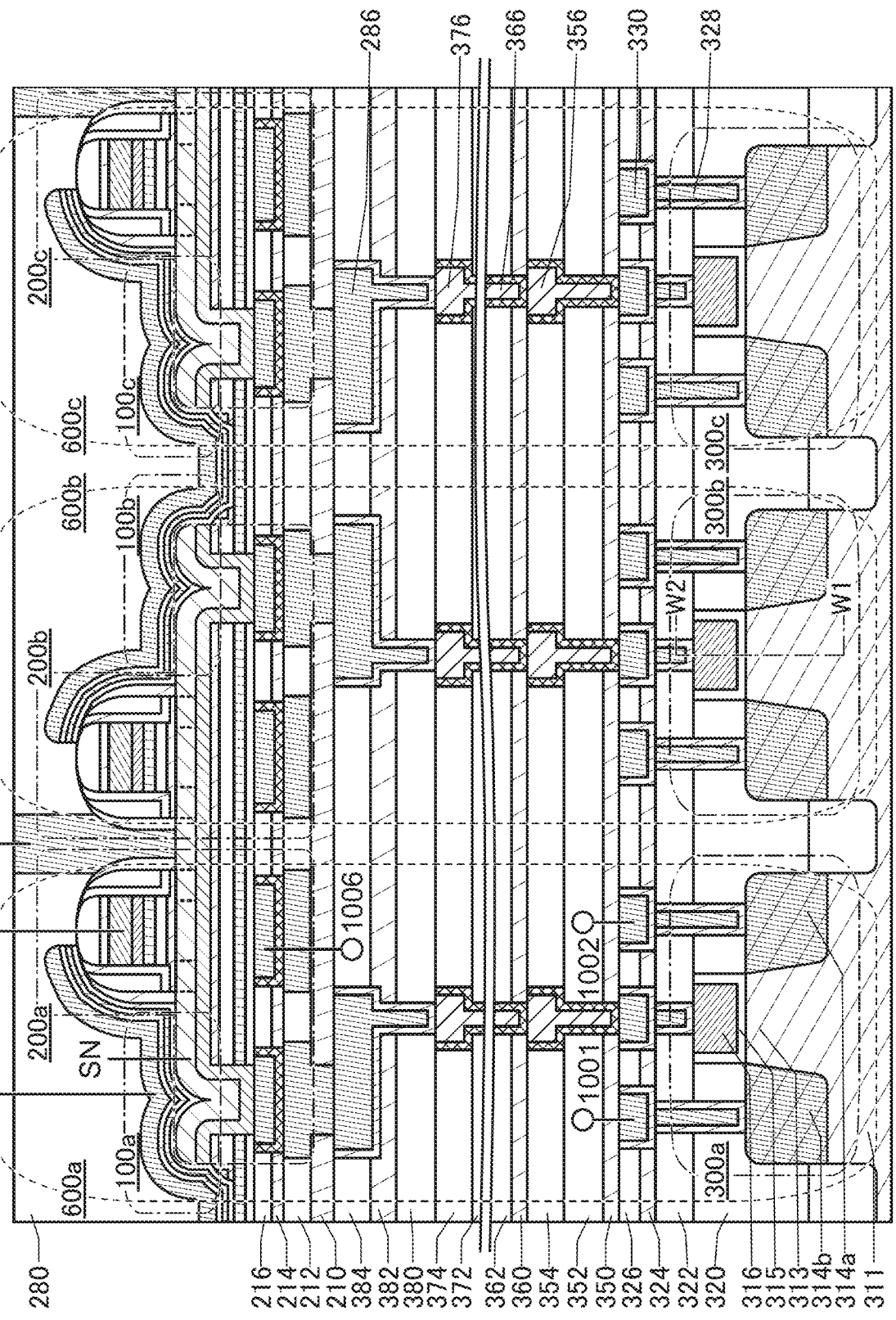
FIG. 51 is a cross section illustrating a structure of a memory device according to one embodiment of the present invention.
Figure 52:
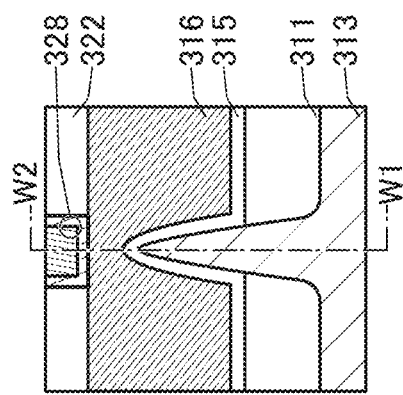
FIG. 52 is a cross section illustrating a structure of a memory device according to one embodiment of the present invention.

This embodiment will describe one embodiment of the semiconductor device with reference to FIG. 51 and FIG. 52.

[Memory Device 1]

The memory device illustrated in FIG. 51 includes a cell 600a, a cell 600b, and a cell 600c. The cell 600a includes the transistor 200a, the capacitor 100a, and a transistor 300a, the cell 600b includes the transistor 200b, the capacitor 100b, and a transistor 300b, and the cell 600c includes a transistor 200c, a capacitor 100c, and a transistor 300c. FIG. 51 is a cross section of the transistors in the channel length direction. FIG. 52 is a cross section taken along dashed-dotted line W1-W2 in FIG. 51. In other words, FIG. 52 is a cross section of the transistor 300b and the vicinity thereof in the channel width direction.

The transistor 200a, the transistor 200b, and the transistor 200c are each a transistor in which a channel is formed in a semiconductor layer including an oxide semiconductor. Since the off-state current of the transistor 200a, the transistor 200b, and the transistor 200c are small, by using the transistor 200a, the transistor 200b, and the transistor 200c in a memory device, stored data can be retained for a long time. In other words, such a memory device does not require refresh operation or has an extremely low frequency of the refresh operation, which leads to a sufficient reduction in power consumption.

In the memory device shown in FIG. 51, a wiring 1001 is electrically connected to one of the source and the drain of the transistor 300a. A wiring 1002 is electrically connected to the other of the source and the drain of the transistor 300a. A wiring 1003 is electrically connected to one of the source and the drain of the transistor 200a and one of the source and the drain of the transistor 200b. A wiring 1004 is electrically connected to the first gate of the transistor 200a. A wiring 1006 is electrically connected to the second gate of the transistor 200a. A wiring 1005 is electrically connected to one electrode of the capacitor 100a.

The memory device illustrated in FIG. 51 is capable of holding the potentials of the gates of the transistor 300a, the transistor 300b, and the transistor 300c, and thus enables writing, retaining, and reading of data. The cell 600a is described below as an example.

Writing and holding of data will be described. First, the potential of the wiring 1004 is set to a potential at which the transistor 200a is on, so that the transistor 200a is turned on. Accordingly, the potential of the wiring 1003 is supplied to a node SN where the gate of the transistor 300a and the one electrode of the capacitor 100a are electrically connected to each other. That is, a predetermined charge is supplied to the gate of the transistor 300a (writing). Here, one of two kinds of charges providing different potential levels (hereinafter referred to as a low-level charge and a high-level charge) is supplied. After that, the potential of the wiring 1004 is set to a potential at which the transistor 200a is turned off, so that the transistor 200a is turned off. Thus, the charge is held at the node SN (retaining).

In the case where the off-state current of the transistor 200a is low, the charge of the node SN is retained for a long time.

Next, reading of data is described. An appropriate potential (reading potential) is supplied to the wiring 1005 while a predetermined potential (constant potential) is supplied to the wiring 1001, whereby the potential of the wiring 1002 varies depending on the amount of charge retained in the node SN. This is because in the case of using an n-channel transistor as the transistor 300*a*, an apparent threshold voltage $V_{th\_H}$ at the time when a high-level charge is given to the gate of the transistor 300*a* is lower than an apparent threshold voltage $V_{th\_L}$ at the time when a low-level charge is given to the gate of the transistor 300*a*. Here, an apparent threshold voltage refers to the potential of the wiring 1005 which is needed to turn on the transistor 300*a*. Thus, the potential of the wiring 1005 is set to a potential $V_0$ which is between $V_{th\_H}$ and $V_{th\_L}$, whereby the charge supplied to the node SN can be determined. For example, in the case where the high-level charge is supplied to the node SN in writing and the potential of the wiring 1005 is $V_0$ ($>V_{th\_H}$), the transistor 300*a* is turned on. On the other hand, in the case where the low-level charge is supplied to the node SN in writing, even when the potential of the wiring 1005 is $V_0$ ($<V_{th\_L}$), the transistor 300*a* remains off. Thus, the data retained in the node SN can be read by determining the potential of the wiring 1002.

<Structure of Memory Device 1>

The memory device of one embodiment of the present invention includes the cell 600*a*, the cell 600*b*, and the cell 600*c* as illustrated in FIG. 51. The cell 600*a* includes the transistor 200*a*, the capacitor 100*a*, and the transistor 300*a*. The cell 600*b* includes the transistor 200*b*, the capacitor 100*b*, and the transistor 300*b*. The cell 600*c* includes the transistor 200*c*, the capacitor 100*c*, and the transistor 300*c*. FIG. 51 is a cross section of the transistors in the channel length direction. FIG. 52 is the cross section taken along dashed-dotted line W1-W2 in FIG. 51. In other words, FIG. 52 is a cross section of the transistor 300*b* and the vicinity thereof in a channel width direction. Note that the above embodiment can be referred to for the configuration of the transistor 200*a*, the transistor 200*b*, the capacitor 100*a*, and the capacitor 100*b*.

The transistor 300 (the transistor 300*a*, the transistor 300*b*, and the transistor 300*c*) is provided over the substrate 311 and includes the conductor 316, the insulator 315, the semiconductor region 313 that is a part of the substrate 311, and the low-resistance region 314*a* and the low-resistance region 314*b* functioning as a source region and a drain region.

As shown in FIG. 52, the top surface and the side surface are in the channel width direction of the semiconductor region 313 of the transistor 300 are covered with the conductor 316 with the insulator 315 provided therebetween. The effective channel width is increased in the FIN-type transistor 300, whereby the on-state characteristics of the transistor 300 can be improved. In addition, since contribution of the electric field of the gate electrode can be increased, the off-state characteristics of the transistor 300 can be improved.

Although the transistor 300 is an n-channel transistor in description in this embodiment, the transistor 300 may be either a p-channel transistor or an n-channel transistor.

It is preferable that a region of the semiconductor region 313 where a channel is formed, a region in the vicinity thereof, the low-resistance regions 314*a* and 314*b* functioning as a source region and a drain region, and the like contain a semiconductor such as a silicon-based semiconductor, further preferably single crystal silicon. Alternatively, a material including germanium (Ge), silicon germanium (SiGe), gallium arsenide (GaAs), gallium aluminum arsenide (GaAlAs), or the like may be contained. Silicon whose effective mass is controlled by applying stress to the crystal lattice and thereby changing the lattice spacing may be contained. Alternatively, the transistor 300 may be a high-electron-mobility transistor (HEMT) with GaAs and GaAlAs or the like.

The low-resistance regions 314*a* and 314*b* contain an element which imparts n-type conductivity, such as arsenic or phosphorus, or an element which imparts p-type conductivity, such as boron, in addition to a semiconductor material used for the semiconductor region 313.

The conductor 316 functioning as a gate electrode can be formed using a semiconductor material such as silicon containing the element which imparts n-type conductivity, such as arsenic or phosphorus, or the element which imparts p-type conductivity, such as boron, or a conductive material such as a metal material, an alloy material, or a metal oxide material.

Note that a material used for a conductor determines the work function, whereby a threshold voltage can be adjusted. Specifically, it is preferable to use titanium nitride, tantalum nitride, or the like as the conductor. Furthermore, in order to ensure the conductivity and embeddability of the conductor, it is preferable to use a laminated layer of metal materials such as tungsten and aluminum as the conductor. In particular, tungsten is preferable in terms of heat resistance.

Note that the transistor 300 illustrated in FIG. 51 is only an example and the structure of the transistor 300 is not limited to that illustrated therein; an appropriate transistor may be used in accordance with a circuit configuration or a driving method.

The insulator 320, the insulator 322, the insulator 324, and the insulator 326 are stacked sequentially and cover the transistor 300.

The insulator 320, the insulator 322, the insulator 324, and the insulator 326 can be formed using, for example, silicon oxide, silicon oxynitride, silicon nitride oxide, silicon nitride, aluminum oxide, aluminum oxynitride, aluminum nitride oxide, aluminum nitride, or the like.

The insulator 322 may function as a planarization film for eliminating a level difference caused by the transistor 300 or the like underlying the insulator 322. For example, the top surface of the insulator 322 may be planarized by planarization treatment using a chemical mechanical polishing (CMP) method or the like to increase the level of planarity.

The insulator 324 is preferably formed using a film with a barrier property that prevents hydrogen and impurities from diffusing from the substrate 311, the transistor 300, or the like into regions where the transistor 200 (the transistor 200*a*, the transistor 200*b*, and the transistor 200*c*) is provided.

As an example of the film having a barrier property with respect to hydrogen, silicon nitride formed by a CVD method can be given. Here, diffusion of hydrogen into a semiconductor element including an oxide semiconductor, such as the transistor 200, degrades the characteristics of the semiconductor element in some cases. Therefore, a film that prevents hydrogen diffusion is preferably provided between the transistor 200 and the transistor 300. Specifically, the film that prevents hydrogen diffusion is a film from which hydrogen is less likely to be released.

The amount of released hydrogen can be measured by thermal desorption spectroscopy (TDS), for example. The amount of hydrogen released from the insulator 324 that is converted into hydrogen molecules per unit area of the insulator 324 is less than or equal to $2 \times 10^{15}$ molecules/cm$^2$, preferably less than or equal to $1 \times 10^{15}$ molecules/cm$^2$, further preferably less than or equal to $5 \times 10^{14}$ molecules/ cm² in TDS analysis in a film-surface temperature range from 50° C. to 500° C., for example.

Note that the dielectric constant of the insulator 326 is preferably lower than that of the insulator 324. For example, the relative dielectric constant of the insulator 326 is preferably lower than 4, more preferably lower than 3. For example, the relative permittivity of the insulator 326 is preferably 0.7 times or less that of the insulator 324, further preferably 0.6 times or less that of the insulator 324. In the case where a material with a low dielectric constant is used as an interlayer film, the parasitic capacitance between wirings can be reduced.

The conductor 328, the conductor 330, and the like that are electrically connected to the transistor 300 are provided in the insulator 320, the insulator 322, the insulator 324, and the insulator 326. Note that the conductor 328 and the conductor 330 each function as a plug or a wiring. A plurality of conductors functioning as plugs or wirings are collectively denoted by the same reference numeral in some cases. Furthermore, in this specification and the like, a wiring and a plug electrically connected to the wiring may be a single component. That is, there are cases where a part of a conductor functions as a wiring and a part of a conductor functions as a plug.

As a material of each of plugs and wirings (e.g., the conductor 328 and the conductor 330), a conductive material such as a metal material, an alloy material, a metal nitride material, or a metal oxide material can be used in a single-layer structure or a layered structure. It is preferable to use a high-melting-point material that has both heat resistance and conductivity, such as tungsten or molybdenum, and it is particularly preferable to use tungsten. Alternatively, a low-resistance conductive material such as aluminum or copper is preferably used. The use of a low-resistance conductive material can reduce wiring resistance.

A wiring layer may be provided over the insulator 326 and the conductor 330. For example, the insulator 350, the insulator 352, and the insulator 354 are sequentially stacked in FIG. 51. Furthermore, the conductor 356 is formed in the insulator 350, the insulator 352, and the insulator 354. The conductor 356 functions as a plug or a wiring. Note that the conductor 356 can be formed using a material similar to that used for forming the conductor 328 and the conductor 330.

Note that for example, the insulator 350 is preferably formed using an insulator having a barrier property with respect to hydrogen, like the insulator 324. Furthermore, the conductor 356 preferably includes a conductor having a barrier property against hydrogen. The conductor having a barrier property with respect to hydrogen is formed particularly in an opening portion of the insulator 350 having a barrier property with respect to hydrogen. In such a structure, the transistor 300 can be separated from the transistor 200 by a barrier layer, so that the diffusion of hydrogen from the transistor 300 into the transistor 200 can be inhibited.

Note that as the conductor having a barrier property with respect to hydrogen, tantalum nitride may be used, for example. By stacking tantalum nitride and tungsten, which has high conductivity, diffusion of hydrogen from the transistor 300 can be prevented while the conductivity of a wiring is ensured. In this case, a tantalum nitride layer having a barrier property with respect to hydrogen is preferably in contact with the insulator 350 having a barrier property with respect to hydrogen.

In the above, a wiring layer including the conductor 356 is described; however, the memory device of this present embodiment is not limited thereto. The memory device may have three or less wiring layers which are similar to the wiring layer including the conductor 356 or may have five or more wiring layers which are similar to the wiring layer including a conductor 356.

Furthermore, a wiring layer may be provided over the insulator 354 and the conductor 356. For example, the wiring layer including the insulator 360, the insulator 362, and the conductor 366 and the wiring layer including the insulator 372, the insulator 374, and the conductor 376 are stacked in this order in FIG. 51. Furthermore, a plurality of wiring layers may be provided between a wiring layer including the insulator 360, the insulator 362, and the conductor 366 and a wiring layer including the insulator 372, the insulator 374, and the conductor 376. Note that the conductor 366 and the conductor 376 function as plugs or wirings. Furthermore, the insulator 360 to the insulator 374 can be formed using a material similar to that used for forming the insulator.

An insulator 380, an insulator 382, and an insulator 384 are stacked sequentially over the insulator 374. It is preferable to use a substance with a barrier property against oxygen or hydrogen for any of the insulator 380, the insulator 382, and the insulator 384. Furthermore, a conductor 286 is formed in the insulator 380, the insulator 382, and the insulator 384. The conductor 286 functions as a plug or a wiring. Note that the conductor 286 can be formed using a material similar to that used for forming the conductor 328 and the conductor 330.

Furthermore, the insulator 210 and the insulator 212 are stacked sequentially over the insulator 384. A material having a barrier property against oxygen and hydrogen is preferably used for any of the insulator 210 or the insulator 212.

The insulator 210 is preferably formed using, for example, a film having a barrier property that prevents hydrogen or impurities from the substrate 311, a region where the transistor 300 is formed, or the like from diffusing to a region where the transistor 200 is formed. Therefore, the insulator 210 can be formed using a material similar to that used for forming the insulator 324.

As an example of the film having a barrier property with respect to hydrogen, silicon nitride deposited by a CVD method can be given. Here, diffusion of hydrogen into the semiconductor element including an oxide semiconductor, such as the transistor 200, degrades the characteristics of the semiconductor element in some cases. Therefore, a film that prevents hydrogen diffusion is preferably provided between the transistor 200 and the transistor 300. Specifically, the film that prevents hydrogen diffusion is a film from which hydrogen is less likely to be released.

For the film having a barrier property against hydrogen used for the insulator 210, for example, a metal oxide such as aluminum oxide, hafnium oxide, or tantalum oxide is preferably used.

In particular, aluminum oxide has an excellent blocking effect that prevents permeation of oxygen and impurities such as hydrogen and moisture which cause a change in electrical characteristics of the transistor. Accordingly, the use of aluminum oxide can prevent entry of impurities such as hydrogen and moisture into the transistor 200 in and after a manufacturing process of the transistor. In addition, release of oxygen from the oxide in the transistor 200 can be prevented. Therefore, aluminum oxide is suitably used as a protective film for the transistor 200.

The insulator 212 can be formed using a material similar to that for the insulator 320, for example. In the case where a material with a relatively low permittivity is used for an interlayer film, the parasitic capacitance between wirings can be reduced. A silicon oxide film or a silicon oxynitride film can be used for the insulator 212, for example.

A conductor functioning as a plug or a wiring that is electrically connected to the transistor 200 or 300, a conductor included in the transistor 200, and the like are provided in the insulators 210, 212, 214, and 216. The conductor functioning as a plug or a wiring that is electrically connected to the transistor 200 or 300 can be formed using a material similar to that used for forming the conductor 328 and the conductor 330.

In particular, part of the conductor 218 which is in contact with the insulators 210 and 214 is preferably a conductor with a barrier property against oxygen, hydrogen, and water. In such a structure, the transistor 300 and the transistor 200 can be completely separated by the layer with a barrier property against oxygen, hydrogen, and water. As a result, the diffusion of hydrogen from the transistor 300 to the transistor 200 can be prevented.

The transistor 200 and the capacitor 100 (the capacitor 100a, the capacitor 100b, and the capacitor 100c) are provided over the insulator 212. Note that the structures of the transistor 200 and the capacitor 100 described in the above embodiments can be used as those of the transistor 200 and the capacitor 100. Note that the transistor 200 and the capacitor 100 in FIG. 51 are an example and are not limited to the structure shown therein; an appropriate transistor may be used in accordance with a circuit structure or a driving method.

The above is the description of the structure example. With the use of the structure, a change in electrical characteristics can be prevented and reliability can be improved in a semiconductor device including a transistor including an oxide semiconductor. A transistor including an oxide semiconductor with high on-state current can be provided. A transistor including an oxide semiconductor with low off-state current can be provided. A semiconductor device with low power consumption can be provided.

<Structure of Memory Device 2>

FIG. 53A is a cross section of the memory device including the capacitor 100a, the capacitor 100b, the transistor 200a, the transistor 200b, and the transistor 400. Note that in the memory device illustrated in FIGS. 53A and 53B, components having the same functions as the components in the semiconductor device and the memory device described in the above embodiment and <Structure of memory device 1> are denoted by the same reference numerals.

The memory device of one embodiment of the present invention includes the transistor 400, the transistor 200a, the transistor 200b, the capacitor 100a, and the capacitor 100b as illustrated in FIG. 53A. The transistor 400, the transistor 200a, the transistor 200b, the capacitor 100a, and the capacitor 100b are provided in the same layer.

Figure 54:
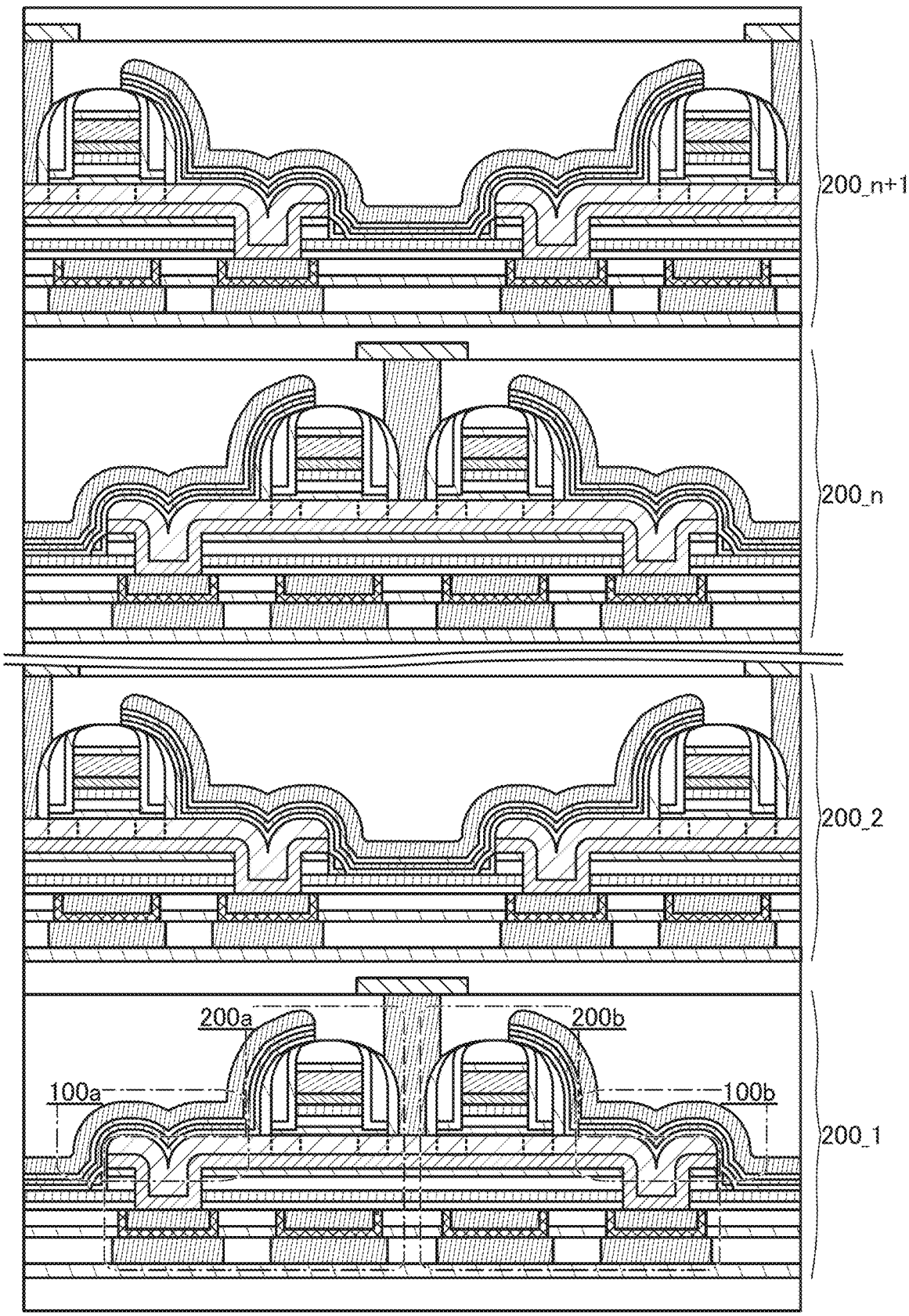
FIG. 54 is a cross section illustrating a structure of a memory device according to one embodiment of the present invention.

Note that the capacitors and the transistors included in the semiconductor device described in the above embodiments with reference to FIGS. 29A to 29D can be used as the transistor 200a, the transistor 200b, the capacitor 100a, and the capacitor 100b. Note that the capacitor 100a, the capacitor 100b, the transistor 200a, the transistor 200b, and the transistor 400 in FIGS. 53A and 53B are only examples and are not limited to the structure therein, and an appropriate transistor may be used in accordance with a circuit configuration or a driving method. For example, not only a single layer of the transistor 200a, the transistor 200b, the capacitor 100a, and the capacitor 100b, but also a stack of layers each including the transistor 200a, the transistor 200b, the capacitor 100a, and the capacitor 100b may be employed. FIG. 54 shows a cross section of the transistor 200a, the transistor 200b, the capacitor 100a, and the capacitor 100b having a layered structure of n+1 layers. As illustrated in FIG. 54, when a plurality of transistors 200a, transistors 200b, capacitors 100a, and capacitors 100b are stacked, the memory devices can be integrated without increasing the area occupied by the memory device. In other words, a memory device with a 3D structure can be provided.

The transistor 400 and the transistor 200 are formed in the same layer and thus can be fabricated in parallel. The transistor 400 includes the conductor 460 functioning as the first gate electrode, the conductor 405 functioning as the second gate electrode, the insulator 470 and the insulator 472 in contact with the conductor 460, the insulator 471 over the insulator 470, the insulator 475 provided on the side surface of the conductor 460 with the insulator 472 provided therebetween, the insulator 474 in contact with the insulator 475, the insulators 220, 222, 450, and 452 functioning as the gate insulating layers, the insulator 424 (the insulator 424a and the insulator 424b), and the oxide 430d including the region where the channel is formed, the oxide 431b and an oxide 431c functioning as one of a source and a drain, and the oxide 432b and an oxide 432c functioning as the other of the source and the drain. Furthermore, the conductor 405 functioning as the second gate electrode is electrically connected to a conductor 403 functioning as a wiring.

In the transistor 400, the conductor 405 is in the same layer as the conductor 205. The insulator 424 is in the same layer as the insulator 224. The oxides 431a and 432a are in the same layer as the oxide 530a, the oxides 431b and 432b are in the same layer as the oxide 530b, and the oxides 431c and 432c are in the same layer as the oxide 530c. The oxide 430d is in the same layer as an oxide 530d (the oxide 530_d1 and the oxide 530_d2). The insulator 450 is in the same layer as the insulator 250a and the insulator 250b. The insulator 452 is in the same layer as the insulator 252a and the insulator 252b. The conductor 460 is in the same layer as the conductor 260_1 and the conductor 260_2. The insulator 470 is in the same layer as the insulator 270a and the insulator 270b. The insulator 472 is in the same layer as the insulator 272a and the insulator 272b. The insulator 474 is in the same layer as the insulator 274a and the insulator 274b. The insulator 475 is in the same layer as the insulator 275a and the insulator 275b.

In the oxide 430d functioning as an active layer of the transistor 400, oxygen vacancies and impurities such as hydrogen or water are reduced, as in the oxide 230 or the like. Accordingly, the threshold voltage of the transistor 400 can be higher than 0 V, an off-state current can be reduced, and the drain current when the second gate voltage and the first gate voltage are 0 V can be extremely low.

With the use of the structure, a change in electrical characteristics can be suppressed and reliability can be improved in a semiconductor device including a transistor including an oxide semiconductor. The power consumption of a semiconductor device using a transistor including an oxide semiconductor can be reduced. A semiconductor device using a transistor including an oxide semiconductor can be miniaturized or highly integrated. Alternatively, a miniaturized or highly integrated semiconductor device can be provided with high productivity.

As described above, the structures, methods, and the like described in this embodiment can be combined with any of the structures, methods, and the like described in the other embodiments as appropriate.

Embodiment 6

In this embodiment, a NOSRAM (registered trademark) is described as an example of a memory device including a transistor in which an oxide is used for a semiconductor (hereinafter referred to as an OS transistor) and a capacitor, which is one embodiment of the present invention, with reference to FIG. 55, FIGS. 56A and 56B, and FIG. 57 to FIG. 62. The term NOSRAM is an abbreviation of "non-volatile oxide semiconductor RAM", which indicates a RAM including a gain cell (2T or 3T) memory cell.

A memory device in which OS transistors are used in memory cells (hereinafter referred to as an OS memory) is applied to the NOSRAM. The OS memory is a memory including at least a capacitor and an OS transistor that controls the charging and discharging of the capacitor. The OS memory has excellent retention characteristics because the OS transistor has an extremely low off-state current, and thus can function as a nonvolatile memory.

<<NOSRAM>>

Figure 55:
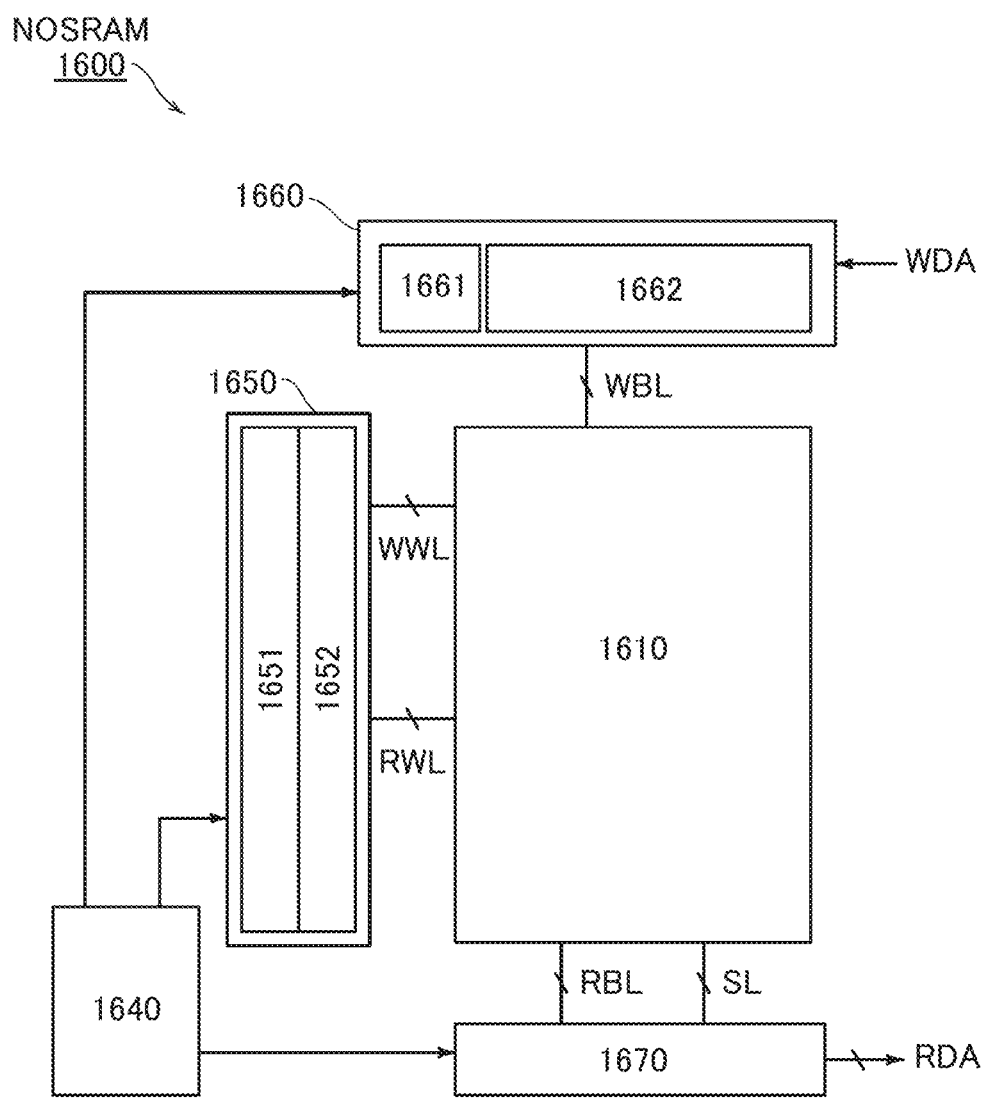
FIG. 55 is a block diagram illustrating a configuration example of a memory device according to one embodiment of the present invention.

FIG. 55 illustrates a configuration example of the NOSRAM. A NOSRAM 1600 illustrated in FIG. 55 includes a memory cell array 1610, a controller 1640, a row driver 1650, a column driver 1660, and a read circuit 1670.

Figure 56A:
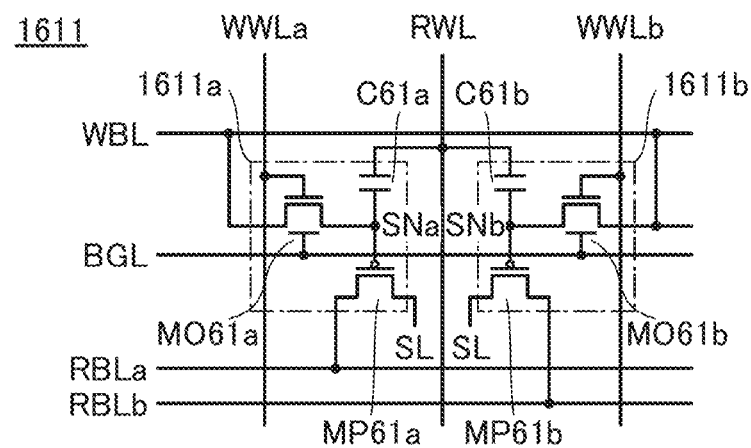
FIGS. 56A and 56B are circuit diagrams each illustrating a configuration example of a memory device according to one embodiment of the present invention.

The memory cell array 1610 includes memory cells 1611 each of which includes, as illustrated in FIG. 56A, word lines WWL and RWL, bit lines WBL and RBL, source lines SL, and a wiring BGL. The word lines WWL function as write word lines and the word line RWL functions as a read word line. The bit line WBL functions as a write bit line and the bit lines RBL function as read bit lines. Note that it is preferable that the word lines WWL and the bit line WBL be extended so as to cross each other perpendicularly. Furthermore, it is preferable that the word line RWL and the bit lines RBL be extended so as to cross each other perpendicularly. The memory cell 1611 includes a memory cell 1611a and a memory cell 1611b.

In the NOSRAM 1600, each of the memory cells 1611a and 1611b may store binary data or multilevel data. In the case where the NOSRAM 1600 has a configuration such that each of the memory cells 1611a and 1611b can store 6-bit (64-level) data, for example, one memory cell 1611 can store 12-bit (64×64-level) data. In the case where each of the memory cells 1611a and 1611b stores multilevel data, it is preferable to provide a digital-to-analog converter circuit (DAC) that converts digital data into analog voltage in the column driver 1660 and an analog-to-digital converter circuit (ADC) that converts analog voltage into digital data in the read circuit 1670.

The controller 1640 controls the NOSRAM 1600 as a whole and writes data WDA and reads data RDA. The controller 1640 processes command signals (e.g., a chip enable signal and a write enable signal) from the outside and generates control signals for the row driver 1650, the column driver 1660, and the read circuit 1670.

The row driver 1650 has a function of selecting which memory cell row to access. The row driver 1650 includes a row decoder 1651 and a word line driver 1652. The word line driver 1652 has a function of selecting the word lines WWL and RWL, for example. Note that the memory cell row is a plurality of memory cells that are connected to the same word line WWL (or word line RWL).

The column driver 1660 drives a memory cell column for each bit line WBL. The column driver 1660 includes a column decoder 1661 and a write driver 1662. The write driver 1662 has a function of selecting the bit line WBL, a function of inputting a write voltage to the selected bit line WBL, and the like. Note that the memory cell column is a plurality of memory cells that are connected to the same bit line WBL (or word line RBL).

The read circuit 1670 has a function of precharging the bit lines RBL, a function of making the bit lines RBL electrically floating, a function of applying potentials to the source lines SL, and the like. The read circuit 1670 includes a sense amplifier circuit that compares the potentials of the bit lines RBL with a reference potential and outputs data, an output buffer that retains the output data, and the like.

The configuration of the row driver 1650, the column driver 1660, and the read circuit 1670 described in this embodiment is not limited to that described above. The arrangement of those drivers and wirings connected to the drivers may be changed or the functions of the drivers and the wirings connected to the drivers may be changed or added, depending on the configuration, driving method, or the like of the memory cell array 1610. For example, the function of the bit line WBL may be partly achieved by the source lines SL.

<Memory Cell>

FIG. 56A is a circuit diagram illustrating a configuration example of the memory cell 1611. The memory cell 1611 includes the memory cell 1611a and the memory cell 1611b that are each a 2T gain cell described in the above embodiment. The cell described in the above embodiment includes two OS transistors that share either of source and drain electrodes; the memory cell in this embodiment includes two capacitors that share their one electrodes. The memory cell 1611 is electrically connected to word lines WWLa, WWLb, and RWL, bit lines WBL, RBLa, and RBLb, the source lines SL, and the wiring BGL. In FIG. 56A, the letter "a" or "b" is added to the reference numerals of the wirings and circuit elements connected to the memory cell 1611a or the memory cell 1611b.

The memory cell 1611a includes a node SNa, an OS transistor MO61a, a transistor MP61a, and a capacitor C61a. The memory cell 1611b includes a node SNb, an OS transistor MO61b, a transistor MP61b, and a capacitor C61b.

In the memory cell 1611a, a gate of the transistor MP61a, one of a source and a drain of the OS transistor MO61a, and one electrode of the capacitor C61a are electrically connected to one another at the node SNa. The bit line WBL and the other of the source and the drain of the OS transistor MO61a are electrically connected to each other. The word line WWLa and a gate of the OS transistor MO61a are electrically connected to each other. The wiring BGL and a bottom gate of the OS transistor MO61a are electrically connected to each other. The wiring RBLa and a drain of the transistor MP61a are electrically connected to each other. The wiring SL and a source of the transistor MP61a are electrically connected to each other. The word line RWL and the other electrode of the capacitor C61a are electrically connected to each other.

The memory cell 1611b can be provided so as to be symmetric to the memory cell 1611a with respect to the word line RWL. Accordingly, in the memory cell 1611b, a gate of the transistor MP61b, one of a source and a drain of the OS transistor MO61b, and one electrode of the capacitor C61b are electrically connected to one another at the node SNb. The bit line WBL and the other of the source and the drain of the OS transistor MO61b are electrically connected to each other. The word line WWLb and a gate of the OS transistor MO61b are electrically connected to each other. The wiring BGL and a bottom gate of the OS transistor MO61b are electrically connected to each other. The wiring RBLb and a drain of the transistor MP61b are electrically connected to each other. The wiring SL and a source of the transistor MP61b are electrically connected to each other.

The word line RWL and the other electrode of the capacitor C61b are electrically connected to each other.

The OS transistors MO61a and MO61b are write transistors. The transistors MP61a and MP61b are read transistors and are formed using p-channel Si transistors, for example. The capacitors C61a and C61b are storage capacitors for holding the voltages of the nodes SNa and SNb. The nodes SNa and SNb are data holding nodes. The node SNa corresponds to the gate of the transistor MP61a and the node SNb corresponds to the gate of the transistor MP61b.

Since the write transistors of the memory cell 1611 are the OS transistors MO61a and MO61b, the NOSRAM 1600 can retain data for a long time.

Figure 56B:
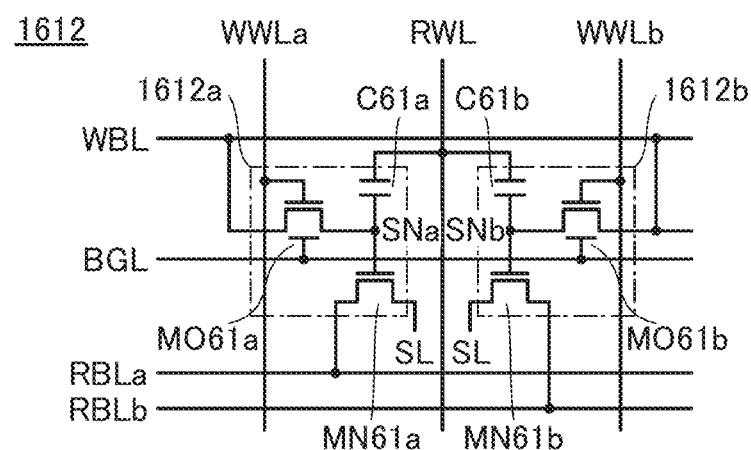

A memory cell 1612 illustrated in FIG. 56B is a modification example of the memory cell 1611; an n-channel transistor MN61a is used for a read transistor of a memory cell 1612a and an n-channel transistor MN61b is used for a read transistor of a memory cell 1612b. The transistors MN61a and MN61b may be OS transistors or Si transistors.

Note that the OS transistors in the memory cells 1611 and 1612 may be transistors having no bottom gates as long as sufficient electrical characteristics can be obtained.

Although the memory cells 1611 and 1612 are described as 2T memory cells in this embodiment, the memory cells 1611 and 1612 are not limited thereto and can be 3T memory cells, for example.

<NOR Memory Cell Array>

Hereinafter, what is called a NOR memory device in which the memory cells 1611 are connected in parallel to the bit lines RBL will be described as an example of the memory cell array 1610.

Figure 57:
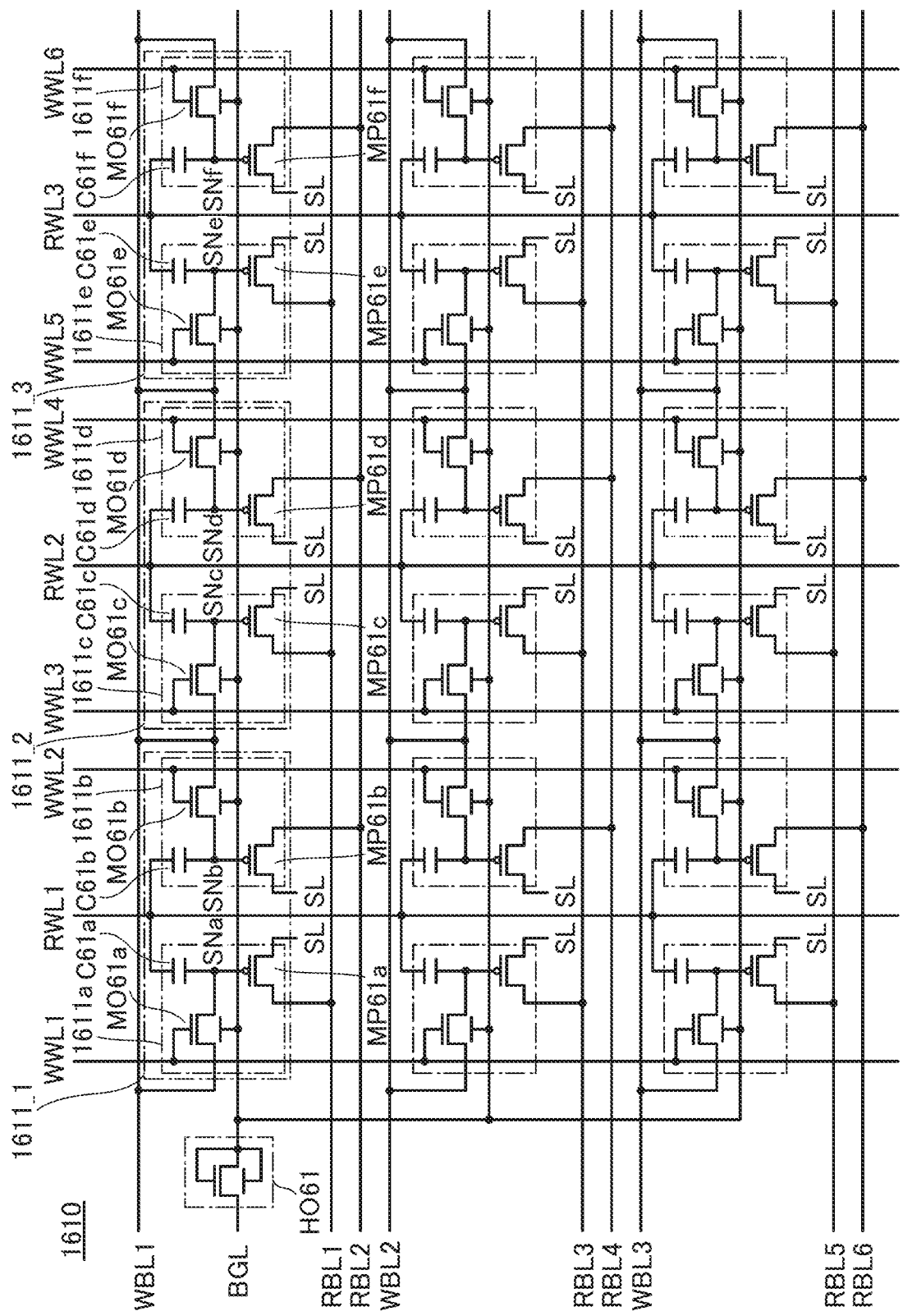
FIG. 57 is a circuit diagram illustrating a configuration example of a memory device according to one embodiment of the present invention.

FIG. 57 is a circuit diagram illustrating a configuration example of the NOR memory cell array 1610. The memory cell array 1610 illustrated in FIG. 57 includes 3×3 memory cells 1611, source lines SL, bit lines RBL1 to RBL6, bit lines WBL1 to WBL3, word lines WWL1 to WWL6, word lines RWL1 to RWL3, the wiring BGL, and an OS transistor HO61. The memory cells 1611 each have a configuration similar to that illustrated in the circuit diagram in FIG. 56A. Although FIG. 57 illustrates 3×3 memory cells 1611 as an example, the memory device of this embodiment is not limited thereto; the number of the memory cells 1611 and that of wirings included in the memory cell array 1610 can be set as appropriate. Furthermore, memory cells that can be used in the NOR memory cell array 1610 are not limited to the memory cells 1611 and can be changed as appropriate depending on the configuration or driving method of the memory cell array 1610. For example, the memory cell 1612 can be used in the NOR memory cell array 1610.

Note that the bit lines RBL1 to RBL6 and WBL1 to WBL3 and the word lines WWL1 to WWL6 and RWL1 to RWL3 are extended so as to cross each other perpendicularly.

Although the source lines SL are electrically isolated from each other, one embodiment of the present invention is not limited thereto. For example, the source lines SL may extend in a direction parallel to the word lines or the bit lines to be connected to each other.

The wiring BGL is electrically connected to the bottom gates of the OS transistors MO61a and MO61b in each of the memory cells 1611 through the OS transistor HO61. The OS transistor HO61 has a structure similar to that of the transistor 400 described in the above embodiment; a top gate and a bottom gate are diode-connected to a source, and the source is electrically connected to the bottom gates of the OS transistors MO61a and MO61b in each of the memory cells 1611. Accordingly, the voltages of the bottom gates of the OS transistors MO61a and MO61b in each of the memory cells 1611 can be controlled and as a result, the threshold voltages of the OS transistors MO61a and MO61b can be controlled. In this embodiment, a negative potential is applied to the bottom gates of the OS transistors MO61a and MO61b in each of the memory cells 1611 through the wiring BGL to reduce the $I_{cut}$ of the OS transistors MO61a and MO61b and to make the OS transistors MO61a and MO61b to have normally-off characteristics. Here, $I_{cut}$ is a drain current when the gate voltage of a transistor is 0 V. Note that this embodiment is not limited to the above structure; the potential of the wiring BGL may be changed in response to the states of the wirings in the memory cell array 1610, for example. In that case, the wiring BGL is provided for each memory cell row or memory cell column separately so as to extend in the direction parallel to the word lines or the bit lines. The OS transistor HO61 may be provided outside the memory cell array 1610. With the use of the OS transistor HO61 as described above, data can be retained for a long time without power supply. Therefore, a memory device with a low refresh frequency or a memory device that does not need refresh operation can be provided.

Hereinafter, a memory cell column (memory cells 1611_1, 1611_2, and 1611_3) that is electrically connected to the bit line WBL1 is described as an example. The memory cell 1611_1 includes the memory cell 1611a and the memory cell 1611b, the memory cell 1611_2 includes a memory cell 1611c and a memory cell 1611d, and the memory cell 1611_3 includes a memory cell 1611e and a memory cell 1611f. The reference numerals of circuit elements included in any of the memory cells 1611a to 1611f include any of the letters "a" to "f".

The word lines WWL1 to WWL6 are electrically connected to the memory cells 1611a to the memory cell 1611f, respectively. The word lines RWL1 to RWL3 are electrically connected to the memory cells 1611_1 to 1611_3, respectively. In the memory cell 1611_1, the word line RWL1 is shared by the capacitor C61a of the memory cell 1611a and the capacitor C61b of the memory cell 1611b. The same applies to the memory cells 1611_2 and 1611_3.

The bit line WBL1 is electrically connected to the memory cells 1611a to 1611f through contact portions. Here, the contact portion to the bit line WBL is shared by the memory cell 1611b and the memory cell 1611c. The same applies to the memory cell 1611d and the memory cell 1611e. The bit line RBL1 is electrically connected to the memory cells 1611a, 1611c, and 1611e. The bit line RBL2 is electrically connected to the memory cells 1611b, 1611d, and 1611f.

Figure 58:
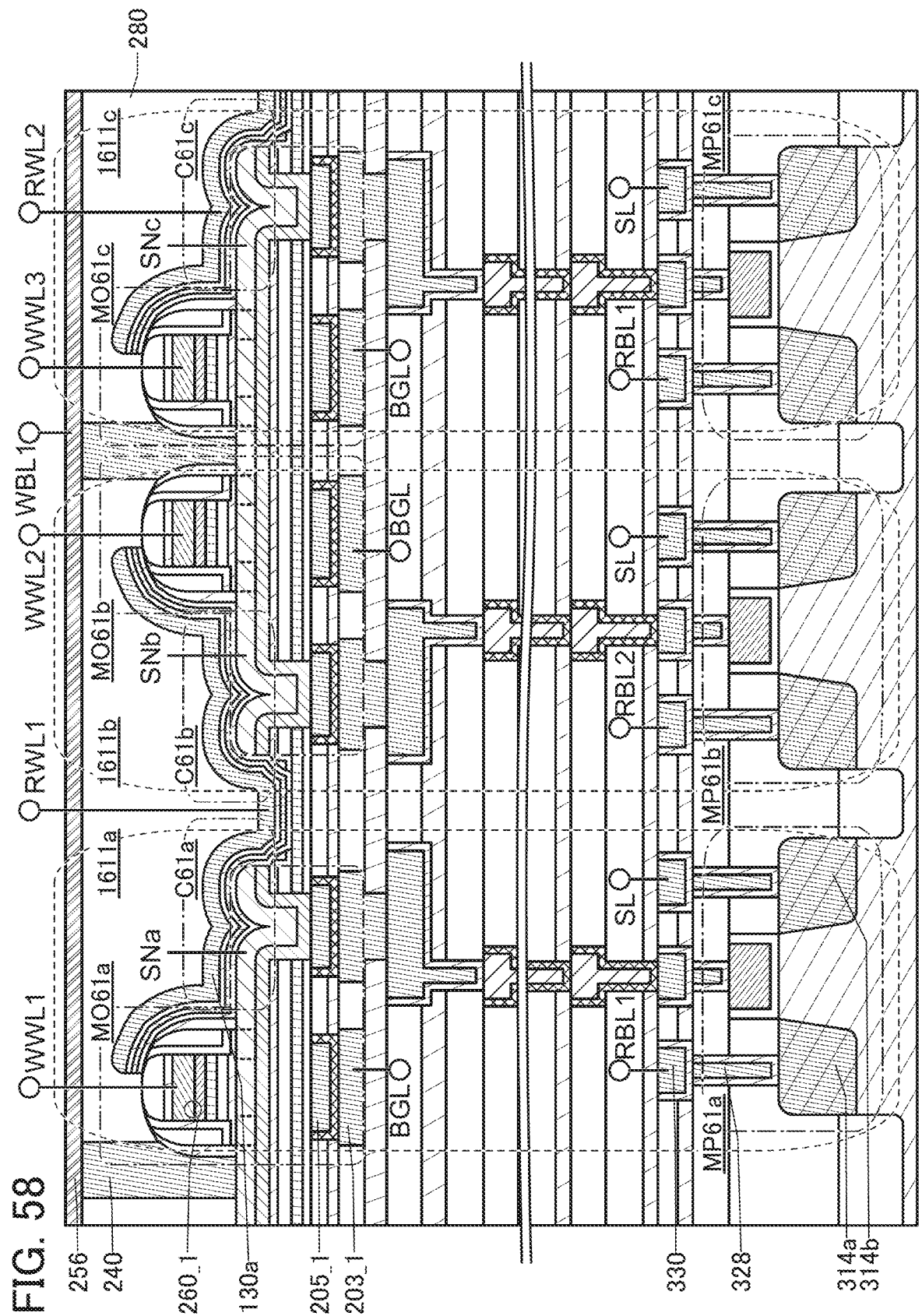
FIG. 58 is a cross section illustrating a structure of a memory device according to one embodiment of the present invention.

FIG. 58 illustrates a cross section showing the memory cells 1611a, 1611b, and 1611c. The memory cells 1611a, 1611b, and 1611c have structures similar to those of the cells in the memory device illustrated in FIG. 51. In other words, capacitors C61a, C61b, and C61c have structures similar to those of the capacitors 100c, 100b, and 100a; OS transistors MO61a, MO61b, and MO61c have structures similar to those of the transistors 200c, 200b, and 200a; and transistors MP61a, MP61b, and MP61c have structures similar to those of the transistors 300c, 300b, and 300a. Note that a conductor 256 is provided over the insulator 280 and the conductor 240 in FIG. 58. FIG. 58 illustrates a structure obtained by flipping the structure illustrated in FIG. 51 so as to correspond to the circuit diagram of the memory cell column illustrated in FIG. 57.

The conductor 130a extends in the memory cell 1611a and functions as the word line RWL1, the conductor 260_1 extends in the memory cell 1611a and functions as the word line WWL1, and the conductor 203_1 in contact with the bottom surface of the conductor 205_1 extends in the memory cell 1611a and functions as the wiring BGL, for example. The word line WWL2 and the wiring BGL are provided similarly in the memory cell 1611b. Note that the conductor 130a functioning as the word line RWL1 is shared by the memory cell 1611a and the memory cell 1611b. Since the word line RWL1 is shared by the memory cell 1611a and the memory cell 1611b, the distance between the memory cell 1611a and the memory cell 1611b can be reduced and the area occupied by the memory cell 1611_1 when seen from the top can be reduced. Accordingly, the memory device of this embodiment can be further highly integrated and the storage capacity per unit area can be increased. Note that in the memory cell 1611c, the word line RWL2, the word line WWL3, and the wiring BGL are provided in a manner similar to the above-described manner.

In the memory cell 1611a, the low-resistance region 314a illustrated in FIG. 58 functions as a drain of the transistor MP61a and is electrically connected to the bit line RBL1 through the conductor 328 and the conductor 330. The low-resistance region 314b functions as a source of the transistor MP61a and is electrically connected to the source line SL through the conductor 328 and the conductor 330. The bit line RBL2 and the source line SL are provided similarly in the memory cell 1611b, and the bit line RBL1 and the source line SL are provided similarly in the memory cell 1611c.

The conductor 256 extends and functions as the bit line WBL1. The conductor 240 functions as the contact portion to the bit line WBL1. The conductor 240 is shared by the OS transistor MO61b and the OS transistor MO61c. Since the contact portion to the bit line WBL1 is shared by the memory cell 1611b and the memory cell 1611c, the number of contact portions to the bit line WBL1 can be reduced and the area occupied by the memory cell 1611_1 and the memory cell 1611_2 when seen from the top can be reduced. Accordingly, the memory device of this embodiment can be further highly integrated and the storage capacity per unit area can be increased.

Next, the writing and reading operations of the NOR memory cell array 1610 illustrated in FIG. 57 will be described. As examples of the writing and reading operations of the memory cell array 1610 illustrated in FIG. 57, writing operation in which data "0" is written to the memory cell 1611a and data "1" is written to the memory cell 1611b and reading operation in which data written to the memory cell 1611a and data written to the memory cell 1611b are read at the same time will be described below with the use of a timing chart shown in FIG. 59. In the following description, data retained in the case where a potential VDD is applied to the node SNa (the node SNb) is data "1", and data retained in the case where a potential VSS is applied to the node SNa (the node SNb) is data "0".

First, the writing operation is described. The writing operation is performed in Period T1 to Period T7 in the timing chart shown in FIG. 59. In the memory device including the NOR memory cell array 1610 illustrated in FIG. 57, the writing operation is performed for each memory cell row. Thus, when data is written to the memory cell 1611a and the memory cell 1611b described below, data can be written to a memory cell row including the memory cell 1611a and a memory cell row including the memory cell 1611b at the same time.

Period T1 is a stand-by period, and no memory cell row is selected. During this period, a potential VSSW at which the OS transistor MO61a is turned off is applied to the word lines WWL1 and WWL2. In addition, the potential VSS that corresponds to data "0" is applied to the bit line WBL1. Moreover, a potential VDDR at which the transistor MP61a (the transistor MP61b) can be turned off is applied to the word line RWL1, regardless of the charge retained at the node SNa (the node SNb). As a result, the transistor MP61a (the transistor MP61b) is turned off and the memory cell 1611a (the memory cell 1611b) is set in a non-selected state. Note that the potential VSSW is a potential lower than or equal to the potential VSS, and the potential VDDR is a potential higher than the potential VDD. During the writing period, a potential VSSO is kept applied to the bit lines RBL1 and RBL2 and the source line SL. Note that since the potentials of the nodes SNa and SNb depend on data that has been retained before Period T1, the potentials are shown as shaded regions in FIG. 59.

In Period T2, the word line WWL1 is selected and data writing to a memory cell row connected to the word line WWL1 is performed. The potential VSS that corresponds to data "0" is applied to the bit line WBL1. A potential VDDW at which the OS transistor MO61a is turned on is applied to the word line WWL1 to turn on the OS transistor MO61a. At this time, a reading potential VSSR is applied to the word line RWL1. As a result, the potential VSS of the bit line WBL1 is applied to the node SNa of the memory cell 1611a, and a charge corresponding to data "0" is applied to the node SNa. In this manner, data "0" can be written to the node SNa of the memory cell 1611a. Note that the potential VDDW is a potential higher than the potential VDD, and the potential VSSR is the same potential as the potential VSS.

During Period T2, the potential VSSW is kept applied to the word lines WWL2 to WWL6 that are not selected, so that the OS transistors MO61b to MO61f are in off states. Thus, writing of wrong data to memory cell rows connected to the word lines WWL2 to WWL6 can be prevented in Period T2.

In Period T3, data writing to the memory cell row connected to the word line WWL1 terminates. The potential VSSW at which the OS transistor MO61a is turned off is applied to the word line WWL1 to turn off the OS transistor MO61a. In this manner, a charge corresponding to data "0" can be retained at the node SNa of the memory cell 1611a.

Period T4 is a stand-by period like Period T1, and no memory cell row is selected. The potentials of the wirings are reset to the potentials applied in Period T1. Note that the potential VDD that corresponds to data "1" is applied to the bit line WBL1 for following Period T5.

In Period T5, the word line WWL2 is selected and data writing to the memory cell row connected to the word line WWL2 is performed. The potential VDDW at which the OS transistor MO61b is turned on is applied to the word line WWL2 to turn on the OS transistor MO61b. At this time, the reading potential VSSR is applied to the word line RWL1. As a result, the potential VDD of the bit line WBL1 is applied to the node SNb of the memory cell 1611b, and a charge corresponding to data "1" is applied to the node SNb. In this manner, data "1" can be written to the node SNb of the memory cell 1611b.

During Period T5, the potential VSSW is kept applied to the word lines WWL1 and WWL3 to WWL6 that are not selected, so that the OS transistors MO61a and MO61c to MO61f are in off states. Thus, writing of wrong data to the memory cell rows connected to the word lines WWL1 and WWL3 to WWL6 can be prevented in Period T5.

In Period T6, data writing to the memory cell row connected to the word line WWL2 terminates. The potential VSSW at which the OS transistor MO61b is turned off is applied to the word line WWL2 to turn off the OS transistor MO61b. In this manner, a charge corresponding to data "1" can be retained at the node SNb of the memory cell 1611b.

Period T7 is a stand-by period like Period T1, and no memory cell row is selected. The potentials of the wirings are reset to the potentials applied in Period T1.

In the above manner, the writing operation in which data "0" is written to the memory cell 1611a and data "1" is written to the memory cell 1611b can be performed.

Next, the reading operation is described. The reading operation is performed in Period T8 to Period T10 in the timing chart shown in FIG. 59. In the memory device including the NOR memory cell array 1610 illustrated in FIG. 57, the reading operation is performed for each memory cell row. Thus, when data of the memory cell 1611a and data of the memory cell 1611b described below are read, data of the memory cell row including the memory cell 1611a and data of the memory cell row including the memory cell 1611b can be read at the same time.

Period T8 is a stand-by period like Period T1, and no memory cell row is selected. The potentials of the wirings are the same as the potentials applied in Period T7. Note that a potential VDDO is applied to the source line SL for following Period T9. Here, the potential VDDO is a potential applied to the bit line RBL when data "0" is retained, and the potential VSSO is a potential applied to the bit line RBL when data "1" is retained. The potential VDDO may be different from the potential VDD. The potential VSSO may be different from the potential VSS. During the reading period, the potential VSSW or the potential VSS is kept applied to the word lines WWL1 and WWL2 and the bit line WBL1.

In Period T9, the word line RWL1 is selected and reading from memory cell rows connected to the word line RWL1 is performed. The reading potential VSSR is applied to the word line RWL1. Note that the reading potential VSSR is a potential at which the transistor MP61a (the transistor MP61b) is turned off when the charge retained at the node SNa (the node SNb) corresponds to data "1" and the transistor MP61a (the transistor MP61b) is turned on when the retained charge corresponds to data "0". Since a charge corresponding to data "0" is retained at the node SNa, the transistor MP61a is turned on, the source line SL and the bit line RBL1 are electrically connected to each other, and the potential VDDO is applied to the bit line RBL1. In addition, since a charge corresponding to data "1" is retained at the node SNb, the transistor MP61b is turned off, the source line SL and the bit line RBL2 are not electrically connected to each other, and the potential VSSO is applied to the bit line RBL2. Reading the potentials of the bit lines RBL1 and RBL2 by the read circuit 1670 enables reading of data retained in the memory cell 1611a and data retained in the memory cell 1611b.

During Period T9, the potential VDDR at which the transistors MP61c to MP61f can be turned off is kept applied to the word lines RWL2 and RWL3 that are not selected, regardless of charges retained at the nodes SNc to SNf, so that the transistors MP61c to MP61f remain off. Thus, reading of wrong data through the bit lines RBL1 and RBL2 can be prevented in Period T9.

Period T10 is a stand-by period like Period T1, and no memory cell row is selected. The potentials of the wirings are reset to the potentials applied in Period T1.

In the above manner, the reading operation in which data written to the memory cell 1611a and data written to the memory cell 1611b are read at the same time can be performed. Since data of two memory cell rows can be read at the same time in the memory device of this embodiment as described above, high-speed reading can be achieved.

<NAND Memory Cell Array>

The NOR memory device in which the memory cells 1611 are connected in parallel to the bit lines RBL is described above, but the memory device of this embodiment is not limited thereto. Hereinafter, what is called a NAND memory device in which the transistors MN61a (the transistors MN61b) of the memory cells 1612 are connected in series between the bit line RBL and the source line SL will be described as another example of the memory cell array 1610.

Figure 60:
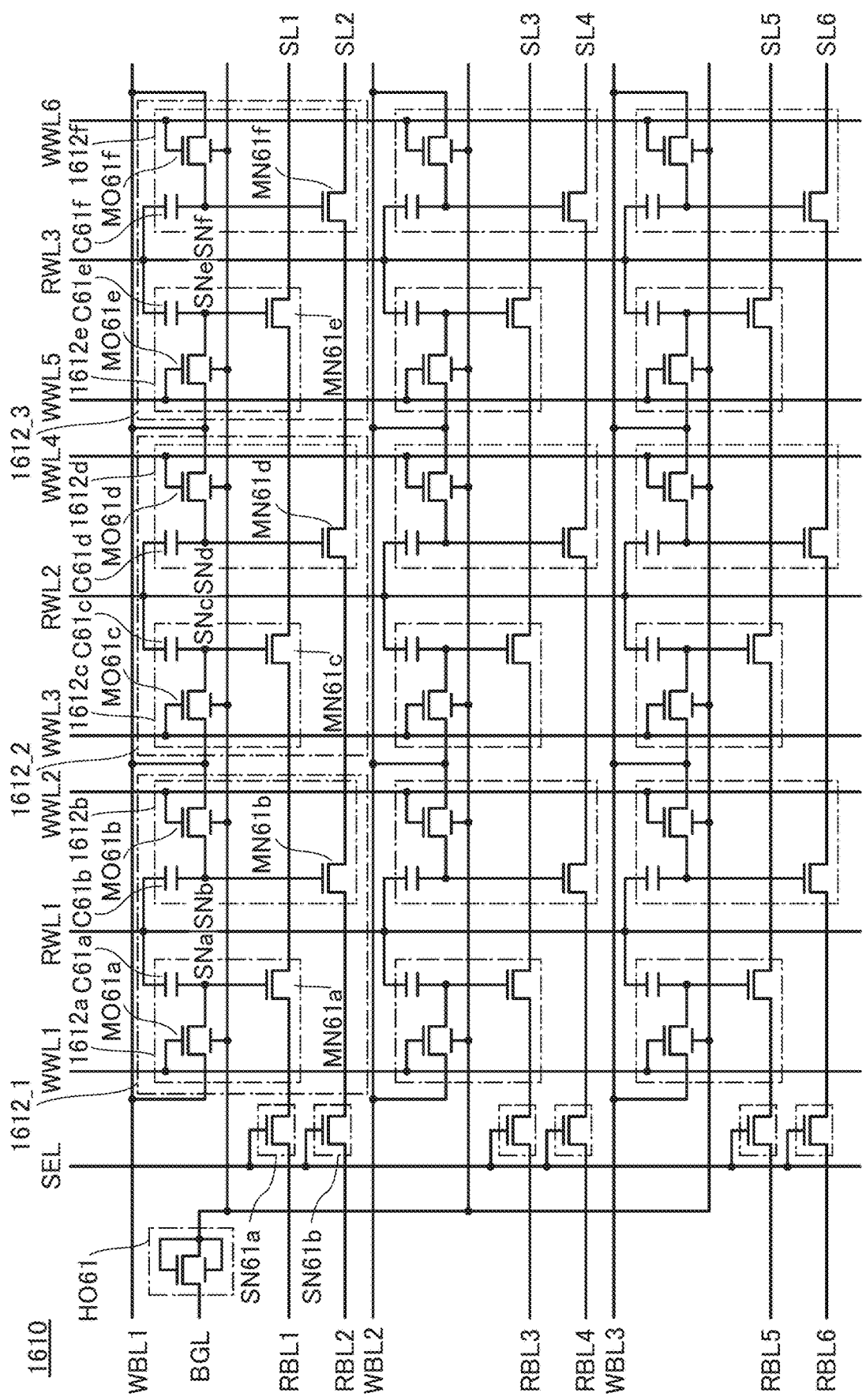
FIG. 60 is a circuit diagram illustrating a configuration example of a memory device according to one embodiment of the present invention.

FIG. 60 is a circuit diagram illustrating a configuration example of the NAND memory cell array 1610. The memory cell array 1610 illustrated in FIG. 60 includes 3×3 memory cells 1612, source lines SL1 to SL6, the bit lines RBL1 to RBL6, the bit lines WBL1 to WBL3, the word lines WWL1 to WWL6, the word lines RWL1 to RWL3, the wiring BGL, a wiring SEL, the OS transistor HO61, and transistors SN61 (transistors SN61a and SN61b and the like). The memory cells 1612 each have a configuration similar to that illustrated in the circuit diagram in FIG. 56B. Although FIG. 60 illustrates 3×3 memory cells 1612 as an example, the memory device of this embodiment is not limited thereto; the number of the memory cells 1612 and that of wirings included in the memory cell array 1610 can be set as appropriate. Furthermore, memory cells that can be used in the NAND memory cell array 1610 are not limited to the memory cells 1612 and can be changed as appropriate depending on the configuration or driving method of the memory cell array 1610. For example, the memory cell 1611 can be used in the NAND memory cell array 1610.

Note that the bit lines WBL1 to WBL3 and the word lines WWL1 to WWL6 and RWL1 to RWL3 are extended so as to cross each other perpendicularly.

Furthermore, the bit line RBL1 and the source line SL1 that are electrically connected to each other with transistors SN61a, MN61a, MN61c, and MN61e provided therebetween are extended so as to cross the word line RWL1 and the like perpendicularly. The same applies to the bit lines RBL2 to RBL6 and the source lines SL2 to SL6.

The transistors SN61 are provided between the bit lines RBL and the memory cells 1612. Gates of the transistors SN61 are electrically connected to the wiring SEL. The wiring SEL is provided so as to extend in the direction parallel to the wirings RWL. FIG. 60 illustrates 3×3 memory cells 1612. It is preferable that a plurality of blocks each of which has a configuration similar to that illustrated in FIG. 60 be formed in the memory cell array 1610. Note that the transistors SN61 function as selection transistors used for selecting a block from the plurality of blocks at the time of the reading operation. In the case of the reading of the block illustrated in FIG. 60, the transistors SN61 are turned on through the wiring SEL so that the bit lines RBL1 to RBL6 are connected to read transistors in the memory cell 1612; thus, the reading operation can be started.

The description referring to FIG. 57 can be referred to for the wiring BGL and the OS transistor HO61.

Hereinafter, a memory cell column (memory cells 1612_1, 1612_2, and 1612_3) that is electrically connected to the bit line WBL1 is described as an example. The memory cell 1612_1 includes the memory cell 1612a and the memory cell 1612b, the memory cell 1612_2 includes a memory cell 1612c and a memory cell 1612d, and the memory cell 1612_3 includes a memory cell 1612e and a memory cell 1612f. The reference numerals of circuit elements included in any of the memory cells 1612a to 1612f include any of the letters "a" to "f".

The description referring to FIG. 57 can be referred to for the word lines WWL1 to WWL6, the word lines RWL1 to RWL3, and the bit line WBL1.

The bit line RBL1 is electrically connected to the source line SL1 with the transistors SN61a, MN61a, MN61c, and MN61e provided therebetween. The transistors SN61a, MN61a, MN61c, and MN61e are connected to each other in series through their sources and drains. The bit line RBL2 is electrically connected to the source line SL2 with the transistors SN61b, MN61b, MN61d, and MN61f provided therebetween. The transistors SN61b, MN61b, MN61d, and MN61f are connected to each other in series through their sources and drains.

Figure 61:
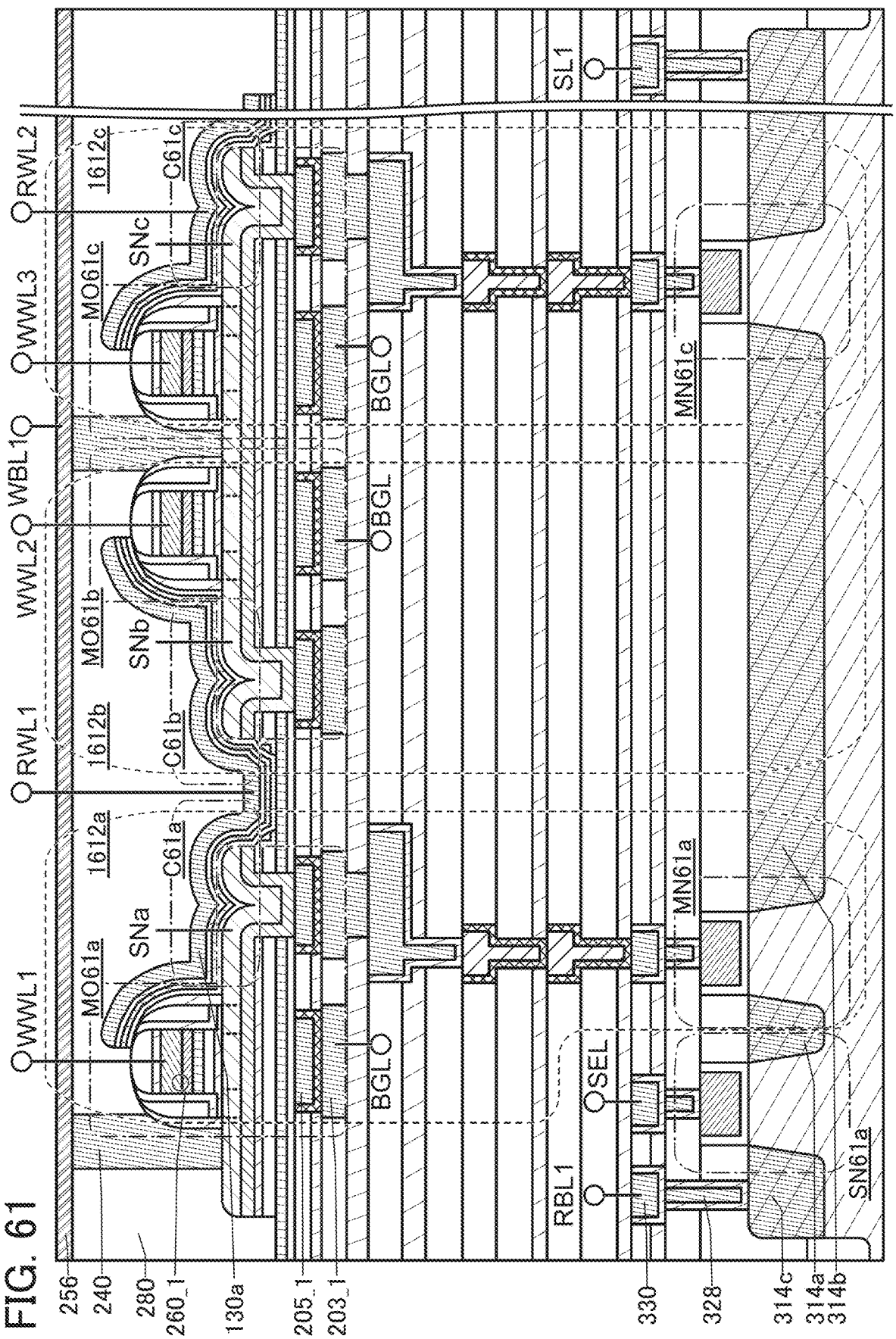
FIG. 61 is a cross section illustrating a structure of a memory device according to one embodiment of the present invention.

FIG. 61 illustrates a cross section showing the memory cells 1612a, 1612b, and 1612c. The memory cells 1612a, 1612b, and 1612c have structures similar to those of the cells in the memory device illustrated in FIG. 51. In other words, the capacitors C61a, C61b, and C61c have structures similar to those of the capacitors 100c, 100b, and 100a; the OS transistors MO61a, MO61b, and MO61c have structures similar to those of the transistors 200c, 200b, and 200a; and the transistors MN61a and MN61c have structures similar to those of the transistors 300c and 300a. Note that the conductor 256 is provided over the insulator 280 and the conductor 240 in FIG. 61. FIG. 61 illustrates a structure obtained by flipping the structure illustrated in FIG. 51 so as to correspond to the circuit diagram of the memory cell column illustrated in FIG. 60. Note that FIG. 61 illustrates transistors between the bit line RBL1 and the source line SL1 and does not illustrate transistors between the bit line RBL2 and the source line SL2.

The conductor 130a extends in the memory cell 1612a and functions as the word line RWL1, the conductor 260_1 extends in the memory cell 1612a and functions as the word line WWL1, and the conductor 203_1 in contact with the bottom surface of the conductor 205_1 extends in the memory cell 1612a and functions as the wiring BGL, for example. The word line WWL2 and the wiring BGL are provided similarly in the memory cell 1612b. Note that the conductor 130a functioning as the word line RWL1 is shared by the memory cell 1612a and the memory cell 1612b. Since the word line RWL1 is shared by the memory cell 1612a and the memory cell 1612b, the distance between the memory cell 1612a and the memory cell 1612b can be reduced and the area occupied by the memory cell 1612_1 when seen from the top can be reduced. Accordingly, the memory device of this embodiment can be further highly integrated and the storage capacity per unit area can be increased. Note that in the memory cell 1612c, the word line RWL2, the word line WWL3, and the wiring BGL are provided in a manner similar to the above-described manner.

The conductor 256 extends and functions as the bit line WBL1. The conductor 240 functions as the contact portion to the bit line WBL1. The conductor 240 is shared by the OS transistor MO61b and the OS transistor MO61c. Since the contact portion to the bit line WBL1 is shared by the memory cell 1612b and the memory cell 1612c, the number of contact portions to the bit line WBL1 can be reduced and the area occupied by the memory cell 1612_1 and the memory cell 1612_2 when seen from the top can be reduced. Accordingly, the memory device of this embodiment can be further highly integrated and the storage capacity per unit area can be increased.

The low-resistance region 314a illustrated in FIG. 61 functions as a source of the transistor SN61a and a drain of the transistor MN61a. The low-resistance region 314b functions as a source of the transistor MN61a and a drain of the transistor MN61c. A source of the transistor MN61c is electrically connected to the source line SL1 through the transistor MN61e, the conductor 328, and the conductor 330.

A low-resistance region 314c functioning as a drain of the transistor SN61a is electrically connected to the bit line RBL1 through the conductor 328 and the conductor 330. The gate of the transistor SN61a is electrically connected to the wiring SEL through the conductor 328 and the conductor 330.

Next, the writing and reading operations of the NAND memory cell array 1610 illustrated in FIG. 60 will be described. As examples of the writing and reading operations of the memory cell array 1610 illustrated in FIG. 60, writing operation in which data "0" is written to the memory cell 1612a and data "1" is written to the memory cell 1612b and reading operation in which data written to the memory cell 1612a and data written to the memory cell 1612b are read at the same time will be described below with the use of a timing chart shown in FIG. 62.

Figure 59:
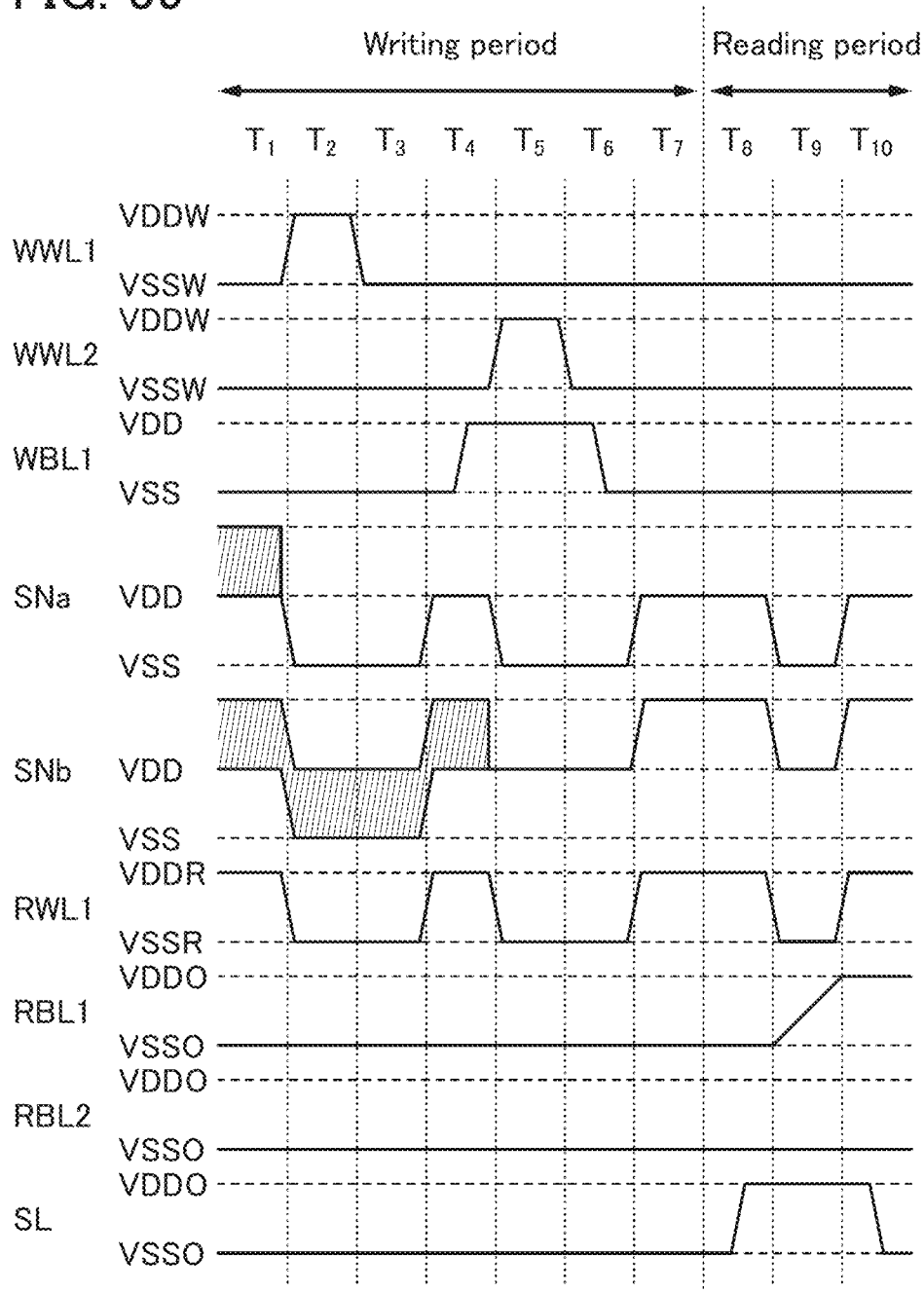
FIG. 59 is a timing chart of a memory device according to one embodiment of the present invention.
Figure 62:
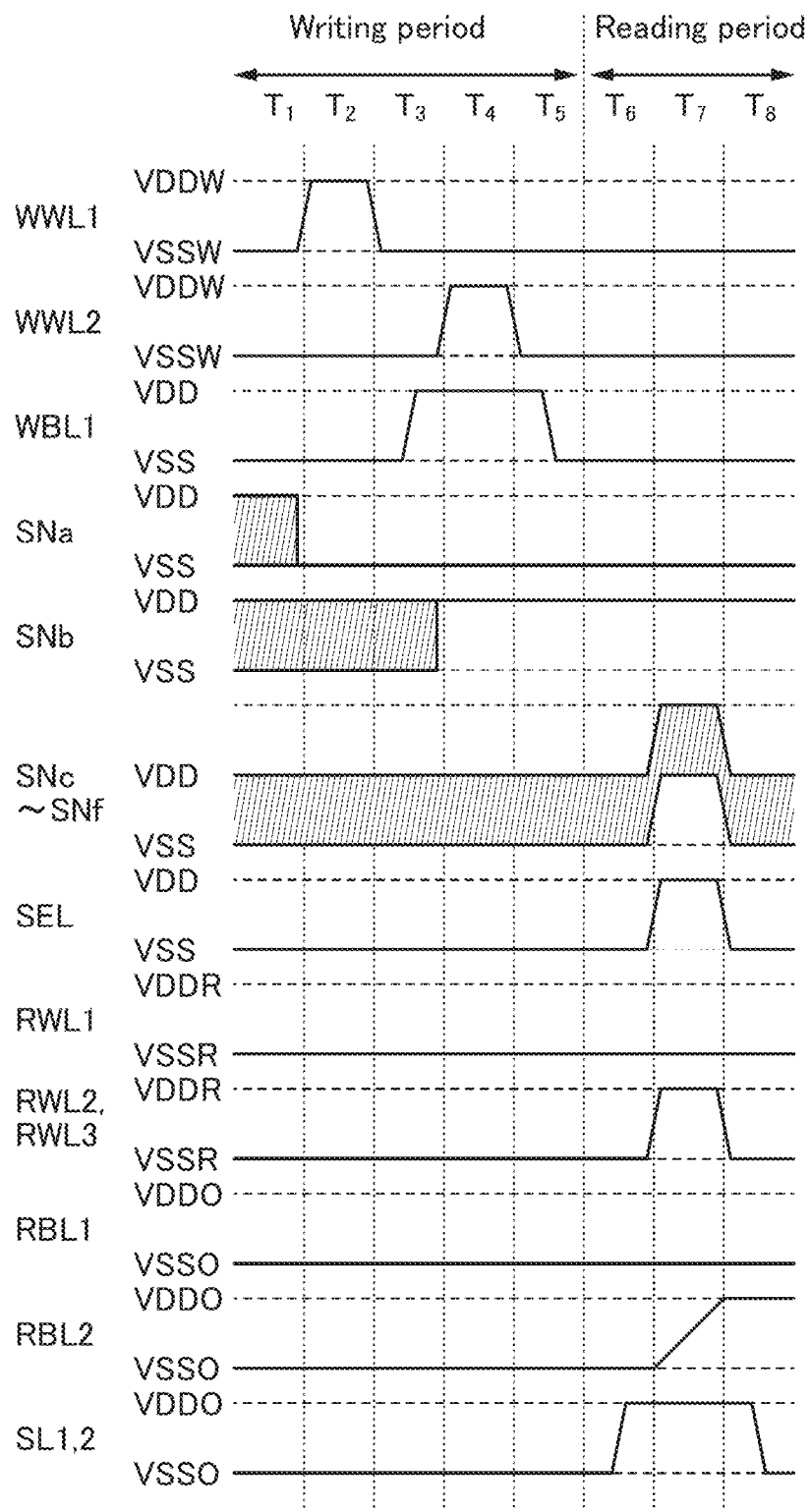
FIG. 62 is a timing chart of a memory device according to one embodiment of the present invention.

The description of the timing chart shown in FIG. 59 can be referred to for the details of potentials shown in the timing chart in FIG. 62. Note that unlike in the memory cells 1611, n-channel transistors are used as the read transistors in the memory cells 1612. For this reason, in the timing chart shown in FIG. 62, the potential VDDR is a potential at which the transistor MN61a (the transistor MN61b) can be turned on regardless of the charge retained at the node SNa (the node SNb). Furthermore, in the timing chart shown in FIG. 62, the reading potential VSSR is a potential at which the transistor MN61a (the transistor MN61b) is turned on when the charge retained at the node SNa (the node SNb) corresponds to data "1" and the transistor MN61a (the transistor MN61b) is turned off when the retained charge corresponds to data "0". Moreover, in the timing chart shown in FIG. 62, the potential VSSO is a potential applied to the bit line RBL when data "0" is retained, and the potential VDDO is a potential applied to the bit line RBL when data "1" is retained.

The writing operation is performed in Period T1 to Period T5 in the timing chart shown in FIG. 62. In the memory device including the NAND memory cell array 1610 illustrated in FIG. 60, the writing operation is performed for each memory cell row. Thus, when data is written to the memory cell 1612a and the memory cell 1612b described below, data can be written to a memory cell row including the memory cell 1612a and a memory cell row including the memory cell 1612b at the same time.

The writing operation of the NAND memory cell array illustrated in FIG. 60 can be performed in a manner similar to that of the writing operation of the NOR memory cell array illustrated in FIG. 57. Thus, the description of the writing operation in Period T1 to Period T7 of the timing chart shown in FIG. 59 can be referred to for the writing operation in Period T1 to Period T5 of the timing chart shown in FIG. 62. Because the potential of the word line RWL1 is kept at the potential VSSR during the writing period in the timing chart shown in FIG. 62, the operation performed in Period T3 and Period T4 of FIG. 59 can be performed only in Period T3 of FIG. 62, and the operation performed in Period T6 and Period T7 of FIG. 59 can be performed only in Period T5 of FIG. 62.

Next, the reading operation is described. The reading operation is performed in Period T6 to Period T8 in the timing chart shown in FIG. 62. In the memory device including the NAND memory cell array 1610 illustrated in FIG. 60, the reading operation is performed for each memory cell row. Thus, when data of the memory cell 1612*a* and data of the memory cell 1612*b* described below are read, data of the memory cell row including the memory cell 1612*a* and data of the memory cell row including the memory cell 1612*b* can be read at the same time.

Period T6 is a stand-by period like Period T1, and no memory cell row is selected. The potentials of the wirings are the same as the potentials applied in Period T5. Note that a potential VDDO is applied to the source lines SL1 and SL2 for following Period T7. During the reading period, the potential VSSW or the potential VSS is kept applied to the word lines WWL1 and WWL2 and the bit line WBL1.

In Period T7, the word line RWL1 is selected and reading from memory cell rows connected to the word line RWL1 is performed. The potential VDD at which the transistors SN61*a* and SN61*b* and the like are turned on is applied to the wiring SEL so that the transistors SN61 connected to the wiring SEL are turned on and the block illustrated in FIG. 60 is selected; accordingly, the reading operation can be started. The potential VDDR is applied to the word lines RWL2 and RWL3 connected to memory cell rows on which reading is not performed to turn on the transistors MN61*c* to MN61*f*. At this time, the potential VSSR is applied to the word line RWL1 connected to the memory cell rows on which reading is performed, and conductance between the bit line RBL1 and the source line SL1 is determined by data retained at the node SNa whereas conductance between the bit line RBL2 and the source line SL2 is determined by data retained at the node SNb. Since a charge corresponding to data "0" is retained at the node SNa, the transistor MN61*a* is turned off, the source line SL1 and the bit line RBL1 are not electrically connected to each other, and the potential VSSO is applied to the bit line RBL1. In addition, since a charge corresponding to data "1" is retained at the node SNb, the transistor MN61*b* is turned on, the source line SL2 and the bit line RBL2 are electrically connected to each other, and the potential VDDO is applied to the bit line RBL2. Reading the potentials of the bit lines RBL1 and RBL2 by the read circuit 1670 enables reading of data retained in the memory cell 1612*a* and data retained in the memory cell 1612*b*.

Period T8 is a stand-by period like Period T1, and no memory cell row is selected. The potentials of the wirings are reset to the potentials applied in Period T1.

In the above manner, the reading operation in which data written to the memory cell 1612*a* and data written to the memory cell 1612*b* are read at the same time can be performed. Since data of two memory cell rows can be read at the same time in the memory device of this embodiment as described above, high-speed reading can be achieved.

In the memory device described in this embodiment, the NOSRAM 1600 has no limitations on the number of rewrites in principle and data can be read and written with low energy consumption, because data is rewritten by charging and discharging the capacitor C61*a* or the capacitor C61*b*. Furthermore, data can be retained for a long time; thus, the refresh rate can be reduced.

In the case where the semiconductor device described in the above embodiment is used in the memory cells 1611 or 1612, the transistors 200*b* and 200*c* can be used as the OS transistors MO61*a* and MO61*b*, the capacitors 100*b* and 100*c* can be used as the capacitors C61*a* and C61*b*, and the transistors 300*b* and 300*c* can be used as the transistors MP61*a* and MN61*a* and the transistors MP61*b* and MN61*b*. In that case, the area occupied by each set consisting of one transistor and one capacitor when seen from the top can be reduced; accordingly, the memory device of this embodiment can be further highly integrated. As a result, storage capacity per unit area of the memory device of this embodiment can be increased.

The structure described in this embodiment can be used in appropriate combination with any of the structures described in the other embodiments.

Embodiment 7

In this embodiment, an AI system in which the semiconductor device of any of the above-described embodiments is used will be described with reference to FIG. 63.

Figure 63:
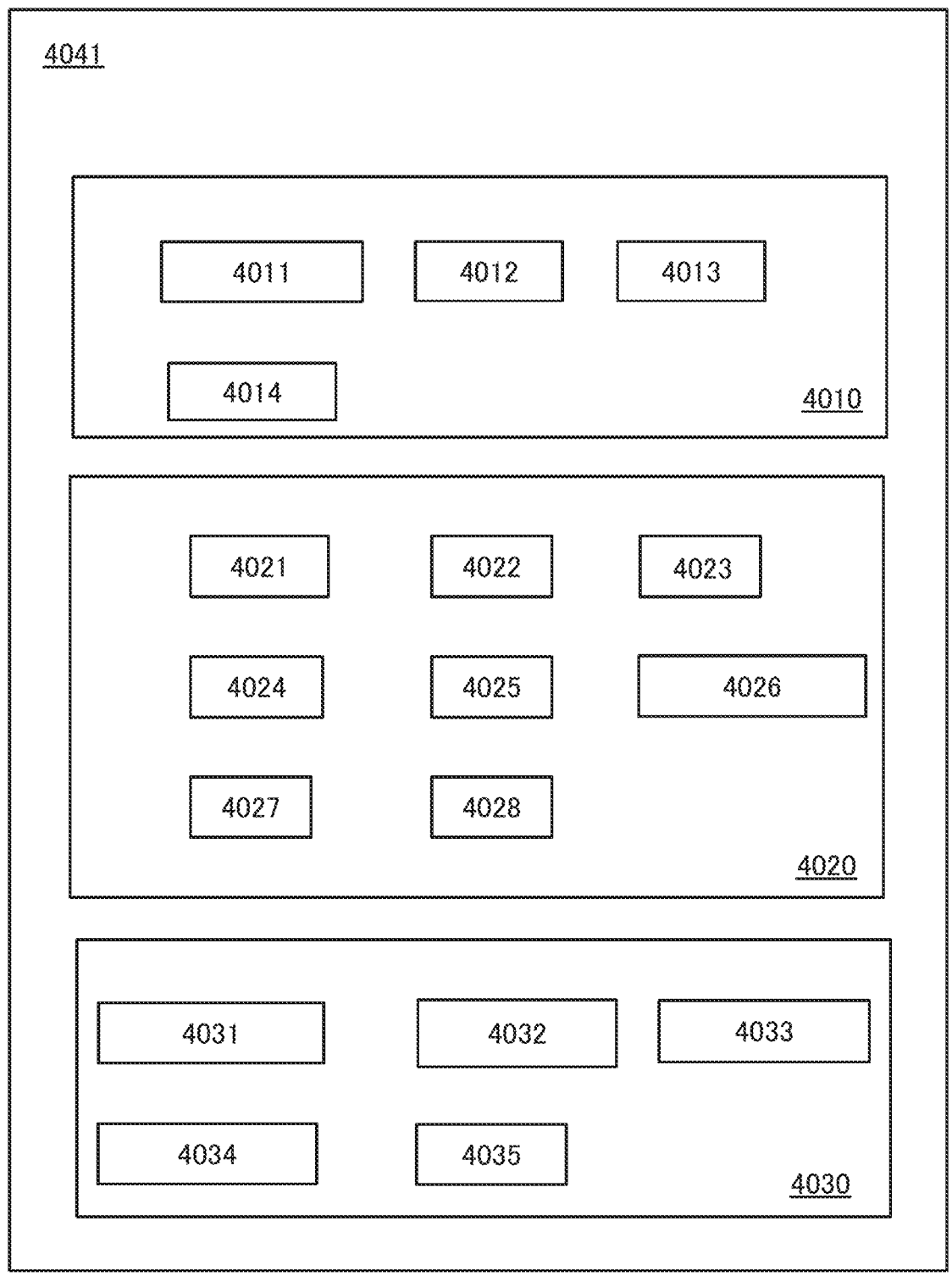
FIG. 63 is a block diagram illustrating a structure example of an AI system according to one embodiment of the present invention.

FIG. 63 is a block diagram illustrating a structure example of an AI system 4041. The AI system 4041 includes an arithmetic portion 4010, a control portion 4020, and an input/output portion 4030.

The arithmetic portion 4010 includes an analog arithmetic circuit 4011, a DOSRAM 4012, a NOSRAM 4013, and an FPGA 4014. The NOSRAM 1600 described in the above embodiment can be used as the NOSRAM 4013.

The control portion 4020 includes a central processing unit (CPU) 4021, a graphics processing unit (GPU) 4022, a phase locked loop (PLL) 4023, a static random access memory (SRAM) 4024, a programmable read only memory (PROM) 4025, a memory controller 4026, a power supply circuit 4027, and a power management unit (PMU) 4028.

The input/output portion 4030 includes an external memory control circuit 4031, an audio codec 4032, a video codec 4033, a general-purpose input/output module 4034, and a communication module 4035.

The arithmetic portion 4010 can perform neural network learning or neural network inference.

The analog arithmetic circuit 4011 includes an analog/digital (A/D) converter circuit, a digital/analog (D/A) converter circuit, and a product-sum operation circuit.

The analog arithmetic circuit 4011 is preferably formed using an OS transistor. The analog arithmetic circuit 4011 formed using an OS transistor includes an analog memory and can execute a product-sum operation necessary for the learning and the inference with low power consumption.

The DOSRAM 4012 is a DRAM including an OS transistor. The term "DOSRAM" (registered trademark) is an abbreviation of "dynamic oxide semiconductor RAM", which indicates a RAM including one transistor (1T) and one capacitor (1C). As in the NOSRAM, an OS memory is used in the DOSRAM of this embodiment.

The DOSRAM 4012 is a memory that temporarily stores digital data sent from the CPU 4021. The DOSRAM 4012 includes a memory cell including an OS transistor and a read circuit portion including a Si transistor. Because the memory cell and the read circuit portion can be provided in different layers that are stacked, the entire circuit area of the DOSRAM 4012 can be small.

In the calculation with the neural network, the number of input data exceeds 1000 in some cases. In the case where the input data are stored in the SRAM 4024, the input data has to be stored piece by piece because of the circuit area limitation and small storage capacity of the SRAM 4024. The DOSRAM 4012 has a larger storage capacity than the SRAM 4024 because memory cells of the DOSRAM can be highly integrated even in a limited circuit area. Therefore, the DOSRAM 4012 can efficiently store the input data.

The NOSRAM 4013 consumes less power in writing data than the other nonvolatile memories such as a flash memory, a resistive random access memory (ReRAM), and a magnetoresistive random access memory (MRAM). Furthermore, unlike a flash memory and a ReRAM which deteriorate by data writing, the NOSRAM does not have a limit on the number of times of data writing.

Furthermore, the NOSRAM 4013 can store multilevel data of two or more bits as well as one-bit binary data. The multilevel data storage in the NOSRAM 4013 leads to a reduction of the memory cell area per bit.

Because the NOSRAM 4013 can store analog data as well as digital data, the analog arithmetic circuit 4011 can use the NOSRAM 4013 as an analog memory. The NOSRAM 4013 can store analog data as it is, and thus a D/A converter circuit and an A/D converter circuit are unnecessary. Therefore, the area of a peripheral circuit for the NOSRAM 4013 can be reduced. In this specification, analog data refers to data having a resolution of three bits (eight levels) or more. The above-described multilevel data might be included in the analog data.

Data and parameters used in the neural network calculation can be once stored in the NOSRAM 4013. The data and parameters may be stored in a memory provided outside the AI system 4041 via the CPU 4021. However, the NOSRAM 4013 provided inside the AI system 4041 can store the data and parameters more quickly with lower power consumption. Furthermore, the NOSRAM 4013 enables a longer bit line than the DOSRAM 4012 and thus can have an increased storage capacity.

The FPGA 4014 is an FPGA including an OS transistor. In the FPGA of this embodiment, an OS memory can be used for a configuration memory and a register. Here, such an FPGA is referred to as an "OS-FPGA". By including the FPGA 4014, the AI system 4041 can establish a connection of a neural network such as a deep neural network (DNN), a convolutional neural network (CNN), a recurrent neural network (RNN), an autoencoder, a deep Boltzmann machine (DBM), a deep belief network (DBN), or the like described later, with a hardware. The connection of the neural network with a hardware enables higher speed performance.

The FPGA 4014 is an OS-FPGA. An OS-FPGA can have a smaller memory area than an FPGA formed using an SRAM. Thus, adding a context switching function only causes a small increase in area. Moreover, an OS-FPGA can transmit data and parameters at high speed by utilizing the boosting.

In the AI system 4041, the analog arithmetic circuit 4011, the DOSRAM 4012, the NOSRAM 4013, and the FPGA 4014 can be provided on one die (chip). Thus, the AI system 4041 can perform calculation of the neural network quickly with low power consumption. The analog arithmetic circuit 4011, the DOSRAM 4012, the NOSRAM 4013, and the FPGA 4014 can be manufactured through the same manufacturing process. This enables the AI system 4041 to be manufactured at low cost.

Note that the arithmetic portion 4010 does not need to include all of the following: the DOSRAM 4012, the NOSRAM 4013, and the FPGA 4014. One or more memories are selected from the DOSRAM 4012, the NOSRAM 4013, and the FPGA 4014 in accordance with a problem that is desired to be solved in the AI system 4041.

The AI system 4041 can implement a method such as a deep neural network (DNN), a convolutional neural network (CNN), a recurrent neural network (RNN), an autoencoder, a deep Boltzmann machine (DBM), or a deep belief network (DBN) in accordance with the problem that is desired to be solved. The PROM 4025 can store a program for implementing at least one of the methods. Part or the whole of the program may be stored in the NOSRAM 4013.

Most of the existing programs used as libraries are designed on the premise that the programs are processed by a GPU. Therefore, the AI system 4041 preferably includes the GPU 4022. The AI system 4041 can execute the bottleneck product-sum operation among all the product-sum operations used for learning and inference in the arithmetic portion 4010, and execute the other product-sum operations in the GPU 4022. In this manner, the learning and inference can be performed at high speed.

The power supply circuit 4027 generates not only a low power supply potential for a logic circuit but also a potential for an analog operation. The power supply circuit 4027 may include an OS memory. In that case, storing a reference potential in the OS memory can reduce the power consumption of the power supply circuit 4027.

The PMU 4028 is configured to temporarily stop the power supply to the AI system 4041.

As a register in each of the CPU 4021 and the GPU 4022, an OS memory is preferably included. By including the OS memory, each of the CPU 4021 and the GPU 4022 can retain data (logic value) in the OS memory even when power supply is stopped. As a result, the AI system 4041 can save the power.

The PLL 4023 is configured to generate a clock. The AI system 4041 performs an operation on the basis of the clock generated by the PLL 4023. The PLL 4023 preferably includes an OS memory. When an OS memory is included in the PLL 4023, an analog potential with which the clock oscillation frequency is controlled can be held.

The AI system 4041 may store data in an external memory such as a DRAM. For this reason, the AI system 4041 preferably includes the memory controller 4026 functioning as an interface with the external DRAM. Furthermore, the memory controller 4026 is preferably provided near the CPU 4021 or the GPU 4022. Thus, quick data transmission can be achieved.

Some or all of the circuits illustrated in the control portion 4020 can be formed on the same die as the arithmetic portion 4010. Thus, the AI system 4041 can execute neural network calculation at high speed with low power consumption.

Data used for neural network calculation is stored in an external storage device such as a hard disk drive (HDD) or a solid state drive (SSD) in many cases. Therefore, the AI system 4041 preferably includes the external memory control circuit 4031 functioning as an interface with the external storage device.

Because audio and video are often subjects of the learning and inference using the neural network, the AI system 4041 includes the audio codec 4032 and the video codec 4033. The audio codec 4032 encodes and decodes audio data, and the video codec 4033 encodes and decodes video data.

The AI system 4041 can perform learning or make an inference using data obtained from an external sensor. For this reason, the AI system 4041 includes the general-purpose input/output module 4034. The general-purpose input/output module 4034 includes a universal serial bus (USB), an inter-integrated circuit (I2C), or the like, for example.

The AI system 4041 can perform learning or make an inference using data obtained via the Internet. For this reason, the AI system 4041 preferably includes the communication module 4035.

The analog arithmetic circuit 4011 may include a multilevel flash memory as an analog memory. However, the flash memory has a limit on the number of rewriting times. In addition, the multi-level flash memory is extremely difficult to embed; in other words, the arithmetic circuit and the memory are difficult to form on the same die.

Alternatively, the analog arithmetic circuit 4011 may include a ReRAM as an analog memory. However, the ReRAM has a limit on the number of rewriting times and also has a problem in storage accuracy. Moreover, because the ReRAM is a two-terminal element, the complicated circuit design is necessary for separating data writing and data reading.

Further alternatively, the analog arithmetic circuit 4011 may include an MRAM as an analog memory. However, the MRAM has a problem in storage capacity because of its low magnetoresistive ratio.

In consideration of the above, an OS memory is preferably used as an analog memory in the analog arithmetic circuit 4011.

The structure described in this embodiment can be used in appropriate combination with any of the structures described in the other embodiments.

Embodiment 8

<Application Example of AI System>

In this embodiment, application examples of the AI system described in the above embodiment will be described with reference to FIGS. 64A and 64B.

Figure 64A:
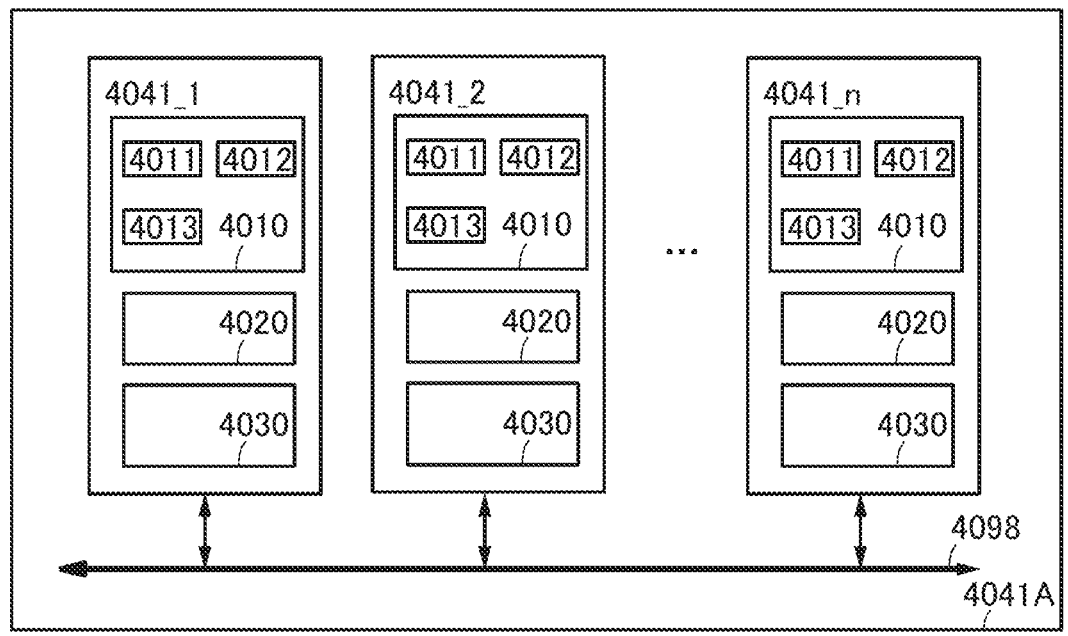
FIGS. 64A and 64B are block diagrams each illustrating an application example of an AI system according to one embodiment of the present invention.

FIG. 64A illustrates an AI system 4041A in which the AI systems 4041 described with FIG. 63 are arranged in parallel and a signal can be transmitted between the systems via a bus line.

The AI system 4041A illustrated in FIG. 64A includes AI systems 4041_1 to 4041_*n* (n is a natural number). The AI systems 4041_1 to 4041_*n* are connected to each other via a bus line 4098.

Figure 64B:
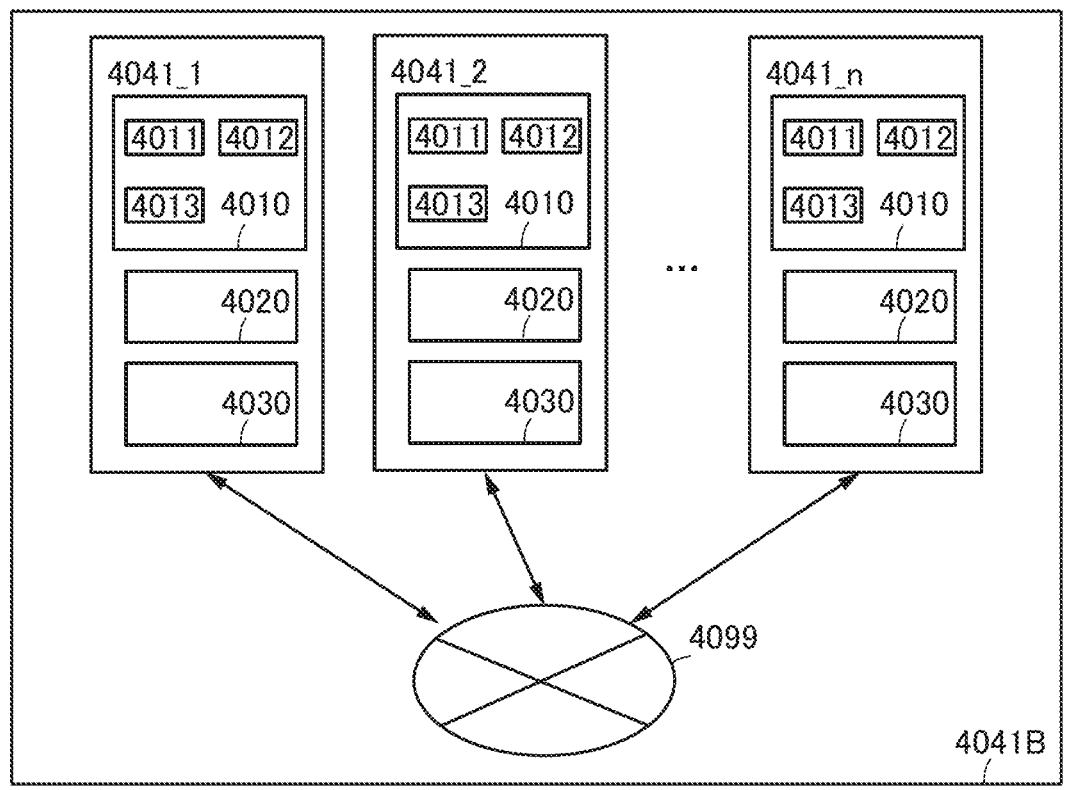

FIG. 64B illustrates an AI system 4041B in which the AI systems 4041 described with FIG. 63 are arranged in parallel as in FIG. 64A and a signal can be transmitted between the systems via a network.

The AI system 4041B illustrated in FIG. 64B includes the AI systems 4041_1 to 4041_*n*. The AI systems 4041_1 to 4041_*n* are connected to each other via a network 4099.

A communication module is provided in each of the AI systems 4041_1 to 4041_*n*; such a configuration enables wireless or wired communication via the network 4099. A communication module can communicate via an antenna. Communication can be performed when an electronic device is connected to a computer network such as the Internet (infrastructure of the World Wide Web, WWW), an intranet, an extranet, a personal area network (PAN), a local area network (LAN), a campus area network (CAN), a metropolitan area network (MAN), a wide area network (WAN), or a global area network (GAN), for example. In the case of performing wireless communication, it is possible to use, as a communication protocol or a communication technology, a communications standard such as Long-Term Evolution (LTE), Global System for Mobile Communication (GSM: registered trademark), Enhanced Data Rates for GSM Evolution (EDGE), Code Division Multiple Access 2000 (CDMA2000), or W-CDMA (registered trademark), or a communications standard developed by IEEE such as Wi-Fi (registered trademark), Bluetooth (registered trademark), or ZigBee (registered trademark).

With the configuration illustrated in FIG. 64A or FIG. 64B, analog signals obtained with external sensors or the like can be processed by different AI systems. For example, analog signals containing biological information such as brain waves, a pulse, blood pressure, and body temperature obtained with a variety of sensors such as a brain wave sensor, a pulse wave sensor, a blood pressure sensor, and a temperature sensor can be processed by different AI systems. Since each of the AI systems performs signal processing or learning, the amount of information processed by each AI system can be reduced. Accordingly, the signal processing or learning requires a smaller amount of arithmetic processing. As a result, recognition accuracy can be increased. With the use of data obtained with each AI system, biological information that irregularly changes should be able to be collectively grasped instantly.

The structure described in this embodiment can be used in appropriate combination with any of the structures described in the other embodiments.

Embodiment 9

In this embodiment, an example of an IC incorporating the AI system described in the above embodiment will be described.

In the AI system described in the above embodiment, a digital processing circuit (e.g., a CPU) that includes a Si transistor and an OS-FPGA, an OS memory (e.g., a DOSRAM or a NOSRAM), and an analog arithmetic circuit that include OS transistors can be integrated into one die.

Figure 65:
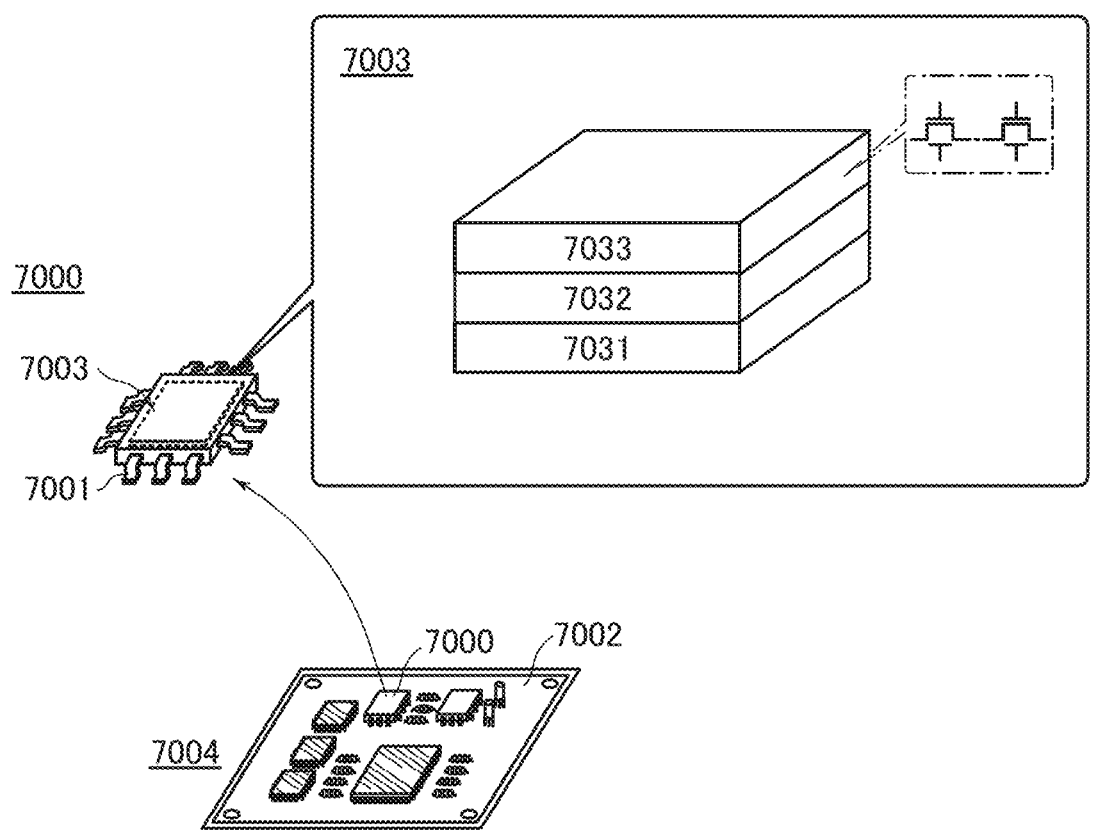
FIG. 65 is a schematic perspective view illustrating a structure example of an IC including an AI system according to one embodiment of the present invention.

FIG. 65 illustrates the example of the IC incorporating the AI system. An AI system IC 7000 illustrated in FIG. 65 includes a lead 7001 and a circuit portion 7003. The AI system IC 7000 is mounted on a printed circuit board 7002, for example. A plurality of such IC chips are combined and electrically connected to each other on the printed circuit board 7002; thus, a circuit board on which electronic components are mounted (a circuit board 7004) is formed. In the circuit portion 7003, the circuits described in the above embodiment are provided on one die. The circuit portion 7003 has a stacked-layer structure that is broadly divided into a Si transistor layer 7031, a wiring layer 7032, and an OS transistor layer 7033. Since the OS transistor layer 7033 can be stacked over the Si transistor layer 7031, the size of the AI system IC 7000 can be easily reduced.

Although a Quad Flat Package (QFP) is used as a package of the AI system IC 7000 in FIG. 65, the package is not limited thereto.

The digital processing circuit (e.g., a CPU) and the OS-FPGA, the OS memory (e.g., a DOSRAM or a NOSRAM), and the analog arithmetic circuit that include OS transistors can all be formed in the Si transistor layer 7031, the wiring layer 7032, and the OS transistor layer 7033. In other words, elements included in the AI system can be formed through the same manufacturing process. Thus, the number of steps in the manufacturing process of the IC described in this embodiment does not need to be increased even when the number of elements is increased, and accordingly the AI system can be incorporated into the IC at low cost.

The structure described in this embodiment can be used in appropriate combination with any of the structures described in the other embodiments.

Embodiment 10

<Electronic Device>

The semiconductor device of one embodiment of the present invention can be used for a variety of electronic devices. FIGS. 66A to 66F each illustrate a specific example of an electronic device including the semiconductor device of one embodiment of the present invention.

Figure 66A:
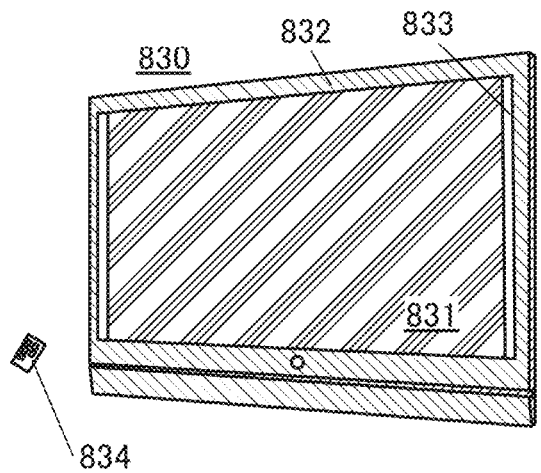
FIGS. 66A to 66F illustrate electronic devices according to one embodiment of the present invention.

FIG. 66A illustrates a monitor 830. The monitor 830 includes a display portion 831, a housing 832, a speaker 833, and the like. The monitor 830 can also include an LED lamp, operation keys (including a power switch or an operation switch), a connection terminal, a variety of sensors, a microphone, and the like. The monitor 830 can be controlled with a remote controller 834.

The monitor 830 can function as a television device by receiving airwaves.

The monitor 830 can receive airwaves such as a ground wave or a satellite wave, airwaves for analog broadcasting or digital broadcasting, airwaves for image-and-sound broadcasting or sound-only broadcasting, or the like. For example, the monitor 830 can receive airwaves transmitted in a certain frequency band in a UHF band (higher than or equal to 300 MHz and lower than or equal to 3 GHz) or a VHF band (higher than or equal to 30 MHz and lower than or equal to 300 MHz). With the use of a plurality of pieces of data received in a plurality of frequency bands, the transfer rate can be increased and more information can thus be obtained. Accordingly, the display portion 831 can display an image with a resolution higher than the full high definition, such as 4K2K, 8K4K, 16K8K, or more.

An image to be displayed on the display portion 831 may be generated using broadcasting data transmitted with a technology for transmitting data via a computer network such as the Internet, a local area network (LAN), or Wi-Fi (registered trademark). In that case, the monitor 830 does not need to include a tuner.

The monitor 830 can be used as a computer monitor when connected to a computer. Several people can see the monitor 830 connected to a computer at the same time; thus, the monitor 830 is suitably used for a conference system. The monitor 830 can also be used for a videoconference system by displaying data in a computer via a network or being connected to a network.

Alternatively, the monitor 830 can be used as a digital signage.

The semiconductor device of one embodiment of the present invention can be used for, for example, a driver circuit or an image processing portion of the display portion, in which case high-speed operation or high-speed signal processing can be achieved with low power consumption.

When an AI system including the semiconductor device of one embodiment of the present invention is used for the image processing portion of the monitor 830, image processing such as noise removal, grayscale conversion, color tone correction, or luminance correction can be performed. Furthermore, pixel interpolation due to resolution up-conversion, frame interpolation due to frame frequency up-conversion, or the like can be performed. In the grayscale conversion, the number of grayscale levels of an image can be changed, and interpolation of the gray value in the case of increasing the number of grayscale levels can be performed. In addition, high-dynamic range (HDR) processing for increasing a dynamic range is also included in the grayscale conversion.

Figure 66B:
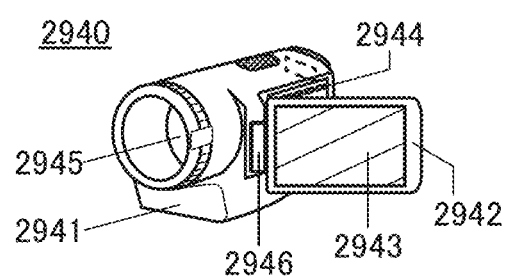

A video camera 2940 illustrated in FIG. 66B includes a housing 2941, a housing 2942, a display portion 2943, operation switches 2944, a lens 2945, a joint 2946, and the like. The operation switches 2944 and the lens 2945 are provided on the housing 2941, and the display portion 2943 is provided on the housing 2942. The video camera 2940 also includes an antenna, a battery, and the like inside the housing 2941. The housing 2941 and the housing 2942 are connected to each other with the joint 2946, and the angle between the housings 2941 and 2942 can be changed with the joint 2946. Depending on the angle between the housings 2941 and 2942, the orientation of an image displayed on the display portion 2943 can be changed or an image can be displayed or undisplayed.

The semiconductor device of one embodiment of the present invention can be used for, for example, a driver circuit or an image processing portion of the display portion, in which case high-speed operation or high-speed signal processing can be achieved with low power consumption.

When an AI system including the semiconductor device of one embodiment of the present invention is used for the image processing portion of the video camera 2940, imaging appropriate for the surroundings of the video camera 2940 can be performed. Specifically, imaging can be performed with optimal exposure for the surrounding brightness. In the case of performing imaging with backlighting or imaging under mixed brightness conditions (e.g., indoors and outdoors), high-dynamic-range (HDR) imaging can be performed.

Furthermore, the AI system can learn user's habit and assist the user in performing imaging. Specifically, the AI system can learn user's camera shaking habit and cancel the camera shaking during imaging, so that blurring of the obtained image associated with camera shaking can be reduced as much as possible. In the case of using a zoom function during imaging, the orientation of a lens or the like can be controlled such that a subject is positioned at the center of an image all the time.

Figure 66C:
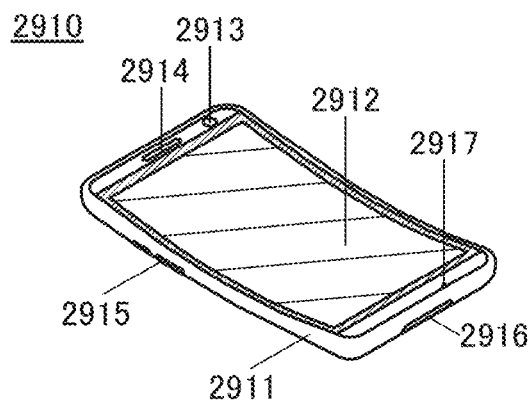

An information terminal 2910 illustrated in FIG. 66C includes a housing 2911, a display portion 2912, a microphone 2917, a speaker portion 2914, a camera 2913, an external connection portion 2916, operation switches 2915, and the like. A touch screen and a display panel formed using flexible substrates are provided in the display portion 2912. The information terminal 2910 also includes an antenna, a battery, and the like inside the housing 2911. The information terminal 2910 can be used as, for example, a smartphone, a mobile phone, a tablet information terminal, a tablet personal computer, or an e-book reader.

A memory device including the semiconductor device of one embodiment of the present invention can hold control data, a control program, or the like of the information terminal 2910 for a long time, for example.

When an AI system including the semiconductor device of one embodiment of the present invention is used for the image processing portion of the information terminal 2910, image processing such as noise removal, grayscale conversion, tone correction, or luminance correction can be performed. Furthermore, pixel interpolation due to resolution up-conversion, frame interpolation due to frame frequency up-conversion, or the like can be performed. In the grayscale conversion, the number of grayscale levels of an image can be changed, and interpolation of the gray value in the case of increasing the number of grayscale levels can be performed. In addition, high-dynamic range (HDR) processing for increasing a dynamic range is also included in the grayscale conversion.

Furthermore, the AI system can learn user's habit and assist the user in operating the information terminal 2910. The information terminal 2910 incorporating the AI system can predict touch input from the motion of user's fingers, eyes, or the like.

Figure 66D:
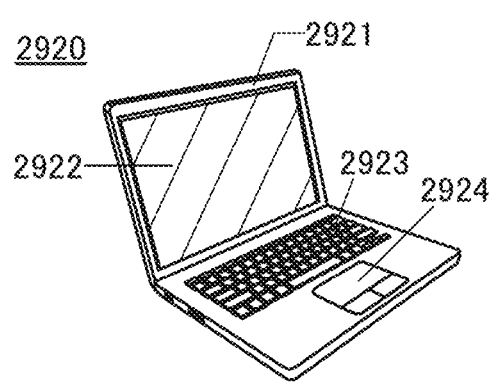

A notebook personal computer 2920 illustrated in FIG. 66D includes a housing 2921, a display portion 2922, a keyboard 2923, a pointing device 2924, and the like. The notebook personal computer 2920 also includes an antenna, a battery, and the like inside the housing 2921.

A memory device including the semiconductor device of one embodiment of the present invention can hold control data, a control program, or the like of the notebook personal computer 2920 for a long time, for example.

When an AI system including the semiconductor device of one embodiment of the present invention is used for the image processing portion of the notebook personal computer 2920, image processing such as noise removal, grayscale conversion, tone correction, or luminance correction can be performed. Furthermore, pixel interpolation due to resolution up-conversion, frame interpolation due to frame frequency up-conversion, or the like can be performed. In the grayscale conversion, the number of grayscale levels of an image can be changed, and interpolation of the gray value in the case of increasing the number of grayscale levels can be performed. In addition, high-dynamic range (HDR) processing for increasing a dynamic range is also included in the grayscale conversion.

Furthermore, the AI system can learn user's habit and assist the user in operating the notebook personal computer 2920. The notebook personal computer 2920 incorporating the AI system can predict touch input to the display portion 2922, from the motion of user's finger, eyes, or the like. In texting, the AI system predicts input from the past input text or a text or a diagram (e.g., a photograph) around the text to be input, to assist conversion. Accordingly, input mistakes and conversion mistakes can be reduced as much as possible.

Figure 66E:
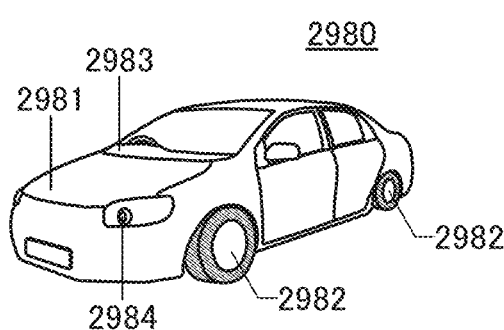
Figure 66F:
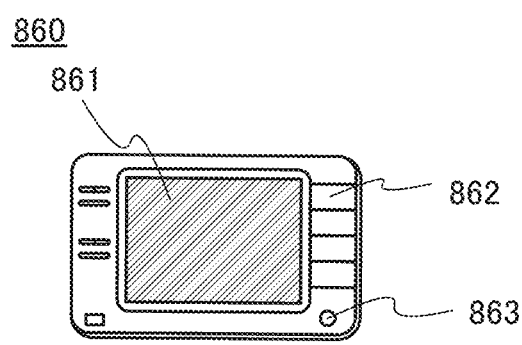

FIG. 66E is an external view illustrating an example of an automobile. FIG. 66F illustrates a navigation device 860. An automobile 2980 includes a car body 2981, wheels 2982, a dashboard 2983, lights 2984, and the like. The automobile 2980 also includes an antenna, a battery, and the like. The navigation device 860 includes a display portion 861, operation buttons 862, and an external input terminal 863. The automobile 2980 and the navigation device 860 can be independent of each other; however, it is preferable that the navigation device 860 be incorporated into and linked to the automobile 2980.

A memory device including the semiconductor device of one embodiment of the present invention can hold control data, a control program, or the like of the automobile 2980 or the navigation device 860 for a long time, for example. When an AI system including the semiconductor device of one embodiment of the present invention is used for a control device or the like of the automobile 2980, the AI system can learn driver's driving skill and habit and assist the driver in safe driving or driving involving efficient use of fuel such as gasoline or a battery. To assist the driver in safe driving, the AI system learns not only driver's driving skill and habit, but also learns the behavior of the automobile 2980 such as the speed and movement, road information saved in the navigation device 860, and the like complexly; thus, lane departure and collision with other automobiles, pedestrians, objects, and the like can be prevented. Specifically, when there is a sharp curve ahead, the navigation device 860 transmits the road information to the automobile 2980 so that the speed of the automobile 2980 can be controlled and steering can be assisted.

This embodiment can be implemented in an appropriate combination with any of the structures described in the other embodiments and the like.

Embodiment 11

In this embodiment, application examples of the storage device using the semiconductor device described in the above embodiment will be described. The semiconductor device described in the above embodiment can be applied to, for example, storage devices of a variety of electronic devices (e.g., information terminals, computers, smartphones, e-book readers, digital cameras (including video cameras), video recording/reproducing devices, and navigation systems). Here, the computers refer not only to tablet computers, notebook computers, and desk-top computers, but also to large computers such as server systems. Alternatively, the semiconductor device described in the above embodiment is applied to removable storage devices such as memory cards (e.g., SD cards), USB memories, and solid state drives (SSD). FIGS. 67A to 67E schematically illustrate some structural examples of removable storage devices. A packaged memory chip including the semiconductor device described in the above embodiment is used in a variety of storage devices and removable memories, for example.

Figure 67A:
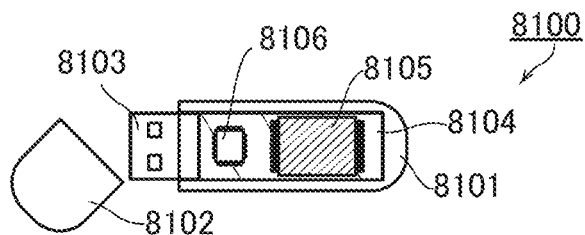
FIGS. 67A to 67E illustrate memory devices according to one embodiment of the present invention.

FIG. 67A is a schematic diagram of a USB memory. A USB memory 8100 includes a housing 8101, a cap 8102, a USB connector 8103, and a substrate 8104. The substrate 8104 is held in the housing 8101. The substrate 8104 is provided with a memory chip 8105 and a controller chip 8106, for example. The semiconductor device described in the above embodiment can be incorporated in the memory chip 8105 or the like on the substrate 8104.

Figures 67B, 67C:
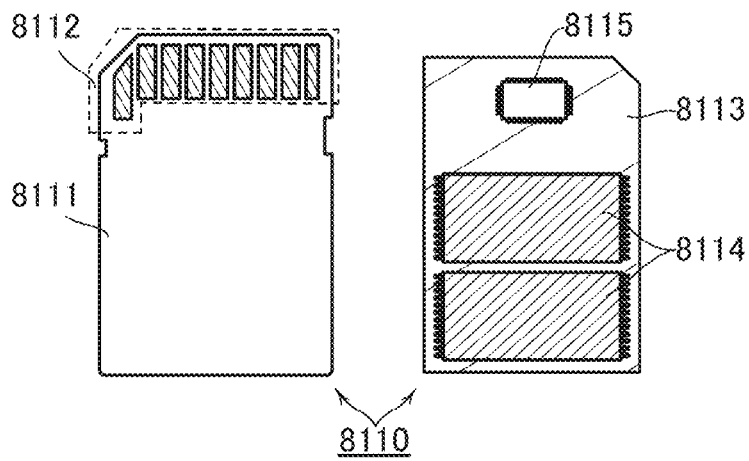

FIG. 67B is a schematic external diagram of an SD card, and FIG. 67C is a schematic diagram illustrating the internal structure of the SD card. An SD card 8110 includes a housing 8111, a connector 8112, and a substrate 8113. The substrate 8113 is held in the housing 8111. The substrate 8113 is provided with a memory chip 8114 and a controller chip 8115, for example. When the memory chip 8114 is also provided on a back side of the substrate 8113, the capacity of the SD card 8110 can be increased. In addition, a wireless chip with a radio communication function may be provided on the substrate 8113. With such a wireless chip, the memory chip 8114 can read and write data by radio communication between a host device and the SD card 8110. The semiconductor device described in the above embodiment can be incorporated in the memory chip 8114 or the like on the substrate 8113.

Figure 67D:
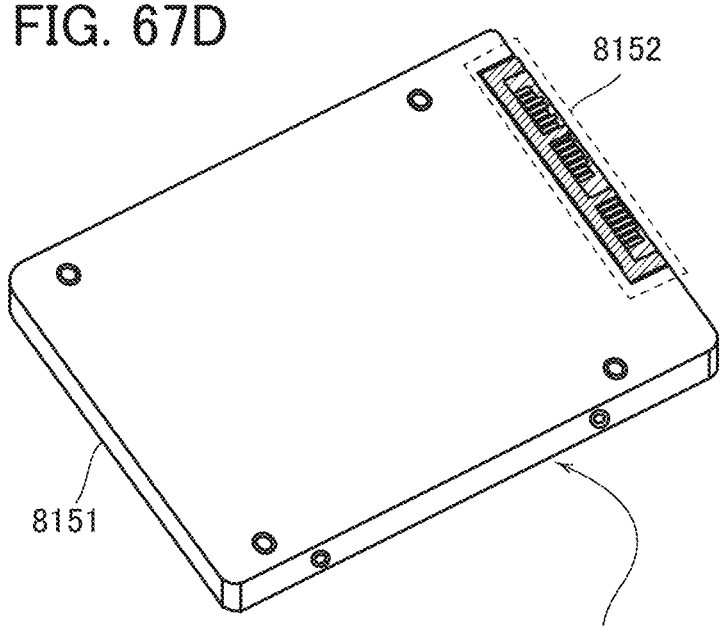
Figure 67E:
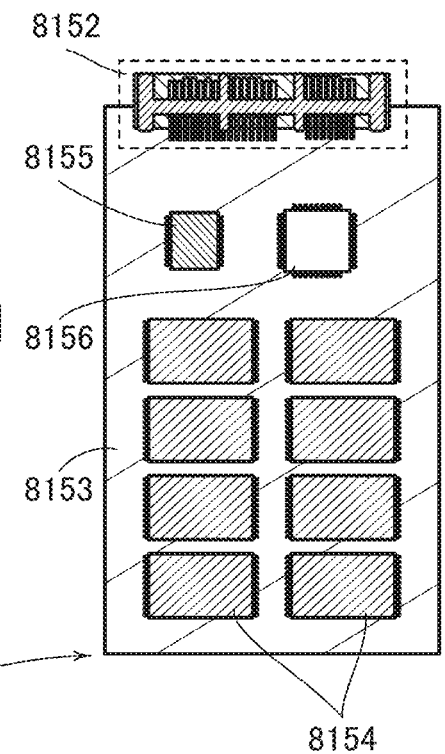

FIG. 67D is a schematic external diagram of an SSD, and FIG. 67E is a schematic diagram illustrating the internal structure of the SSD. An SSD 8150 includes a housing 8151, a connector 8152, and a substrate 8153. The substrate 8153 is held in the housing 8151. The substrate 8153 is provided with a memory chip 8154, a memory chip 8155, and a controller chip 8156, for example. The memory chip 8155 is a work memory of the controller chip 8156, and a DRAM chip may be used, for example. When the memory chip 8154 is also provided on a back side of the substrate 8153, the capacity of the SSD 8150 can be increased. The semiconductor device described in the above embodiment can be incorporated in the memory chip 8154 or the like on the substrate 8153.

This embodiment can be implemented in an appropriate combination with any of the structures described in the other embodiments and the like.

REFERENCE NUMERALS

100: capacitor, 100*a*: capacitor, 100*b*: capacitor, 100*c*: capacitor, 130: conductor, 130*a*: conductor, 130*b*: conductor, 130*c*: capacitor, 200: transistor, 200*a*: transistor, 200*b*: transistor, 200*c*: transistor, 201: insulator, 203_1: conductor, 203_2: conductor, 204_1: conductor, 204_2: conductor, 205: conductor, 205_1: conductor, 205_1*a*: conductor, 205_1*b*: conductor, 205_2: conductor, 205_2*a*: conductor, 205_2*b*: conductor, 206_1: conductor, 206_2: conductor, 210: insulator, 212: insulator, 214: insulator, 216: insulator, 218:

conductor, 220: insulator, 222: insulator, 224: insulator, 230: oxide, 230_1c: oxide, 230_2c: oxide, 230a: oxide, 230A: oxide film, 230b: oxide, 230B: oxide film, 230c: oxide, 230C: oxide film, 231: region, 231a: region, 231b: region, 232: junction region, 232a: junction region, 232b: junction region, 234: region, 240: conductor, 250: insulating film, 250a: insulator, 250b: insulator, 252: insulating film, 252a: insulator, 252b: insulator, 253: conductor, 256: conductor, 260: conductive film, 260_1: conductor, 260_1a: conductor, 260_1b: conductor, 260_2: conductor, 260_2a: conductor, 260_2b: conductor, 260A: conductive film, 260B: conductive film, 270: insulating film, 270a: insulator, 270b: insulator, 271: insulating film, 271a: insulator, 271b: insulator, 272: insulating film, 272a: insulator, 272b: insulator, 274: insulating film, 274a: insulator, 274b: insulator, 275: insulating film, 275a: insulator, 275b: insulator, 276a: insulator, 276b: insulator, 277: oxide, 280: insulator, 286: conductor, 300: transistor, 300a: transistor, 300b: transistor, 300c: transistor, 311: substrate, 313: semiconductor region, 314a: low-resistance region, 314b: low-resistance region, 314c: low-resistance region, 315: insulator, 316: conductor, 320: insulator, 322: insulator, 324: insulator, 326: insulator, 328: conductor, 330: conductor, 350: insulator, 352: insulator, 354: insulator, 356: conductor, 360: insulator, 362: insulator, 366: conductor, 372: insulator, 374: insulator, 376: conductor, 380: insulator, 382: insulator, 384: insulator, 400: transistor, 403: conductor, 405: conductor, 405a: conductor, 405b: conductor, 424: insulator, 424a: insulator, 424b: insulator, 430c: oxide, 430d: oxide, 431a: oxide, 431b: oxide, 431c: oxide, 432a: oxide, 432b: oxide, 432c: oxide, 450: insulator, 452: insulator, 460: conductor, 460a: conductor, 460b: conductor, 470: insulator, 471: insulator, 472: insulator, 474: insulator, 475: insulator, 530: oxide, 530_d1: oxide, 530_d2: oxide, 530a: oxide, 530A: oxide film, 530b: oxide, 530B: oxide film, 530c: oxide, 530C: oxide film, 530d: oxide, 530D: oxide film, 600: cell, 600a: cell, 600b: cell, 600c: cell, 601: cell, 830: monitor, 831: display portion, 832: housing, 833: speaker, 834: remote controller, 860: navigation device, 861: display portion, 862: operation button, 863: external input terminal, 1001: wiring, 1002: wiring, 1003: wiring, 1004: wiring, 1004a: wiring, 1004b: wiring, 1005: wiring, 1005a: wiring, 1005b: wiring, 1006: wiring, 1006a: wiring, 1006b: wiring, 1007: wiring, 1008: wiring, 1009: wiring, 1010: wiring, 1400: DOSRAM, 1405: controller, 1410: row circuit, 1411: decoder, 1412: word line driver circuit, 1413: column selector, 1414: sense amplifier driver circuit, 1415: column circuit, 1416: global sense amplifier driver circuit, 1417: input/output circuit, 1420: MC-SA array, 1422: memory cell array, 1423: sense amplifier array, 1425: local memory cell array, 1426: local sense amplifier array, 1444: switch array, 1445: memory cell, 1445a: memory cell, 1445b: memory cell, 1446: sense amplifier, 1447: global sense amplifier, 1600: NOSRAM, 1610: memory cell array, 1611: memory cell, 1611_1: memory cell, 1611_2: memory cell, 1611_3: memory cell, 1611a: memory cell, 1611b: memory cell, 1611c: memory cell, 1611d: memory cell, 1611e: memory cell, 1611f: memory cell, 1612: memory cell, 1612_1: memory cell, 1612_2: memory cell, 1612_3: memory cell, 1612a: memory cell, 1612b: memory cell, 1612c: memory cell, 1612d: memory cell, 1612e: memory cell, 1612f: memory cell, 1640: controller, 1650: row driver, 1651: row decoder, 1652: word line driver, 1660: column driver, 1661: column decoder, 1662: driver, 1670: circuit, 2000: CDMA, 2910: information terminal, 2911: housing, 2912: display portion, 2913: camera, 2914: speaker portion, 2915: operation switch, 2916: external connection portion, 2917: microphone, 2920: notebook personal computer, 2921: housing, 2922: display portion, 2923: keyboard, 2924: pointing device, 2940: video camera, 2941: housing, 2942: housing, 2943: display portion, 2944: operation switch, 2945: lens, 2946: connection portion, 2980: car, 2981: car body, 2982: wheel, 2983: dashboard, 2984: light, 3001: wiring, 3002: wiring, 3003: wiring, 3004a: wiring, 3004b: wiring, 3005a: wiring, 3005b: wiring, 3006a: wiring, 3006b: wiring, 3007: wiring, 3564: conductor, 4010: arithmetic portion, 4011: analog arithmetic circuit, 4012: DOSRAM, 4013: NOSRAM, 4014: FPGA, 4020: control portion, 4021: CPU, 4022: GPU, 4023: PLL, 4025: PROM, 4026: memory controller, 4027: power supply circuit, 4028: PMU, 4030: input/output portion, 4031: external memory control circuit, 4032: audio codec, 4033: video codec, 4034: general-purpose input/output module, 4035: communication module, 4041: AI system, 4041_n: AI system, 4041_1: AI system, 4041A: AI system, 4041B: AI system, 4098: bus line, 4099: network, 8100: USB memory, 8101: housing, 8102: cap, 8103: USB connector, 8104: substrate, 8105: memory chip, 8106: controller chip, 8110: SD card, 8111: housing, 8112: connector, 8113: substrate, 8114: memory chip, 8115: controller chip, 8150: SSD, 8151: housing, 8152: connector, 8153: substrate, 8154: memory chip, 8155: memory chip, 8156: controller chip.

This application is based on Japanese Patent Application Serial No. 2017-090374 filed with Japan Patent Office on Apr. 28, 2017 and Japanese Patent Application Serial No. 2017-090842 filed with Japan Patent Office on Apr. 28, 2017, the entire contents of which are hereby incorporated by reference.

The invention claimed is:
1. A semiconductor device comprising:
a first transistor, a second transistor, a first capacitor, a second capacitor, and a wiring;
wherein the first transistor comprises:
an oxide semiconductor over a first insulator;
a second insulator over the oxide semiconductor;
a first conductor over the second insulator;
a third insulator over the first conductor;
a fourth insulator in contact with the second insulator, the first conductor, and the third insulator; and
a fifth insulator in contact with the fourth insulator,
wherein the second transistor comprises:
the semiconductor oxide over the first insulator;
a sixth insulator over the oxide semiconductor;
a second conductor over the sixth insulator;
a seventh insulator over the second conductor;
an eighth insulator in contact with the sixth insulator, the second conductor, and the seventh insulator; and
a ninth insulator in contact with the eighth insulator,
wherein the first capacitor comprises:
the oxide semiconductor;
a tenth insulator in contact with one side surface of the oxide semiconductor in a channel length direction and part of a top surface of the oxide semiconductor; and
a third conductor over and in contact with the tenth insulator,
wherein the second capacitor comprises:
the oxide semiconductor;
an eleventh insulator in contact with the other side surface of the oxide semiconductor in the channel length direction and part of the top surface of the oxide semiconductor; and
a fourth conductor over and in contact with the eleventh insulator,
wherein the oxide semiconductor comprises:

a channel formation region of the first transistor overlapping with the second insulator;
a channel formation region of the second transistor overlapping with the sixth insulator; and
a region between the channel formation region of the first transistor and the channel formation region of the second transistor, and
wherein the wiring is in contact with the fifth insulator and the ninth insulator and electrically connected to the region.

2. The semiconductor device according to claim 1, wherein the oxide semiconductor comprises In, an element M, and Zn, and
wherein the element M is Al, Ga, Y, or Sn.

3. The semiconductor device according to claim 1, wherein the oxide semiconductor further comprises a first region overlapping with the fourth insulator and a second region overlapping with the eighth insulator,
wherein the first region is between the channel formation region of the first transistor and the region,
wherein the second region is between the channel formation region of the second transistor and the region,
wherein the region has a higher carrier density than the first region and the second region, and
wherein the first region and the second region have a higher carrier density than the channel formation region of the first transistor and the channel formation region of the second transistor.

4. The semiconductor device according to claim 1, wherein the fourth insulator and the eighth insulator each comprise a metal oxide.

5. The semiconductor device according to claim 1, wherein the fifth insulator and the ninth insulator each comprise one or more selected from aluminum oxide, silicon oxide, silicon oxynitride, silicon nitride oxide, and silicon nitride.

6. The semiconductor device according to claim 1, wherein the fifth insulator and the ninth insulator each have a structure in which a silicon oxynitride film and a silicon nitride film are stacked in this order.

7. A memory device comprising the semiconductor device according to claim 1 and a semiconductor element electrically connected to the semiconductor device, wherein the semiconductor element comprises silicon in a channel formation region.

8. The memory device according to claim 7, wherein the semiconductor device is over the semiconductor element.

* * * * *